US010545405B2

(12) United States Patent
Yamaguchi et al.

(10) Patent No.: US 10,545,405 B2
(45) Date of Patent: Jan. 28, 2020

(54) ACTINIC RAY-SENSITIVE OR RADIATION-SENSITIVE RESIN COMPOSITION, ACTINIC RAY-SENSITIVE OR RADIATION-SENSITIVE FILM, MASK BLANK INCLUDING ACTINIC RAY-SENSITIVE OR RADIATION-SENSITIVE FILM, PATTERN FORMING METHOD, AND METHOD FOR MANUFACTURING ELECTRONIC DEVICE

(71) Applicant: FUJIFILM Corporation, Tokyo (JP)

(72) Inventors: Shuhei Yamaguchi, Shizuoka (JP); Koutarou Takahashi, Shizuoka (JP); Toshiaki Fukuhara, Shizuoka (JP); Shuji Hirano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/685,499

(22) Filed: Aug. 24, 2017

(65) Prior Publication Data
US 2017/0351176 A1 Dec. 7, 2017

Related U.S. Application Data
(63) Continuation of application No. PCT/JP2016/054625, filed on Feb. 17, 2016.

(30) Foreign Application Priority Data

Feb. 27, 2015 (JP) .................. 2015-038744
Jun. 18, 2015 (JP) .................. 2015-123245
Dec. 18, 2015 (JP) .................. 2015-247932

(51) Int. Cl.
G03F 7/038 (2006.01)
G03F 7/30 (2006.01)
G03F 1/50 (2012.01)
G03F 7/16 (2006.01)
G03F 7/20 (2006.01)

(52) U.S. Cl.
CPC ............. G03F 7/0382 (2013.01); G03F 1/50 (2013.01); G03F 7/038 (2013.01); G03F 7/16 (2013.01); G03F 7/2004 (2013.01); G03F 7/30 (2013.01)

(58) Field of Classification Search
CPC ..................... G03F 7/0382; G03F 7/0045
USPC ...................... 430/270.1, 905, 910
See application file for complete search history.

(56) References Cited

U.S. PATENT DOCUMENTS

| 6,506,534 | B1 | 1/2003 | Nozaki et al. |
| 2003/0138724 | A1 | 7/2003 | Nozaki et al. |
| 2003/0138725 | A1 | 7/2003 | Nozaki et al. |
| 2003/0138726 | A1 | 7/2003 | Nozaki et al. |
| 2003/0143482 | A1 | 7/2003 | Nozaki et al. |
| 2006/0246371 | A1 | 11/2006 | Nishikawa et al. |
| 2008/0305432 | A1* | 12/2008 | Kanna ............. G03F 7/0045 430/285.1 |
| 2009/0274976 | A1 | 11/2009 | Sho |
| 2010/0035178 | A1 | 2/2010 | Abe et al. |
| 2010/0304302 | A1 | 12/2010 | Masunaga et al. |
| 2012/0028189 | A1 | 2/2012 | Asano et al. |
| 2012/0164581 | A1 | 6/2012 | Sho et al. |
| 2012/0214100 | A1 | 8/2012 | Kobayashi et al. |
| 2013/0143159 | A1 | 6/2013 | Iwashita et al. |
| 2014/0242502 | A1* | 8/2014 | Tsuchimura ............. C08F 12/22 430/5 |
| 2014/0349222 | A1* | 11/2014 | Shibui ..................... G03F 7/038 430/18 |
| 2015/0010855 | A1* | 1/2015 | Tsuchimura ............. C08F 12/24 430/5 |
| 2015/0191572 | A1* | 7/2015 | Hatanaka ................. C08L 33/24 522/69 |
| 2015/0253631 | A1* | 9/2015 | Hatanaka ............... G02B 5/201 428/195.1 |
| 2015/0362836 | A1 | 12/2015 | Tsuchimura et al. |
| 2016/0026088 | A1 | 1/2016 | Yamanaka et al. |
| 2016/0116840 | A1 | 4/2016 | Tsuchimura |
| 2016/0320700 | A1 | 11/2016 | Yokokawa et al. |

FOREIGN PATENT DOCUMENTS

| JP | 4-165359 A | 6/1992 |
| JP | 2001-249455 A | 9/2001 |
| JP | 2001-249456 A | 9/2001 |
| JP | 200543876 A | 2/2005 |
| JP | 2008-162101 A | 7/2008 |
| JP | 2009-288771 A | 12/2009 |
| JP | 2010-15089 A | 1/2010 |
| JP | 2010-107992 A | 5/2010 |
| JP | 2012-173479 A | 9/2012 |
| JP | 2013-104985 A | 5/2013 |
| JP | 5445320 B2 | 3/2014 |

(Continued)

OTHER PUBLICATIONS

International Preliminary Report on Patentability and English translation of Written Opinion dated May 17, 2016, issued by the International Searching Authority in counterpart International Patent Application No. PCT/JP2016/054625 (PCT/IB/373, PCT/ISA/237).

(Continued)

Primary Examiner — John S Chu
(74) Attorney, Agent, or Firm — Sughrue Mion, PLLC

(57) ABSTRACT

Provided are an actinic ray-sensitive or radiation-sensitive resin composition including a compound (A) whose dissolution rate in an alkali developer decreases by the action of an acid, a resin (B) having a group that decomposes by the action of an alkali developer to increase the solubility in the alkali developer and having at least one of a fluorine atom or a silicon atom, and a resin (C) having a phenolic hydroxyl group, different from the resin (B), an actinic ray-sensitive or radiation-sensitive film and a mask blank, each formed using the actinic ray-sensitive or radiation-sensitive resin composition, a pattern forming method using the actinic ray-sensitive or radiation-sensitive resin composition, and a method for manufacturing an electronic device.

17 Claims, No Drawings

(56) References Cited

FOREIGN PATENT DOCUMENTS

| JP | 2015034963 A | 2/2015 |
| JP | 2015-147926 A | 8/2015 |
| JP | 2015147925 A | 8/2015 |
| KR | 10-2012-0011815 A | 2/2012 |
| TW | 2014-39062 A | 10/2014 |
| TW | 2014-47511 A | 12/2014 |
| WO | 2005/006077 A1 | 1/2005 |
| WO | 2015/125514 A1 | 8/2015 |

OTHER PUBLICATIONS

Communication dated Feb. 20, 2018, from the Japanese Patent Office in counterpart application No. 2017-502300.
Search Report dated May 17, 2016, issued by the International Searching Authority in counterpart International Patent Application No. PCT/JP2016/054625 (PCT/ISA/210).
Written Opinion dated May 17, 2016, issued by the International Searching Authority in counterpart International Patent Application No. PCT/JP2016/054625 (PCT/ISA/237).
Office Action dated Dec. 2, 2018 by the Korean Intellectual Property Office in counterpart Korean Patent Application No. 10-2017-7023806.
Office Action dated May 1, 2019, issued by the Korean Intellectual Property Office in counterpart Korean Application No. 10-2017-7023806.
Office Action dated Jul. 29, 2019, issued by the Taiwan Patent Office in counterpart Taiwan Application No. 105105772.

* cited by examiner

ACTINIC RAY-SENSITIVE OR RADIATION-SENSITIVE RESIN COMPOSITION, ACTINIC RAY-SENSITIVE OR RADIATION-SENSITIVE FILM, MASK BLANK INCLUDING ACTINIC RAY-SENSITIVE OR RADIATION-SENSITIVE FILM, PATTERN FORMING METHOD, AND METHOD FOR MANUFACTURING ELECTRONIC DEVICE

CROSS REFERENCE TO RELATED APPLICATION(S)

This is a continuation of International Application No. PCT/JP2016/054625 filed on Feb. 17, 2016, and claims priorities from Japanese Patent Application No. 2015-03874 filed on Feb. 27, 2015, Japanese Patent Application No. 2015-123245 filed on Jun. 18, 2015, and Japanese Patent Application No. 2015-247932 filed on Dec. 18, 2015, the entire disclosures of which are incorporated herein by reference.

BACKGROUND OF THE INVENTION

1. Field of the Invention

The present invention relates to an actinic ray-sensitive or radiation-sensitive resin com position which is suitably used in an ultramicrolithographic process which is applicable to a process for manufacturing an ultra-LSI and high-capacity microchip, a process for manufacturing a mold for nanoimprints, a process for manufacturing a high-density information recording medium, and the like, and to other photofabrication processes, as well as an actinic ray-sensitive or radiation-sensitive film, a mask blank including the actinic ray-sensitive or radiation-sensitive film, a pattern forming method, and a method for manufacturing an electronic device. More specifically, the present invention relates to an actinic ray-sensitive or radiation-sensitive resin composition which can be suitably used for microfabrication of a semiconductor device using electron beams, X-rays, or EUV light, an actinic ray-sensitive or radiation-sensitive film, a mask blank including the actinic ray-sensitive or radiation-sensitive film, a pattern forming method, and a method for manufacturing an electronic device.

2. Description of the Related Art

In microfabrication using a resist composition, formation of an ultrafine pattern has been required due to an increased integration degree of an integrated circuit. Accordingly, there is a tendency that the exposure wavelength becomes shorter, such as from a g line to an i line, or further to KrF laser light or ArF laser light. More recently, lithography using electron beams, X-rays, or EUV light instead of excimer laser light has been under development.

However, from the viewpoint of overall performance of a resist composition, it remains very difficult to find a suitable combination of a resin, a photoacid generator, a basic compound, an additive, a solvent, and the like to be used. In particular, upon considering a recent demand for formation of an ultrafine pattern (for example, a pattern having a line width of 50 nm or less) with high performance, it cannot be said that currently available lithography is sufficient in terms of its performance.

The adhesion of the pattern on a substrate on which a pattern is hardly formed, such as a film surface, due to a chromium compound, is low, and has thus caused a generation of pattern collapse. Meanwhile, an improvement of the resolutions with the use of a polymer having a phenolic hydroxyl group as an adhesive group has been investigated (JP5445320B).

In the formation of a negative tone resist pattern, typically, even in a case of providing an unexposed area intended to be removed by a developer and an exposed area not intended to be removed by a developer on a resist film when performing exposure, a region within the unexposed area being adjacent to the exposed area is subjected to an exposure of even a low exposure dose (hereinafter, this region is referred to as a weakly exposed area). Therefore, even a weakly exposed area becomes insoluble or poorly-soluble in a developer, which leads to generation of scum between patterns formed by the development.

In the field of electron beams (EB) lithography, it has been found that the influence of electron scattering, that is, forward scattering in a resist film is reduced by increasing the acceleration voltage of an EB. Accordingly, there has recently been a tendency to increase the acceleration voltage of an EB. However, if the acceleration voltage of an EB increases, the influence of forward scattering is reduced, whereas the influence of scattering of electrons reflected in a resist substrate, that is, backward scattering increases. In addition, in a case of forming an isolated space pattern having a large exposure area, the influence of backward scattering is particularly significant. Thus, for example, an increase in the acceleration voltage of an EB may possibly result in the generation of scum between isolated space patterns.

Particularly, in a case of patterning on a photomask blank for use in semiconductor exposure, a light-shielding film containing heavy atoms such as chromium, molybdenum, and tantalum is present in the underlayer of a resist film, and thus, the influence of backward scattering due to reflection from the resist underlayer film is more significant, as compared with a case of applying a resist onto a silicon wafer. As a result, in a case of forming an isolated space pattern on a photomask blank, the pattern is particularly susceptible to the influence of backward scattering, and the resolution thereof is highly likely to decrease. On the other hand, in extreme ultraviolet (EUV) lithography, there is a possibility of generating scum between patterns due to the flare light generated by the surface topology and a phase difference of a reflection mirror constituting an optical system of an exposure apparatus, and the unintended light of different wavelengths (Out of Band light: OoB light) from that of EUV light, which is generated due to the reflection mirror also exhibiting a certain degree of reflection characteristics with respect to wavelengths different from an exposure wavelength of EUV light (typically 13.5 nm).

Moreover, microfabrication with a resist composition is not only used directly in the manufacture of integrated circuits but has also recently been applied to the fabrication of a so-called imprint mold structure, or the like (see, for example, JP2008-162101A and Fundamentals of Nanoimprint and Technical Development/Application Deployment-Substrate Technique of Nanoimprint and Latest Application Deployment, edited by Yoshihiko Hirai, Frontier Publishing (issued in June 2006)). Thus, in particular, even in a case of forming an ultrafine pattern (for example, a pattern having a line width of 50 nm or less) using X-rays, soft X-rays, or electron beams as an exposure light source, it has become an important task to meet resist performance such as a high resolution and good roughness characteristics, and there is a demand for solving these requirements.

As the resist composition, various polarity conversion negative tone resist compositions have been proposed. As an example of a negative tone resist composition that reduces alkali solubility of a resist film of an exposed area by polarity conversion, a composition for forming a pattern by a dehydration reaction of an alicyclic alcohol, followed by a reaction thereof with an alkali-soluble group (JP2001-249455A and JP2001-249456A); a composition for forming a negative tone pattern by polarity conversion through a dehydration reaction of a tertiary alcohol (JP1992-165359A (JP-H04-165359A)); and the like have been proposed.

SUMMARY OF THE INVENTION

However, according to JP5445320B, the developer solubility and the adhesiveness of a phenolic hydroxyl group cause generation of scum between patterns. In particular, in the pattern formation using a resist composition including a resin having a phenolic hydroxyl group and a crosslinking agent, it is difficult to satisfy various characteristics such as the collapse performance of a pattern and suppression of the generation of scum to a high level.

Taking the circumstance into consideration, it is an object of the present invention to provide an actinic ray-sensitive or radiation-sensitive resin composition capable of forming a pattern which has excellent sensitivity, resolution, and collapse performance, suppressed generation of scum, and excellent line-edge-roughness performance, in particular, in the formation of an ultrafine pattern (for example, a pattern having a line width of 50 nm or less), as well as an actinic ray-sensitive or radiation-sensitive film, a mask blank having the actinic ray-sensitive or radiation-sensitive film, a pattern forming method, and a method for manufacturing an electronic device, including the pattern forming method, each using the actinic ray-sensitive or radiation-sensitive resin composition.

The present inventors have presumed that the scum generated during the formation of a pattern using a resist composition including a resin having a phenolic hydroxyl group and a crosslinking agent are due to sparingly soluble materials formed on the surface of the pattern. Further, they have found that by adding a resin (B) having a group that decomposes by the action of an alkali developer to increase the solubility in the alkali developer and having at least one of a fluorine atom or a silicon atom to the resist composition, the formation of the sparingly soluble materials is suppressed, and thus, scum is drastically reduced. As a result, it is believed that it is possible to suppress the generation of scum while maintaining various characteristics such as collapse performance of the pattern.

That is, the present inventors have found that the above objects can be achieved by the following means.

[1] An actinic ray-sensitive or radiation-sensitive resin composition comprising:

a compound (A) whose dissolution rate in an alkali developer decreases by the action of an acid;

a resin (B) having a group that decomposes by the action of an alkali developer to increase the solubility in the alkali developer and having at least one of a fluorine atom or a silicon atom; and a resin (C) having a phenolic hydroxyl group, different from the resin (B).

[2] The actinic ray-sensitive or radiation-sensitive resin composition as described in [1], in which the resin (C) having a phenolic hydroxyl group has a repeating unit represented by General Formula (30).

General Formula (30)

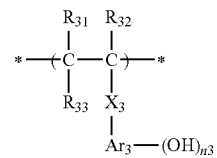

In General Formula (30), $R_{31}$, $R_{32}$, and $R_{33}$ each independently represent a hydrogen atom, an alkyl group, a cycloalkyl group, a halogen atom, a cyano group, or an alkoxycarbonyl group. $R_{33}$ may be bonded to $Ar_3$ to form a ring, and $R_{33}$ in this case represents an alkylene group.

$X_3$ represents a single bond or a divalent linking group.

$Ar_3$ represents an (n3+1)-valent aromatic ring group, and in a case of being bonded to $R_{33}$ to form a ring, $Ar_3$ represents an (n3+2)-valent aromatic ring group.

n3 represents an integer of 1 to 4.

[3] The actinic ray-sensitive or radiation-sensitive resin composition as described in [1] or [2], in which the compound (A) whose dissolution rate in an alkali developer decreases by the action of an acid is a phenol derivative.

[4] The actinic ray-sensitive or radiation-sensitive resin composition as described in any one of [1] to [3], in which the compound (A) whose dissolution rate in an alkali developer decreases by the action of an acid has a structure represented by General Formula (1).

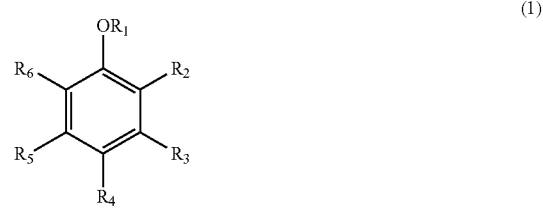

In General Formula (1), $R_1$ to $R_6$ each independently represent a hydrogen atom, an organic group having 1 to 50 carbon atoms, or a binding position to the linking group or the single bond represented by L in General Formula (3), provided that at least one of $R_2$, . . . , or $R_6$ is a structure represented by General Formula (2).

In General Formula (2), $R_7$ represents a hydrogen atom or an organic group having carbon atoms 1 to 30, and * represents a binding position in any one of $R_2$ to $R_6$.

In General Formula (3), L represents a linking group or a single bond, * represents a binding position in any one of $R_1$ to $R_6$, and k represents an integer of 2 to 5.

[5] The actinic ray-sensitive or radiation-sensitive resin composition as described in any one of [1] to [4], in which the group that decomposes by the action of an alkali developer to increase the solubility in the alkali developer is a group represented by X in a partial structure represented by General Formula (KA-1) or (KB-1).

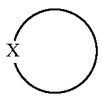

(KA-1)

Y¹—X—Y² (KB-1)

In General Formula (KA-1) or (KB-1), X represents —COO—, —C(O)OC(O)—, —NHCONH—, —COS—, —OC(O)O—, —OSO₂O—, or —SO₂O—.

Y$^1$ and Y$^2$ may be the same as or different from each other, and represent an electron-withdrawing group.

[6] The actinic ray-sensitive or radiation-sensitive resin composition as described in any one of [1] to [5], further comprising a compound that generates an acid upon irradiation with actinic ray or radiation.

[7] The actinic ray-sensitive or radiation-sensitive resin composition as described in [6], in which the compound that generates an acid upon irradiation with actinic ray or radiation is a sulfonium salt.

[8] The actinic ray-sensitive or radiation-sensitive resin composition as described in any one of [1] to [7], further comprising a basic compound or ammonium salt compound whose basicity decreases upon irradiation with actinic ray or radiation.

[9] An actinic ray-sensitive or radiation-sensitive film formed using the actinic ray-sensitive or radiation-sensitive resin composition as described in any one of [1] to [8].

[10] A mask blank comprising the actinic ray-sensitive or radiation-sensitive film as described in [9].

[11] A pattern forming method comprising:
a step of applying the actinic ray-sensitive or radiation-sensitive resin composition as described in any one of [1] to [8] onto a substrate to form a film;
a step of exposing the film; and
a step of developing the exposed film to form a negative tone pattern.

[12] The pattern forming method as described in [11], comprising:
a step of applying the actinic ray-sensitive or radiation-sensitive resin composition as described in any one of [1] to [8] onto a substrate to form a film;
a step of exposing the film with electron beams or extreme ultraviolet rays; and
a step of developing the exposed film to form a negative tone pattern.

[13] A method for manufacturing an electronic device, comprising the pattern forming method as described in [11] or [12].

According to the present invention, it is possible to provide an actinic ray-sensitive or radiation-sensitive resin composition capable of forming a pattern having excellent sensitivity, resolution, and collapse performance, suppressed generation of scum, and excellent line-edge-roughness performance in the formation of an ultrafine pattern (for example, a pattern with a line width of 50 nm or less), as well as an actinic ray-sensitive or radiation-sensitive film, a mask blank having an actinic ray-sensitive or radiation-sensitive film, a pattern forming method, and a method for manufacturing an electronic device, including the pattern forming method, each using the actinic ray-sensitive or radiation-sensitive resin composition.

DESCRIPTION OF THE PREFERRED EMBODIMENTS

In citations for a group (atomic group) in the present specification, a description not referring to substitution or non-substitution includes both a group having no substituent and a group having a substituent. For example, an "alkyl group" includes not only an alkyl group having no substituent (an unsubstituted alkyl group) but also an alkyl group having a substituent (a substituted alkyl group).

"Actinic rays" or "radiation" in the present specification means, for example, a bright line spectrum of a mercury lamp, far ultraviolet rays represented by an excimer laser, extreme ultraviolet rays (EUV light), X-rays, electron beams (EB), or the like. In addition, in the present invention, light means actinic ray or radiation.

In addition, unless otherwise specified, "exposure" as used herein includes not only exposure by a mercury lamp, far ultraviolet rays represented by an excimer laser, extreme ultraviolet rays, X-rays, EUV light, or the like, but also writing by particle rays such as electron beams and ion beams.

In the present specification, the weight-average molecular weight of a resin is a value in terms of polystyrene, measured by a GPC method. GPC can be carried out in accordance with a method using TSK gel Multipore HXL-M (manufactured by Tosoh Corporation, 7.8 mmID×30.0 cm) as a column and tetrahydrofuran (THF) as an eluent, using HLC-8120 (manufactured by Tosoh Corporation).

The radiation-sensitive or actinic ray-sensitive resin composition of the present invention is typically a resist composition, and preferably a negative tone resist composition. Further, the radiation-sensitive or actinic ray-sensitive resin composition of the present invention is typically a chemical amplification type resist composition. The radiation-sensitive or actinic ray-sensitive resin composition of the present invention is preferably a chemical amplification type and negative tone resist composition.

The radiation-sensitive or actinic ray-sensitive resin composition of the present invention is preferably for exposure with electron beams or extreme ultraviolet rays.

The resist composition of the present invention can also be suitably used as a resist underlayer film, an antireflection film, or the like.

Hereinafter, embodiments of the present invention will be described in detail.

The actinic ray-sensitive or radiation-sensitive resin composition of the present invention (also referred to as "the composition of the present invention") is an actinic ray-sensitive or radiation-sensitive resin composition including a compound (A) whose dissolution rate in an alkali developer decreases by the action of an acid, a resin (B) having a group that decomposes by the action of an alkali developer to increase the solubility in the alkali developer and having at least one of a fluorine atom or a silicon atom, and a resin (C) having a phenolic hydroxyl group, different from the resin (B).

[Compound (A) Whose Dissolution Rate in Alkali Developer Decreases by Action of Acid]

The actinic ray-sensitive or radiation-sensitive resin composition of the present invention includes a compound (A) whose dissolution rate in an alkali developer decreases by the action of an acid (also referred to a "compound (A)").

The compound (A) may be either a high molecular compound or a low molecular compound.

From the viewpoints of reactivity and developability, it is preferable that the compound (A) is a phenol derivative.

[N-A] Resin Whose Dissolution Rate in Alkali Developer Decreases by Action of Acid The resin whose dissolution rate in an alkali developer decreases by the action of an acid (also referred to as a "resin [N-A]") is not particularly limited, but is preferably a resin whose dissolution rate in an alkali developer decreases by the action of an acid, and is generated from an acid generator which will be described later.

Examples of the resin [N-A] include a resin having a group which is polymerized by the action of an acid or an active species, and is preferably a resin having at least one of the following repeating unit represented by General Formula (L-1) or the following repeating unit represented by General Formula (L-2).

As the resin having the repeating unit represented by General Formula (L-1), the compounds described in [0030] to [0047] of JP2012-242556A can be suitably used, and as the resin having the repeating unit represented by General Formula (L-2), the compounds described in [0044] to [0048] of JP2014-24999A and [0020] to [0031] of JP2013-164588A can be suitably used.

In the present invention, at least one of a repeating unit represented by General Formula (L-1) and a repeating unit represented by General Formula (L-2) may be included in a part of the resin (C) which will be described later or may also be included in a resin other than the resin (C).

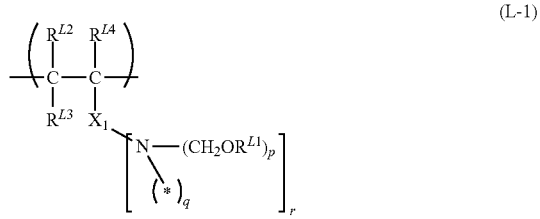

(L-1)

$R^{L1}$ represents a hydrogen atom, an alkyl group, or a cycloalkyl group. p represents 1 or 2. q represents an integer represented by (2-p). * represents a bonding arm to another atom constituting the repeating unit (L-1). In a case where p is 2, or r is 2 or more, a plurality of $R^{L1}$'s may be the same as or different from each other. $R^{L2}$, $R^{L3}$, and $R^{L4}$ each independently represent a hydrogen atom, an alkyl group, a cycloalkyl group, a halogen atom, a cyano group, or an alkoxycarbonyl group. $X_1$ represents a single bond, or a r+1-valent group a linear or branched hydrocarbon group selected from the group consisting of a cyclic hydrocarbon group which may contain a heteroatom as a ring member, —O—, —S—, —CO—, —SO$_2$—, —NR—, and a group formed by combining these members. R represents a hydrogen atom, an alkyl group, or a group represented by —CH$_2$OR$^{L1}$. Further, $R^{L1}$ in the group represented by —CH$_2$OR$^{L1}$ has the same definition as $R^{L1}$. r represents an integer of 1 to 5, provided that in a case where $X_1$ is a single bond, r is 1.

The alkyl group in $R^{L1}$ may be either linear or branched, and examples thereof include an alkyl group having 1 to 20 carbon atoms (for example, a methyl group, an ethyl group, a propyl group, an isopropyl group, a butyl group, an isobutyl group, a t-butyl group, an n-pentyl group, an n-hexyl group, an n-octyl group, and an n-dodecyl group). The alkyl group is preferably an alkyl group having 1 to 8 carbon atoms, more preferably an alkyl group having 1 to 6 carbon atoms, and particularly preferably an alkyl group having 1 to 4 carbon atoms.

The cycloalkyl group in $R^{L1}$ may be either monocyclic or polycyclic, and examples thereof include a cycloalkyl group having 3 to 17 carbon atoms (for example, a cyclopentyl group, a cyclohexyl group, a norbornanyl group, and an adamantyl group). The cycloalkyl group is preferably a cycloalkyl group having 5 to 12 carbon atoms, more preferably a cycloalkyl group having 5 to 10 carbon atoms, and particularly preferably a cycloalkyl group having 5 or 6 carbon atoms.

As $R^{L1}$ in General Formula (L-1), a hydrogen atom or an alkyl group having 1 to 8 carbon atoms is preferable, a hydrogen atom or an alkyl group having 1 to 6 carbon atoms is more preferable, and a hydrogen atom or an alkyl group having 1 to 4 carbon atoms is particularly preferable.

$R^{L2}$, $R^{L3}$, and $R^{L4}$ each independently represent a hydrogen atom, an alkyl group, a cycloalkyl group, a halogen atom, a cyano group, or an alkoxycarbonyl group.

$X_1$ represents a single bond, or an (r+1)-valent group selected from the group consisting of a linear or branched hydrocarbon group, a cyclic hydrocarbon group which may contain a heteroatom as a ring member, —O—, —S—, —CO—, —SO$_2$—, —NR— (R is a hydrogen atom, an alkyl group, or a group represented by —CH$_2$OR$^{L1}$), or a group formed by combining these members. Further, $R^{L1}$ in the group represented by —CH$_2$OR$^{L1}$ has the same definition as $R^{L1}$ in General Formula (L-1).

r represents an integer of 1 to 5, provided that in a case where $X_1$ is a single bond, r is 1.

Specific examples of the repeating unit represented by General Formula (L-1) are shown below, but are not limited thereto. R and R' each represent a hydrogen atom or a methyl group.

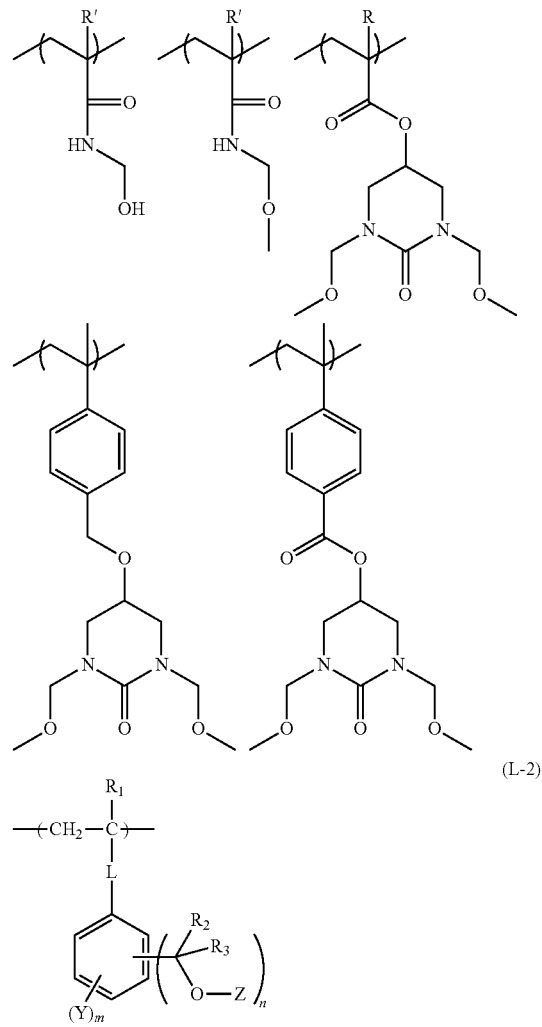

In General Formula (L-2), $R_1$ represents a hydrogen atom, a methyl group, or a halogen atom; $R_2$ and $R_3$ each independently represent a hydrogen atom, an alkyl group, or a cycloalkyl group; L represents a divalent linking group or a single bond; Y represents a monovalent substituent excluding a methylol group; Z represents a hydrogen atom or a monovalent substituent; m represents an integer of 0 to 4; n represents an integer of 1 to 5; m+n is 5 or less; in a case where m is 2 or more, a plurality of Y's may be the same as or different from each other, a plurality of Y's may be bonded to each other to form a ring structure; in a case where n is 2 or more, a plurality of $R_2$'S, $R_3$'s, and Z's, may be the same as or different from each other.

L preferably contains a divalent aromatic ring group or a linking group represented by —COO—.

Specific examples of the repeating unit represented by General Formula (L-2) are shown below, but are not limited thereto. Ac represents an acetyl group and Me represents a methyl group.

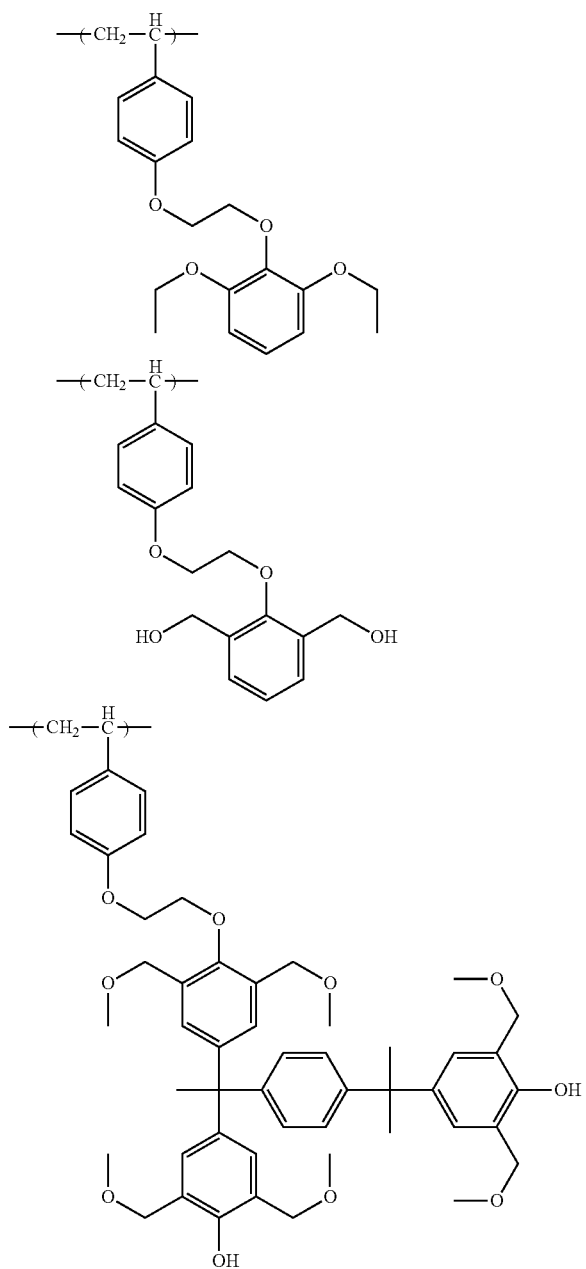

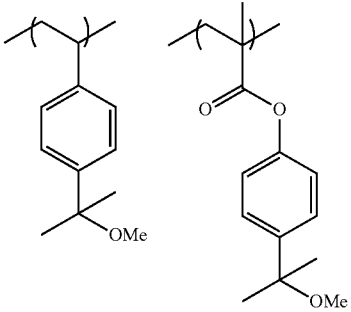

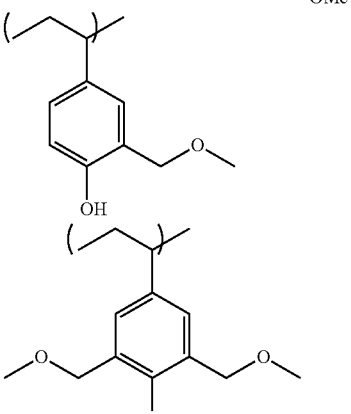

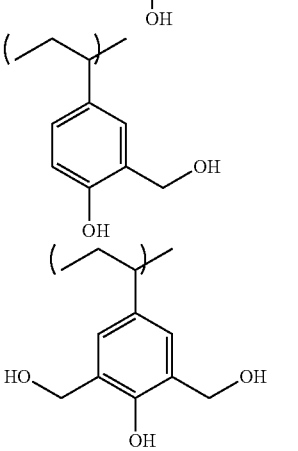

Furthermore, the resin [N-A] may include a repeating unit having an epoxy structure or an oxetane structure, and specifically, paragraphs [0076] to [0080] of JP2013-122569A can be incorporated herein by reference, the contents of which are incorporated herein by reference.

In a case of forming a negative tone image (that is, a case where the actinic ray-sensitive or radiation-sensitive composition is a negative tone actinic ray-sensitive or radiation-sensitive composition), the content of the repeating unit represented by General Formula (L-1) and the repeating unit represented by General Formula (L-2) is preferably 5% to 50% by mole, and more preferably 10% to 40% by mole, with respect to all the repeating units included in the resin [N-A].

The resin [N-A] may contain other repeating units, in addition to the repeating unit represented by General Formula (L-1) and the repeating unit represented by General Formula (L-2), and may also contain, for example, the repeating units mentioned with regard to the resin (C) which will be described later.

The resin [N-A] can be synthesized by a known radical polymerization method, an anion polymerization method, or a living radical polymerization method (an iniferter method or the like). For example, in the anion polymerization method, vinyl monomers can be dissolved in an appropriate organic solvent and reacted using a metal compound (butyllithium or the like) as an initiator, unusually under cooling conditions, thereby obtaining a polymer.

The weight-average molecular weight of the resin [N-A] is preferably 1,000 to 50,000, and more preferably 2,000 to 20,000.

The resin [N-A] can be used singly or in combination of two or more kinds thereof. The content of the resin [N-A] is preferably 20% to 99% by mass, more preferably 30% to 99% by mass, and still more preferably 40% to 99% by mass, with respect to the total solid content of the actinic ray-sensitive or radiation-sensitive composition of the present invention.

[N-C] Low Molecular Compound Whose Dissolution Rate in Alkali Developer Decreases by Action of Acid The low molecular compound whose dissolution rate in an alkali developer decreases by the action of an acid (also referred to as a "low molecular compound [N-C]") is not particularly limited, but examples thereof include the compound whose dissolution rate in an alkali developer decreases by the action of an acid, generated from the acid generator which will be described later.

The molecular weight of the low molecular compound [N-C] is preferably in the range of 100 to 1,000, more preferably in the range of 200 to 900, and particularly preferably in the range of 300 to 800.

Here, the low molecular compound in the present invention is a compound having a uniform molecular weight (a compound not substantially having a molecular weight distribution), not a so-called polymer or oligomer, obtained by subjecting a compound having an unsaturated bond (a so-called polymerizable monomer) to cleavage of the unsaturated bond using an initiator, leading to a chained growth of the bonds.

Examples of the low molecular compound [N-C] include an addition polymerizable compound having a double bond. In this case, the low molecular compound [N-C] is selected from the compounds having at least one ethylenically unsaturated bond at the terminal, and preferably two or more ethylenically unsaturated bonds at the terminal. Such a group of the compounds is widely known to the related industrial field, and can be widely used in the present invention without particular limitation.

As the addition polymerizable compound having a double bond, the monomers described in [0108] to [0113] in JP2014-104631A can be suitably used.

Suitable examples of the low molecular compound [N-C] include a compound (hereinafter also referred to as a "crosslinking agent") that crosslinks the resin (C) having a phenolic hydroxyl group which will be described later. Here, a known crosslinking agent can be effectively used.

The crosslinking agent is, for example, a compound having a crosslinkable group capable of crosslinking the resin (C) having a phenolic hydroxyl group, and preferred examples thereof include a compound having two or more of a hydroxymethyl group, an alkoxymethyl group, an acyloxymethyl group, and an alkoxymethyl ether group, and an epoxy compound.

More preferred examples thereof include an alkoxymethylated or acyloxymethylated melamine compound, an alkoxymethylated or acyloxymethylated urea compound, a hydroxymethylated or alkoxymethylated phenol compound, and an alkoxymethyl etherified phenol compound.

Furthermore, as the compound [N-C], the epoxy compounds described in paragraphs [0196] to [0020] of JP2013-64998A ([0271] to [0277] of the specification of the corresponding US2014/0178634A) or the oxetane compounds described in paragraph [0065] of JP2013-258332A can also be used, the contents of which are incorporated herein by reference.

The crosslinking agent preferably has a structure represented by General Formula (1).

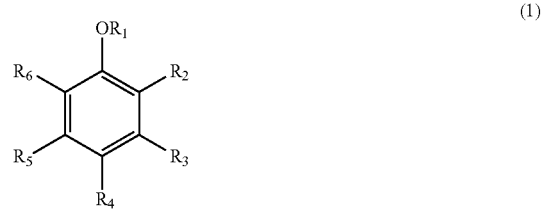

In General Formula (1), $R_1$ to $R_6$ each independently represent a hydrogen atom, an organic group having 1 to 50 carbon atoms, or a binding position to the linking group or the single bond represented by L in General Formula (3), provided that at least one of $R_2, \ldots,$ or $R_6$ is the structure represented by General Formula (2).

In General Formula (2), $R_7$ represents a hydrogen atom or an organic group having carbon atoms 1 to 30, and * represents a binding position in any one of $R_2$ to $R_6$.

In General Formula (3), L represents a linking group or a single bond, * represents a binding position in any one of $R_1$ to $R_6$, and k represents an integer of 2 to 5.

In a case where the crosslinking agent is a compound represented by General Formula (1), $R_1$ to $R_6$ each independently represent a hydrogen atom or an organic group having 1 to 50 carbon atoms. Examples of the organic group having 1 to 50 carbon atoms include an alkyl group, a cycloalkyl group, or an aryl group, or a group having these groups linked via a group formed of an alkylene group, an arylene group, a carboxylic acid ester bond, a carbonic acid ester bond, an ether bond, a thioether bond, a sulfo group, a sulfone group, a urethane bond, a urea bond, or a combination thereof.

Furthermore, at least one of $R_2, \ldots,$ or $R_6$ is a structure represented by General Formula (2). Examples of the organic group having 1 to 30 carbon atoms represented by $R_7$ in General Formula (2) include the same ones as the specific examples of the above-mentioned organic group represented by $R_1$ to $R_6$. The organic group preferably has two or more structures represented by General Formula (2) in one molecule thereof.

In another aspect of the present invention, the crosslinking agent may be a compound in which 1 to 5 structures represented by General Formula (1) are linked via the linking group or the single bond represented by L in General Formula (3). In this case, at least one of $R_1$, ..., or $R_6$ in General Formula (1) represents a binding position to the linking group or the single bond represented by L in General Formula (3).

Examples of the linking group represented by L in General Formula (3) include an alkylene group, an arylene group, a carboxylic acid ester bond, a carbonic acid ester bond, an ether bond, a thioether bond, a sulfo group, a sulfone group, a urethane bond, a urea bond, and a group formed by combining two or more of these groups, and preferably an alkylene group, an arylene group, and a carboxylic acid ester bond.

k preferably represents 2 or 3.

In one aspect of the present invention, the crosslinking agent is, for example, the above-mentioned compound represented by General Formula (1), and the compound formed by the two or three compounds as a polarity converting group linked via a linking group or a single bond represented by L in General Formula (3a) is preferable.

$$(*)_{\overline{k_1}}\!-\!L \tag{3a}$$

In General Formula (3a), L has the same definition as the above-mentioned L in General Formula (3), and $k_1$ represents 2 or 3.

Specific examples of L are shown below, but the present invention is not limited thereto.

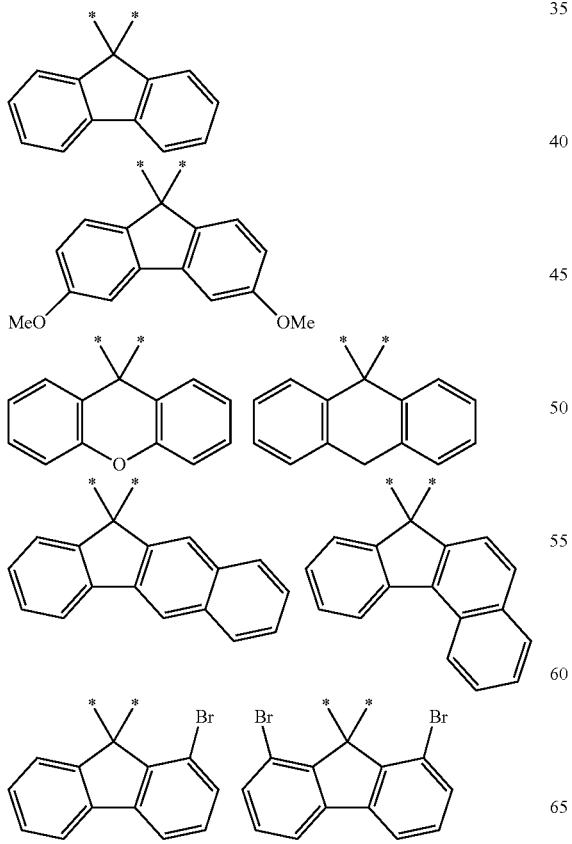

-continued

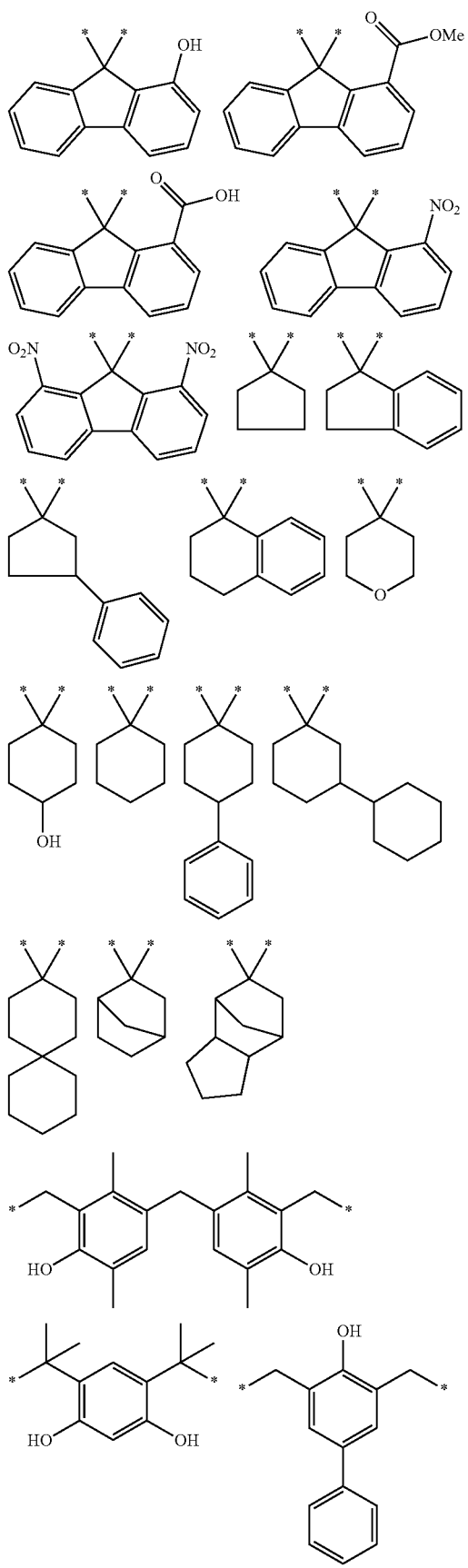

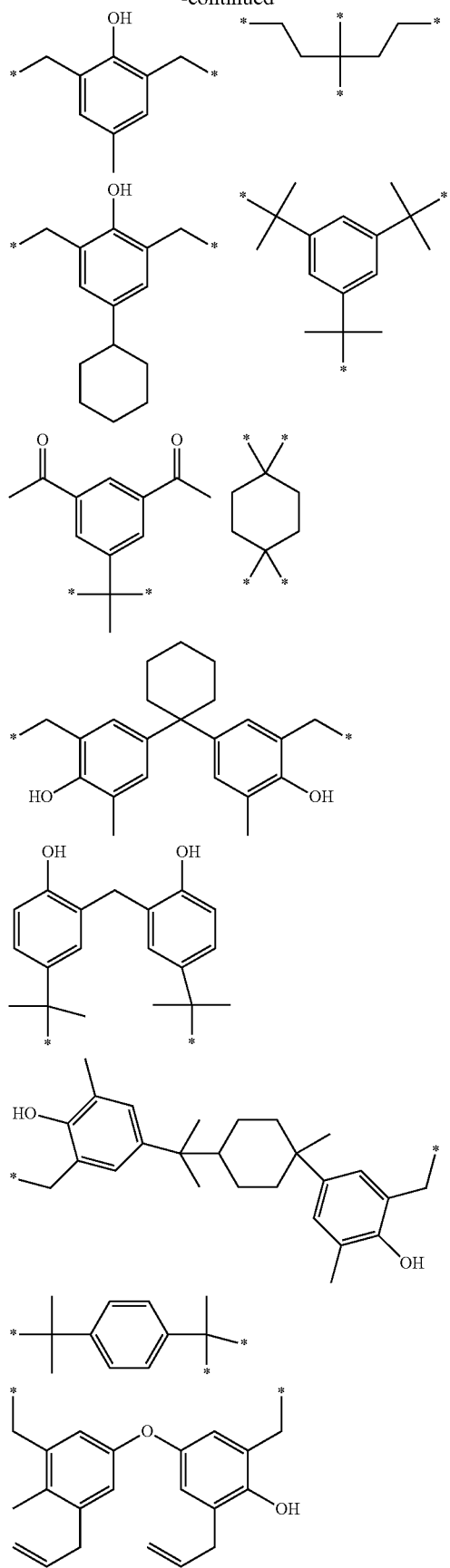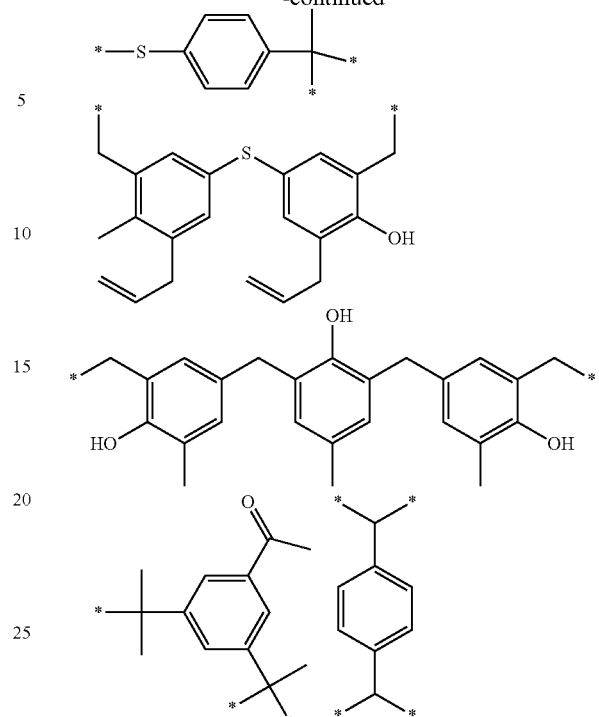
Specific examples of the crosslinking agent of the present invention are shown below, but the present invention is not limited thereto.
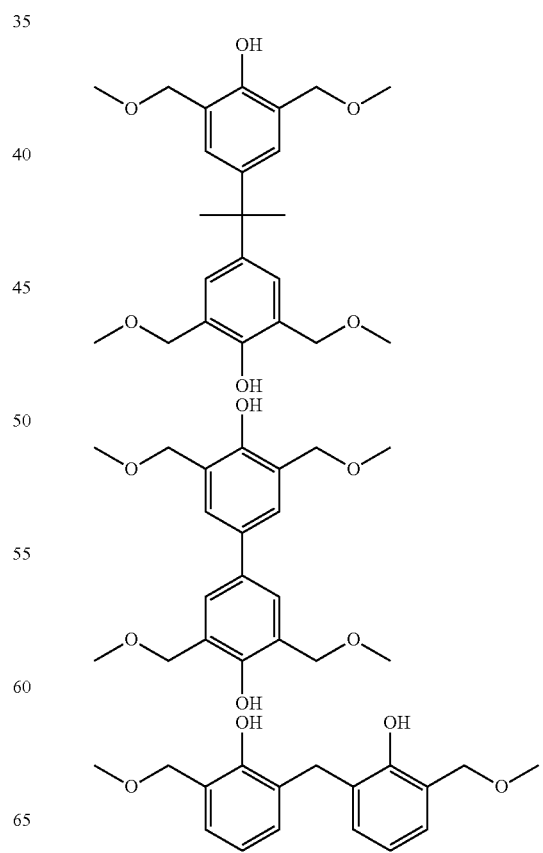

-continued
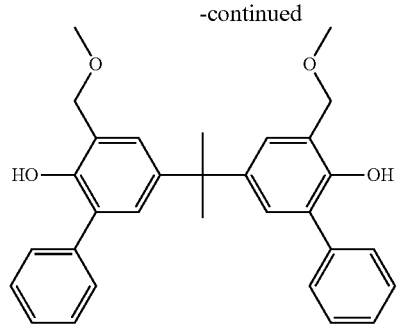
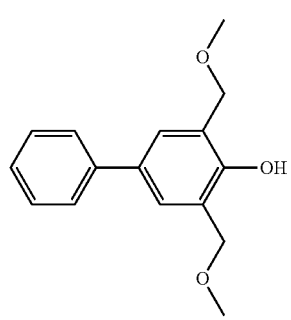
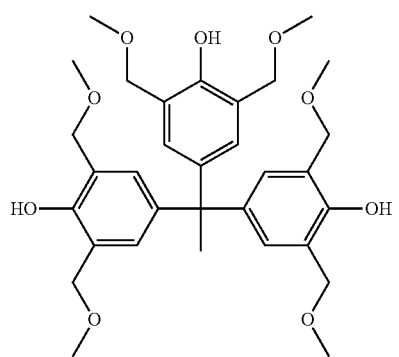
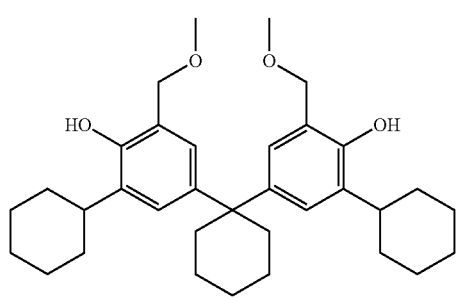
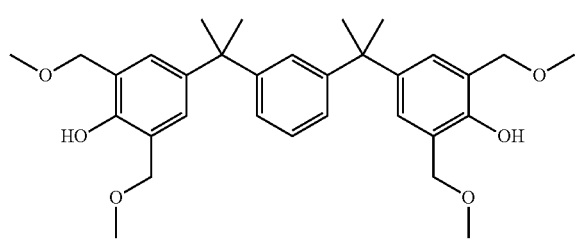
-continued
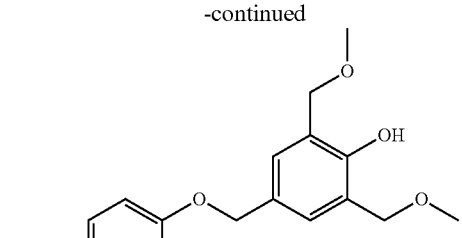
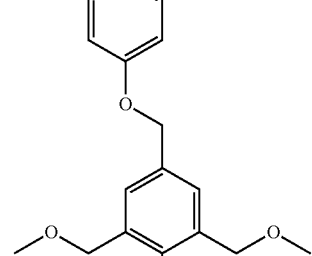
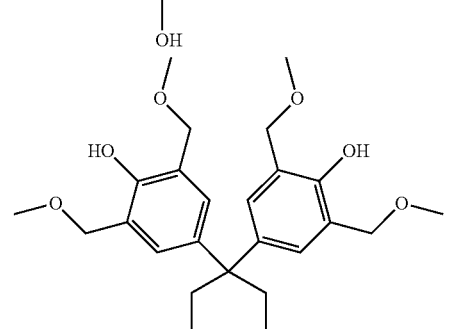
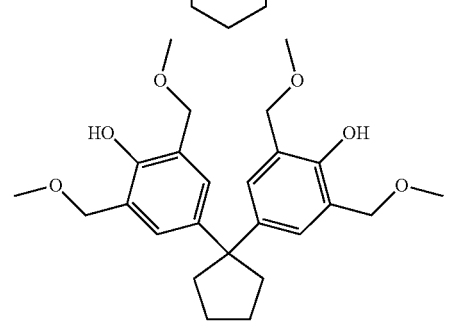
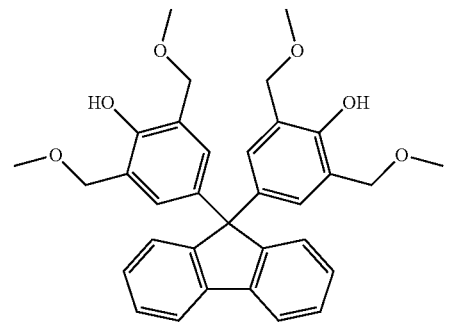
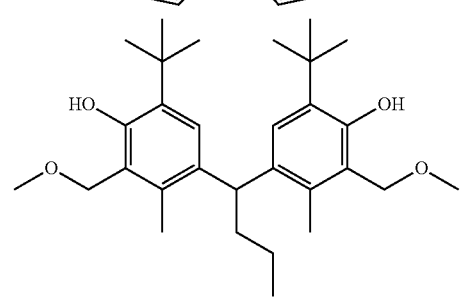

-continued
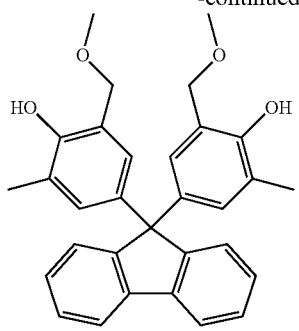
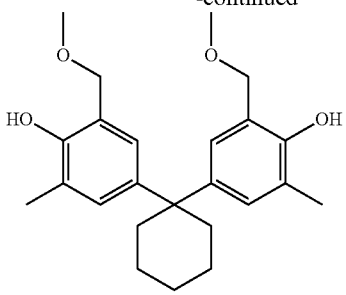
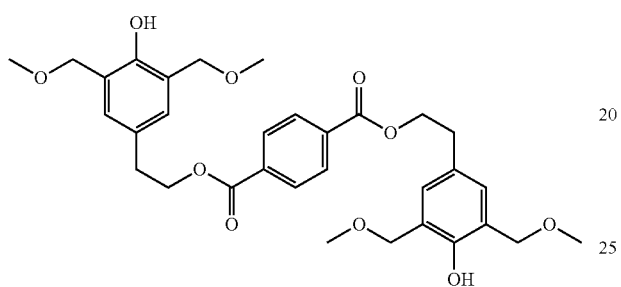
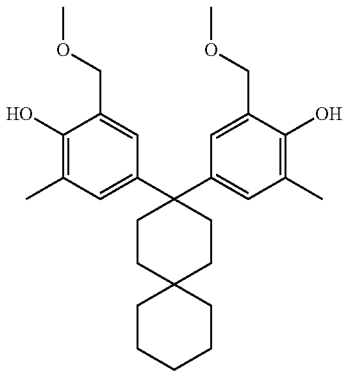
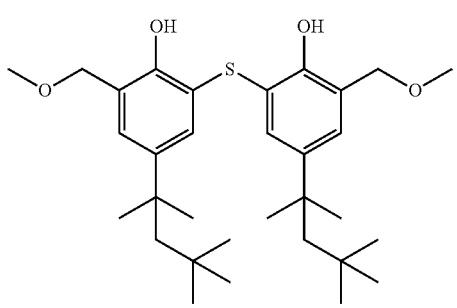
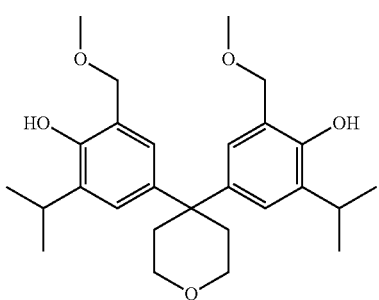
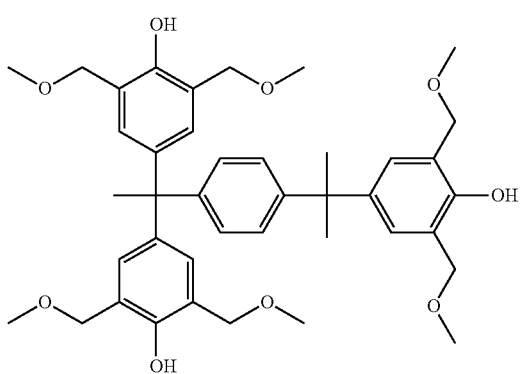
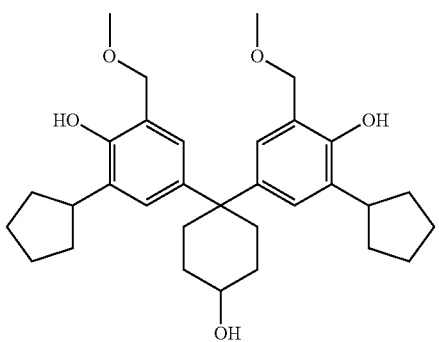
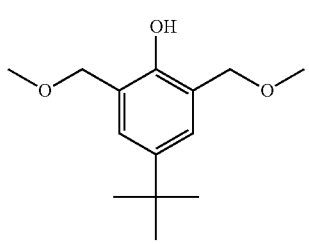
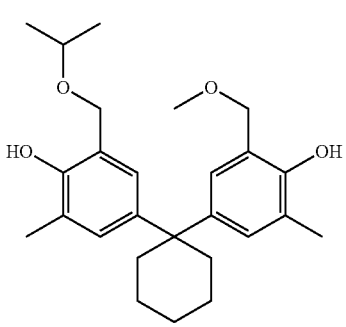

21
-continued
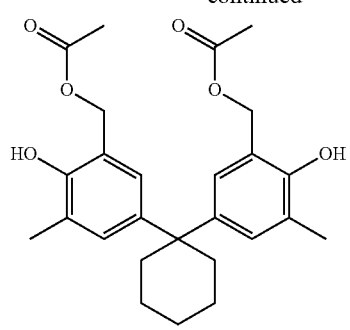
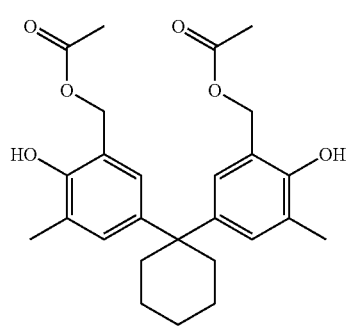
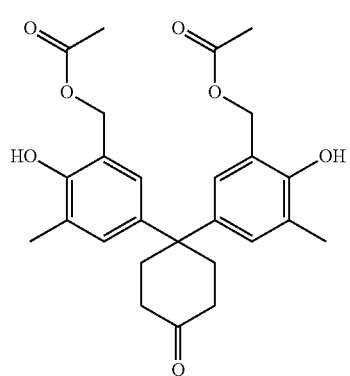
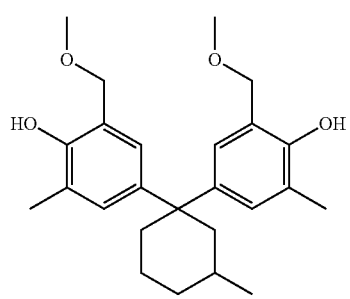
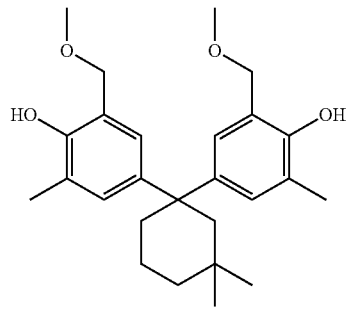
22
-continued
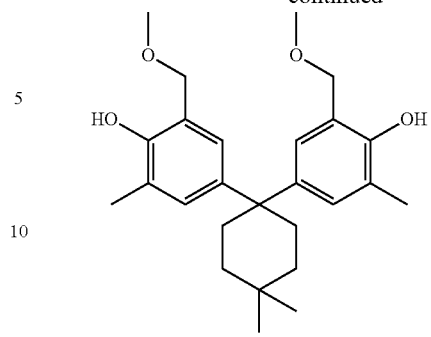
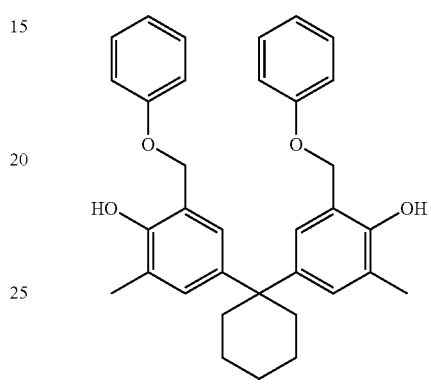
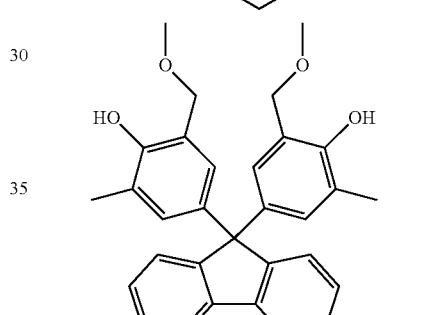
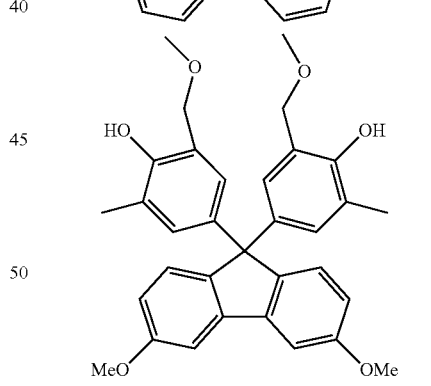
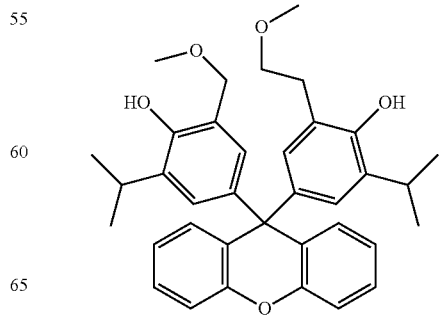

-continued
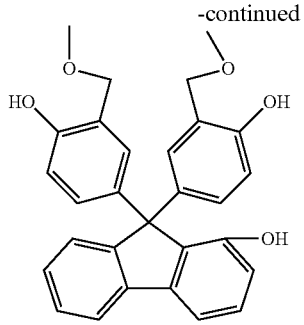
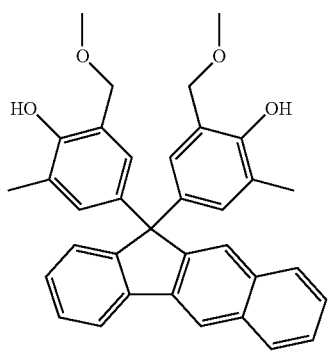
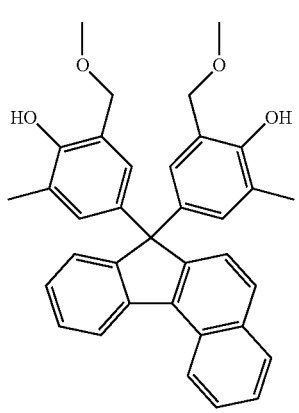
-continued
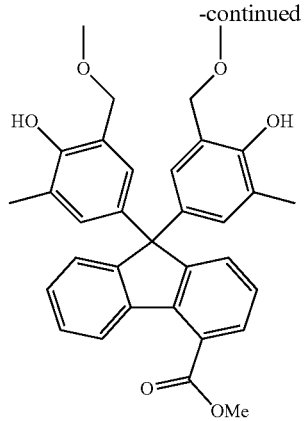
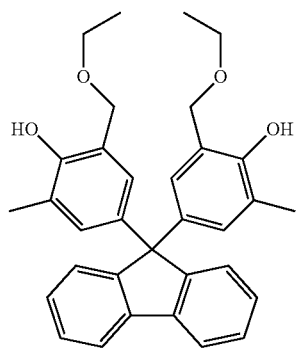
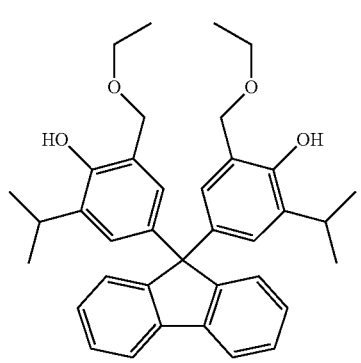
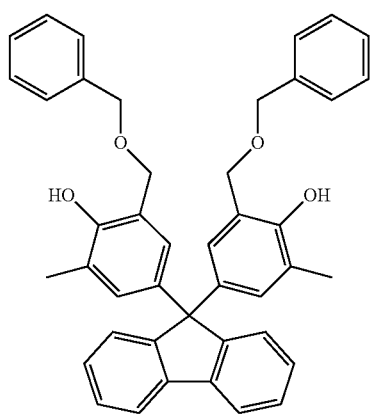

-continued

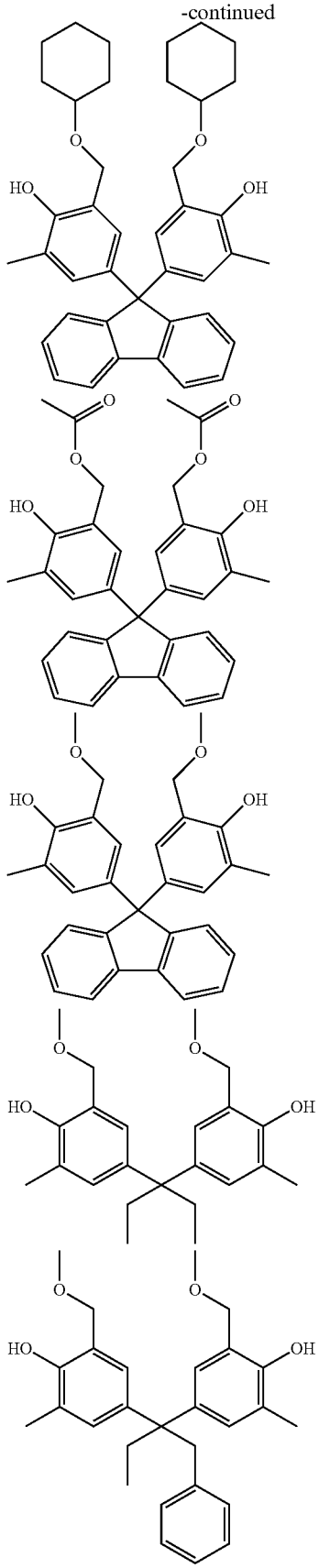

A method for synthesizing the crosslinking agent of the present invention can be appropriately selected depending on a desired compound, and is not particularly limited to specific synthesis methods. As one example, a method in which a compound having both of a crosslinking group and a nucleophilic group (for example, a hydroxyl group) and a compound having a polarity convening group and leaving group (for example, a halogen atom such as bromine) are obtained as a raw material by a substitution reaction may be exemplified.

The content of the crosslinking agent in the present invention is preferably 3% to 65% by mass, and more preferably 5% to 50% by mass, with respect to the solid content of the actinic ray-sensitive or radiation-sensitive resin composition of the present invention.

In addition, in the present invention, the crosslinking agent may be used singly or in combination of two or more kinds thereof.

As the crosslinking agent, commercially available products can also be used, or the crosslinking agent can also be synthesized by a known method. For example, a phenol derivative having a hydroxymethyl group can be obtained by reacting a phenol compound which does not have a corresponding hydroxymethyl group with a formaldehyde in the presence of a base catalyst. At this time, in order to prevent resinification or gelation, the reaction is preferably performed at a reaction temperature of 60° C. or lower. Specifically, synthesis can be performed by the methods described in JP 1994-282067A (JP-H06-282067A), JP1995-64285A (JP-H07-64285A), and the like.

The phenol derivative having an alkoxymethyl group can be obtained by reacting a phenol derivative having a corresponding hydroxymethyl group with an alcohol in the presence of an acid catalyst. In such a case, in order to prevent resinification or gelation, the reaction is preferably performed at a reaction temperature of 100° C. or lower. Specifically, it is possible for the compounds to be synthesized with the methods which are described in EP632003A1 and the like. The phenol derivative having a hydroxymethyl group or an alkoxymethyl group, synthesized in this manner is preferable from the viewpoint of stability during storage, and, the phenol derivative having an alkoxymethyl group is particularly preferable from the viewpoint of stability during storage. The phenol derivatives which have two or more combined hydroxymethyl groups or alkoxymethyl groups in which either are concentrated in the benzene rings or distributedly bonded thereto may be used singly or in combination of two or more kinds thereof.

In addition, other examples of the crosslinking agent include (i) a compound having an N-hydroxymethyl group, an N-alkoxymethyl group, or an N-acyloxymethyl group, and (ii) an epoxy compound, which will be described below. Specifically, the compounds represented by the general formulae described in [0294] to [0315] in JP2012-242556A can be suitably used. In particular, as (i) the compound having an N-hydroxymethyl group, an N-alkoxymethyl group, or an N-acyloxymethyl group, a compound having two or more (more preferably two to eight) partial structures which are represented by General Formula (CLNM-1) is preferable.

(CLNM-1)

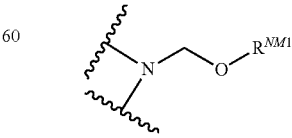

In General Formula (CLNM-1),
$R^{NM1}$ represents a hydrogen atom, an alkyl group, a cycloalkyl group, or an oxoalkyl group.

Examples of more preferable aspects of the compound having two or more partial structures represented by General Formula (CLNM-1) include a urea-based crosslinking agent represented by General Formula (CLNM-2), an alkylene urea-based crosslinking agent represented by General Formula (CLNM-3), a glycoluril-based crosslinking agent represented by General Formula (CLNM-4), and a melamine-based crosslinking agent represented by General Formula (CLNM-5).

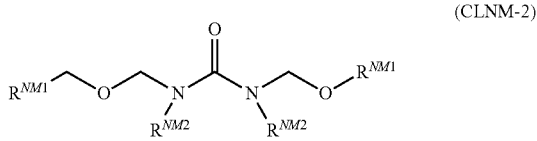

(CLNM-2)

In General Formula (CLNM-2), $R^{NM1}$'s each independently have the same definition as $R^{NM1}$ in General Formula (CLNM-1).

$R^{NM2}$'s each independently represent a hydrogen atom, an alkyl group (preferably having 1 to 6 carbon atoms), or a cycloalkyl group (preferably having 5 or 6 carbon atoms).

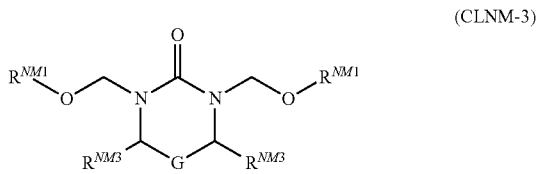

(CLNM-3)

In General Formula (CLNM-3), $R^{NM1}$'s each independently have the same definition as $R^{NM1}$ in General Formula (CLNM-1).

$R^{NM3}$'s each independently represent a hydrogen atom, a hydroxyl group, a linear or branched alkyl group (preferably having 1 to 6 carbon atoms), a cycloalkyl group (preferably having 5 or 6 carbon atoms), an oxoalkyl group (preferably having 1 to 6 carbon atoms), an alkoxy group (preferably having 1 to 6 carbon atoms), or an oxoalkoxy group (preferably having 1 to 6 carbon atoms).

G represents a single bond, an oxygen atom, a sulfur atom, an alkylene group (preferably having 1 to 3 carbon atoms), or a carbonyl group.

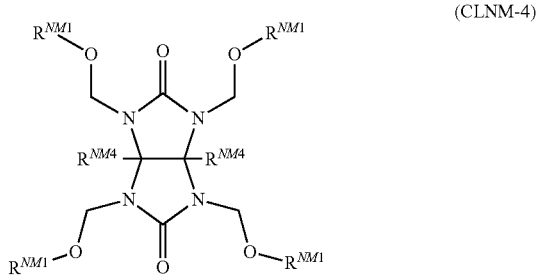

(CLNM-4)

In General Formula (CLNM-4), $R^{NM1}$'s each independently have the same definition as $R^{NM1}$ in General Formula (CLNM-1).

$R^{NM4}$ each independently represent a hydrogen atom, a hydroxyl group, an alkyl group, a cycloalkyl group, or an alkoxy group.

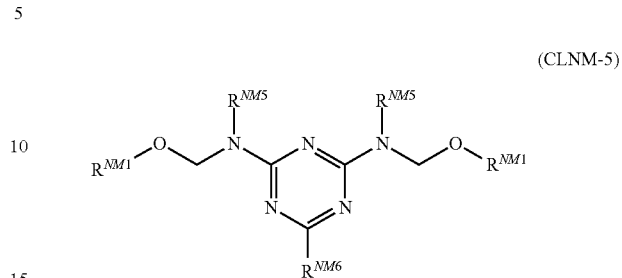

(CLNM-5)

In General Formula (CLNM-5), $R^{NM1}$'s each independently have the same definition as $R^{NM1}$ in General Formula (CLNM-1).

$R^{NM5}$'s each independently represent a hydrogen atom, an alkyl group, a cycloalkyl group, an aryl group, or an atomic group represented by General Formula (CLNM-5').

$R^{NM6}$ represents a hydrogen atom, an alkyl group, a cycloalkyl group, an aryl group, or an atomic group represented by General Formula (CLNM-5").

(CLNM-5')

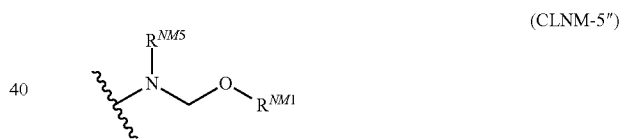

(CLNM-5")

In General Formula (CLNM-5'), $R^{NM1}$ has the same definition as $R^{NM1}$ in General Formula (CLNM-1).

In General Formula (CLNM-5"), $R^{NM1}$ has the same definition as $R^{NM1}$ in General Formula (CLNM-1), and $R^{NM5}$ has the same definition as $R^{NM5}$ in General Formula (CLNM-5).

As the alkyl group of $R^{NM5}$ and $R^{NM6}$, an alkyl group having 1 to 6 carbon atoms is preferable, as the cycloalkyl group, a cycloalkyl group having 5 or 6 carbon atoms is preferable, and as an aryl group, an aryl group having 6 to 10 carbon atoms is preferable.

In General Formulae (CLNM-1) to (CLNM-5), the group represented by each of $R^{NM1}$ to $R^{NM6}$ may further have a substituent.

Specific examples of the compound having two or more partial structures represented by General Formula (CLNM-1) are shown below, but the present invention is not limited thereto.

29 30
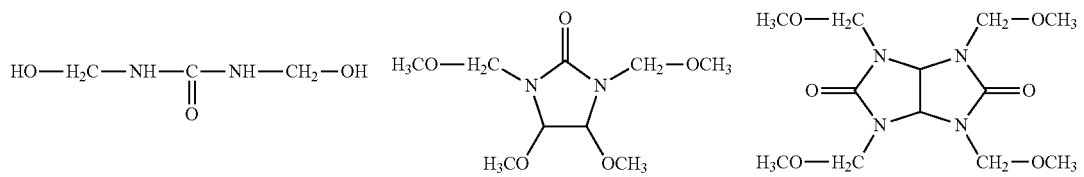
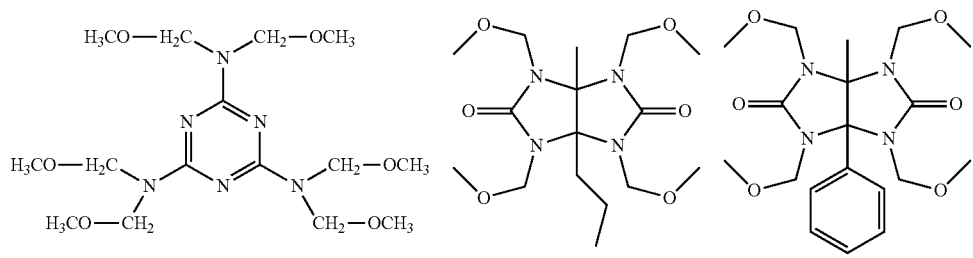
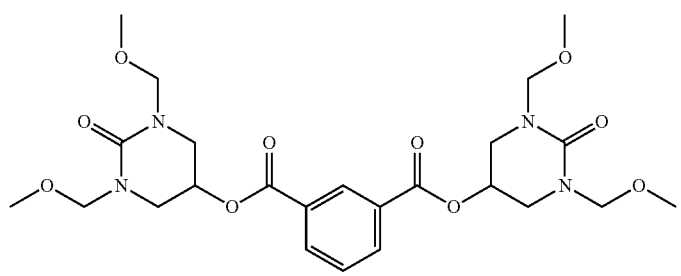
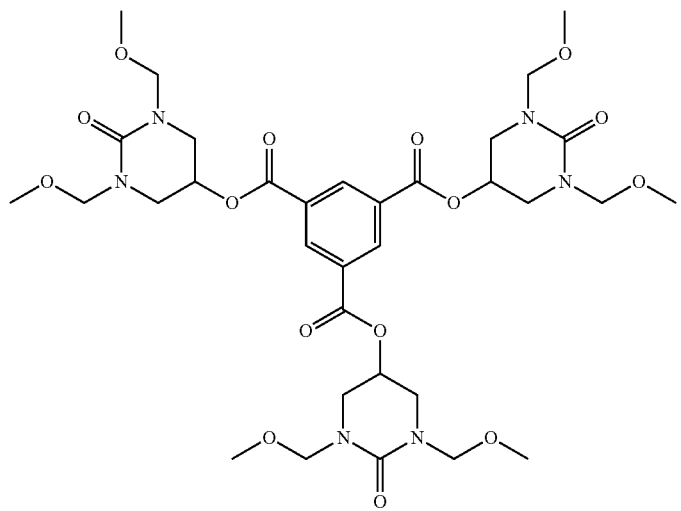
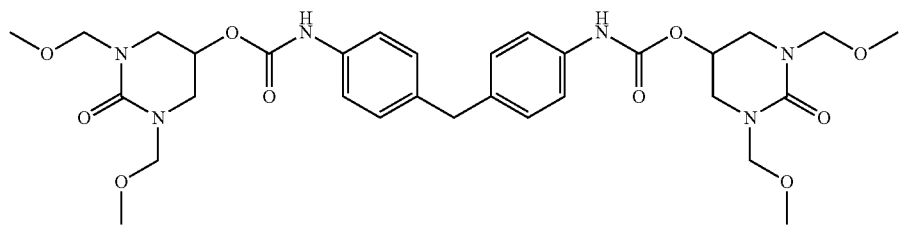

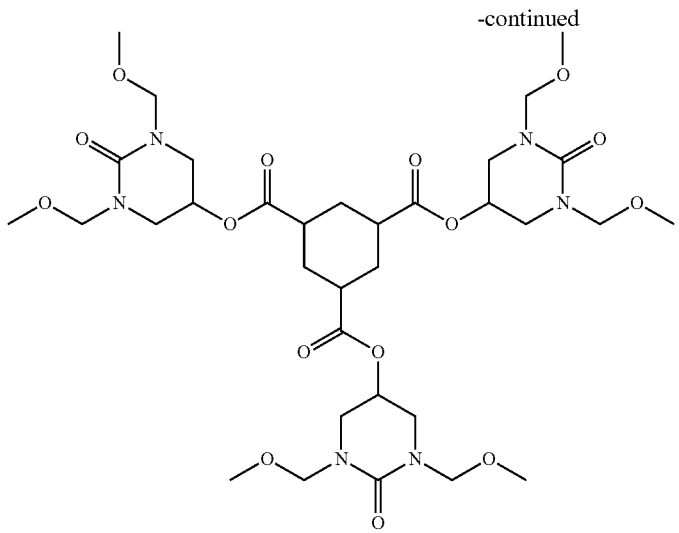

A tertiary alcohol having a hydroxyl group on carbon directly bonded to an aromatic ring as shown below can also be used as the low molecular compound [N-C]. The compounds described in JP1997-197672A (JP-H09-197672A), JP2001-324811 A, and JP2000-31020A can be suitably used.

As the low molecular compound [N-C], a compound represented by General Formula (X) is preferable.

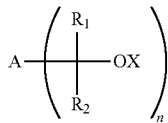

General Formula (X)

X represents a hydrogen atom, an alkyl group, a cycloalkyl group, an aryl group, or an acyl group.

A represents an aromatic hydrocarbon group, an aromatic heterocyclic group, or an alicyclic group.

$R_1$ and $R_2$ each independently represent a hydrogen atom, an alkyl group, a cycloalkyl group, or an aryl group, provided that all of $R_1$'s and $R_2$'s are not hydrogen atoms at the same time in any case.

n represents an integer of 2 or more.

As the compound represented by General Formula (X), a compound represented by General Formula (1), (2), (3), (4), or (I) is preferable.

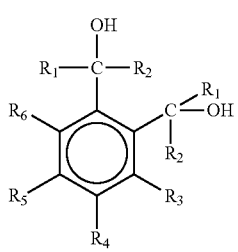
(1)

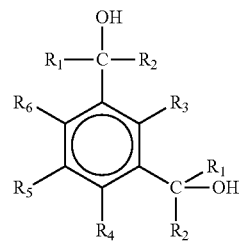
(2)

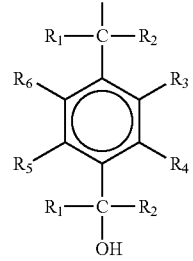
(3)

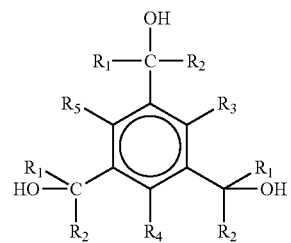
(4)

Here, $R_1$ and $R_2$ each represent a hydrogen atom or a substituted or unsubstituted alkyl group having 1 to 4 carbon atoms. $R_3$, $R_4$, $R_5$, and $R_6$ each independently represent an atom or atomic group selected from a hydrogen atom, a halogen atom, a substituted or unsubstituted alkyl group having 1 to 4 carbon atoms, a substituted or unsubstituted alkoxy group having 1 to 4 carbon atoms, a phenyl group, a methoxy group, and a cyclopropyl group. $R_1$ and $R_2$ may be the same as or different from each other. Further, $R_3$, $R_4$, $R_5$, and $R_6$ may be the same as or different from each other.

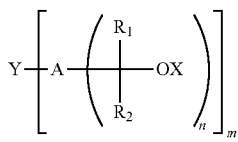

General Formula (I)

In the formula,

X represents a hydrogen atom, an alkyl group, a cycloalkyl group, an aryl group, or an acyl group.

A represents an aromatic hydrocarbon group, an aromatic heterocyclic group, or an alicyclic group.

$R_1$ and $R_2$ each independently represent a hydrogen atom, an alkyl group, a cycloalkyl group, or an aryl group, provided that all of $R_1$'s and $R_2$'s are not hydrogen atoms at the same time in any case.

m and n each independently represent an integer of 1 or more.

In a case where at least one of m or n represents an integer of 2 or more, a plurality of $R_1$'s, a plurality of $R_2$'s and a plurality of X's may be the same as or different from each other.

In a case where m represents an integer of 2 or more, a plurality of A's may be the same as or different from each other.

Y represents an m-valent group. Y is preferably an m-valent group having a heteroatom.

A and at least one of $R_1$ or $R_2$ may be bonded to form a ring.

$R_1$ and $R_2$ may be bonded to each other to form a ring together with a carbon atom to which these are bonded.

In a case where A represents an aromatic hydrocarbon group, the aromatic hydrocarbon group is preferably a group formed by removing n+1 hydrogen atoms from a monocyclic or polycyclic aromatic hydrocarbon (n represents an integer of 1 or more).

Examples of the aromatic hydrocarbon include an aromatic hydrocarbon ring (preferably having 6 to 18 carbon atoms) such as a benzene ring, a naphthalene ring, an anthracene ring, a fluorene ring, and a phenanthrene ring. Among these, a benzene ring and a naphthalene ring are preferable from the viewpoint of resolution, and a benzene ring is the most preferable.

In a case where A represents an alicyclic group, the alicyclic group may be either monocyclic or polycyclic, and specifically, a group formed by removing n+1 hydrogen atom (n represents an integer of 1 or more) from a monocyclic or polycyclic alicycle (preferably an alicycle having 3 to 18 carbon atoms) is preferable, and a group corresponding to a monocyclic or polycyclic monovalent alicyclic group (a group formed by removing n hydrogen atoms from a monovalent alicyclic group) is more preferable.

Examples of the monocyclic alicyclic group include groups corresponding to cycloalkyl groups such as a cyclopropyl group, a cyclobutyl group, a cycloheptyl group, a cyclohexyl group, a cyclopentyl group, a cyclooctyl group, a cyclononyl group, a cyclodecyl group, a cycloundecyl group, a cyclododecanyl group, a cyclohexenyl group, a cyclohexadienyl group, a cyclopentenyl group, and a cyclopentadienyl group, with a group corresponding to a cyclohexyl group or a cyclopentyl group being preferable.

Examples of the polycyclic alicyclic group include groups having a bicyclic, tricyclic, or tetracyclic structure, or the like, for example, a group corresponding to a bicyclobutyl group, a bicyclooctyl group, a bicyclononyl group, a bicycloundecyl group, a bicyclooctenyl group, a bicyclotridecenyl group, an adamantyl group, an isobornyl group, a norbornyl group, a camphanyl group, an α-pinenyl group, a tricyclodecanyl group, a tetracyclododecyl group, or an androstanyl group. More preferred examples thereof include groups corresponding to an adamantyl group, a decalin group, a norbornyl group, a cedrol group, a cyclohexyl group, a cycloheptyl group, a cyclooctyl group, a cyclodecanyl group, a cyclododecanyl group, and a tricyclodecanyl group, with a group corresponding to an adamantyl group being the most preferable, from the viewpoint of dry etching resistance.

In addition, some carbon atoms in the monocyclic or polycyclic alicyclic group may be substituted with heteroatoms such as an oxygen atom, a nitrogen atom, and a sulfur atom. Specific examples thereof include a thiophene ring, a furan ring, and a pyrrole ring.

In a case where A represents an aromatic heterocyclic group, an aromatic heterocyclic group including an oxygen atom, a nitrogen atom, or a sulfur atom is preferable. Further, A is preferably an aromatic heterocyclic group having 3 to 18 carbon atoms, specifically such as, but not limited to, groups having a heterocyclic structure, such as a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxthine ring, a phenothiazine ring, and a phenazine ring.

Moreover, A and at least one of $R_1$ or $R_2$ may be bonded to each other to form a ring.

The aromatic hydrocarbon group, the aromatic heterocyclic group, or the alicyclic group of A may have a substituent, and examples of the substituent include an alkyl group, a halogen atom, a hydroxyl group, an alkoxy group, a carboxyl group, an alkoxycarbonyl group, an alkylcarbonyl group, an alkylcarbonyloxy group, an alkylsulfonyloxy group, and an arylcarbonyl group.

$R_1$ and $R_2$ each independently represent an alkyl group, a cycloalkyl group, or an aryl group. $R_1$ and $R_2$ may be bonded to each other to form a ring together with a carbon atom to which these are bonded.

$R_1$ and $R_2$ each independently preferably represent an alkyl group or a cycloalkyl group, more preferably represents an alkyl group having 1 to 10 carbon atoms, or a cycloalkyl group having 3 to 10 carbon atoms, and still more preferably an alkyl group having 1 to 5 carbon atoms.

$R_1$ and $R_2$ each may have a substituent, and examples of the substituent include alkyl group, a halogen atom, a hydroxyl group, an alkoxy group, a carboxyl group, an alkoxycarbonyl group, an alkylcarbonyl group, an alkylcarbonyloxy group, an alkylsulfonyloxy group, and an arylcarbonyl group.

In a case of having a substituent, examples of $R_1$ and $R_2$ include a benzyl group and a cyclohexylmethyl group.

There is no case where all of $R_1$'s and $R_2$'s are hydrogen atoms at the same time. In a case where all of $R_1$'s and $R_2$'s are not hydrogen atoms at the same time, the reaction efficiency is enhanced, and thus, sensitivity is improved.

X represents a hydrogen atom, an alkyl group, a cycloalkyl group, an aryl group, or an acyl group. X is preferably a hydrogen atom, an alkyl group, or an acyl group, and more preferably a hydrogen atom, an alkyl group having 1 to 5 carbon atoms, or an acyl group having 2 to 5 carbon atoms.

Examples of the m-valent group containing the heteroatom of Y include —S—, —O—, —CO—, —SO$_2$—, —N(R$_0$)—, and an m-valent group formed by combining a plurality of these groups, or an m-valent group formed by combining these members with a hydrocarbon group, or an m-valent heterocyclic group. $R_0$ represents a hydrogen atom or an alkyl group (for example, an alkyl group having carbon atoms 1 to 8, and specifically, a methyl group, an ethyl group, a propyl group, an n-butyl group, a sec-butyl group, a hexyl group, and an octyl group). Examples of the hydrocarbon group include an alkylene group (for example, a methylene group, an ethylene group, a propylene group, a butylene group, a hexylene group, and an octylene group), a cycloalkylene group (for example, a cyclopentylene group and a cyclohexylene group), and alkenylene group (for example, an ethylene group, a propenylene group, and a butenylene group), and an arylene group (for example, a phenylene group, a tolylene group, and a naphthylene group).

From the viewpoints of the interaction with a polymer, the resolution, and the etching resistance, as the m-valent group containing the heteroatom of Y, an m-valent group having a heteroatom and a ring structure is more preferable, and an m-valent group having —O—, —CO—, —SO$_2$—, and a group formed by combining a plurality of these groups, and an aryl group is the most preferable.

m and n each independently represent an integer of 1 or more. m is preferably an integer of 1 to 3, and from the viewpoints of the reaction efficiency and the developer solubility, m is most preferably 2. n is preferably an integer of 1 to 3, and more preferably an integer of 1 or 2.

General Formula (X) is preferably General Formula (I-1).

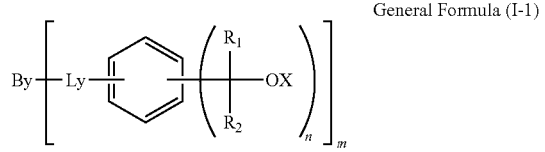

General Formula (I-1)

In General Formula (I-1),

X represents a hydrogen atom, an alkyl group, a cycloalkyl group, an aryl group, or an acyl group.

$R_1$ and $R_2$ each independently represent a hydrogen atom, an alkyl group, a cycloalkyl group, or an aryl group, provided that there is no case where all of $R_1$'s and $R_2$'S are hydrogen atoms at the same time.

Ly represents —S—, —O—, —CO—, —SO$_2$—, —N(R$_0$)—, alkylene group, and a divalent group formed by combining a plurality of these groups.

M and n each independently represent an integer of 1 or more.

In a case where at least one of m or n represents an integer of 2 or more, a plurality of $R_1$'s, a plurality of $R_2$'s and a plurality of X's may be the same as or different from each other.

In a case where m represents an integer of 2 or more, a plurality of Ly's may be the same as or different from each other.

$R_1$ and $R_2$ may be bonded to each other to form a ring together with a carbon atom to which these are bonded.

By represents an m-valent group having one structure selected from the following six structures.

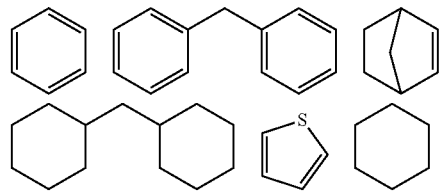

Specific examples and preferred ranges of X, $R_1$, $R_2$, $R_0$, m, and n in General Formula (I-1) are the same as the specific examples and the preferred ranges of X, $R_1$, $R_2$, $R_0$, m, and n in General Formula (I), respectively.

Ly represents —S—, —O—, —CO—, —SO$_2$—, —N(R$_0$)—, an alkylene group, or a divalent group formed by combining a plurality of these groups. As the alkylene group, an alkylene group having 1 to 5 carbon atoms is preferable.

The compound (A) can be synthesized in accordance with, for example, the same method as the synthesis of 2,2'-(5-hydroxy-1,3-phenylene)dipropan-2-ol in Journal of Photopolymer Science and Technology Volume 26, Number 5 (2013) 665-671.

Examples of the secondary or tertiary alcohol having a hydroxyl group on carbon directly bonded to the aromatic ring used in the present invention, of the compound represented by General Formula (I-1) or the like include α,α'-dimethyl-1,2-benzenedimethanol, α,α'-diethyl-1,2-benzenedimethanol, 4-methoxy-α,α'-dimethyl-1,2-benzenedimethanol, 4,5-dichloro-α,α'-dimethyl-1,2-benzenedimethanol, 4,5,α,α'-tetramethyl-1,2-benzenedimethanol, α,α'-dimethyl-1,3-benzenedimethanol, α,α'-diethyl-1,3-benzenedimethanol, 5-methoxy-α,α'-dimethyl-1,3-benzenedimethanol, 5-chloro-α,α'-dimethyl-1,3-benzenedimethanol, 5-bromo-α,α'-dimethyl-1,3-benzenedimethanol, α,α'-dimethyl-1,4-benzenedimethanol, α,α'-diethyl-1,4-benzenedimethanol, 2,3,5,6,α,α'-hexamethyl-1,4-benzenedimethanol, 2-chloro-α,α'-dimethyl-1,4-benzenedimethanol, 2-bromo-α,α'-dimethyl-1,4-benzenedimethanol, α,α',α"-trimethyl-1,3,5-benzenetrimethanol, α,α',α"-triethyl-1,3,5-benzenetrimethanol, α,α',α"-trihydroxy-1,3,5-triisopropylbenzene, α,α'-dimethyl-1,5-naphthalenedimethanol, α,α'-dimethyl-1,4-naphthalenedimethanol, and α,α'-dimethyl-9,10-anthracenedimethanol.

Among the secondary or tertiary alcohols having a hydroxyl group on carbon directly bonded to the aromatic ring, tertiary alcohols are more preferable as a high-sensitivity pattern forming material since they are efficiently dehydrated even in the presence of a small amount of an acid. Further, tertiary alcohols having 3 or more 2-hydroxyisopropyl groups on the same aromatic ring are more preferable as an alcohol compound for use in the pattern forming material of the present invention since they are less volatilized during the pre-exposure bake.

Specific examples of the compound represented by General Formula (X) are shown below.

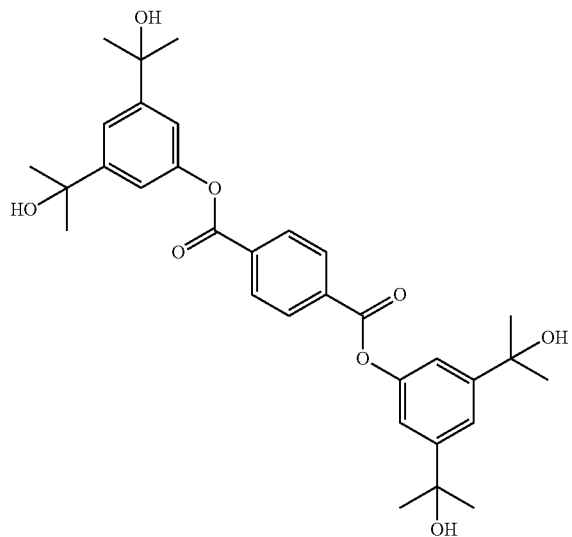
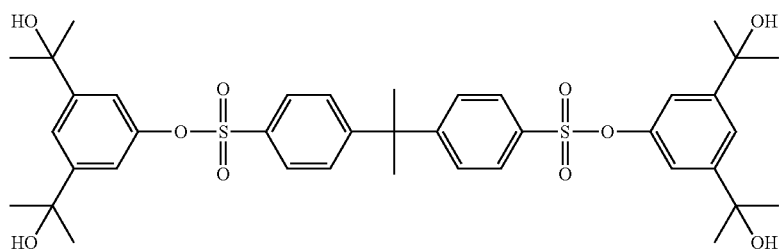
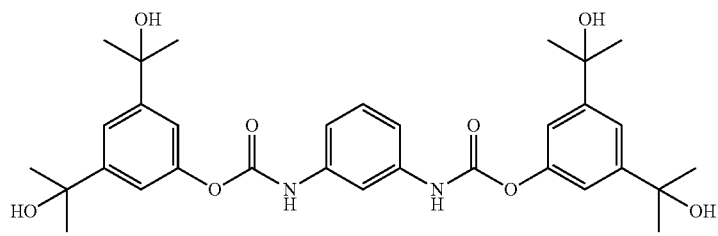
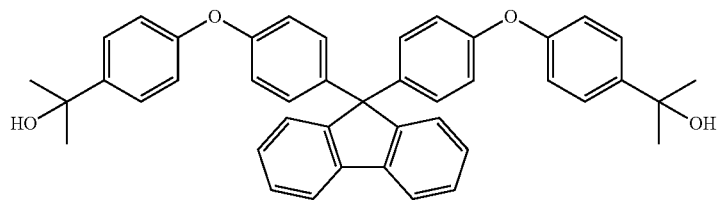
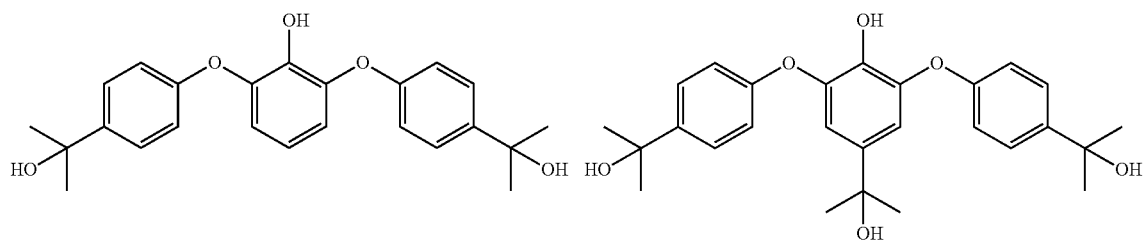
Moreover, the actinic ray-sensitive or radiation-sensitive composition of the present invention preferably contains a compound having a molecular weight of 500 or more as the low molecular compound [N-C], and thus, can be suppressed from being volatilized from the film in vacuo during the pre-heating step, the post-heating step, and the exposure.

[Resin (B) Having Group that Decomposes by Action of Alkali Developer to Increase Solubility in Alkali Developer as Well as at Least One of Fluorine Atom or Silicon Atom]

The composition of the present invention includes a resin (B) having a group that decomposes by the action of an alkali developer to increase the solubility in the alkali developer and having at least one of a fluorine atom or a silicon atom (also referred to as a "resin (B)").

The resin (B) has at least one of a fluorine atom or silicon atom.

At least one of the fluorine atom or the silicon atom in the resin (B) may be contained in the main chain or the side chain of the resin.

In a case where the resin (B) contains a fluorine atom, it is preferably a resin which contains an alkyl group having a fluorine atom, a cycloalkyl group having a fluorine atom, or an aryl group having a fluorine atom, as a partial structure having a fluorine atom.

The alkyl group having a fluorine atom is a linear or branched alkyl group in which at least one hydrogen atom has been substituted with a fluorine atom, and preferably has 1 to 10 carbon atoms, and more preferably has 1 to 4 carbon atoms. The alkyl group may further have another substituent.

The cycloalkyl group having a fluorine atom is a monocyclic or polycyclic cycloalkyl group in which at least one hydrogen atom has been substituted with a fluorine atom. The cycloalkyl group may further have another substituent.

Examples of the aryl group having a fluorine atom include an aryl group such as a phenyl group and a naphthyl group, in which at least one hydrogen atom has been substituted with a fluorine atom. The aryl group may further have another substituent.

Preferred examples of the alkyl group having a fluorine atom, the cycloalkyl group having a fluorine atom, and the aryl group having a fluorine atom include groups represented by any one of General Formulae (F2) to (F4), but the present invention is not limited thereto.

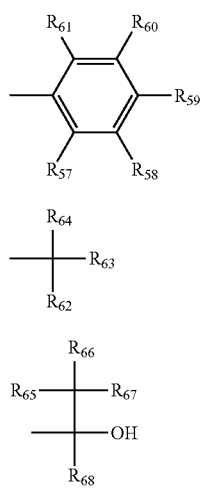

In General Formulae (F2) to (F4), $R_{57}$ to $R_{68}$ each independently represent a hydrogen atom, a fluorine atom, or an (linear or branched) alkyl group, provided that at least one of $R_{57}, \ldots,$ or $R_{61}$, at least one of $R_{62}, \ldots,$ or $R_{64}$, and at least one of $R_{65}, \ldots,$ or $R_{68}$ represent a fluorine atom or an alkyl group (preferably having 1 to 4 carbon atoms) in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably a fluoroalkyl group (preferably having 1 to 4 carbon atoms), and more preferably a perfluoroalkyl group having 1 to 4 carbon atoms. When $R_{62}$ and $R_{63}$ are each a perfluoroalkyl group, $R_{64}$ is preferably a hydrogen atom. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. The hexafluoroisopropyl group, the heptafluoroisopropyl group, the hexafluoro(2-methyl)isopropyl group, the octafluoroisobutyl group, the nonafluoro-t-butyl group, and the perfluoroisopentyl group are preferable, and the hexafluoroisopropyl group and the heptafluoroisopropyl group are more preferable.

Specific examples of the group represented by General Formula (F4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferable.

The partial structure containing a fluorine atom may be bonded directly to the main chain or may be bonded to the main chain via a group selected from the group consisting of an alkylene group, a phenylene group, an ether bond, a thioether bond, a carbonyl group, an ester bond, an amide bond, a urethane bond, and a ureylene bond, a group formed by combining two or more of these members.

Suitable examples of the repeating unit having a fluorine atom include those shown below.

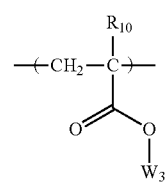

(C-Ia)

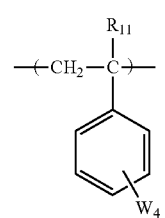

(C-Ib)

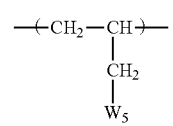

(C-Ic)

-continued

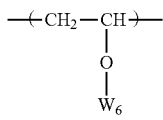
(C-Id)

In the formulae, $R_{10}$ and $R_{11}$ each independently represent a hydrogen atom, a fluorine atom, or an alkyl group. The alkyl group is preferably a linear or branched alkyl group having 1 to 4 carbon atoms, and may have a substituent. Examples of the alkyl group having a substituent include, in particular, a fluorinated alkyl group.

$W_3$ to $W_6$ each independently represent an organic group having at least one fluorine atom. Specific examples thereof include the atomic groups of (F2) to (F4) above.

Furthermore, the resin (B) may have a unit as shown below as a repeating unit having a fluorine atom, in addition to those.

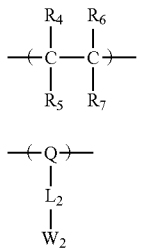
(C-II)

(C-III)

In the formulae, $R_4$ to $R_7$ each independently represent a hydrogen atom, fluorine atom, or alkyl group. The alkyl group is preferably a linear or branched alkyl group having 1 to 4 carbon atoms, and may have a substituent. Examples of the alkyl group having a substituent include, in particular, a fluorinated alkyl group.

However, at least one of $R_4$, ..., or $R_7$ represents a fluorine atom. $R_4$ and $R_5$ or $R_6$ and $R_7$ may form a ring.

$W_2$ represents an organic group having at least one fluorine atom, and specific examples thereof include the atomic groups of (F2) to (F4) above.

$L_2$ represents a single bond, or a divalent linking group. Examples of the divalent linking group include a substituted or unsubstituted arylene group, a substituted or unsubstituted alkylene group, a substituted or unsubstituted cycloalkylene group, —O—, —SO$_2$—, —CO—, —N(R)— (in the formula, R represents a hydrogen atom or alkyl), —NHSO$_2$—, or a divalent linking group formed by combining a plurality of these groups.

Q represents an alicyclic structure. The alicyclic structure may have a substituent and may be monocyclic or polycyclic, and in a case of a polycyclic structure, the structure may be a crosslinked structure. The monocyclic structure is preferably a cycloalkyl group having 3 to 8 carbon atoms, and examples thereof include a cyclopentyl group, a cyclohexyl group, a cyclobutyl group, and a cyclooctyl group. Examples of the polycyclic structure include a group with a bicyclo, tricyclo, or tetracyclo structure having 5 or more carbon atoms. A cycloalkyl group having 6 to 20 carbon atoms is preferable, and examples thereof include an adamantyl group, a norbornyl group, a dicyclopentyl group, a tricyclodecanyl group, and a tetracyclododecyl group. Further, some carbon atoms in the cycloalkyl group may be substituted with heteroatoms such as an oxygen atom. Particularly preferred examples of Q include a norbornyl group, a tricyclodecanyl group, and a tetracyclododecyl group.

The resin (B) may contain a silicon atom.

The resin (B) preferably has an alkylsilyl structure (preferably a trialkylsilyl group), or a cyclic siloxane structure as a partial structure having a silicon atom. Specific examples of the alkylsilyl structure or the cyclic siloxane structure include groups represented by General Formula (CS-1) to (CS-3).

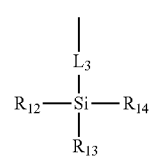
(CS-1)

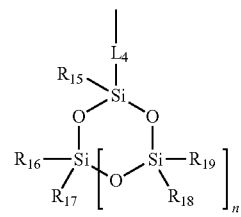
(CS-2)

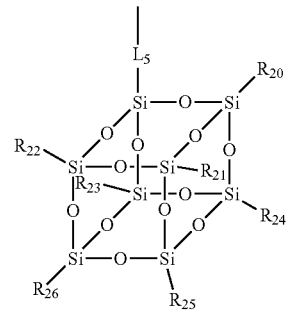
(CS-3)

In General Formulae (CS-1) to (CS-3), $R_{12}$ to $R_{26}$ each independently represent a linear or branched alkyl group (preferably having 1 to 20 carbon atoms) or a cycloalkyl group (preferably having 3 to 20 carbon atoms).

$L_3$ to $L_5$ each represent a single bond or a divalent linking group. The divalent linking group is a single group or a combination of two or more groups, selected from the group consisting of an alkylene group, a phenylene group, an ether bond, a thioether bond, a carbonyl group, an ester bond, an amide bond, a urethane bond, and a ureylene bond.

n represents an integer of 1 to 5. n is preferably an integer of 2 to 4.

The repeating unit having at least one of a fluorine atom or a silicon atom is preferably a (meth)acrylate-based repeating unit.

Specific examples of the repeating unit having at least one of a fluorine atom or a silicon atom are shown below, but the present invention is not limited thereto. Further, in the specific examples, $X_1$ represents a hydrogen atom, —CH$_3$, —F, or —CF$_3$, and $X_2$ represents —F or —CF$_3$.

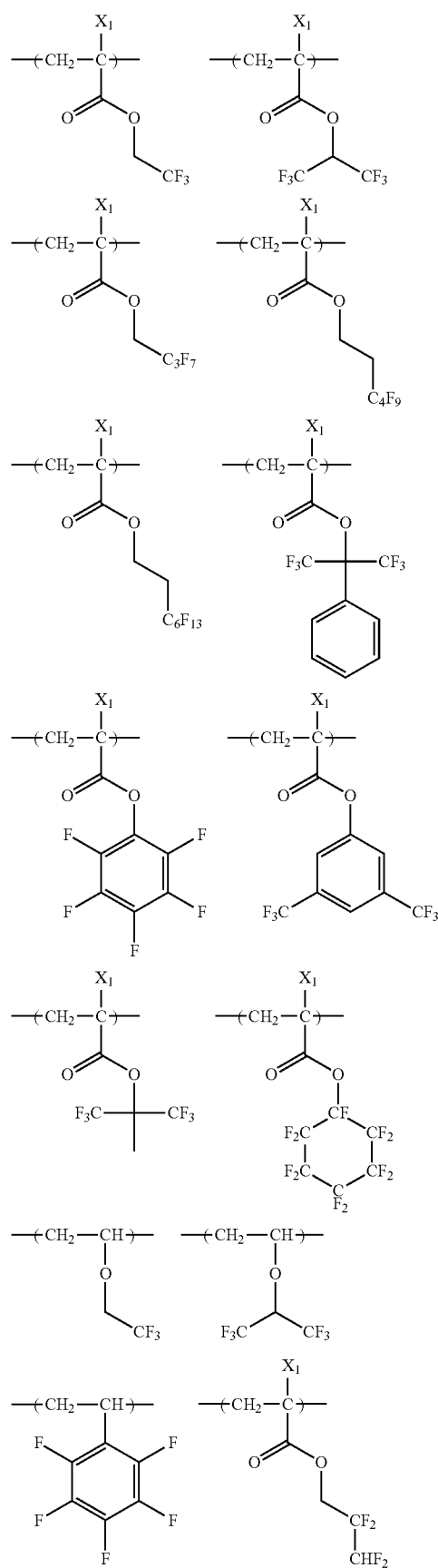
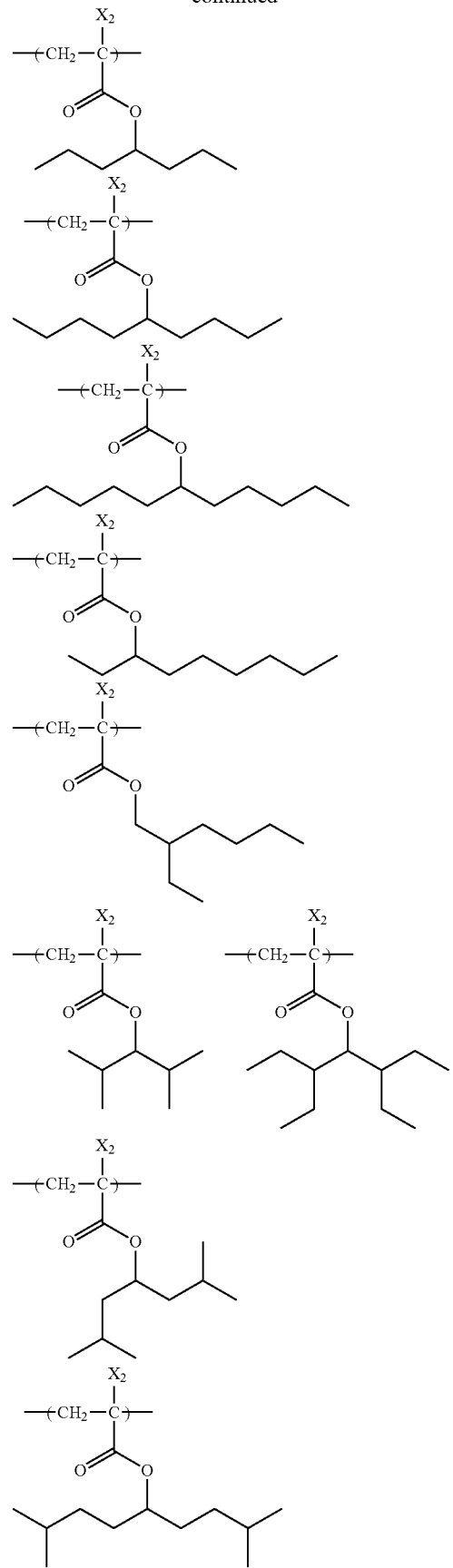

-continued
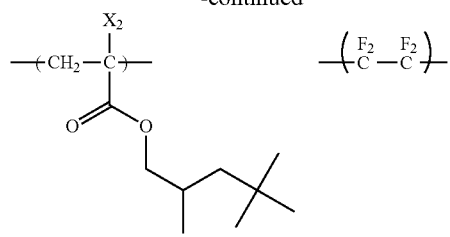
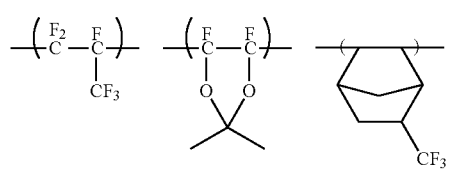
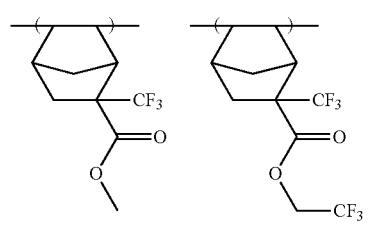
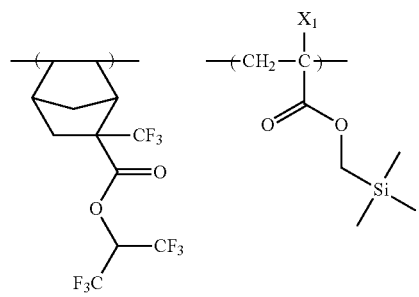
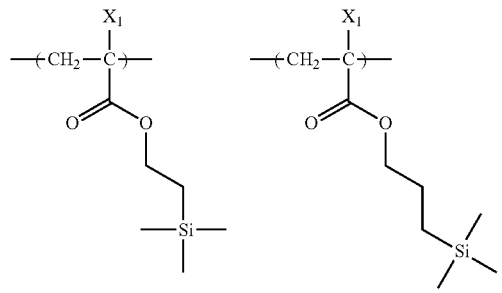
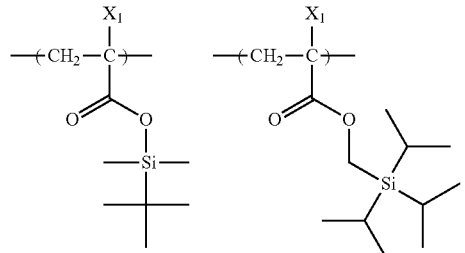
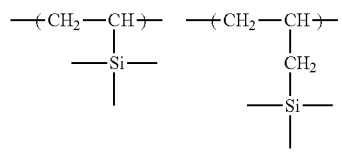
-continued
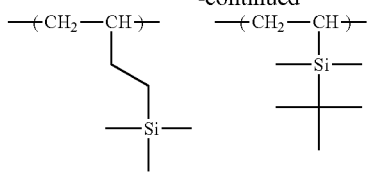
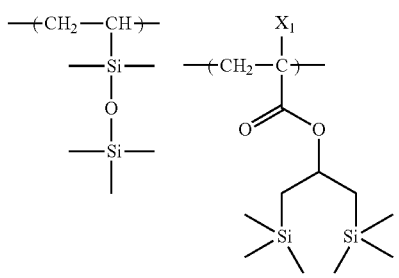
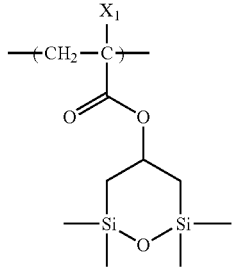
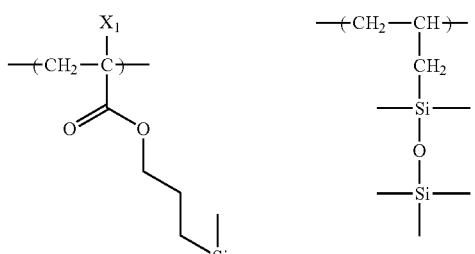
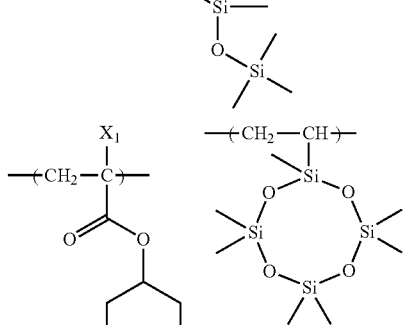
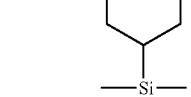
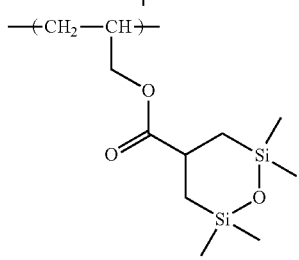

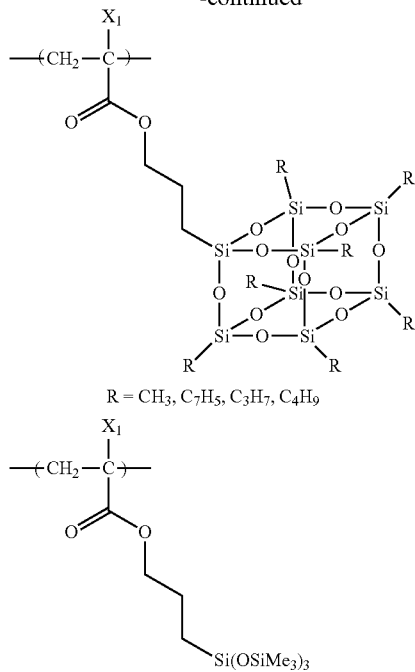

R = CH$_3$, C$_7$H$_5$, C$_3$H$_7$, C$_4$H$_9$

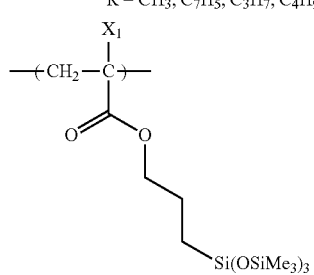

The resin (B) preferably has a repeating unit (b) with a group (y) (also referred to as a "polarity converting group (y)") that decomposes by the action of an alkali developer to increase the solubility in the alkali developer.

Examples of the repeating unit (b) include the following types.

Repeating unit (b') having, in one side chain, at least one of a fluorine atom or a silicon atom, and at least one group selected from the group consisting of (y) above, Repeating unit (b*) having at least one group selected from the group consisting of (y) above, and having neither a fluorine atom nor a silicon atom, Repeating unit (b") having, in one side chain, at least one group selected from the group consisting of (y) above, and further having at least one of a fluorine atom or a silicon atom, in the side chain other than the side chain in the same repeating unit It is more preferable that the resin (B) has the repeating unit (b') as the repeating unit (b). That is, it is more preferable that the repeating unit (b) having at least one group selected from the group consisting of (y) above has at least one of a fluorine atom or a silicon atom.

Incidentally, it is preferable that in a case where the resin (B) has the repeating unit (b*), the resin (B) is a copolymer with a repeating unit having at least one of a fluorine atom or a silicon atom (a repeating unit other than the repeating units (b') and (b")). Further, it is preferable that the side chain having at least one group selected from the group consisting of (y) above and the side chain having at least one of a fluorine atom or a silicon atom in the repeating unit (b") are bonded to each other on the same carbon atom in the main chain, that is, are in the same positional relationship as in Formula (K1).

In the formulae, B1 represents a partial structure having at least one group selected from the group consisting of (y) above, and B2 represents a partial structure having at least one of a fluorine atom or a silicon atom.

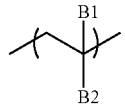

(K1)

Examples of the polarity converting group (y) include a lactone group, a carboxylic acid ester group (—COO—), an acid anhydride group (—C(O)OC(O)—), an acid imide group (—NHCONH—), a carboxylic acid thioester group (—COS—), a carbonic acid ester group (—OC(O)O—), a sulfuric acid ester group (—OSO$_2$O—), and a sulfonic acid ester group (—SO$_2$O—), with a lactone group being preferred.

As for the polarity converting group (y), both an aspect in which the group is contained, for example, in a repeating unit by an acrylic acid ester or a methacrylic acid ester and thereby is introduced into the side chain of the resin, and an aspect in which the group is introduced into the terminal of the polymer chain by using a polymerization initiator or a chain transfer agent having (y) a polarity converting group during the polymerization, are preferable.

Specific examples of the repeating unit (b) having the polarity converting group (y) include repeating units having lactone structures represented by Formulae (KA-1-1) to (KA-1-17) which will be described later.

Furthermore, the repeating unit (b) having the polarity converting group (y) is preferably a repeating unit having at least one of a fluorine atom or a silicon atom (that is, a repeating unit corresponding to the repeating unit (b') or (b")). The resin containing the repeating unit (b) has hydrophobicity, but this repeating unit is preferable, in particular, from the viewpoint of reducing the development defect.

Examples of the repeating unit (b) include a repeating unit represented by Formula (K0).

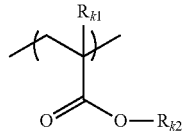

(K0)

In the formula, $R_{k1}$ represents a hydrogen atom, a halogen atom, a hydroxyl group, an alkyl group, a cycloalkyl group, an aryl group, or a group containing a polarity converting group.

$R_{k2}$ represents an alkyl group, a cycloalkyl group, an aryl group, or a group containing a polarity converting group.

However, at least one of $R_{k1}$ or $R_{k2}$ represents a group containing a polarity converting group.

The polarity converting group is a group that decomposes by the action of an alkali developer to increase the solubility in the alkali developer as described above. The polarity converting group is preferably a group represented by X in a partial structure represented by General Formula (KA-1) or (KB-1).

(KA-1)

Y$^1$—X—Y$^2$ (KB-1)

In General Formulae (KA-1) and (KB-1), X represents a carboxylic acid ester group: —COO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —OSO$_2$O—, or a sulfonic acid ester group: —SO$_2$O—.

$Y^1$ and $Y^2$ may be the same as or different from each other, and represent an electron-withdrawing group.

Incidentally, the repeating unit (b) has a preferred group that increases the solubility in an alkali developer by containing a group having a partial structure represented by General Formula (KA-1) or (KB-1), but as in a case of the partial structure represented by General Formula (KA-1) or the partial structure represented by General Formula (KB-1) where $Y^1$ and $Y^2$ are monovalent, when the partial structure does not have a bonding arm, the group having the partial structure is a group having a monovalent or higher valent group formed by removing at least one arbitrary hydrogen atom in the partial structure.

The partial structure represented by General Formula (KA-1) or (KB-1) is linked to the main chain of the resin (B) at an arbitrary position through a substituent.

The partial structure represented by General Formula (KA-1) is a structure forming a ring structure together with the group as X.

In General Formula (KA-1), X is preferably a carboxylic acid ester group (that is, a case of forming a lactone ring structure as KA-1), an acid anhydride group or a carbonic acid ester group, and more preferably a carboxylic acid ester group.

The ring structure represented by General Formula (KA-1) may have a substituent and, for example, may have nka substituents $Z_{ka1}$.

In a case where a plurality of $Z_{ka1}$'s are present, $Z_{ka1}$'s each independently represent a halogen atom, an alkyl group, a cycloalkyl group, an ether group, a hydroxyl group, an amido group, an aryl group, a lactone ring group, or an electron-withdrawing group.

$Z_{ka1}$'s may be linked to each other to form a ring. Examples of the ring formed by linking $Z_{ka1}$'s with each other include a cycloalkyl ring and a heterocyclic ring (a cyclic ether ring, a lactone ring, and the like).

nka represents an integer of 0 to 10, and is preferably an integer of 0 to 8, more preferably an integer of 0 to 5, still more preferably an integer of 1 to 4, and most preferably an integer of 1 to 3.

The electron-withdrawing group as $Z_{ka1}$ is the same as the electron-withdrawing group as $Y^1$ and $Y^2$ which will be described later. Further, the electron-withdrawing group may be substituted with another electron-withdrawing group.

$Z_{ka1}$ is preferably an alkyl group, a cycloalkyl group, an ether group, a hydroxyl group, or an electron-withdrawing group, and more preferably an alkyl group, a cycloalkyl group, or an electron-withdrawing group. Further, the ether group is preferably an ether group substituted, for example, with an alkyl group, a cycloalkyl group, or the like, that is, an alkyl ether group or the like. The electron-withdrawing group has the same definition as above.

Examples of the halogen atom as $Z_{ka1}$ include a fluorine atom, a chlorine atom, a bromine atom, and an iodine atom, with the fluorine atom being preferable.

The alkyl group as $Z_{ka1}$ may have a substituent and may be either linear or branched. The linear alkyl group is preferably an alkyl group having 1 to 30 carbon atoms, and more preferably an alkyl group having 1 to 20 carbon atoms, and examples thereof include a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, and an n-decanyl group. The branched alkyl group is preferably an alkyl group having 3 to 30 carbon atoms, and more preferably an alkyl group having 3 to 20 carbon atoms, and examples thereof include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, and a t-decanoyl group. An alkyl group having 1 to 4 carbon atoms, such as a methyl group, an ethyl group, an n-propyl group, an i-propyl group, an n-butyl group, an i-butyl group, and a t-butyl group, is preferable.

The cycloalkyl group as $Z_{ka1}$ may have a substituent and may be either monocyclic or polycyclic, and in a case of polycyclic, the cycloalkyl group may be crosslinked. That is, in this case, the cycloalkyl group may have a bridged structure. The monocyclic cycloalkyl group is preferably a cycloalkyl group having 3 to 8 carbon atoms, and examples thereof include a cyclopropyl group, a cyclopentyl group, a cyclohexyl group, a cyclobutyl group, and a cyclooctyl group. Examples of the polycyclic cycloalkyl group include a group having a bicyclo, tricyclo, or tetracyclo structure and having 5 or more carbon atoms. A cycloalkyl group having 6 to 20 carbon atoms is preferable, and examples thereof include an adamantyl group, a norbornyl group, an isobornyl group, a camphanyl group, a dicyclopentyl group, an α-pinenyl group, a tricyclodecanyl group, a tetracyclododecyl group, and an androstanyl group. As cycloalkyl groups, the following structures are also preferable. Incidentally, some of carbon atoms in the cycloalkyl group may be substituted with heteroatoms such as an oxygen atom.

(1)

(2)

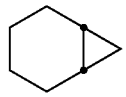

(3)

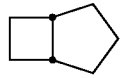

(4)

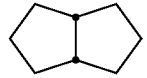

(5)

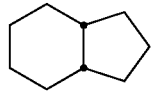

(6)

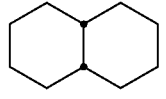

(7)

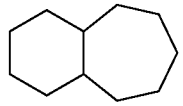

(8)

-continued
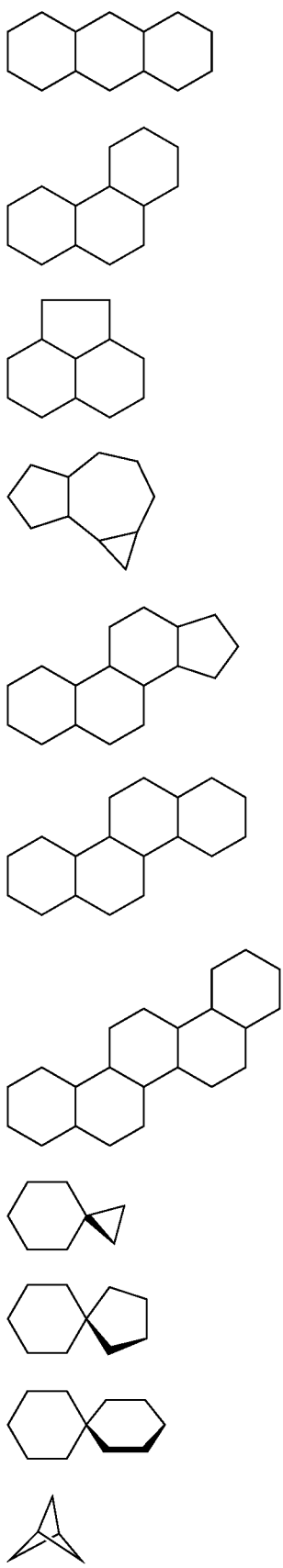
(9)
(10)
(11)
(12)
(13)
(14)
(15)
(16)
(17)
(18)
(19)
-continued
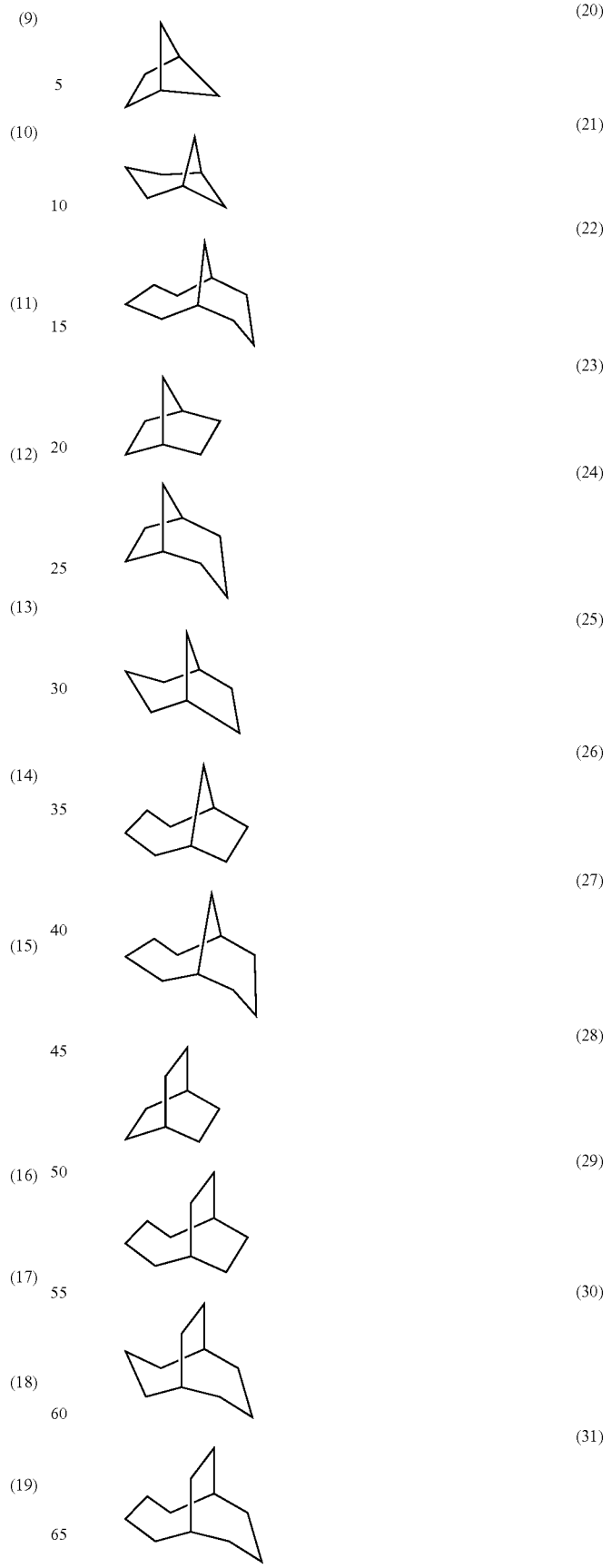
(20)
(21)
(22)
(23)
(24)
(25)
(26)
(27)
(28)
(29)
(30)
(31)

(32) 

(33) 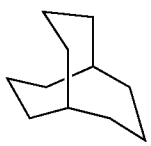

(34) 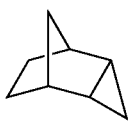

(35) 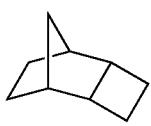

(36) 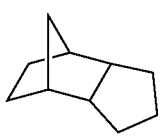

(37) 

(38) 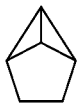

(39) 

(40) 

(41) 

(42) 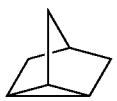

(43) 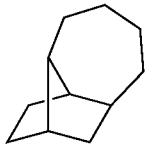

(44) 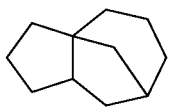

(45) 

(46) 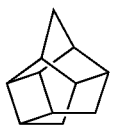

(47) 

(48) 

(49) 

(50)

The alicyclic moiety is preferably an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group, or a cyclododecanyl group, and more preferably an adamantyl group, a decalin group, a norbornyl group, a cedrol group, a cyclohexyl group, a cycloheptyl group, a cyclooctyl group, a cyclodecanyl group, a cyclododecanyl group, or a tricyclodecanyl group.

Examples of the substituent of the alicyclic structure include an alkyl group, a halogen atom, a hydroxyl group, an alkoxy group, a carboxyl group, and an alkoxycarbonyl group. The alkyl group is preferably a lower alkyl group such as a methyl group, an ethyl group, a propyl group, an isopropyl group, and a butyl group, and more preferably represents a methyl group, an ethyl group, a propyl group, or an isopropyl group. Preferred examples of the alkoxy group include an alkoxy group having 1 to 4 carbon atoms, such as a methoxy group, an ethoxy group, a propoxy group, and a butoxy group. Examples of the substituent which the alkyl group and the alkoxy group may have include a hydroxyl group, a halogen atom, and an alkoxy group (preferably having 1 to 4 carbon atoms).

The groups above may further have a substituent, and examples of the additional substituent include a hydroxyl group, a halogen atom (fluorine, chlorine, bromine, and iodine), a nitro group, a cyano group, the above-described alkyl group, an alkoxy group such as a methoxy group, an ethoxy group, a hydroxyethoxy group, a propoxy group, a hydroxypropoxy group, an n-butoxy group, an isobutoxy group, a sec-butoxy group, and a t-butoxy group, an alkoxycarbonyl group such as a methoxycarbonyl group and an ethoxycarbonyl group, an aralkyl group such as a benzyl group, a phenethyl group, and a cumyl group, an aralkyloxy group, an acyl group such as a formyl group, an acetyl group, a butyryl group, a benzoyl group, a cinnamyl group, and a valeryl group, an acyloxy group such as a butyryloxy group, the above-described alkenyl group, an alkenyloxy group such as a vinyloxy group, a propenyloxy group, an allyloxy group, and a butenyloxy group, the above-described aryl group, an aryloxy group such as phenoxy group, and an aryloxycarbonyl group such as a benzoyloxy group.

It is preferable that X in General Formula (KA-1) is a carboxylic acid ester group and the partial structure represented by General Formula (KA-1) is a lactone ring, and the lactone ring is preferably a 5- to 7-membered lactone ring.

Incidentally, as in (KA-1-1) to (KA-1-17) below, another ring structure is preferably fused to a 5- to 7-membered lactone ring that is the partial structure represented by General Formula (KA-1), in the form of forming a bicyclo or spiro structure.

Examples of the peripheral ring structure to which the ring structure represented by General Formula (KA-1) may be bonded include those in (KA-1-1) to (KA-1-17) below or structures based on these structures.

The structure containing the lactone ring structure represented by General Formula (KA-1) is more preferably a structure represented by any one of the following (KA-1-1) to (KA-1-17). The lactone structure may be bonded directly to the main chain. Preferred structures are (KA-1-1), (KA-1-4), (KA-1-5), (KA-1-6), (KA-1-13), (KA-1-14), and (KA-1-17).

KA-1-1

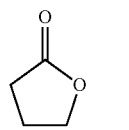

KA-1-2

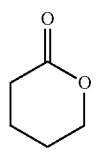

KA-1-3

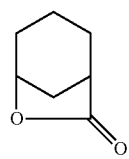

KA-1-4

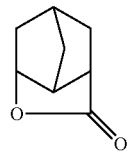

KA-1-5

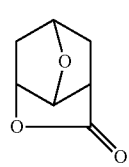

KA-1-6

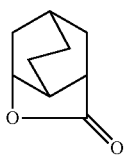

KA-1-7

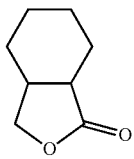

KA-1-8

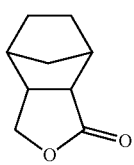

KA-1-9

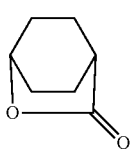

KA-1-10

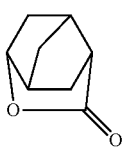

KA-1-11

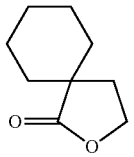

KA-1-12

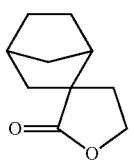

KA-1-13

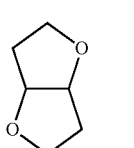

KA-1-14

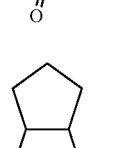

-continued

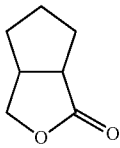
KA-1-15

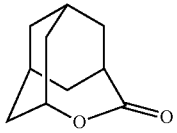
KA-1-16

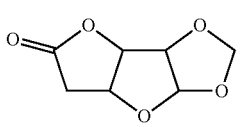
KA-1-17

The structure containing the lactone ring structure may or may not have a substituent. Preferred examples of the substituent are the same as those in the substituent $Z_{ka1}$ which the ring structure represented by General Formula (KA-1) may have.

Preferred examples of X in General Formula (KB-1) include a carboxylic acid ester group (—COO—).

$Y^1$ and $Y^2$ in General Formula (KB-1) each independently represent an electron-withdrawing group.

The electron-withdrawing group is a partial structure represented by Formula (EW). In Formula (EW), * represents a bonding arm directly bonded to (KA-1) or a bonding arm directly bonded to X in (KB-1).

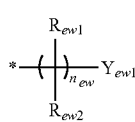
(EW)

In Formula (EW), $n_{ew}$ is a repetition number of the linking group represented by —C($R_{ew1}$)($R_{ew2}$)— and represents an integer of 0 or 1. In a case where $n_{ew}$ is 0, it indicates that the bond is a single bond and $Y_{ew1}$ is directly bonded.

$Y_{ew1}$ is a halogen atom, a cyano group, a nitrile group, a nitro group, a halo(cyclo)alkyl or haloaryl group represented by —C($R_{f1}$)($R_{f2}$)—$R_{f3}$, an oxy group, a carbonyl group, a sulfonyl group, a sulfinyl group, or a combination thereof. The electron-withdrawing group may be, for example, a structure shown below. Further, the "halo(cyclo)alkyl group" represents an alkyl or cycloalkyl group which is at least partially halogenated, and the "haloaryl group" represents an aryl group which is at least partially halogenated. In the following structural formulae, $R_{ew3}$ and $R_{ew4}$ each independently represent an arbitrary structure. The partial structure represented by Formula (EW) has an electron-withdrawing property regardless of what structure $R_{ew3}$ or $R_{ew4}$ may take, and $R_{ew3}$ and $R_{ew4}$ may each be linked, for example, to the main chain of the resin, but is preferably an alkyl group, a cycloalkyl group, or a fluorinated alkyl group.

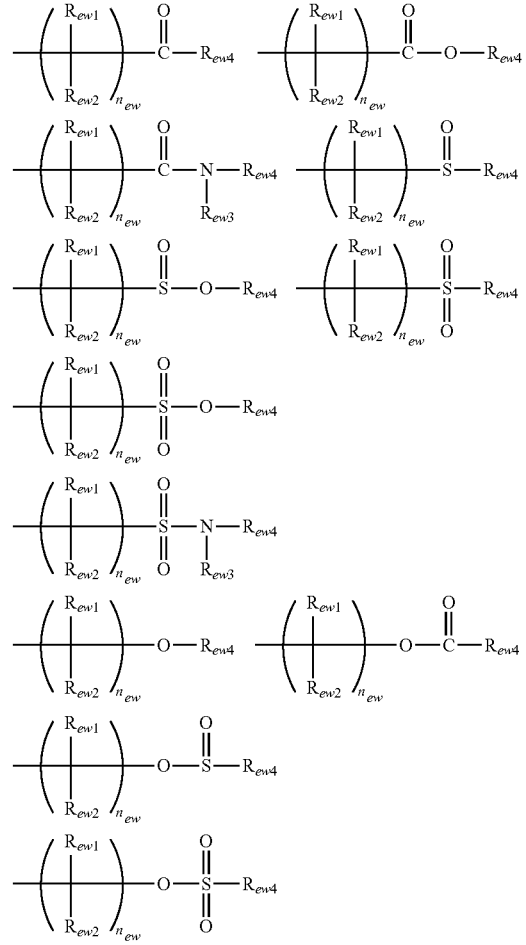

In a case where $Y_{ew1}$ is a divalent or higher valent group, the remaining bonds arm forms bonding to an arbitrary atom or substituent. At least any one group of $Y_{ew1}$, $R_{ew1}$, or $R_{ew2}$ may further be linked to the main chain of the resin (C) through a substituent.

$Y_{ew1}$ is preferably a halogen atom or a halo(cyclo)alkyl or haloaryl group represented by —C($R_{f1}$)($R_{f2}$)—$R_{f3}$.

$R_{ew1}$ and $R_{ew2}$ each independently represent an arbitrary substituent, and represent, for example, a hydrogen atom, an alkyl group, a cycloalkyl group, or an aryl group.

At least two members of $Y_{ew1}$, $R_{ew1}$, or $R_{ew2}$ may be linked to each other to form a ring.

Here, $R_{f1}$ represents a halogen atom, a perhaloalkyl group, a perhalocycloalkyl group, or a perhaloaryl group, and is more preferably a fluorine atom, a perfluoroalkyl group, or a perfluorocycloalkyl group, and still more preferably a fluorine atom or a trifluoromethyl group.

$R_{f2}$ and $R_{f3}$ each independently represent a hydrogen atom, a halogen atom, or an organic group, and $R_{f2}$ and $R_{f3}$ may be linked to each other to form a ring. Examples of the organic group include an alkyl group, a cycloalkyl group, and an alkoxy group. More preferably, $R_{f2}$ represents the same group as $R_{f1}$ or is linked to $R_{f3}$ to form a ring.

$R_{f1}$ to $R_{f3}$ may be linked to each other to form a ring, and examples of the ring formed include a (halo)cycloalkyl ring and a (halo)aryl ring.

Examples of the (halo)alkyl group in $R_{f1}$ to $R_{f3}$ include the alkyl groups in $Z_{ka1}$ as described above and halogenated structures thereof.

Examples of the (per)halocycloalkyl group and (per)haloaryl group in $R_{f1}$ to $R_{f3}$ or in the ring formed by the mutual linking of $R_{f2}$ and $R_{f3}$ include a structure formed by the halogenation of the cycloalkyl group in $Z_{ka1}$ as described above, and more preferably a fluorocycloalkyl group represented by $-C_{(n)}F_{(n-2)}H$ and a perfluoroaryl group represented by $-C_{(n)}F_{(n-1)}$, in which the number n of carbon atoms is not particularly limited, but is preferably 5 to 13, and more preferably 6.

The ring which may be formed by the mutual linking of at least two members of $R_{ew1}$, $R_{ew2}$, and $Y_{ew1}$ is preferably a cycloalkyl group or a heterocyclic group, and the heterocyclic group is preferably a lactone ring group. Examples of the lactone ring include the structures represented by Formulae (KA-1-1) to (KA-1-17).

Incidentally, the repeating unit (b) may have a plurality of partial structures represented by General Formula (KA-1), a plurality of partial structures represented by General Formula (KB-1), or both a partial structure of General Formula (KA-1) and a partial structure of General Formula (KB-1).

Furthermore, the partial structure of General Formula (KA-1) may also partially or entirely serve as the electron-withdrawing group of $Y^1$ or $Y^2$ in General Formula (KB-1). For example, in a case where X in General Formula (KA-1) is a carboxylic acid ester group, the carboxylic acid ester group may function as an electron-withdrawing group of $Y^1$ or $Y^2$ in General Formula (KB-1) in some cases.

Moreover, in a case where the repeating unit (b) corresponds to the repeating unit (b*) or the repeating unit (b") and has a partial structure represented by General Formula (KA-1), the partial structure represented by General Formula (KA-1) is more preferably a partial structure where the polarity converting group is —COO— in the structure represented by General Formula (KA-1).

The repeating unit (b) may be a repeating unit having a partial structure represented by General Formula (KY-0).

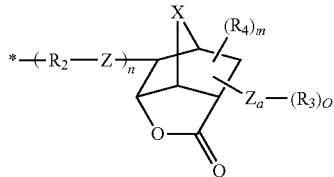

(KY-0)

In General Formula (KY-0), $R_2$ represents a chained or cyclic alkylene group and in a case where a plurality of $R_2$'s are present, these may be the same as or different from each other.

$R_3$ represents a linear, branched, or cyclic hydrocarbon group in which a part or all hydrogen atoms on the constituent carbons are substituted with a fluorine atom.

$R_4$ represents a halogen atom, a cyano group, a hydroxy group, an amido group, an alkyl group, a cycloalkyl group, an alkoxy group, a phenyl group, an acyl group, an alkoxycarbonyl group, or a group represented by R—C(=O)— or R—C(=O)O— (in which R represents an alkyl group or a cycloalkyl group). In a case where a plurality of $R_4$'s are present, these may be the same as or different from each other, and two or more $R_4$'s may be bonded to each other to form a ring.

X represents an alkylene group, an oxygen atom, or a sulfur atom.

Z and Za each represent a single bond, an ether bond, an ester bond, an amide bond, a urethane bond, or a urea bond, and in a case where a plurality of Z's or Za's are present, these may be the same as or different from each other.

* represents a bonding arm to the main chain or the side chain of the resin.

o is the number of substituents and represents an integer of 1 to 7.

m is the number of substituents and represents an integer of 0 to 7.

n is a repetition number and represents an integer of 0 to 5.

The structure of $-R_2-Z-$ is preferably a structure represented by $-(CH_2)_l-COO-$ (in which l represents an integer of 1 to 5).

The preferred range of the number of carbon atoms and specific examples of the chained or cyclic alkylene group as $R_2$ are the same as those described for the chained alkylene group and the cyclic alkylene group in $Z_2$ of General Formula (bb).

The number of carbon atoms of the linear, branched, or cyclic hydrocarbon group as $R_3$ is, in a case of a linear hydrocarbon group, preferably from 1 to 30, and more preferably 1 to 20; in a case of a branched hydrocarbon group, preferably 3 to 30, and more preferably 3 to 20; and in a case of a cyclic hydrocarbon group, 6 to 20. Specific examples of $R_3$ include the specific examples of the alkyl group and the cycloalkyl group as $Z_{ka1}$ as described above.

The preferred number of carbon atoms and specific examples of the alkyl group and the cycloalkyl group as $R_4$ and R are the same as those described for the alkyl group and the cycloalkyl group as $Z_{ka1}$ as described above.

The acyl group as $R_4$ is preferably an acyl group having 1 to 6 carbon atoms, and examples thereof include a formyl group, an acetyl group, a propionyl group, a butyryl group, an isobutyryl group, a valeryl group, and a pivaloyl group.

Examples of the alkyl moiety in the alkoxy group and the alkoxycarbonyl group as $R_4$ include a linear, branched, or cyclic alkyl moiety, and the preferred number of carbon atoms and specific examples of the alkyl moiety are the same as those described for the alkyl group and the cycloalkyl group as $Z_{ka1}$ as described above.

Examples of the alkylene group as X include a chained or cyclic alkylene group, and the preferred carbon number and specific examples thereof are the same as those described for the chain alkylene group and the cyclic alkylene group as $R_2$ as described above.

Furthermore, examples of the specific structure of the repeating unit (b) include repeating units having partial structures shown below.

(rf-1)

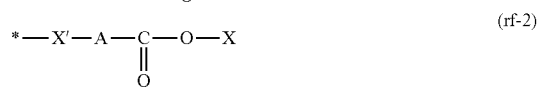

(rf-2)

In General Formulae (rf-1) and (rf-2),

X' represents an electron-withdrawing substituent and is preferably a carbonyloxy group, an oxycarbonyl group, a fluorine atom-substituted alkylene group, or a cycloalkylene group substituted with a fluorine atom.

A represents a single bond or a divalent linking group represented by —C(Rx)(Ry)-, in which Rx and Ry each independently represent a hydrogen atom, a fluorine atom, an alkyl group (preferably having 1 to 6 carbon atoms;

which may be substituted with a fluorine atom or the like), or a cycloalkyl group (preferably having 5 to 12 carbon atoms; which may be substituted with a fluorine atom or the like). Rx and Ry are each preferably a hydrogen atom, an alkyl group, or an alkyl group substituted with a fluorine atom.

X represents an electron-withdrawing group and specific examples thereof include those electron-withdrawing groups as $Y^1$ and $Y^2$ as described above. A fluorinated alkyl group, a fluorinated cycloalkyl group, an aryl group substituted with fluorine, or a fluorinated alkyl group, an aralkyl group substituted with fluorine or a fluorinated alkyl group, a cyano group, and a nitro group are preferable.

* represents a bonding arm to the main chain or the side chain of the resin, that is, a bonding arm which is bonded to the main chain of the resin through a single bond or a linking group.

Incidentally, when X' is a carbonyloxy group or an oxycarbonyl group, A is not a single bond.

The polarity converting group decomposes by the action of an alkali developer to effect polarity conversion, whereby the receding contact angle with water of the resin composition film after alkali development can be decreased. Decrease in the receding contact angle with water of the film after alkali development is preferable from the viewpoint of suppressing the development defect.

The receding contact angle with water of the resin composition film after alkali development is preferably 50° or less, more preferably 40° or less, still more preferably 35° or less, and most preferably 30° or less, at a temperature of 23° C.±3° C. and a humidity of 45%±5%.

The receding contact angle refers to a contact angle determined when the contact line at a droplet-substrate interface draws back. It is generally known that the receding contact angle is useful in the simulation of droplet mobility in a dynamic condition. In brief, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as a dilation/contraction method.

The receding contact angle of the film after alkali development is a contact angle in a case where the contact angle for the films described later is measured by an expansion/contraction method described in Examples described later. That is, an organic antireflection film ARC29A (manufactured by Nissan Chemical Industries, Ltd.) is applied onto a silicon wafer (with an opening diameter of 8 inches) and baked at 205° C. for 60 seconds to form an antireflection film having a film thickness of 98 nm. The composition of the present invention was applied thereonto and baked at 120° C. for 60 seconds to form a film having a film thickness of 120 nm. This film was developed with an aqueous tetramethylammonium hydroxide solution (2.38% by mass) for 30 seconds, rinsed with pure water, and then spin-dried to obtain the film, on which the contact angle was measured by an expansion/contraction method.

The hydrolysis rate of the resin (B) for an alkali developer is preferably 0.001 nm/sec or more, more preferably 0.01 nm/sec or more, still more preferably 0.1 nm/sec or more, and most preferably 1 nm/sec or more.

Here, the hydrolysis rate of the resin (B) for an alkali developer is a rate at which the film thickness of a resin film formed of only the resin (B) decreases when being treated with aqueous tetramethylammonium hydroxide (TMAH) solution (2.38% by mass) at 23° C.

It is thought that a resist composition including a resin having a phenolic hydroxyl group and a crosslinking agent generates scum due to a sparingly soluble layer formed on the surface. In contrast, the resin (C) of the present invention is hydrophobic during the formation of a resist film and unevenly distributed on the surface of a film, while decomposes by the action of an alkali developer during the development to perform polarity conversion, and thus, hydrophobicized on the film surface. In this regard, it is thought that scum is drastically reduced due to the suppression of formation of the sparingly soluble layer on the surface.

Moreover, the repeating unit (b) is more preferably a repeating unit having at least two or more polarity converting groups.

In a case where the repeating unit (b) has at least two polarity converting groups, the repeating unit preferably has a group containing a partial structure having two polarity converting groups represented by General Formula (KY-1). Incidentally, in a case where the structure represented by General Formula (KY-1) does not have a bonding arm, this is a group containing a monovalent or higher valent group formed by removing at least one arbitrary hydrogen atom from the structure.

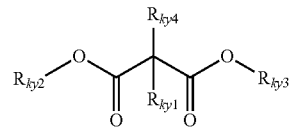

(KY-1)

In General Formula (KY-1), $R_{ky1}$ and $R_{ky4}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amido group, or an aryl group. Alternatively, $R_{ky1}$ and $R_{ky4}$ may be bonded to the same atom to form a double bond. For example, $R_{ky1}$ and $R_{ky4}$ may be bonded to the same oxygen atom to form a part (=O) of a carbonyl group.

$R_{ky2}$ and $R_{ky3}$ are each independently an electron-withdrawing group, or $R_{ky1}$ and $R_{ky2}$ are linked to each other to form a lactone ring and $R_{ky3}$ is an electron-withdrawing group. The lactone ring formed is preferably a structure of (KA-1-1) to (KA-1-17). Examples of the electron-withdrawing group are the same as those for $Y_1$ and $Y_2$ in Formula (KB-1), and a halogen atom and the halo(cyclo)alkyl or haloaryl group represented by —C($R_{f1}$)($R_{f2}$)—$R_{f3}$ are preferable. Preferably, $R_{ky3}$ is a halogen atom or the halo(cyclo)alkyl or haloaryl group represented by —C($R_{f1}$)($R_{f2}$)—$R_{f3}$, and $R_{ky2}$ is linked to $R_{ky1}$ to form a lactone ring or is an electron-withdrawing group containing no halogen atom.

$R_{ky1}$, $R_{ky2}$, and $R_{ky4}$ may be linked to one another to form a monocyclic or polycyclic structure.

Specific examples of $R_{ky1}$ and $R_{ky4}$ include the same groups as $Z_{ka1}$ in Formula (KA-1).

As the lactone ring formed by the mutual linking of $R_{ky1}$ and $R_{ky2}$, the structures of (KA-1-1) to (KA-1-17) are preferable. Examples of the electron-withdrawing group include the same ones as those for $Y_1$ and $Y_2$ in Formula (KB-1).

As the structure represented by General Formula (KY-1), a structure represented by General Formula (KY-2) is more preferable. Incidentally, the structure represented by General Formula (KY-2) is a group having a monovalent or higher valent group formed by removing at least one arbitrary hydrogen atom from the structure.

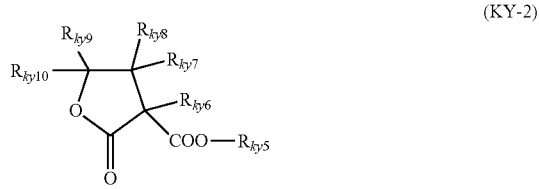

(KY-2)

In Formula (KY-2), $R_{ky6}$ to $R_{ky10}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amido group, or an aryl group.

Two or more members of $R_{ky6}$ to $R_{ky10}$ may be linked to each other to form a monocyclic or polycyclic structure.

$R_{ky5}$ represents an electron-withdrawing group. Examples of the electron-withdrawing group include the same ones as those for $Y_1$ and $Y_2$, and a halogen atom and a halo(cyclo)alkyl or a haloaryl group represented by —C($R_{f1}$)($R_{f2}$)—$R_{f3}$ are preferable.

Specific examples of $R_{ky5}$ to $R_{ky10}$ include the same groups as those for $Z_{ka1}$ in Formula (KA-1).

The structure represented by Formula (KY-2) is more preferably a partial structure represented by General Formula (KY-3).

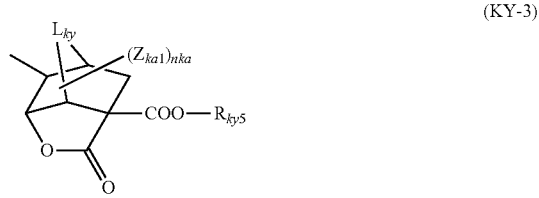

(KY-3)

In Formula (KY-3), $Z_{ka1}$ and nka have the same definitions as in General Formula (KA-1). $R_{ky5}$ has the same definition as in Formula (KY-2).

$L_{ky}$ represents an alkylene group, an oxygen atom, or a sulfur atom. Examples of the alkylene group in $L_{ky}$ include a methylene group and an ethylene group. $L_{ky}$ is preferably an oxygen atom or a methylene group, and more preferably a methylene group.

The repeating unit (b) is not limited as long as it is a repeating unit obtained by polymerization such as addition polymerization, condensation polymerization, and addition condensation, but this repeating unit is preferably a repeating unit obtained by addition polymerization of a carbon-carbon double bond. Examples thereof include an acrylate-based repeating unit (including a system having a substituent at the α- or β-position), a styrene-based repeating unit (including a system having a substituent at the α- or β-position), a vinyl ether-based repeating unit, a norbornene-based repeating unit, and a maleic acid derivative (such as maleic acid anhydride, a derivative thereof, and maleimide) repeating unit. An acrylate-based repeating unit, a styrene-based repeating unit, a vinyl ether-based repeating unit and a norbornene-based repeating unit are preferable, an acrylate-based repeating unit, a vinyl ether-based repeating unit and a norbornene-based repeating unit are more preferable, and an acrylate-based repeating unit is the most preferable.

In a case where the repeating unit (b) is a repeating unit having at least one of a fluorine atom or a silicon atom (that is, a repeating unit corresponding to the repeating unit (b') or (b")), examples of the fluorine atom-containing partial structure in the repeating unit (b) are the same as those in the repeating unit having at least one of a fluorine atom or a silicon atom described above, and the groups represented by General Formulae (F2) to (F4) described above are preferred. Further, examples of the silicon atom-containing partial structure in the repeating unit (b) are the same as those in the repeating unit having at least one of a fluorine atom or a silicon atom described above, and the groups represented by General Formulae (CS-1) to (CS-3) described above are preferred.

Specific examples of the repeating unit (b) having a group that increases the solubility in an alkali developer are shown below, but the present invention is not limited thereto. Specific examples of the repeating unit (b) also include those described as specific examples of the repeating unit (a3) of the resin (C).

Ra represents a hydrogen atom, a fluorine atom, a methyl group, or a trifluoromethyl group.

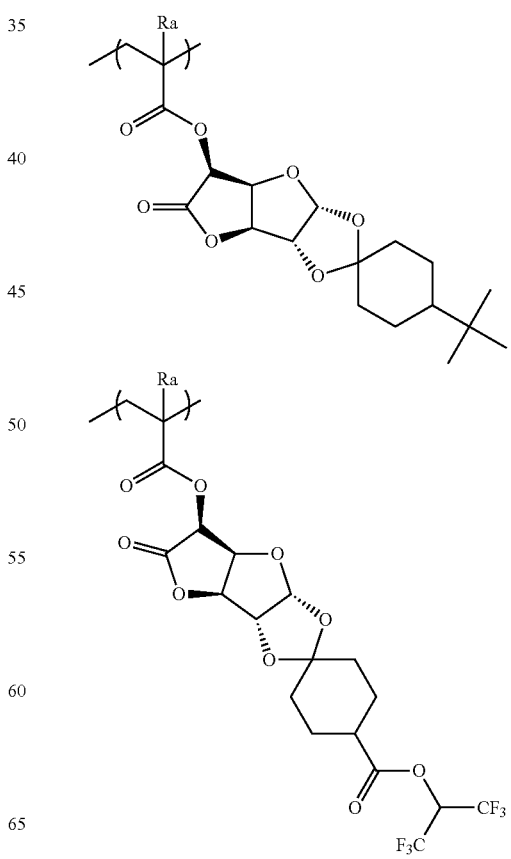

65
-continued
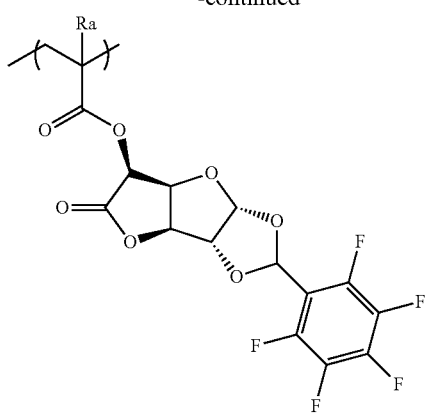
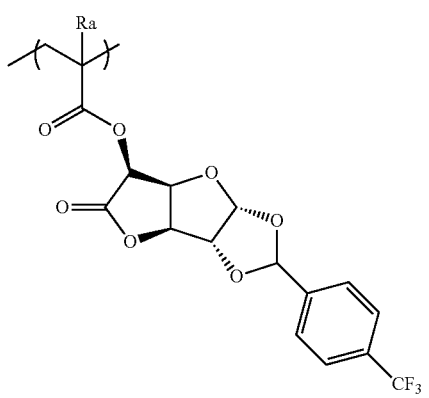
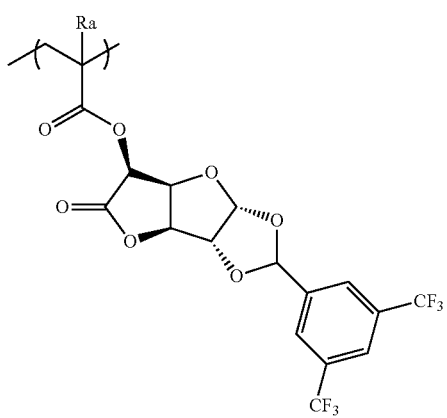
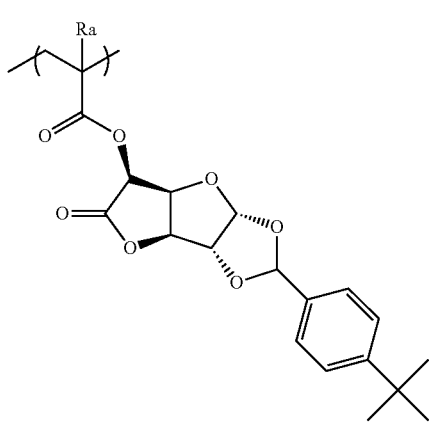
66
-continued
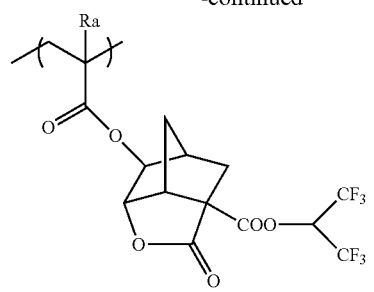
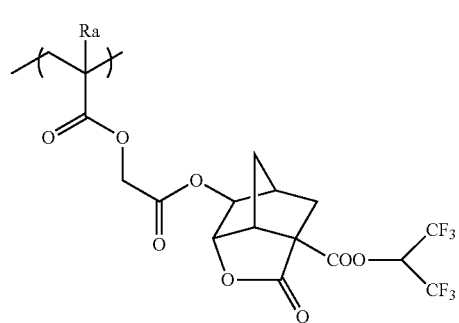
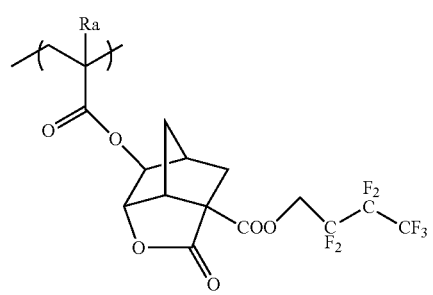
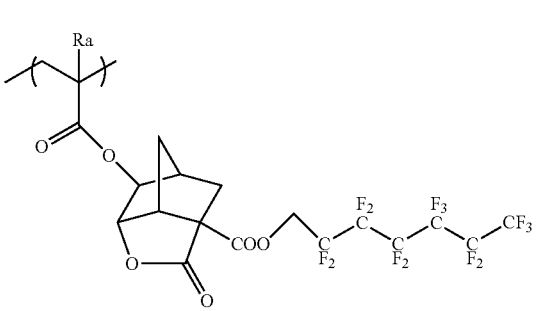
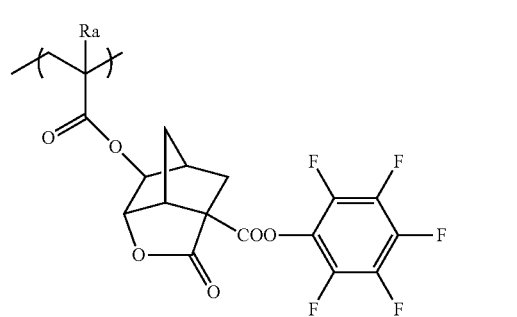

67
-continued
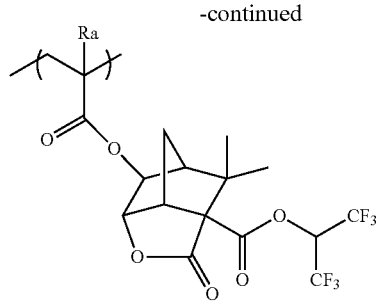
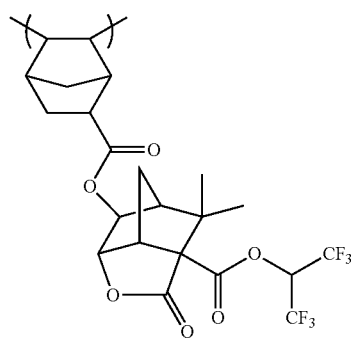
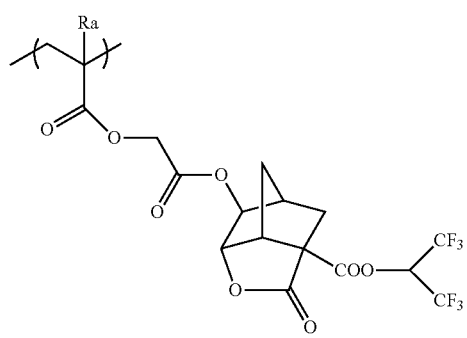
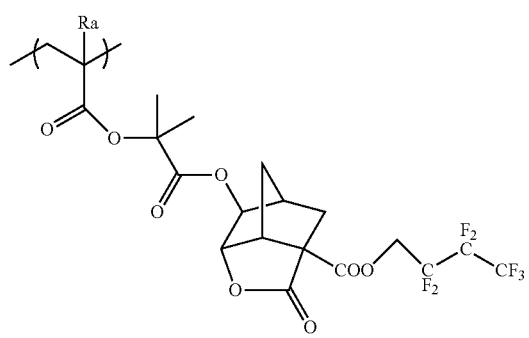
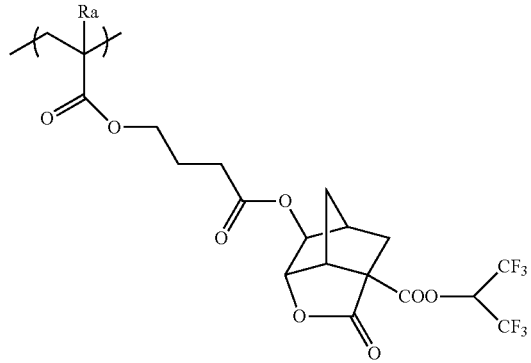
68
-continued
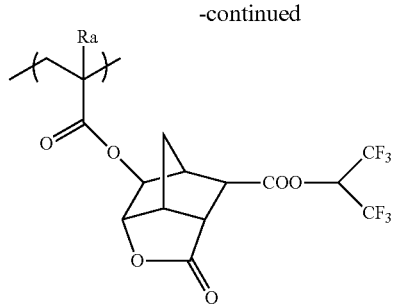
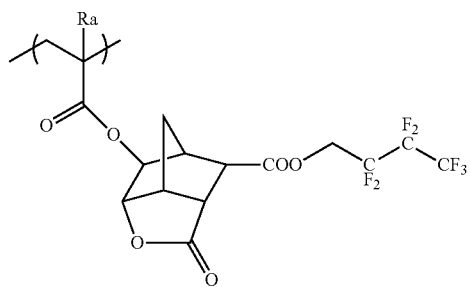
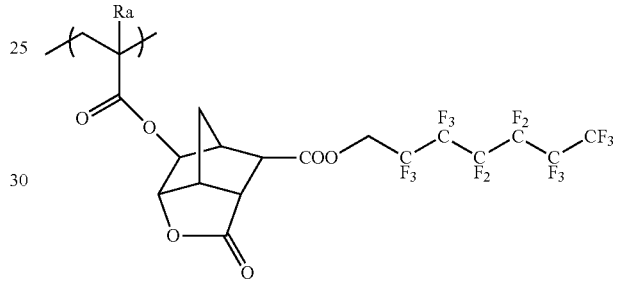
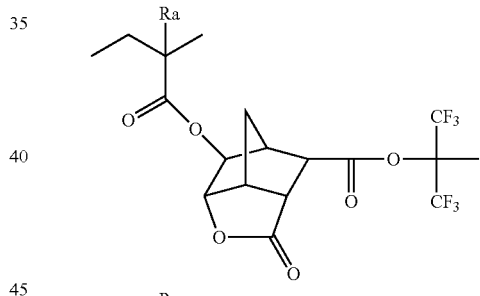
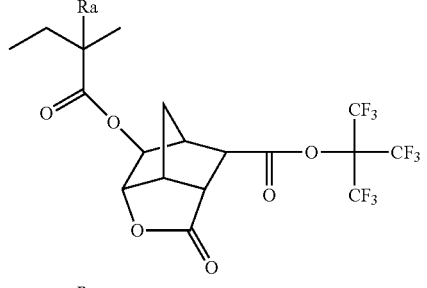
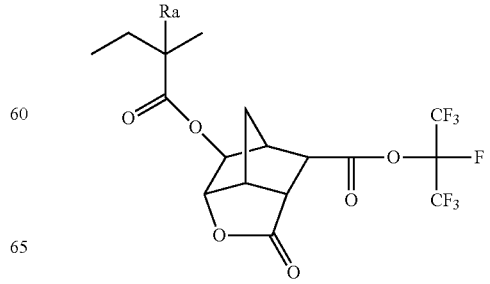

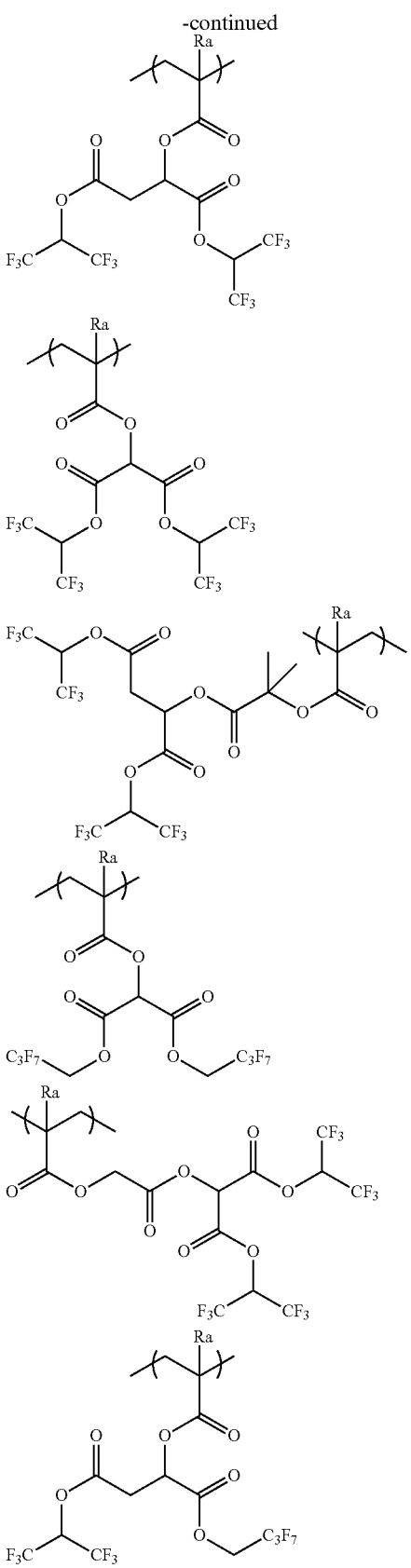

In the resin (B) the content of the repeating unit (b) is preferably 1% to 98% by mole, more preferably 3 to 98% by mole, more preferably 5 to 97% by mole, most preferably 10 to 95% by mole, with respect to all repeating units in the resin (B).

The content of the repeating unit (b') is preferably 1 to 100% by mole, more preferably 3% to 99% by mole, still more preferably 5% to 97% by mole, and most preferably 10% to 95% by mole, with respect to all repeating units in the resin (B).

The content of the repeating unit (b*) is preferably 1% to 90% by mole, more preferably 3% to 80% by mole, still more preferably 5% to 70% by mole, and most preferably 10% to 60% by mole, with respect to all repeating units in the resin (B). The content of the repeating unit having at least one of a fluorine atom or a silicon atom, which is used together with the repeating unit (b*), is preferably 10% to 99% by mole, more preferably 20% to 97% by mole, still more preferably 30% to 95% by mole, and most preferably 40% to 90% by mole, with respect to all repeating units in the resin (B).

The content of the repeating unit (b") is preferably 1% to 100% by mole, more preferably 3% to 99% by mole, still more preferably 5% to 97% by mole, and most preferably 10% to 95% by mole, with respect to all repeating units in the resin (B).

The resin (B) may further contain a repeating unit represented by General Formula (CIII).

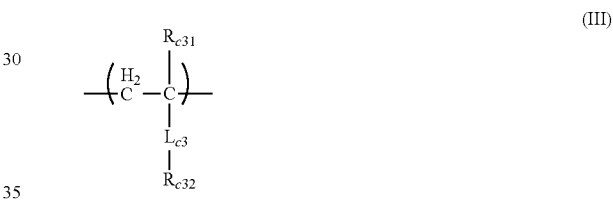

(III)

In General Formula (CIII), $R_{c31}$ represents a hydrogen atom, an alkyl group or an alkyl group which may be substituted with fluorine, a cyano group, or a —$CH_2$—O-$Rac_2$ group. In the formula, $Rac_2$ represents a hydrogen atom, an alkyl group, or an acyl group. $R_{c31}$ is preferably a hydrogen atom, a methyl group, a hydroxymethyl group, or a trifluoromethyl group, and particularly preferably a hydrogen atom or a methyl group.

$R_{c32}$ represents a group having an alkyl group, a cycloalkyl group, an alkenyl group, a cycloalkenyl group, or an aryl group. These groups may be substituted with a group containing a fluorine atom or a silicon atom, or the like.

$L_{c3}$ represents a single bond or a divalent linking group.

In General Formula (CIII), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, and more preferably a phenyl group or a naphthyl group, and these may have a substituent.

$R_{c32}$ is preferably an unsubstituted alkyl group or an alkyl group substituted with a fluorine atom.

The divalent linking group of $L_{c3}$ is preferably an alkylene group (preferably having 1 to 5 carbon atoms), an oxy group, a phenylene group, or an ester bond (a group represented by —COO—).

It is also preferable that the resin (B) further has a repeating unit represented by General Formula (BII-AB)

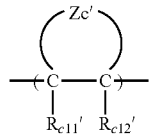

(BII-AB)

In Formula (BII-AB), $R_{c11}'$ and $R_{c12}'$ each independently represent a hydrogen atom, a cyano group, a halogen atom, or an alkyl group.

Zc' represents an atomic group for forming an alicyclic structure containing two carbon atoms (C—C) to which Zc' is bonded.

In a case where each group in the repeating units represented by General Formulae (III) and (BII-AB) is substituted with a group containing a fluorine atom or a silicon atom, the repeating unit corresponds also to the repeating unit having at least one of a fluorine atom or a silicon atom.

Specific examples of the repeating units represented by General Formulae (III) and (BII-AB) are shown below, but the present invention is not limited thereto. In the formulae, Ra represents H, $CH_3$, $CH_2OH$, $CF_3$, or CN. Incidentally, the repeating unit in a case where Ra is $CF_3$ corresponds also to the repeating unit having at least one of a fluorine atom or a silicon atom.

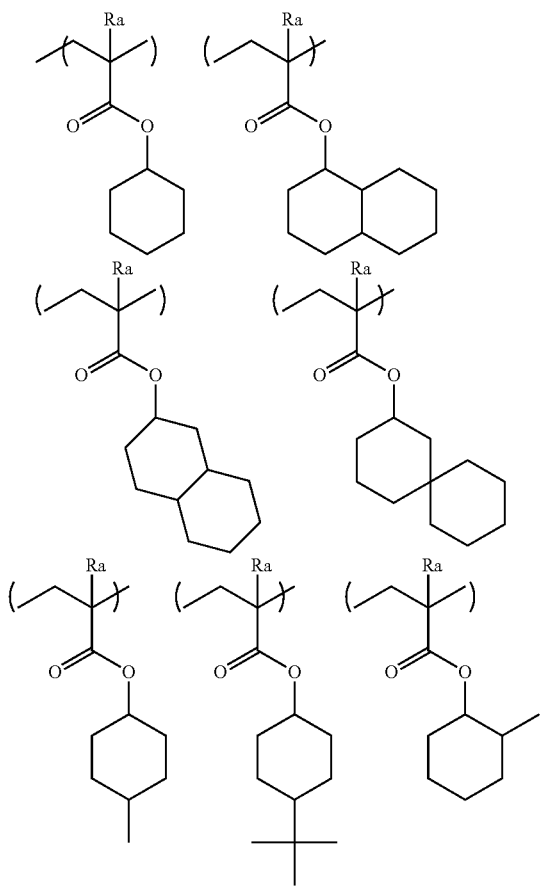

-continued

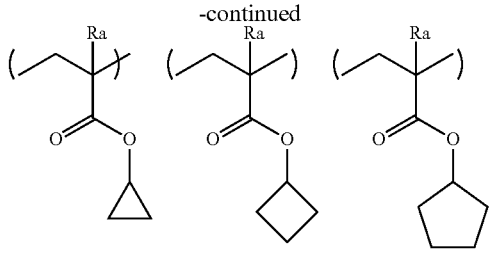

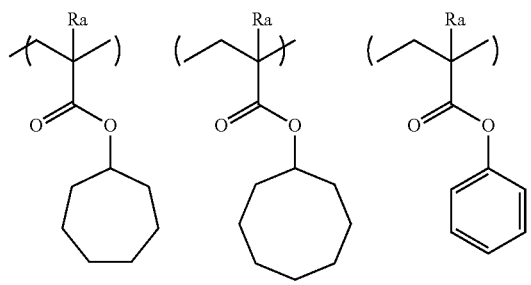

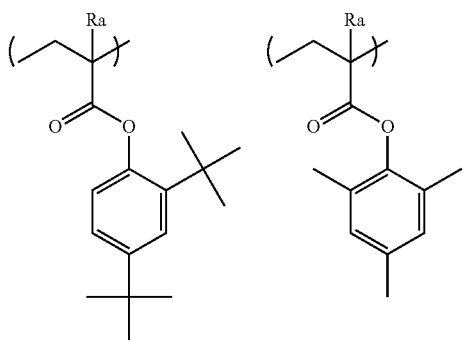

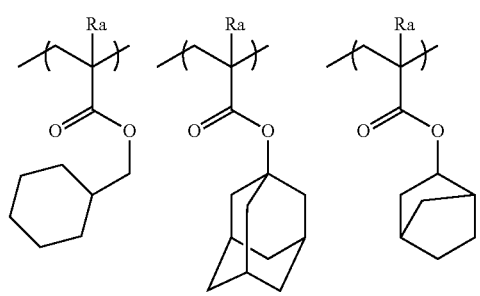

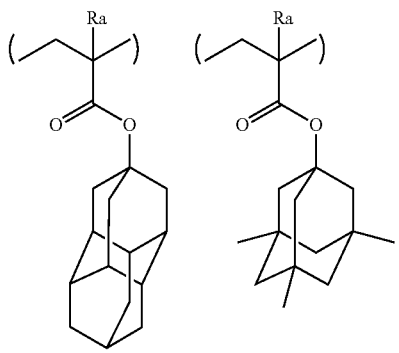

-continued

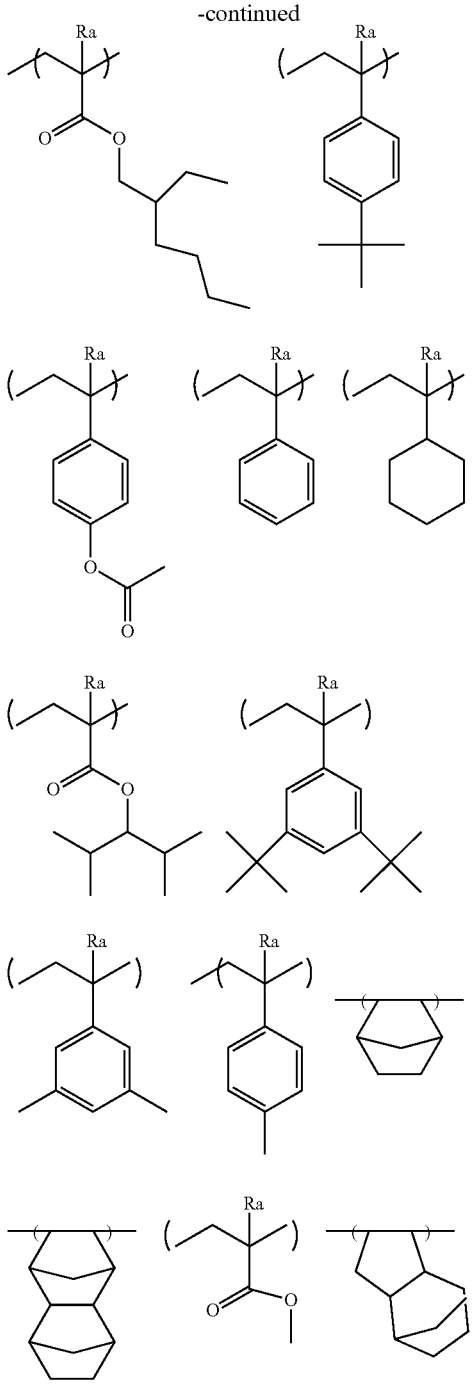

In the resin (B), it is of course preferable that the content of impurities such as a metal is small, but the content of residual monomers or oligomer components is preferably 0% to 100/% by mass, more preferably 0% to 5% by mass, and still more preferably 0% to 1% by mass. In this case, a resist composition free from extraneous substances in the liquid or change with aging of sensitivity or the like can be obtained. Further, from the viewpoints of a resolution, a resist profile, the side wall of a resist pattern, a roughness, and the like, the molecular weight distribution (Mw/Mn, sometimes referred to as "dispersity") is preferably in the range of 1 to 3, more preferably in the range of 1 to 2, still more preferably in the range of 1 to 1.8, and most preferably in the range of 1 to 1.5.

As for the resin (B), various commercially available products may be used, or the resin may be synthesized by an ordinary method (for example, radical polymerization). Examples of the general synthesis method include a batch polymerization method of dissolving monomer species and an initiator in a solvent and heating the solution, thereby affecting the polymerization, and a dropping polymerization method of adding a solution containing monomer species and an initiator dropwise to a heated solvent over 1 to 10 hours, with the dropping polymerization method being preferable.

Specific examples of the resin (B) are shown below. Further, the molar ratio of repeating units (corresponding to the respective repeating units in order starting from the left), the weight-average molecular weight, and the dispersity of each resin are shown in the table described below.

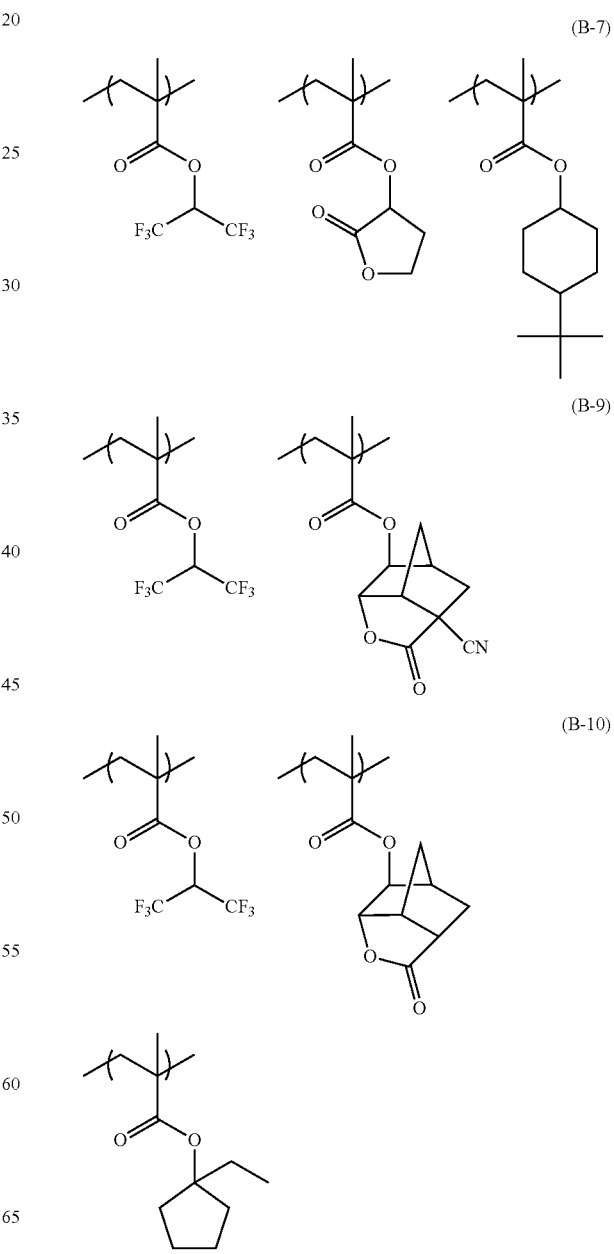

(B-11) 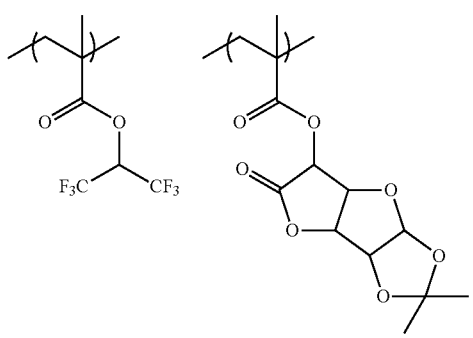
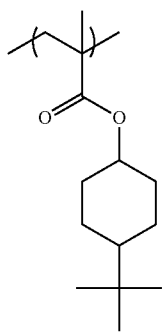
(B-12) 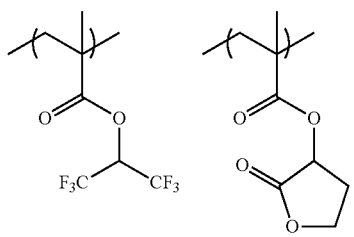
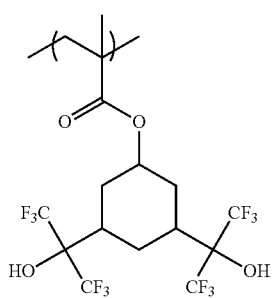
(B-13) 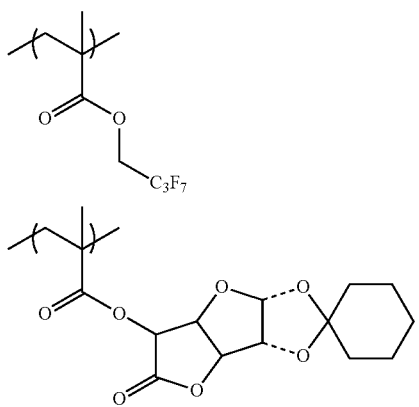
(B-21) 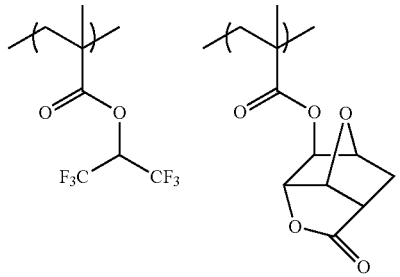
(B-22) 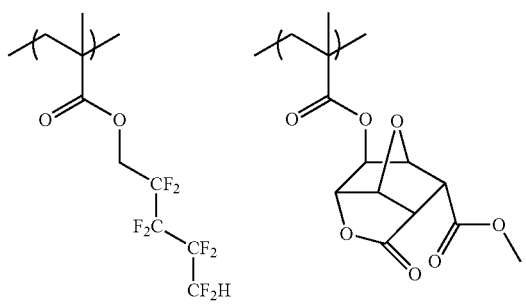
(B-23) 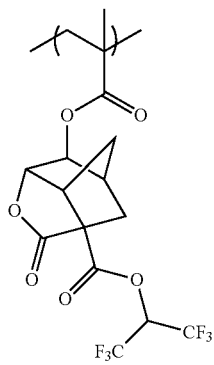
(B-24) 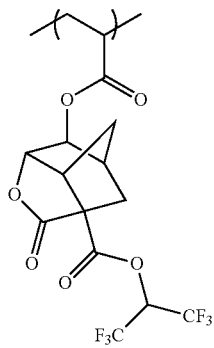

-continued (B-25)

(B-26)

(B-27)

(B-28)

(B-29)

(B-30)

(B-31)

(B-32)
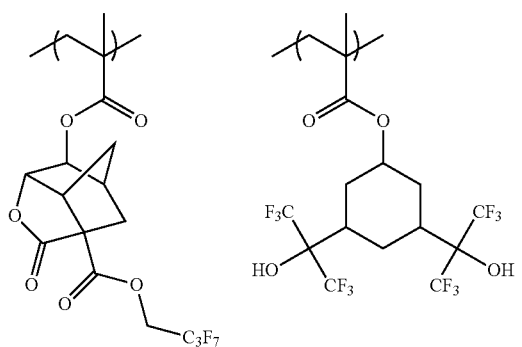
(B-33)
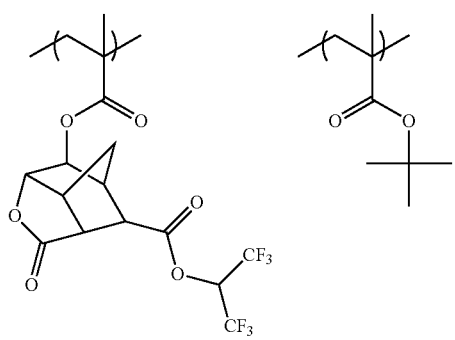
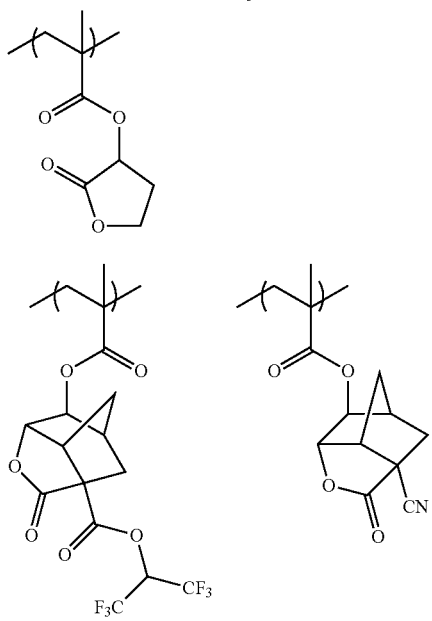
(B-34)
(B-35)
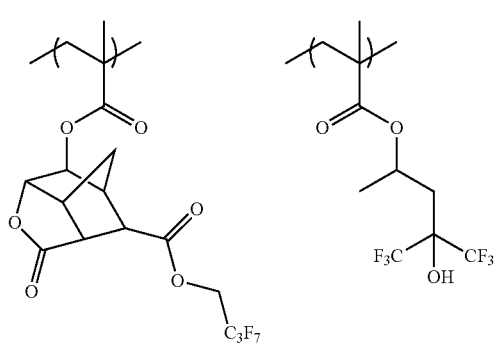
(B-36)
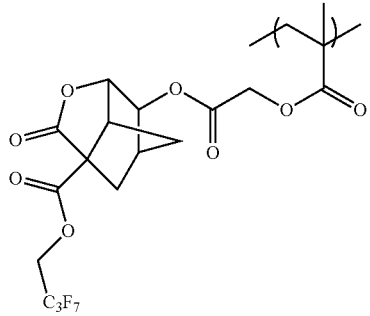
(B-37)
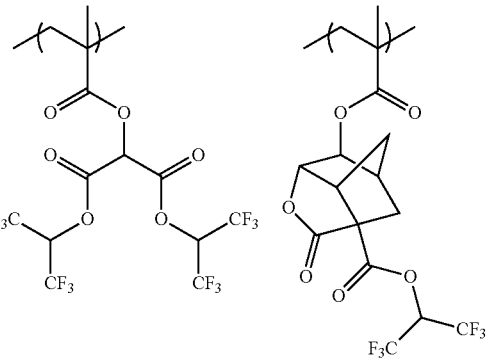
(B-38)
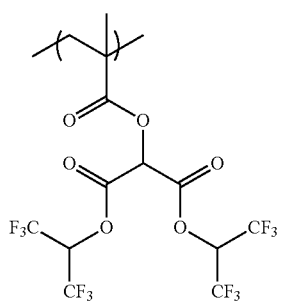
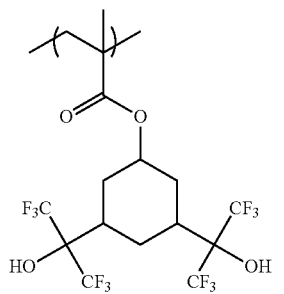
(B-39)
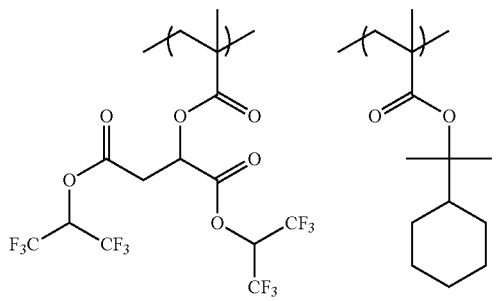

(B-40)
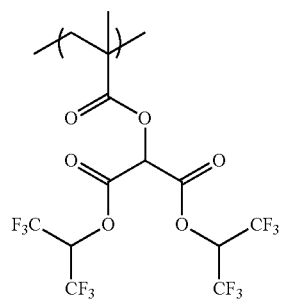
(B-41)
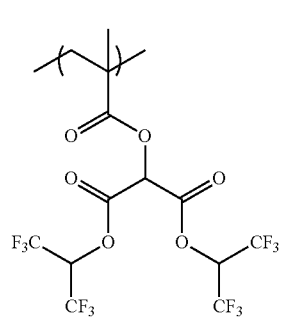
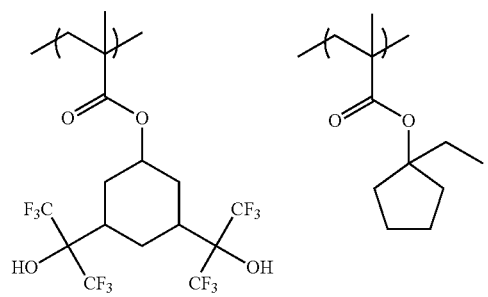
(B-42)
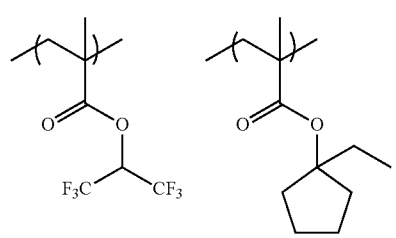
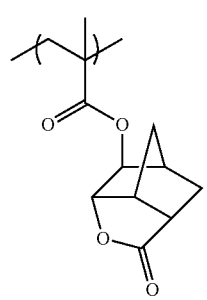
(B-43)
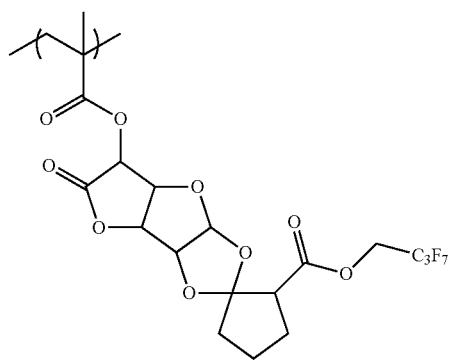
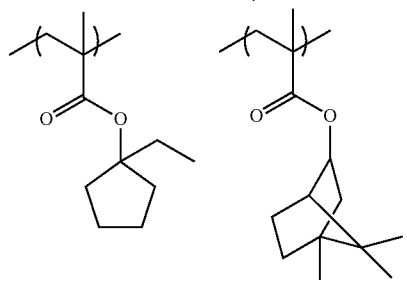
(B-44)
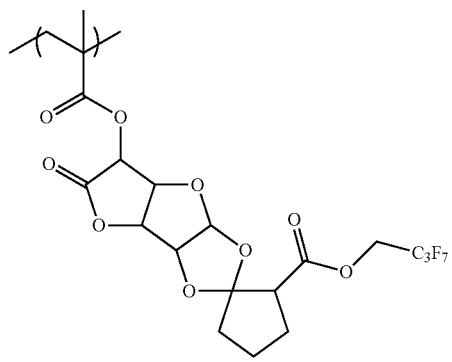
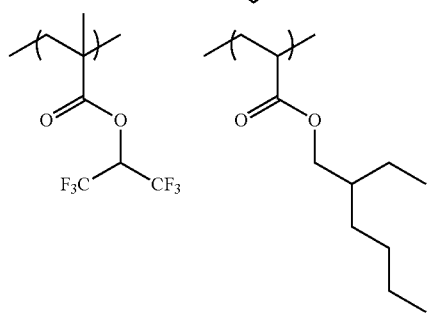
(B-45)
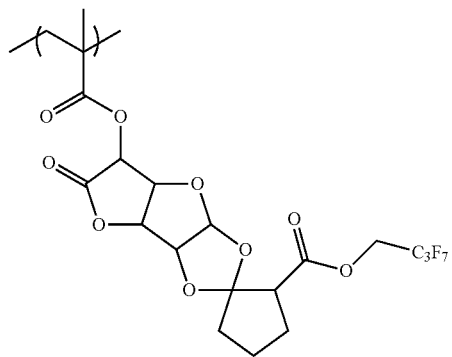

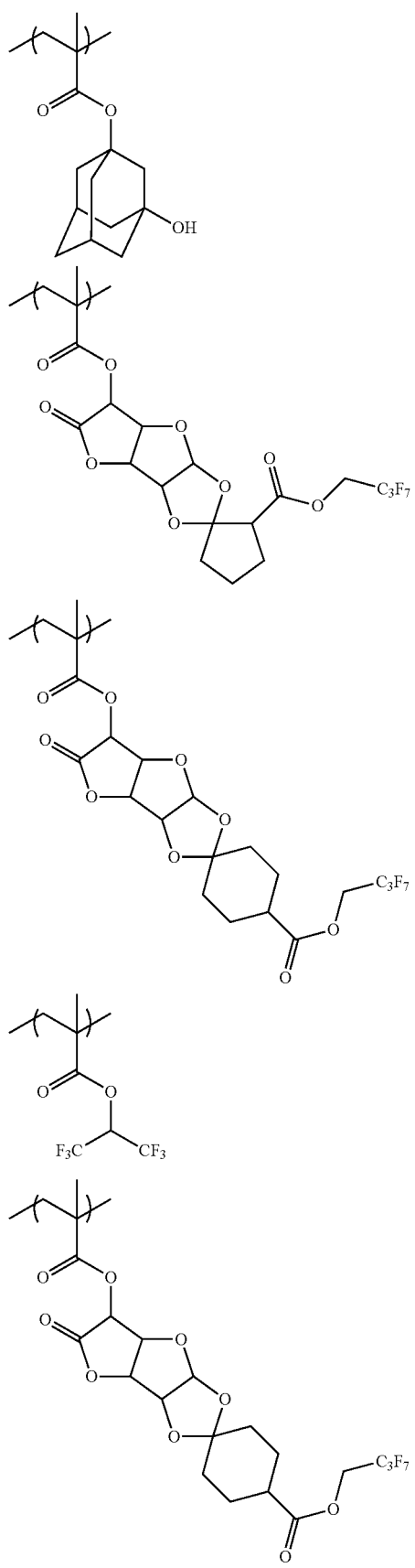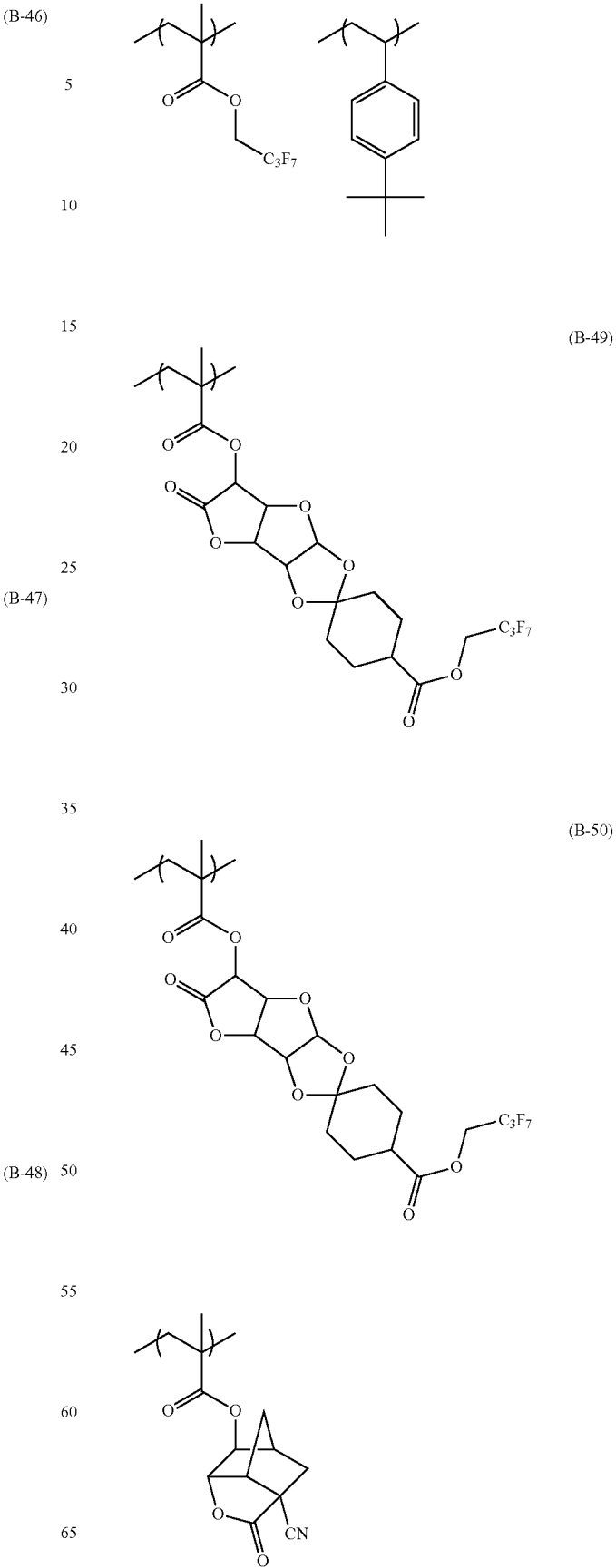

(B-51)
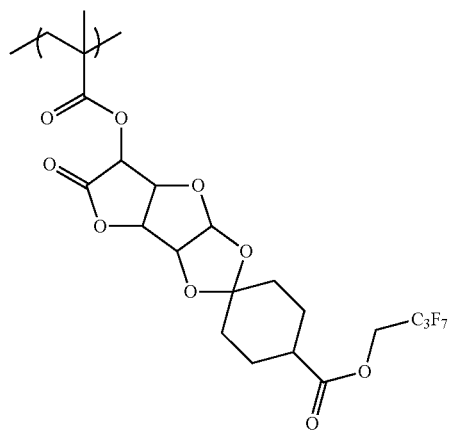
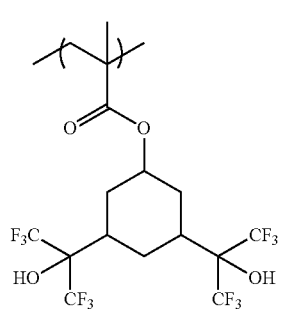
(B-52)
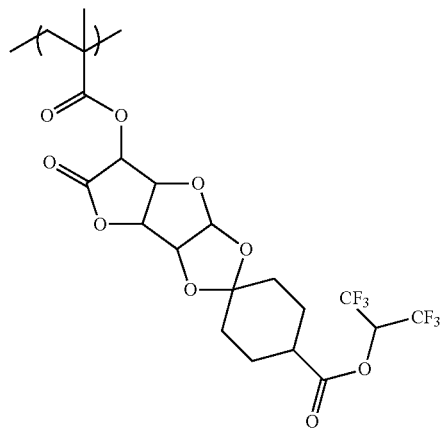
(B-53)
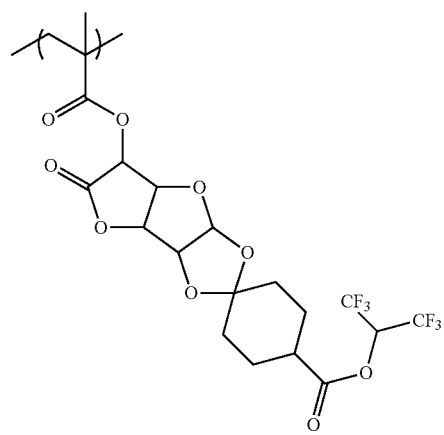
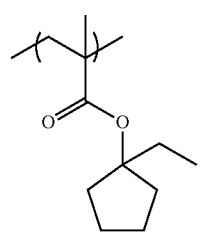
(B-54)
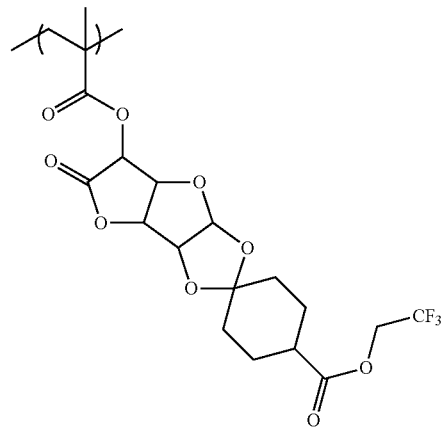
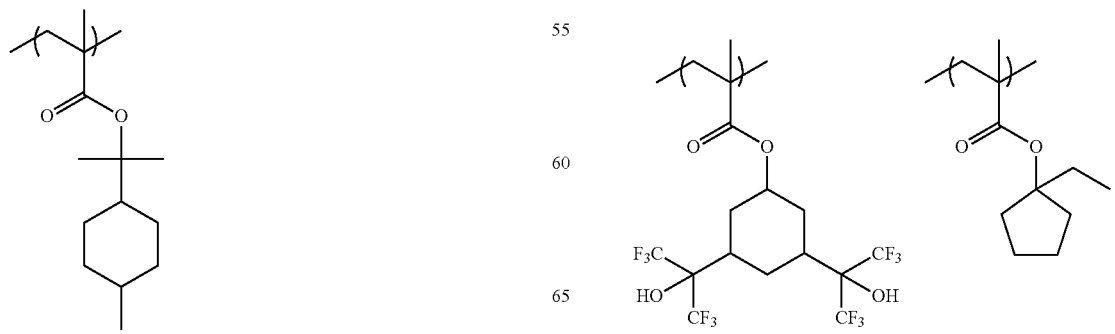

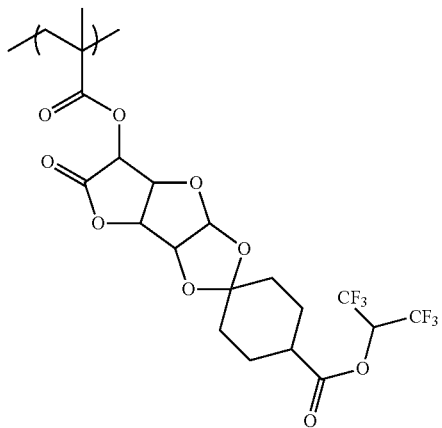
(B-55)
(B-56)
(B-57)
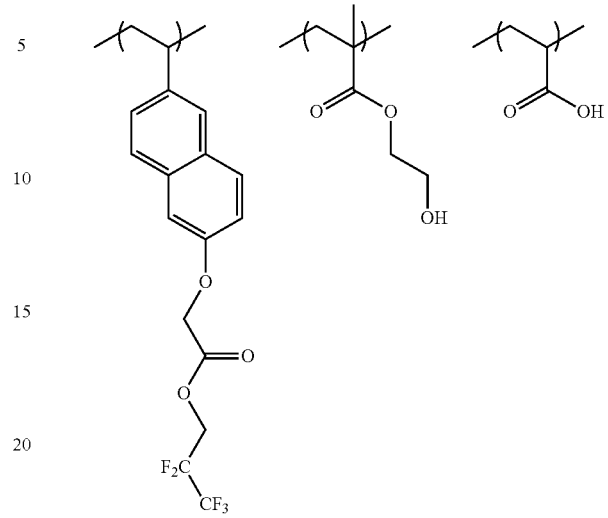
(B-58)
TABLE 1
| Polymer | Compositional ratio (% by mole) | Mw | Mw/Mn |
|---|---|---|---|
| B-7 | 30/40/30 | 8,000 | 1.4 |
| B-9 | 50/50 | 6,000 | 1.4 |
| B-10 | 40/40/20 | 7,000 | 1.4 |
| B-11 | 40/30/30 | 9,000 | 1.6 |
| B-12 | 30/30/40 | 6,000 | 1.4 |
| B-13 | 60/40 | 9,500 | 1.4 |
| B-21 | 50/50 | 6,000 | 1.6 |
| B-22 | 40/60 | 9,600 | 1.3 |
| B-23 | 100 | 20,000 | 1.7 |
| B-24 | 100 | 25,000 | 1.4 |
| B-25 | 100 | 15,000 | 1.7 |
| B-26 | 100 | 12,000 | 1.8 |
| B-27 | 100 | 18,000 | 1.3 |
| B-28 | 70/30 | 15,000 | 2.0 |
TABLE 2
| Polymer | Compositional ratio (% by mole) | Mw | Mw/Mn |
|---|---|---|---|
| B-29 | 80/15/5 | 18,000 | 1.8 |
| B-30 | 60/40 | 25,000 | 1.8 |
| B-31 | 90/10 | 19,000 | 1.6 |
| B-32 | 60/40 | 20,000 | 1.8 |
| B-33 | 50/30/20 | 11,000 | 1.6 |
| B-34 | 60/40 | 12,000 | 1.8 |
| B-35 | 60/40 | 15,000 | 1.6 |
| B-36 | 100 | 22,000 | 1.8 |
| B-37 | 20/80 | 35,000 | 1.6 |
| B-38 | 30/70 | 12,000 | 1.7 |
| B-39 | 30/70 | 9,000 | 1.5 |
| B-40 | 100 | 9,000 | 1.5 |
| B-41 | 40/15/45 | 12,000 | 1.9 |
| B-42 | 30/30/40 | 13,000 | 2.0 |
| B-43 | 40/40/20 | 23,000 | 2.1 |
| B-44 | 65/30/5 | 25,000 | 1.6 |
| B-45 | 100 | 15,000 | 1.7 |
| B-46 | 20/80 | 9,000 | 1.7 |
| B-47 | 70/30 | 18,000 | 1.5 |
| B-48 | 60/20/20 | 18,000 | 1.8 |
| B-49 | 100 | 12,000 | 1.4 |
| B-50 | 60/40 | 20,000 | 1.6 |
| B-51 | 70/30 | 33,000 | 2.0 |
| B-52 | 60/40 | 19,000 | 1.8 |
| B-53 | 50/50 | 15,000 | 1.5 |

TABLE 2-continued

| Polymer | Compositional ratio (% by mole) | Mw | Mw/Mn |
|---|---|---|---|
| B-54 | 40/20/40 | 35,000 | 1.9 |
| B-55 | 100 | 16,000 | 1.4 |

TABLE 3

| Polymer | Compositional ratio (% by mole) | Mw | Mw/Mn |
|---|---|---|---|
| B-56 | 90/10 | 5,200 | 1.8 |
| B-57 | 80/20 | 4,400 | 1.7 |
| B-58 | 59/27/14 | 13,000 | 1.6 |

By incorporating a hydrophobic resin (B) containing at least one of a fluorine atom or a silicon atom into the actinic ray-sensitive or radiation-sensitive resin composition of the present invention, the resin (B) is unevenly distributed to the surface layer of a film formed of the actinic ray-sensitive or radiation-sensitive resin composition, so that in a case where the immersion medium is water, the receding contact angle for water on the film surface as well as the followability of the immersion liquid can be enhanced.

In addition, it is presumed that the formation of a sparingly soluble material is suppressed by making the resin (B) unevenly distributed on the surface layer of the film, and thus, scum is drastically reduced. By this, it is presumed that while maintaining various characteristics such as the collapse performance of a pattern, the generation of scum can be suppressed.

The receding contact angle of a film after baking a coating film formed of the actinic ray-sensitive or radiation-sensitive resin composition of the present invention but before exposure is preferably 60° to 90°, more preferably 650 or more, still more preferably 700 or more, and particularly preferably 75° or more, at the temperature during exposure, usually room temperature 23±3° C. and a humidity of 45±5%.

The resin (B) is unevenly distributed to the interface as described above, but unlike a surfactant, does not need to necessarily have a hydrophilic group in the molecule and may not contribute to uniform mixing of polar/nonpolar substances.

In the liquid immersion exposing step, the immersion liquid must move on a wafer following the movement of an exposure head that scans the wafer at a high speed and forms an exposure pattern. Therefore, the contact angle of the immersion liquid with the resist film in a dynamic state is important, and the resist is required to have a performance of allowing a liquid droplet to follow the high-speed scanning of an exposure head with none remaining.

The resin (B) is hydrophobic and therefore, liable to worsen the development residue (scum) and BLOB defect after alkali development, but by virtue of having three or more polymer chains through at least one branch part, the alkali dissolution rate is enhanced as compared with a linear chain-type resin and in turn, the performance in terms of development residue (scum) and the BLOB defect is improved.

In a case where the resin (B) has a fluorine atom, the content of the fluorine atom is preferably 5% to 80% by mass, and more preferably 10% to 80% by mass, with respect to the weight-average molecular weight of the resin (B). Further, the repeating unit containing the fluorine atom preferably accounts for 10% to 100% by mass, and more preferably 30% to 100% by mass, with respect to all repeating units in the resin (B).

In a case where the resin (B) has a silicon atom, the content of the silicon atom is preferably 2% to 50% by mass, and more preferably 2% to 30% by mass, with respect to the molecular weight of the resin (B). Further, the repeating unit containing the silicon atom preferably accounts for 10% to 90% by mass, and more preferably 20% to 80% by mass, with respect to all repeating units in the resin (B).

The weight-average molecular weight of the resin (B) is preferably 1,000 to 100,000, more preferably 2,000 to 50,000, and more preferably 3,000 to 30,000. Here, the weight-average molecular weight of the resin is measured by the above-mentioned method.

The content of the resin (B) in the actinic ray-sensitive or radiation-sensitive resin composition of the present invention is preferably 0.01% to 20% by mass, more preferably 0.1% to 15% by mass, still more preferably 0.1% to 10% by mass, and particularly preferably 0.5% to 8% by mass, with respect to the total solid content of the actinic ray-sensitive or radiation-sensitive resin composition.

The resin (B) can be used singly or in combination of two or more kinds thereof.

[Resin (C) Having Phenolic Hydroxyl Group]

The actinic ray-sensitive or radiation-sensitive resin composition of the present invention contains a resin (C) having a phenolic hydroxyl group (also referred to as a "resin (C)") other than the resin (B).

The phenolic hydroxyl group in the present invention is a group formed by substituting a hydrogen atom of the aromatic ring group with a hydroxyl group. The aromatic ring of the aromatic ring group is a monocyclic or polycyclic aromatic ring, and examples thereof include a benzene ring and a naphthalene ring.

The resin (C) is preferably a resin having a repeating unit represented by General Formula (30).

General Formaula (30)

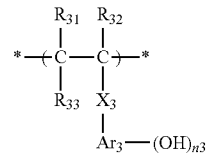

In General Formula (30), $R_{31}$, $R_{32}$, and $R_{33}$ each independently represent a hydrogen atom, an alkyl group, a cycloalkyl group, a halogen atom, a cyano group, or an alkoxycarbonyl group. $R_{33}$ may be bonded to $Ar_3$ to form a ring, and $R_{33}$ in this case represents an alkylene group.

$X_3$ represents a single bond or a divalent linking group.

$Ar_3$ represents an (n3+1)-valent aromatic ring group, and in a case of being bonded with $R_{33}$ to form a ring, $Ar_3$ represents an (n3+2)-valent aromatic ring group.

n3 represents an integer of 1 to 4.

$Ar_3$ represents an (n3+1)-valent aromatic ring group. The divalent aromatic ring group in a case where n3 is 1 may have a substituent, and preferred examples thereof include arylene groups having 6 to 18 carbon atoms, such as a phenylene group, a tolylene group, a naphthylene group, and an anthracenylene group, and aromatic ring groups including a heterocycle, such as thiophene, furan, pyrrole, benzothiophene, benzofuran, benzopyrrole, triazine, imidazole, benzimidazole, triazole, thiadiazole, and thiazole.

Suitable specific examples of the (n3+1)-valent aromatic ring group in a case where n3 is an integer of 2 or greater can include a group obtained by excluding (n3-1) arbitrary hydrogen atoms from the specific examples described above of the divalent aromatic ring group.

The (n3+1)-valent aromatic ring group may further have a substituent.

Examples of the substituent which the alkylene group and the (n3+1)-valent aromatic ring group described above can have include alkoxy groups such as an alkyl group, a methoxy group, an ethoxy group, a hydroxyethoxy group, a propoxy group, a hydroxypropoxy group, and a butoxy group, and aryl groups such as a phenyl group, mentioned as $R_{51}$ to $R_{53}$ in General Formula (V).

Examples of the divalent linking group of $X_3$ include —COO— and —CONR$_{64}$—.

Examples of the alkyl group of $R_{64}$ in —CONR$_{64}$— ($R_{64}$ represents a hydrogen atom or an alkyl group) represented by $X_3$ include the same groups as the alkyl groups of each of $R_{61}$ to $R_{63}$.

$X_3$ is preferably a single bond, —COO—, or —CONH—, and more preferably a single bond or —COO—.

$Ar_3$ is more preferably an aromatic ring group having 6 to 18 carbon atoms, which may have a substituent, and particularly preferably a benzene ring group, a naphthalene ring group, or a biphenylene ring group.

The repeating unit represented by General Formula (30) preferably has a hydroxystyrene structure. That is, $Ar_3$ is preferably a benzene ring group.

n3 represents an integer of 1 to 4, preferably 1 or 2, and more preferably 1.

The resin (C) may be constituted only with the repeating unit having a phenolic hydroxyl group as described above. The resin (C) may also have the repeating unit which will be described later, in addition to the repeating unit having a phenolic hydroxyl group as described above. In this case, the content of the repeating unit having a phenolic hydroxyl group is preferably 10% to 98% by mole, more preferably 30% to 97% by mole, and still more preferably 40% to 95% by mole, with respect to all the repeating units of the resin (C). With these contents, particularly, in a case where the resist film is a thin film (for example, a case where the thickness of the resist film is 10 to 150 nm), the dissolution rate of an exposed area of a resist film formed using the composition of the present invention in an alkali developer can be more reliably reduced (that is, the dissolution rate of the resist film using the composition of the present invention can be more reliably controlled to an optimal value). As a result, the sensitivity can be more reliably improved.

Hereinafter, specific examples of the repeating unit having a phenolic hydroxyl group are described, but are not limited thereto.

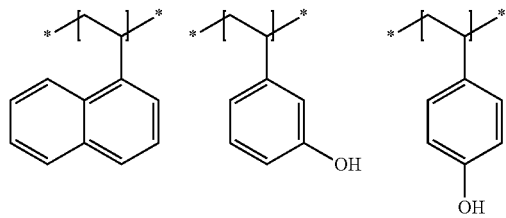

-continued

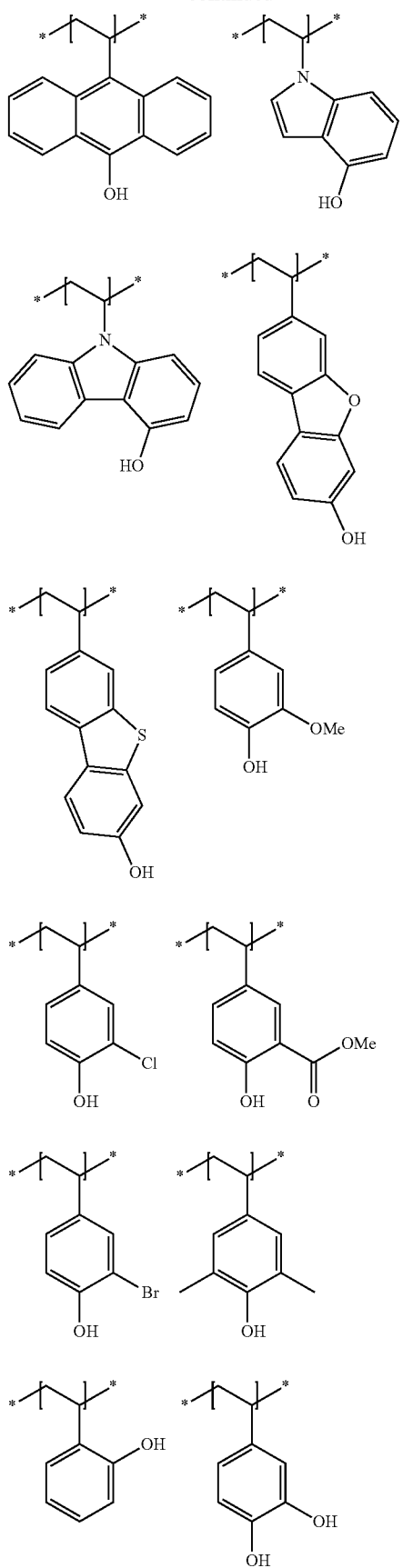

-continued
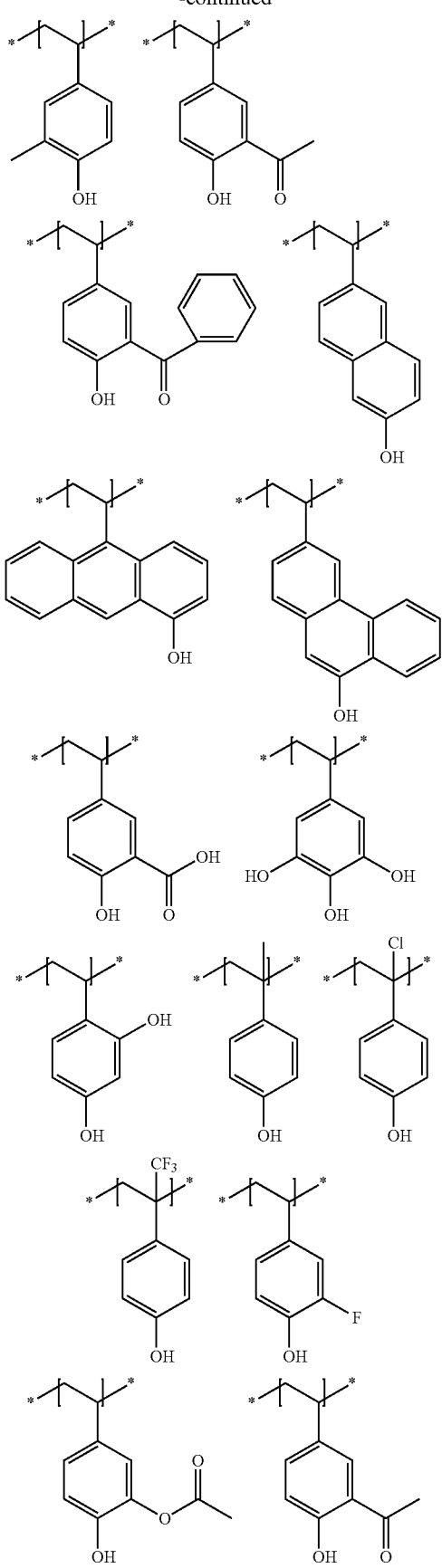
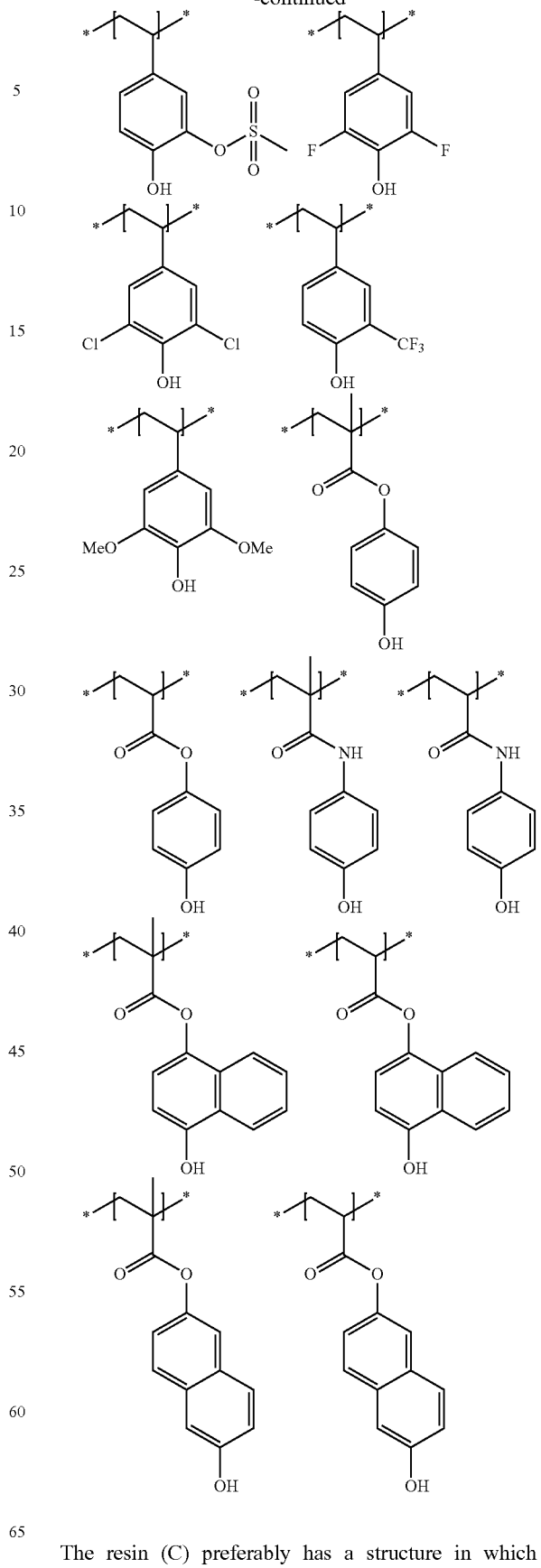
The resin (C) preferably has a structure in which a hydrogen atom of the phenolic hydroxyl group is substituted with a group having non-acid-decomposable alicyclic hydrocarbon structure which is polycyclic, in view that a high glass transition temperature (Tg) is obtained and the dry etching resistance is improved.

When the resin (C) has the above-mentioned specific structure, the glass transition temperature (Tg) of the resin (C) becomes higher, and thus, a highly hard resist film can be formed, and diffusivity or dry etching resistance of an acid can be controlled. Accordingly, since the diffusivity of an acid is highly suppressed in an exposed area with actinic ray or radiation such as electron beams and extreme ultraviolet rays, the resolving power, the pattern shape, and the LER performance of fine patterns are more excellent. Further, it is thought that the resin (C) which has a non-acid-decomposable alicyclic hydrocarbon structure which is polycyclic contributes to further improvement of dry etching resistance. In addition, further details are not clear, but the alicyclic hydrocarbon structure which is polycyclic has high donating properties of a hydrogen radical and becomes a hydrogen source upon decomposition of a photoacid generator, and therefore, it is presumed that the decomposition efficiency of the photoacid generator is further improved, and the acid generating efficiency further increases, which is thought to contribute to more excellent sensitivity.

In the above-mentioned specific structure which the resin (C) may have, an aromatic ring such as a benzene ring and a group having a non-acid-decomposable alicyclic hydrocarbon structure which is polycyclic are linked to each other through an oxygen atom derived from a phenolic hydroxyl group. As described above, the structure can not only contribute to high dry etching resistance, but also enhance the glass transition temperature (Tg) of the resin (C), and it is presumed that a combination thereof provides a higher resolving power.

In the present invention, the non-acid-decomposability means a property that a decomposition reaction does not occur by an acid generated by a photoacid generator.

More specifically, a group having a non-acid-decomposable alicyclic hydrocarbon structure which is polycyclic is preferably a group which is stable against an acid and an alkali. The group which is stable against an acid and an alkali means a group which does not exhibit acid decomposability and alkali decomposability. Here, acid-decomposability means a property that a photoacid generator causes a decomposition reaction by the action of the generated acid.

In addition, the alkali decomposability means a property of causing a decomposition reaction by the action of an alkali developer, and examples of a group exhibiting alkali decomposability include a group (for example, a group having a lactone structure) which is decomposed by the action of an alkali developer known in the related art, included in a resin suitably used in a positive tone and chemical amplification type resist composition, and thus, its dissolution rate in an alkali developer increases.

The group having an alicyclic hydrocarbon structure which is polycyclic is not particularly limited as long as it is a monovalent group having an alicyclic hydrocarbon structure which is polycyclic, but preferably has a total number of carbon atoms of 5 to 40, and more preferably has a total number of carbon atoms of 7 to 30. The alicyclic hydrocarbon structure which is polycyclic may have an unsaturated bond within a ring.

The alicyclic hydrocarbon structure which is polycyclic in the group having an alicyclic hydrocarbon structure which is polycyclic means a structure having a plurality of alicyclic hydrocarbon groups which are of monocyclic types, or an alicyclic hydrocarbon structure which is of a polycyclic type, and may be crosslinked. As the alicyclic hydrocarbon group which is of a monocyclic type, a cycloalkyl group having 3 to 8 carbon atoms is preferable, and examples thereof include a cyclopropyl group, a cyclopentyl group, a cyclohexyl group, a cyclobutyl group, and a cyclooctyl group. The structure having a plurality of alicyclic hydrocarbon groups which are of monocyclic types have a plurality of the above groups. The structure having a plurality of alicyclic hydrocarbon groups which are of monocyclic types preferably has 2 to 4 alicyclic hydrocarbon groups which are of monocyclic types, and particularly preferably two alicyclic hydrocarbon groups which are of monocyclic types.

Examples of the alicyclic hydrocarbon structure which is of a polycyclic type include bicyclo, tricyclo, or tetracyclo structure having 5 or more carbon atoms, and the structure is preferably a polycyclic cyclo structure having 6 to 30 carbon atoms, and examples thereof include an adamantane structure, a decalin structure, a norbornane structure, a norbornene structure, a cedrol structure, an isobornane structure, a bornane structure, a dicyclopentane structure, an α-pinene structure, a tricyclodecane structure, a tetracyclododecane structure, and an androstane structure. In addition, some of carbon atoms in the monocyclic or polycyclic cycloalkyl group may also be substituted with heteroatoms such as an oxygen atom.

Preferred examples of the alicyclic hydrocarbon structure which is polycyclic include an adamantane structure, a decalin structure, a norbornane structure, a norbornene structure, a cedrol structure, a structure having a plurality of cyclohexyl groups, a structure having a plurality of cycloheptyl groups, a structure having a plurality of cyclooctyl groups, a structure having a plurality of cyclodecanyl groups, a structure having a plurality of cyclododecanyl groups, and a tricyclodecane structure, and the adamantane structure is the most preferable from the viewpoint of dry etching resistance (that is, the group having the non-acid-decomposable alicyclic hydrocarbon structure which is polycyclic is most preferably a group having a non-acid-decomposable adamantane structure).

Examples of these alicyclic hydrocarbon structures which are polycyclic (for the structures having a plurality of alicyclic hydrocarbon groups which are of monocyclic types) include Formulae (1) to (51) described in the above-mentioned resin (B).

The alicyclic hydrocarbon structure which is polycyclic may further have a substituent, and examples of the substituent include an alkyl group (preferably having 1 to 6 carbon atoms), cycloalkyl group (preferably having 3 to 10 carbon atoms), aryl group (preferably having 6 to 15 carbon atoms), halogen atom, a hydroxyl group, an alkoxy group (preferably having 1 to 6 carbon atoms), a carboxyl group, a carbonyl group, a thiocarbonyl group, an alkoxycarbonyl group (preferably having 2 to 7 carbon atoms), and a group formed by combining these members (preferably having a total number of carbon atoms of 1 to 30, and more preferably having a total number of carbon atoms of 1 to 15).

As the alicyclic hydrocarbon structure which is polycyclic, the structure represented by any one of Formulae (7), (23), (40), (41), and (51), or a structure having two monovalent groups having any one hydrogen atom in the structure of Formula (48) as a bonding arm are preferable, a structure represented by any one of Formulae (23), (40), and (51), or a structure having two monovalent groups having any one hydrogen atom in the structure of Formula (48) as a bonding arm are more preferable, and the structure represented by Formula (40) is the most preferable.

As the group having an alicyclic hydrocarbon structure which is polycyclic, a monovalent group having any one hydrogen atom in the alicyclic hydrocarbon structure which is polycyclic as a bonding arm is preferable.

The structure in which a hydrogen atom of a phenolic hydroxyl group is substituted with a group having the non-acid-decomposable alicyclic hydrocarbon structure which is polycyclic as described above is preferably included as a repeating unit having a structure in which a hydrogen atom of a phenolic hydroxyl group is substituted with a group having the non-acid-decomposable alicyclic hydrocarbon structure which is polycyclic as described above in the resin (C), and a repeating unit represented by General Formula (3A) is more preferably included in the resin (C).

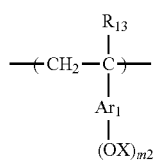
(3A)

In General Formula (3A), $R_{13}$ represents a hydrogen atom or a methyl group.

X represents a group having a non-acid-decomposable alicyclic hydrocarbon structure which is polycyclic.

$Ar_1$ represents an aromatic ring.

m2 represents an integer of 1 or more.

$R_{13}$ in General Formula (3A) represents a hydrogen atom or a methyl group, and is particularly preferably a hydrogen atom.

Examples of the aromatic ring of $Ar_1$ in General Formula (3A) include an aromatic hydrocarbon ring having 6 to 18 carbon atoms, which may have a substituent, such as a benzene ring, a naphthalene ring, an anthracene ring, a fluorene ring, and a phenanthrene ring, and an aromatic heterocycle containing a heterocycle such as a thiophene ring, a furan ring, a pyrrole ring, a benzothiophene ring, a benzofuran ring, a benzopyrrole ring, a triazine ring, an imidazole ring, a benzoimidazole ring, a triazole ring, a thiadiazole ring, and a thiazole ring. Among those, a benzene ring and a naphthalene ring are preferable from the viewpoint of resolution, and a benzene ring is the most preferable.

The aromatic ring of $Ar_1$ may have a substituent other than the group represented by —OX, and examples of the substituent include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxyl group, and an alkoxycarbonyl group (preferably having 2 to 7 carbon atoms), with the alkyl group, the alkoxy group, and the alkoxycarbonyl group being preferable, and the alkoxy group being more preferable.

X represents a group having a non-acid-decomposable alicyclic hydrocarbon structure which is polycyclic. Specific examples of the group having the non-acid-decomposable alicyclic hydrocarbon structure which is polycyclic represented by X and a preferred range thereof are the same as those described above. X is more preferably a group represented by —Y—$X_2$ in General Formula (4) which will be described later.

m2 is preferably an integer of 1 to 5, and most preferably 1. When m2 is 1 and $Ar_1$ is a benzene ring, the substitution position of —OX may be a para position, a meta position, or an ortho position with respect to the binding position to the polymer main chain of the benzene ring, but is preferably a para position or a meta position, and more preferably a para position.

In the present invention, the repeating unit represented by General Formula (3A) is preferably a repeating unit represented by General Formula (4A).

If the resin (C) having the repeating unit represented by General Formula (4A) is used, the Tg of the resin (C) increases, and thus, a highly hard resist film is formed. As a result, the diffusivity or the dry etching resistance of an acid can be more reliably controlled.

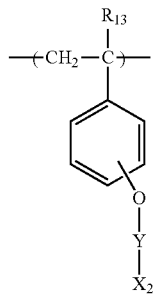
(4A)

In General Formula (4A), $R_{13}$ represents a hydrogen atom or a methyl group.

Y represents a single bond or a divalent linking group.

$X_2$ represents a non-acid-decomposable alicyclic hydrocarbon group which is polycyclic.

Preferred examples of the repeating unit represented by General Formula (4A), which is used in the present invention, will be described below.

$R_{13}$ in General Formula (4A) represents a hydrogen atom or a methyl group, and is particularly preferably a hydrogen atom.

In General Formula (4A), Y is preferably a divalent linking group. The divalent linking group of Y is preferably a carbonyl group, a thiocarbonyl group, an alkylene group (preferably having 1 to 10 carbon atoms, and more preferably having 1 to 5 carbon atoms), a sulfonyl group, —COCH$_2$—, —NH—, or a divalent linking group (preferably having a total number of carbon atoms of 1 to 20, and more preferably a total number of carbon atoms of 1 to 10) formed by combining these, more preferably a carbonyl group, —COCH$_2$—, a sulfonyl group, —CONH—, or —CSNH—, still more preferably a carbonyl group or —COCH$_2$—, and particularly preferably a carbonyl group.

$X_2$ represents an alicyclic hydrocarbon group which is polycyclic, and is non-acid-decomposable. The alicyclic hydrocarbon group which is polycyclic preferably has a total number of carbon atoms of 5 to 40, and more preferably has a total number of carbon atoms of 7 to 30. The alicyclic hydrocarbon group which is polycyclic may have an unsaturated bond within a ring.

Such an alicyclic hydrocarbon group which is polycyclic may be a group having a plurality of alicyclic hydrocarbon groups which are of monocyclic types, or an alicyclic hydrocarbon group which is of a polycyclic type, and may be crosslinked. As the alicyclic hydrocarbon group which is of a monocyclic type, a cycloalkyl group having 3 to 8 carbon atoms is preferable, and examples thereof include a cyclopropyl group, a cyclopentyl group, a cyclohexyl group, a cyclobutyl group, and a cyclooctyl group. The alicyclic hydrocarbon group which is monocyclic has a plurality of these groups. The group having a plurality of alicyclic hydrocarbon groups which are of monocyclic types preferably has 2 to 4 alicyclic hydrocarbon groups which are of monocyclic types, and particularly preferably has two alicyclic hydrocarbon groups which are of monocyclic types.

Examples of the alicyclic hydrocarbon group which is of a polycyclic type include groups having bicyclo, tricyclo, or tetracyclo structures having 5 or more carbon atoms. A group having a polycyclic cyclo structure having 6 to 30 carbon atoms is preferable, and examples thereof include an adamantyl group, a norbornyl group, a norbornenyl group, an isobornyl group, a camphanyl group, a dicyclopentyl group, an α-pinenyl group, a tricyclodecanyl group, a tetracyclododecyl group, and an androstanyl group. Further, some of carbon atoms in the monocyclic or polycyclic cycloalkyl group may be substituted with heteroatoms such as an oxygen atom.

As the alicyclic hydrocarbon group which is polycyclic of $X_2$, an adamantyl group, a decalin group, a norbornyl group, a norbornenyl group, a cedrol group, a group having a plurality of cyclohexyl groups, a group having a plurality of cycloheptyl groups, a group having a plurality of cyclooctyl groups, a group having a plurality of cyclodecanyl groups, a group having a plurality of cyclododecanyl groups, or a tricyclodecanyl group is preferable, and an adamantyl group is the most preferable from the viewpoint of dry etching resistance. Examples of the chemical formula of the alicyclic hydrocarbon structure which is polycyclic in the alicyclic hydrocarbon group which is polycyclic of $X_2$ include the same chemical formulae as those of the alicyclic hydrocarbon structure which is polycyclic in the above-mentioned group having an alicyclic hydrocarbon structure which is polycyclic, and a preferred range thereof is also the same. Examples of the alicyclic hydrocarbon group which is polycyclic of $X_2$ include monovalent groups having any one hydrogen atom in the above-mentioned alicyclic hydrocarbon structure which is polycyclic as a bonding arm.

The alicyclic hydrocarbon group may further have a substituent, and examples of the substituent include the same ones described as the substituent which the alicyclic hydrocarbon structure which is polycyclic may have.

The substitution position of —O—Y—$X_2$ in General Formula (4A) with respect to the binding position to the polymer main chain of the benzene ring may be a para position, a meta position, or an ortho position, and the para position is preferable.

In the present invention, the repeating unit represented by General Formula (3A) is most preferably a repeating unit represented by General Formula (4').

(4')

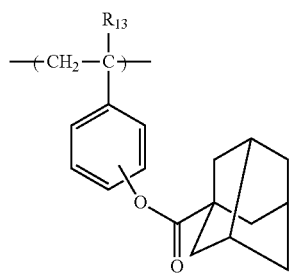

In General Formula (4'), $R_{13}$ represents a hydrogen atom or a methyl group.

$R_{13}$ in General Formula (4') represents a hydrogen atom or a methyl group, and is particularly preferably a hydrogen atom.

The substitution position of the adamantyl ester group in General Formula (4') with respect to the binding position to the polymer main chain of the benzene ring may be a para position, a meta position, or an ortho position, and is preferably a para position.

Specific examples of the repeating unit represented by General Formula (3A) include the following ones.

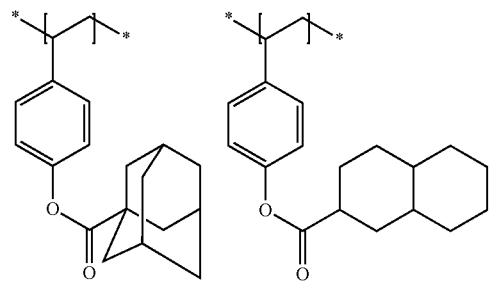

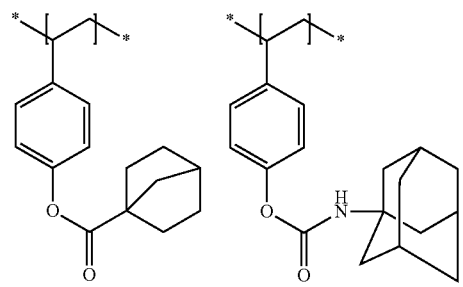

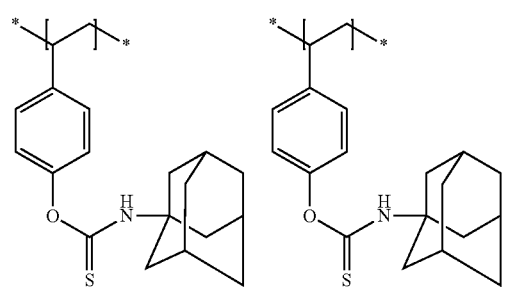

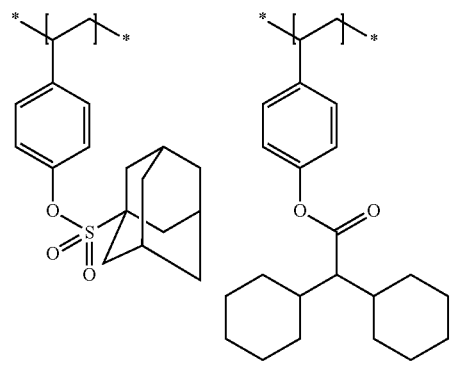

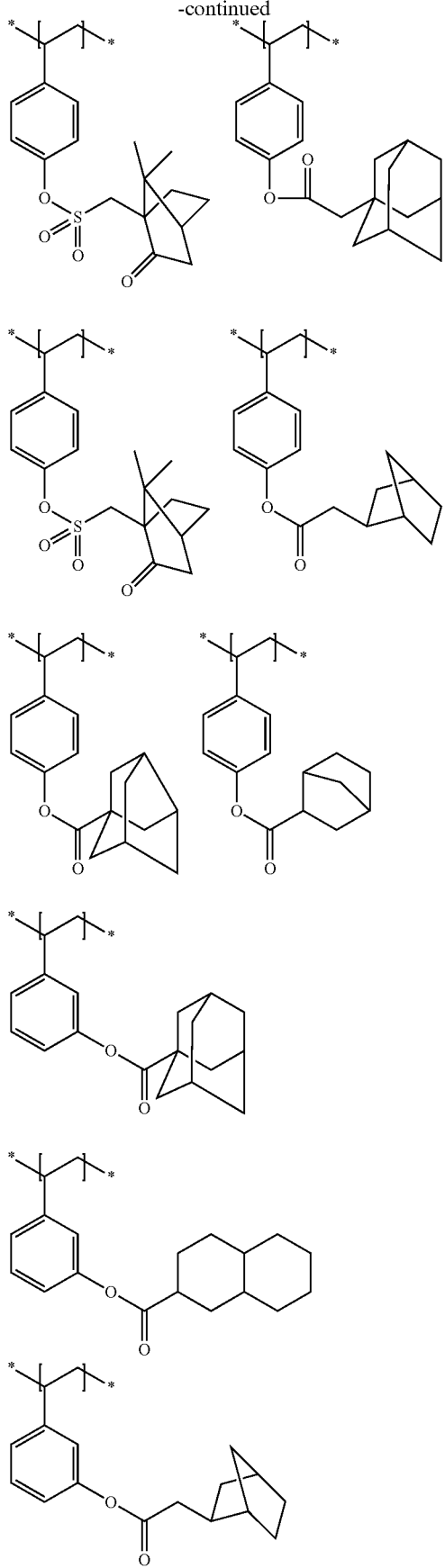

-continued

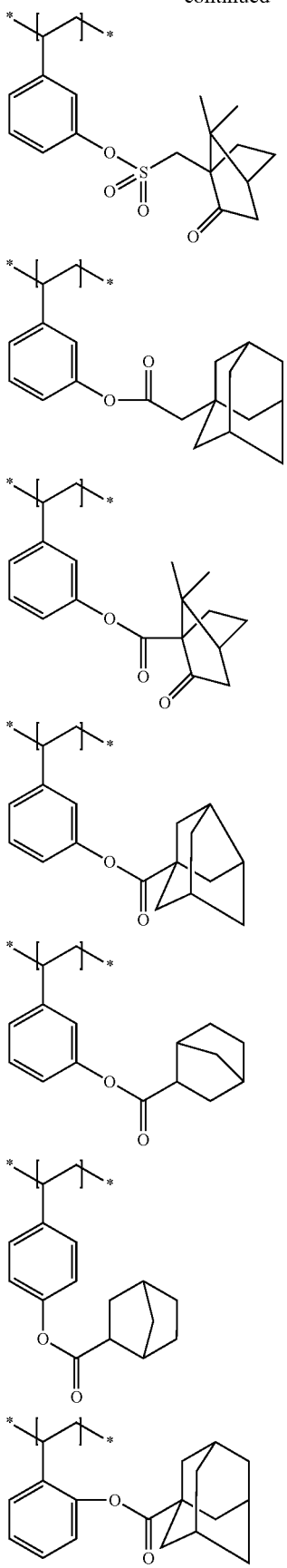

-continued

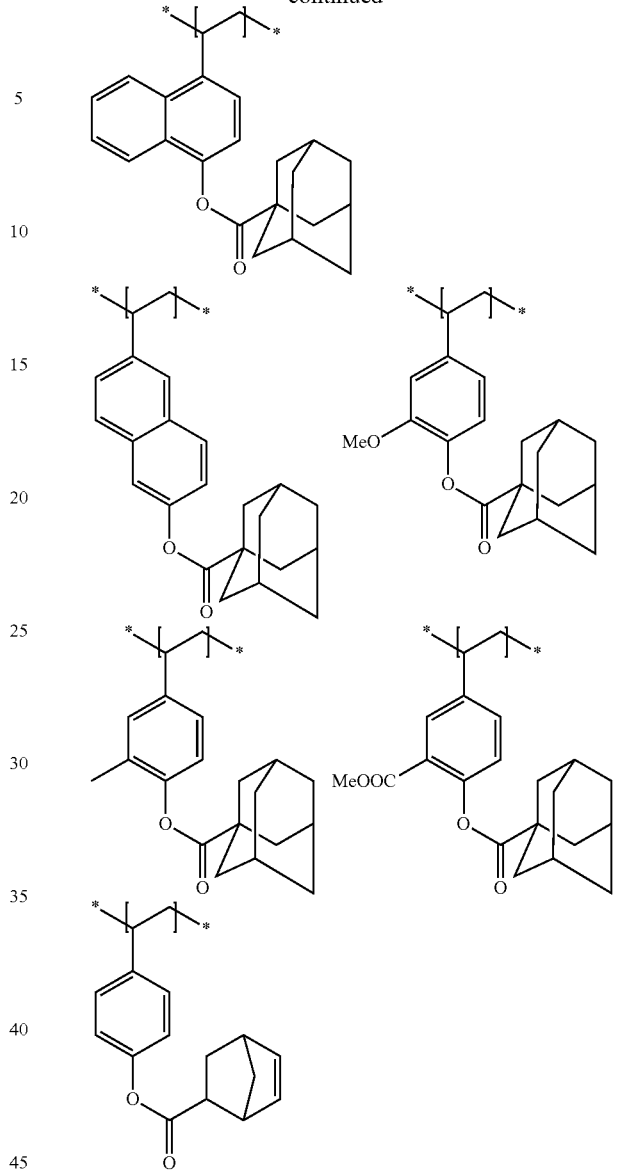

In a case where the resin (C) contains a repeating unit having a structure in which a hydrogen atom in a phenolic hydroxyl group is substituted with the group having a non-acid-decomposable alicyclic hydrocarbon structure which is polycyclic as described above, the content of the repeating unit is preferably 1% to 40% by mole, and more preferably 2% to 30% by mole, with respect to all the repeating units of the resin (C).

The resin (C) may further include a repeating unit having a structural moiety that decomposes upon irradiation with actinic ray or radiation to generate an acid in the side chain.

It is also preferable that the resin (C) further has the repeating unit as described below (hereinafter also referred to as "other repeating units") as the repeating units other than the repeating unit.

Examples of the polymerizable monomer for forming these other repeating units include styrene, alkyl-substituted styrene, alkoxy-substituted styrene, halogen-substituted styrene, O-alkylated styrene, O-acylated styrene, hydrogenated hydroxystyrene, maleic acid anhydride, an acrylic acid derivative (acrylic acid, acrylic acid ester, and the like), a methacrylic acid derivative (methacrylic acid, methacrylic acid ester, and the like), N-substituted maleimide, acrylonitrile, methacrylonitrile, vinylnaphthalene, vinylanthracene, and indene which may have a substituent.

The resin (C) may or may not contain these other repeating units, and in a case where it contains these other repeating units, the content of these other repeating units in the resin (C) is generally 1% to 30% by mole, preferably 1% to 20% by mole, and more preferably 2% to 10% by mole, with respect to all the repeating units constituting the resin (C).

The resin (C) may contain a repeating unit represented by General Formula (IV) or (V).

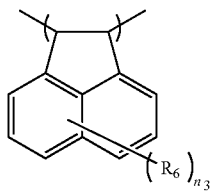

(IV)

In the formula, $R_6$ represents a hydrogen atom, a hydroxyl group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R is an alkyl group or fluorinated alkyl group having 1 to 6 carbon atoms), or a carboxyl group.

$n_3$ represents an integer of 0 to 6.

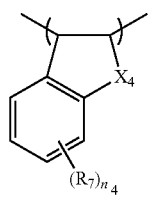

(V)

In the formula, $R_7$ represents a hydrogen atom, a hydroxyl group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R is an alkyl group or fluorinated alkyl group having 1 to 6 carbon atoms), or a carboxyl group.

$n_4$ represents an integer of 0 to 4.

$X_4$ is a methylene group, an oxygen atom, or a sulfur atom. $R_7$ is an aryl group or aralkyl group having 6 to 20 carbon atoms, and may have a hydroxyl group, a linear, branched, or cyclic alkyl group or alkoxy group, an ester group (—OCOR or —COOR: R is an alkyl group having 1 to 6 carbon atoms), a ketone group (—COR: R is an alkyl group having 1 to 6 carbon atoms), a fluorine atom, a trifluoromethyl group, a nitro group, an amino group, or a cyano group.

Specific examples of the repeating unit represented by General Formula (IV) or General Formula (V) are shown below, but are not limited thereto.

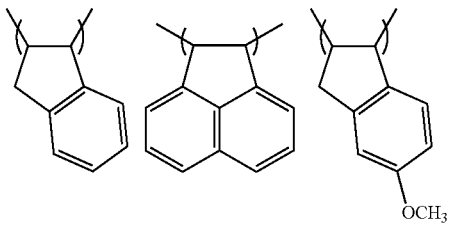

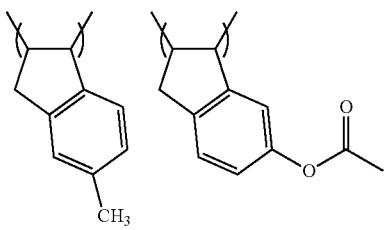

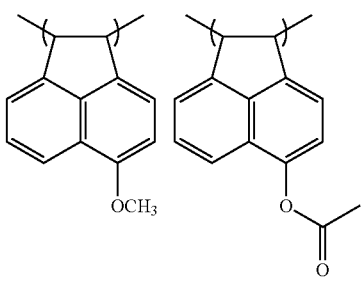

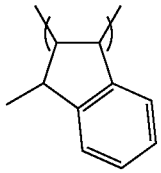

[Repeating Unit Having Silicon Atom in Side Chain]

The resin (C) may contain a repeating unit having a silicon atom in the side chain.

The repeating unit having a silicon atom in the side chain is not particularly limited as long as it has a silicon atom in the side chain, but examples thereof include a (meth)acrylate-based repeating unit having a silicon atom, and a vinyl-based repeating unit having a silicon atom.

The repeating unit having a silicon atom is preferably a repeating unit not having a structure (acid-decomposable group) protected with a leaving group that leaves by the decomposition of a polar group by the action of an acid.

The repeating unit having a silicon atom in the side chain is typically a repeating unit having a group having a silicon atom in the side chain, and examples of the group having a silicon atom include a trimethylsilyl group, a triethylsilyl group, a triphenylsilyl group, a tricyclohexylsilyl group, a tristrimethylsiloxysilyl group, a tristrimethylsilylsilyl group, a methylbistrimethylsilylsilyl group, a methylbistrimethylsiloxysilyl group, a dimethyltrimethylsilylsilyl group, a dimethyltrimethylsiloxysilyl group, cyclic or linear polysiloxanes as shown below, and cage type, ladder type, or random type silsesquioxane structures. In the formulae, R and $R^1$ each independently represent a monovalent substituent. * represents a bonding arm.

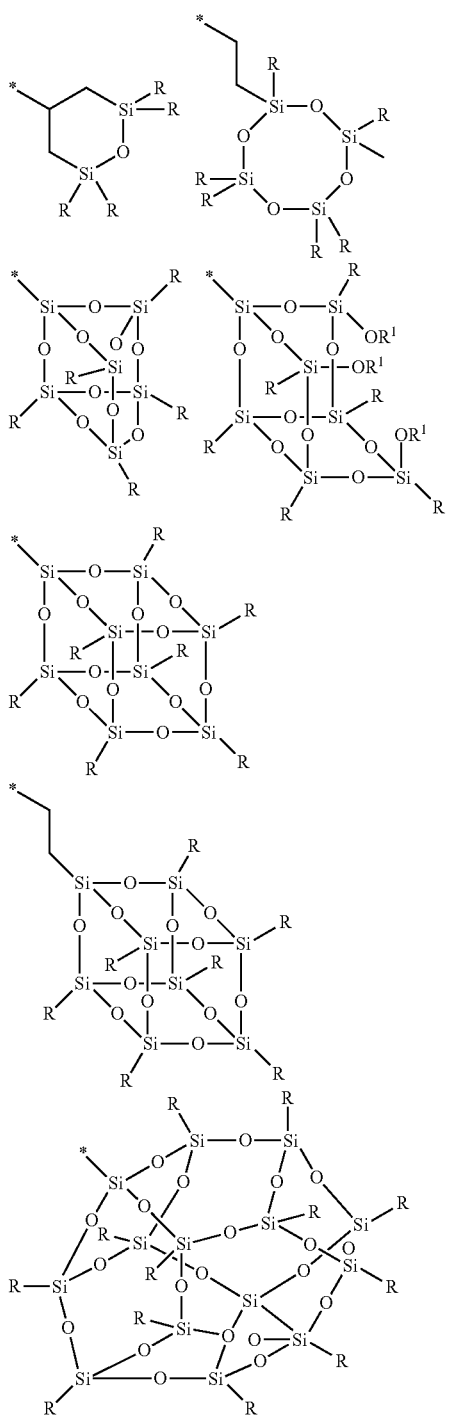

Suitable examples of the repeating unit having the above-mentioned group include a repeating unit derived from an acrylate or methacrylate compound having the above-mentioned group and a repeating unit derived from a compound having a vinyl group.

The repeating unit having a silicon atom is preferably a repeating unit having a silsesquioxane structure, and with such a structure, the repeating unit is ultrafine (for example, having a line width of 50 nm or less) and can express extremely excellent collapse performance in the formation of a pattern with a cross-section having a high aspect ratio (for example, a film thickness/line width of 2 or more).

Examples of the silsesquioxane structure include a cage type silsesquioxane structure, a ladder type silsesquioxane structure, and a random type silsesquioxane structure. Among these, a cage type silsesquioxane structure is preferable.

Here, the cage type silsesquioxane structure is a silsesquioxane structure a structure having a cage shape skeleton. The cage type silsesquioxane structure may be either a full cage type silsesquioxane structure or a partial cage type silsesquioxane structure, with the full cage type silsesquioxane structure being preferable.

Furthermore, the ladder type silsesquioxane structure is a silsesquioxane structure having a ladder shape skeleton.

In addition, the random type silsesquioxane structure is a silsesquioxane structure having a random skeleton.

The cage type silsesquioxane structure is preferably a siloxane structure represented by Formula (S).

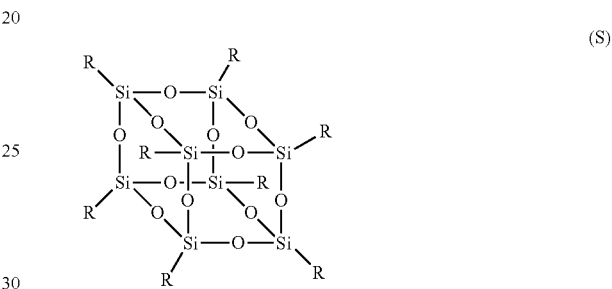

(S)

In Formula (S), R represents a monovalent substituent. R's which are present in plural numbers may be the same as or different from each other.

The monovalent substituent is not particularly limited, but specific examples thereof include a halogen atom, a hydroxyl group, a nitro group, a carboxyl group, an alkoxy group, an amino group, a mercapto group, a blocked mercapto group (for example, a mercapto group blocked (protected) with an acyl group), an acyl group, an imido group, a phosphino group, a phosphinyl group, a silyl group, a vinyl group, a hydrocarbon group which may have a heteroatom, a (meth)acryl group-containing group, and an epoxy group-containing group.

Examples of the halogen atom include a fluorine atom, a chlorine atom, a bromine atom, and an iodine atom.

Examples of the heteroatom of the hydrocarbon group which may have the heteroatom include an oxygen atom, a nitrogen atom, a sulfur atom, and a phosphorus atom.

Examples of the hydrocarbon group in the hydrocarbon group which may have the heteroatom include an aliphatic hydrocarbon group, an aromatic hydrocarbon group, and a group formed by combining these groups.

The aliphatic hydrocarbon group may be linear, branched, or cyclic. Specific examples of the aliphatic hydrocarbon group include a linear or branched alkyl group (in particular, having 1 to 30 carbon atoms), a linear or branched alkenyl group (in particular, having 2 to 30 carbon atoms), and a linear or branched alkynyl group (in particular, having 2 to 30 carbon atoms).

Examples of the aromatic hydrocarbon group include aromatic hydrocarbon groups having 6 to 18 carbon atoms, such as a phenyl group, a tolyl group, a xylyl group, and a naphthyl group.

The repeating unit having a silicon atom is preferably represented by Formula (I).

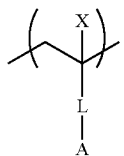
(I)

In Formula (I), L represents a single bond or a divalent linking group.

Examples of the divalent linking group include an alkylene group, a —COO-Rt-group, and an —O-Rt-group. In the formula, Rt represents an alkylene group or cycloalkylene group.

L is preferably a single bond or a —COO-Rt-group. Rt is preferably an alkylene group having 1 to 5 carbon atoms, and more preferably a —CH$_2$-group, a —(CH$_2$)$_2$-group, or a —(CH$_2$)$_3$-group.

In Formula (I), X represents a hydrogen atom or an organic group.

Examples of the organic group include an alkyl group which may have a substituent such as a fluorine atom and a hydroxyl group, with the hydrogen atom, the methyl group, the trifluoromethyl group, and the hydroxymethyl group being preferable.

In Formula (I), A represents a silicon atom-containing group. Among these, a group represented by Formula (a) or (b) is preferable.

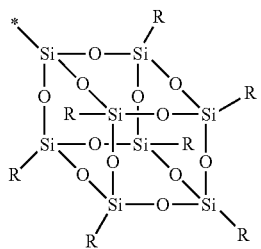
(a)

In Formula (a), R represents a monovalent substituent. R's which are present in plural numbers may be the same as or different from each other. Specific examples and suitable aspects of R are the same as in Formula (S) described above. In addition, in a case where A in Formula (I) is the group represented by Formula (a), Formula (I) is represented by Formula (I-a).

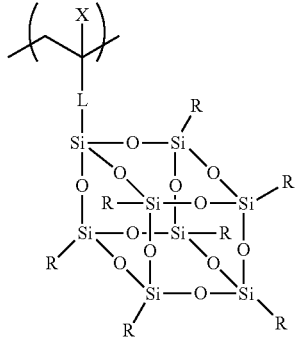
(I-a)

(b)

In Formula (b), R$_b$ represents a hydrocarbon group which may have a heteroatom. Specific examples and suitable aspects of the hydrocarbon group which may have a heteroatom are the same as that for R in Formula (S) above.

The resin (C) may have one kind or two or more kinds of repeating unit having a silicon atom.

The content of the repeating unit having a silicon atom is preferably 1% to 30% by mole, more preferably 1% to 20% by mole, and still more preferably 1% to 10% by mole, with respect to all the repeating units of the resin (C).

Moreover, in the present specification, a repeating unit having a silicon atom and a structure (acid-decomposable group) protected with a leaving group which leaves by the decomposition of a polar group by the action of an acid corresponds to both a repeating unit having a silicon atom and a repeating unit having an acid-decomposable group.

The resin (C) can be synthesized in accordance with a known radical polymerization method, an anion polymerization method, or a living radical polymerization method (an iniferter method or the like). For example, in the anion polymerization method, vinyl monomers can be dissolved in an appropriate organic solvent and reacted using a metal compound (butyllithium or the like) as an initiator, unusually under cooling conditions, thereby obtaining a polymer.

As the resin (C), a polyphenol compound (for example, JP2008-145539A) produced by a condensation reaction of an aromatic ketone or an aromatic aldehyde with a compound containing 1 to 3 phenolic hydroxyl groups, a calixarene derivative (for example, JP2004-18421A), a Noria derivative (for example, JP2009-222920A), or a polyphenol derivative (for example, JP2008-94782A) can be applied, and may also be synthesized through modification by a polymer reaction.

In addition, the resin (C) is preferably synthesized through modification of a polymer synthesized by a radical polymerization method or an anion polymerization method by use of a polymer reaction.

The weight-average molecular weight of the resin (C) is preferably 1,000 to 200,000, more preferably 2,000 to 50,000, and still more preferably 2,000 to 15,000.

The dispersity (molecular weight distribution, Mw/Mn) of the resin (C) is preferably 2.0 or less. From the viewpoint of improvement of sensitivity and resolution, the dispersity is preferably 1.0 to 1.80, more preferably 1.0 to 1.60, and most preferably 1.0 to 1.20. The use of living polymerization such as living anion polymerization preferably uniformizes the dispersity (molecular weight distribution) of the obtained high molecular compound. The weight-average molecular weight and the dispersity of the resin (C) as the high molecular compound are measured by means of the above-mentioned method.

The content of the resin (C) with respect to the composition of the present invention is preferably 30% to 95% by mass, more preferably 40% to 90% by mass, and particularly preferably 50% to 85% by mass, with respect to the total solid content of the composition.

Specific examples of the resin (C) are shown below, but the present invention is not limited thereto.

111
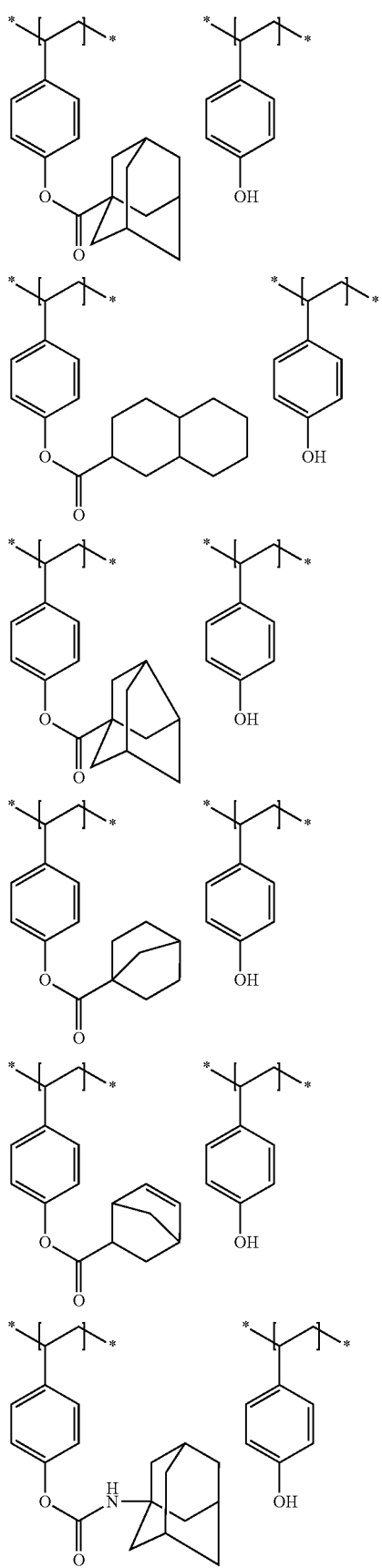
112
-continued
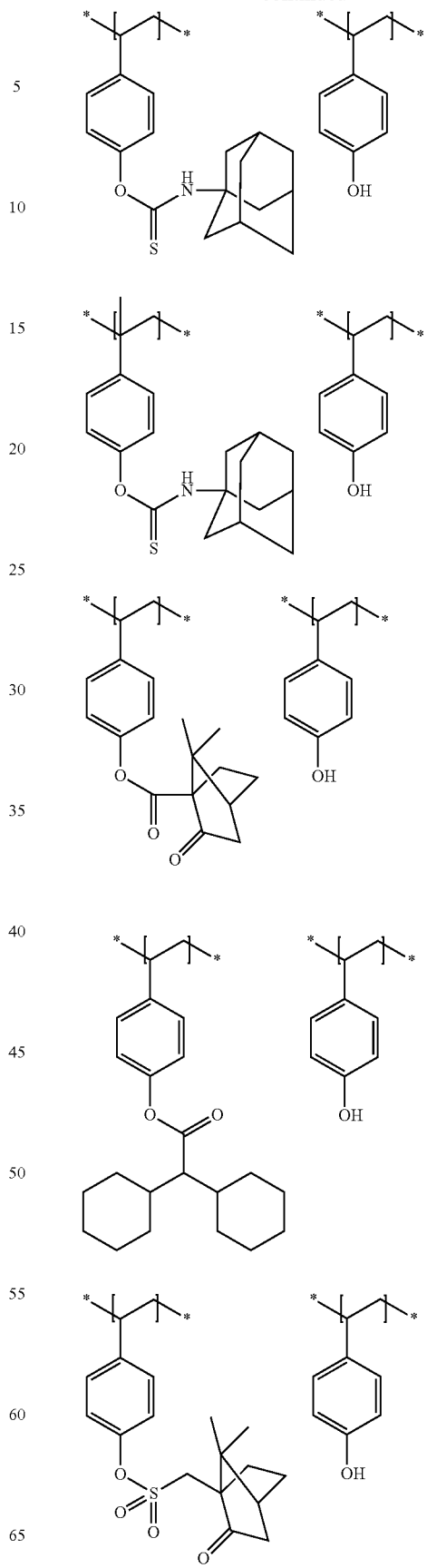

-continued
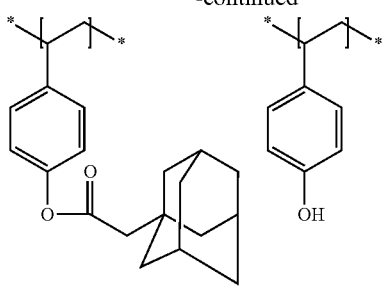
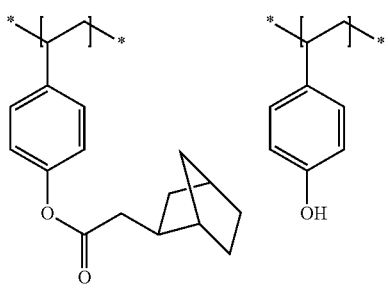
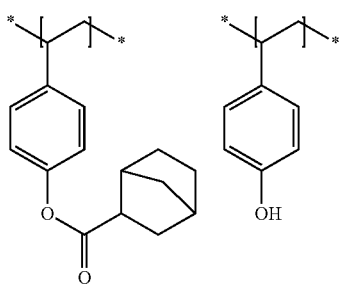
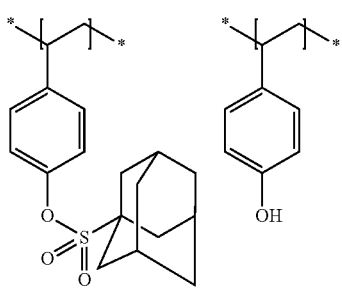
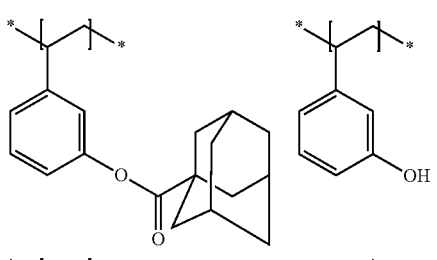
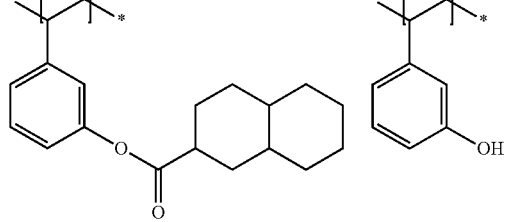
-continued
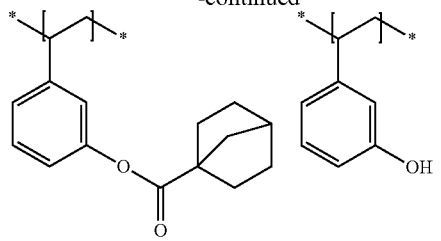
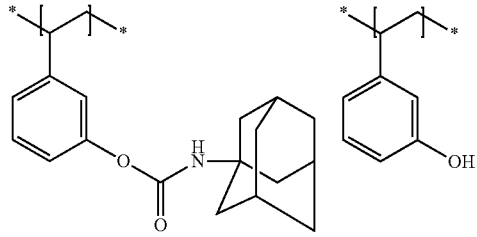
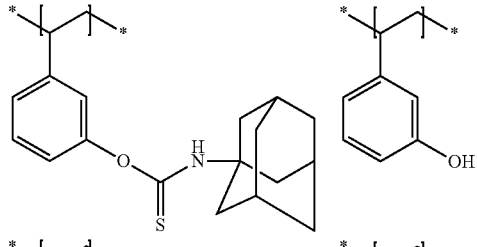
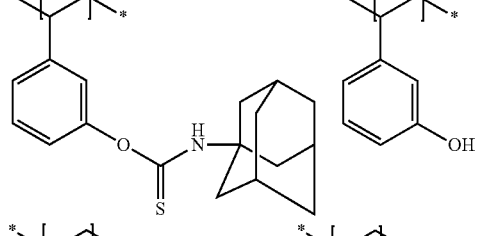
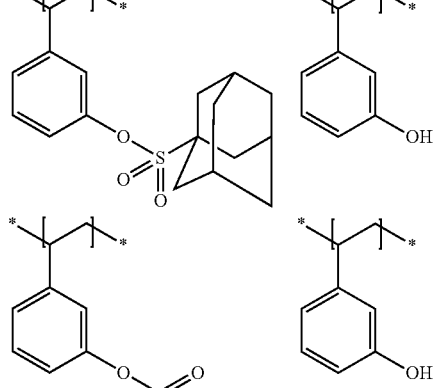
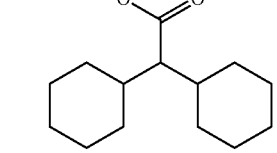
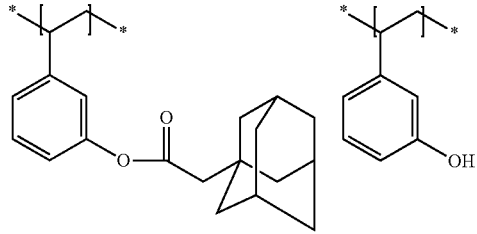

115
-continued
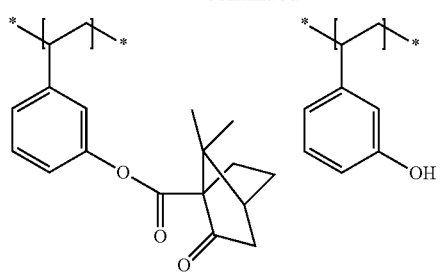
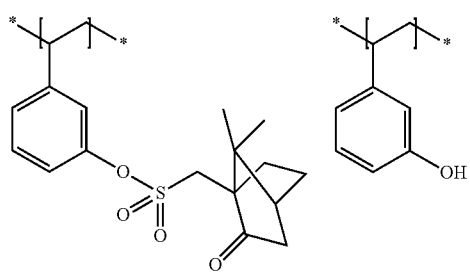
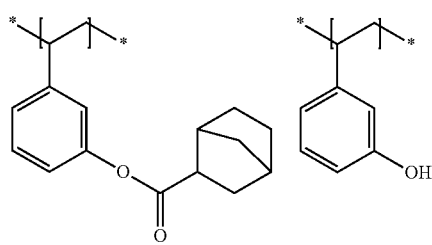
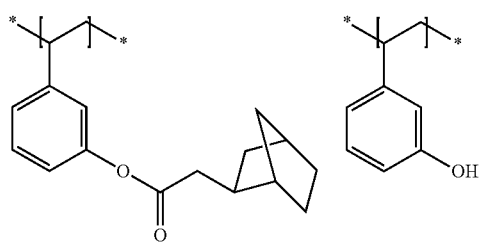
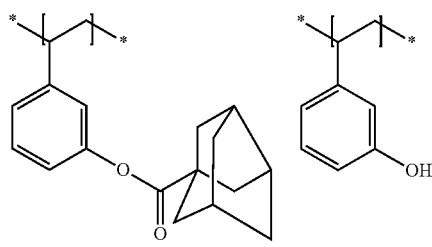
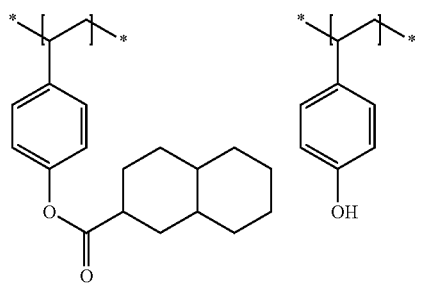
116
-continued
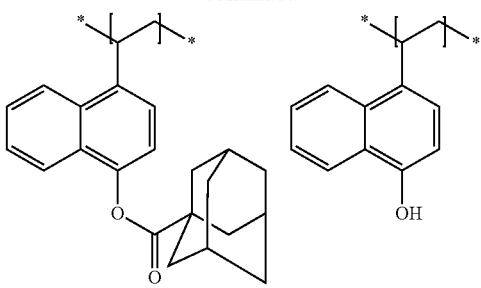
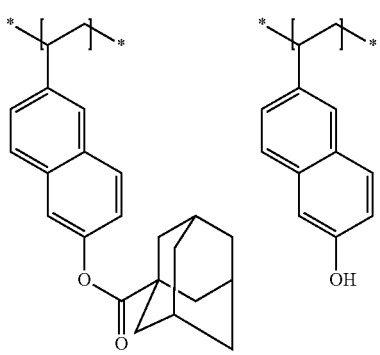
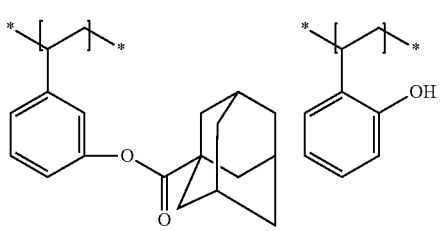
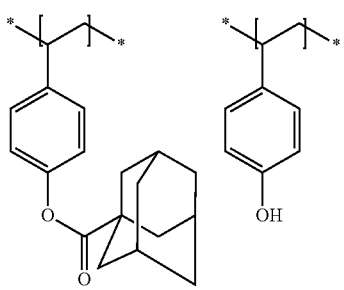
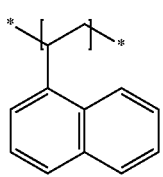
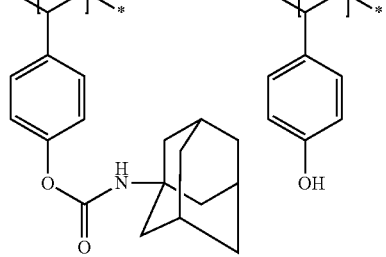

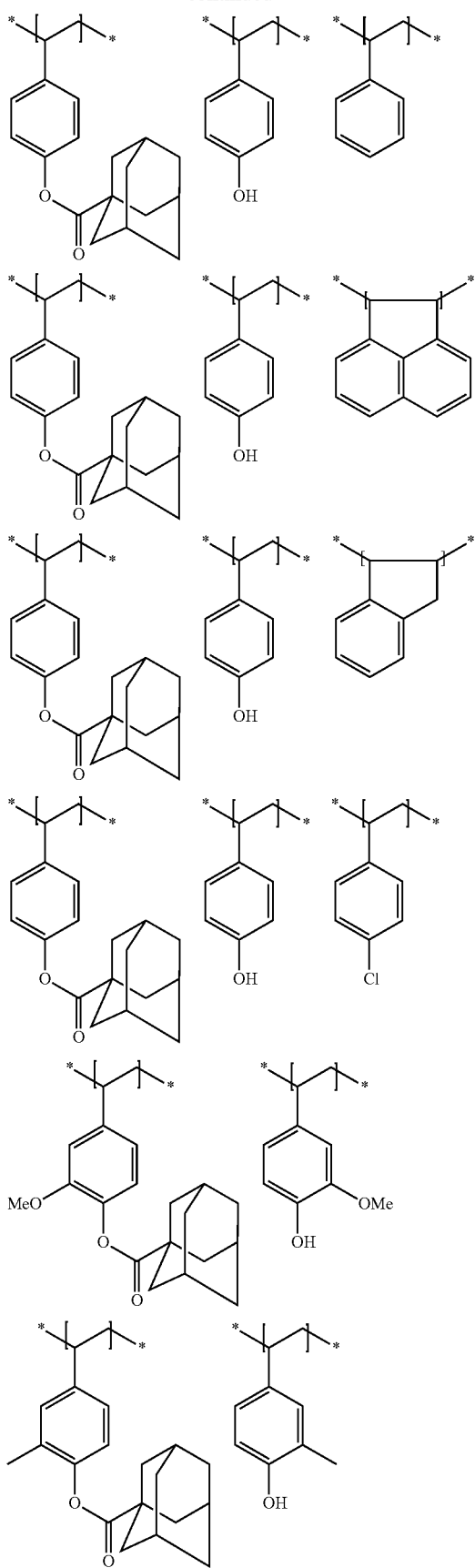
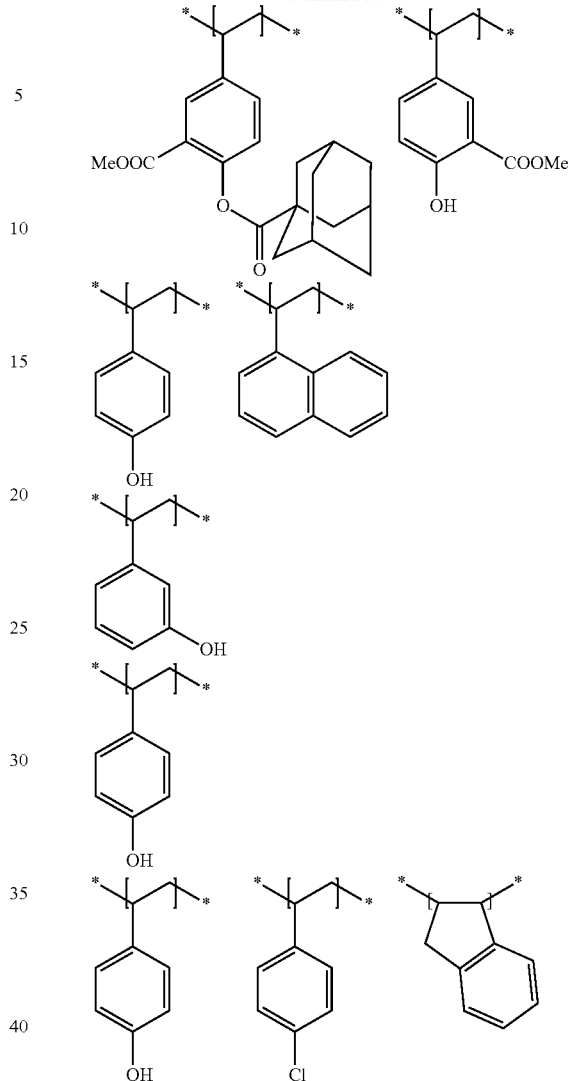

<Compound (D) which Generates Acid Upon Irradiation with Actinic Ray or Radiation>

The actinic ray-sensitive or radiation-sensitive resin composition of the present invention preferably includes a compound (D) that generates an acid upon irradiation with actinic ray or radiation (also referred to as a "compound (D)," an "acid generator," or a "photoacid generator").

The compound (D) that generates an acid upon irradiation with actinic ray or radiation may be in a form of a low molecular compound or in a form introduced into a part of a polymer. Further, a combination of the form of a low molecular compound and the form introduced into a part of a polymer may also be used.

In a case where the compound (D) that generates an acid upon irradiation with actinic ray or radiation is in the form of a low molecular compound, the molecular weight is preferably 3,000 or less, more preferably 2,000 or less, and still more preferably 1,000 or less.

In a case where the compound (D) that generates an acid upon irradiation with actinic ray or radiation is in the form introduced into a part of a polymer, it may be introduced into a part of the resin (C) described above or into a resin other than the resin (C).

In order to adjust the cross-sectional shape of the pattern, the number of fluorine atoms contained in the acid generator is appropriately adjusted. By adjusting the fluorine atoms, it is possible to control uneven distribution of the acid generator in the actinic ray-sensitive or radiation-sensitive film on the surface. As the number of the fluorine atoms contained in the acid generator is higher, uneven distribution on the surface is clearer.

Preferred aspects of the acid generator include an onium salt compound. Examples of such an onium salt compound include a sulfonium salt, an iodonium salt, and a phosphonium salt, with the sulfonium salt being particularly preferable.

Furthermore, other preferred aspects of the acid generator include a compound that generates a sulfonic acid, an imidic acid, or a methide acid upon irradiation with actinic ray or radiation. Examples of the acid generator in this aspect include a sulfonium salt, an iodonium salt, a phosphonium salt, oxime sulfonate, and imide sulfonate.

The acid generator is preferably a compound that generates an acid upon irradiation with electron beams or extreme ultraviolet rays.

In the present invention, preferred examples of the onium salt compound include a sulfonium compound represented by General Formula (7) and an iodonium compound by General Formula (8).

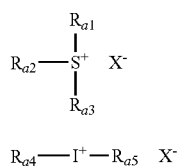

(7)

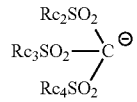

(8)

In General Formulae (7) and (8), $R_{a1}$, $R_{a2}$, $R_{a3}$, $R_{a4}$, and $R_{a5}$ each independently represent an organic group.

$X^-$ represents an organic anion.

Hereinafter, the sulfonium compound represented by General Formula (7) and the iodonium compound by General Formula (8) will be described in more detail.

$R_{a1}$, $R_{a2}$, and $R_{a3}$ in General Formula (7) and $R_{a4}$ and $R_{a5}$ in General Formula (8) each independently represent an organic group. Preferably, at least one of $R_{a1}$, $R_{a2}$, or $R_{a3}$, and at least one of $R_{a4}$ or $R_{a5}$ are each an aryl group. As the aryl group, a phenyl group or a naphthyl group is preferable, and a phenyl group is more preferable.

Examples of the organic anion of $X^-$ in General Formulae (7) and (8) include a sulfonate anion, a carboxylate anion, a bis(alkylsulfonyl)amide anion, and a tris(alkylsulfonyl)methide anion. The organic anion is preferably an organic anion represented by General Formula (9), (10), or (11), and more preferably any of those of General Formula (9).

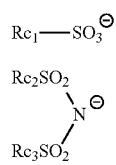

(9)

(10)

(11)

In General Formulae (9), (10), and (11), $R_{c1}$, $R_{c2}$, $R_{c3}$, and $R_{c4}$ each independently represent an organic group.

The organic anion of $X^-$ corresponds to a sulfonic acid, an imidic acid, a methide acid, or the like which is an acid generated by actinic ray or radiation, such as electron beams or extreme ultraviolet rays.

Examples of the organic groups of $R_{c1}$, $R_{c2}$, $R_{c3}$, and $R_{c4}$ include an alkyl group, an aryl group, and a group formed of a plurality of these groups linked to each other. Among these organic groups, an alkyl group having a fluorine atom or a fluoroalkyl group substituted at its 1-position, and a phenyl group having a fluorine atom or a fluoroalkyl group substituted therein are preferable. The incorporation of a fluorine atom or a fluoroalkyl group increases the acidity of an acid generated upon irradiation with light, whereby the sensitivity is improved. However, it is preferable that the terminal group contains no fluorine atom as a substituent.

Preferred examples of the organic anion of $X^-$ in General Formulae (7) and (8) include the following ones. A in the following examples represents a cyclic organic group.

$SO_3$—$CF_2$—$CH_2$—OCO-A, $SO_3$—$CF_2$—CHF—$CH_2$—OCO-A, $SO_3$—$CF_2$—COO-A, $SO_3$—$CF_2$—$CF_2$—$CH_2$-A, $SO_3$—$CF_2$—$CH(CF_3)$—OCO-A

Moreover, in the present invention, from the viewpoint of suppressing the diffusion of an acid after exposure into unexposed areas to attain improvement of resolution and pattern shape, the compound (D) is preferably a compound that generates an acid (more preferably sulfonic acid) having a volume of 130 Å$^3$ or more, more preferably a compound that generates an acid (more preferably sulfonic acid) having a volume of 190 Å$^3$ or more, more preferably a compound that generates an acid (more preferably sulfonic acid) having a volume of 270 Å$^3$ or more, and particularly preferably compound (D) is a compound that generates an acid (more preferably sulfonic acid) having a volume of 400 Å$^3$ or more. However, from the viewpoint of sensitivity and coating solvent solubility, the volume is preferably 2,000 Å$^3$ or less, and more preferably 1,500 Å$^3$ or less. The value of the volume was determined by means of "WinMOPAC" manufactured by Fujitsu Limited. That is, first, the chemical structure of the acid generated by each of the compounds was inputted. Subsequently, while regarding this structure as an initial structure, the most stable conformation of the acid was determined by a molecular force field calculation using an MM3 method. Thereafter, a molecular orbital calculation using a PM3 method was carried out with respect to the most stable conformation. Thus, the "accessible volume" of each acid can be calculated.

Paragraphs [0368] to [0377] of JP2014-41328A, paragraphs [0240] to [0262] of JP2013-228681A ([0339] of the specification of the corresponding US2015/004533A) can be incorporated herein by reference, the contents of which are incorporated herein by reference. Further, specific examples thereof include the following compounds, but are not limited thereto.

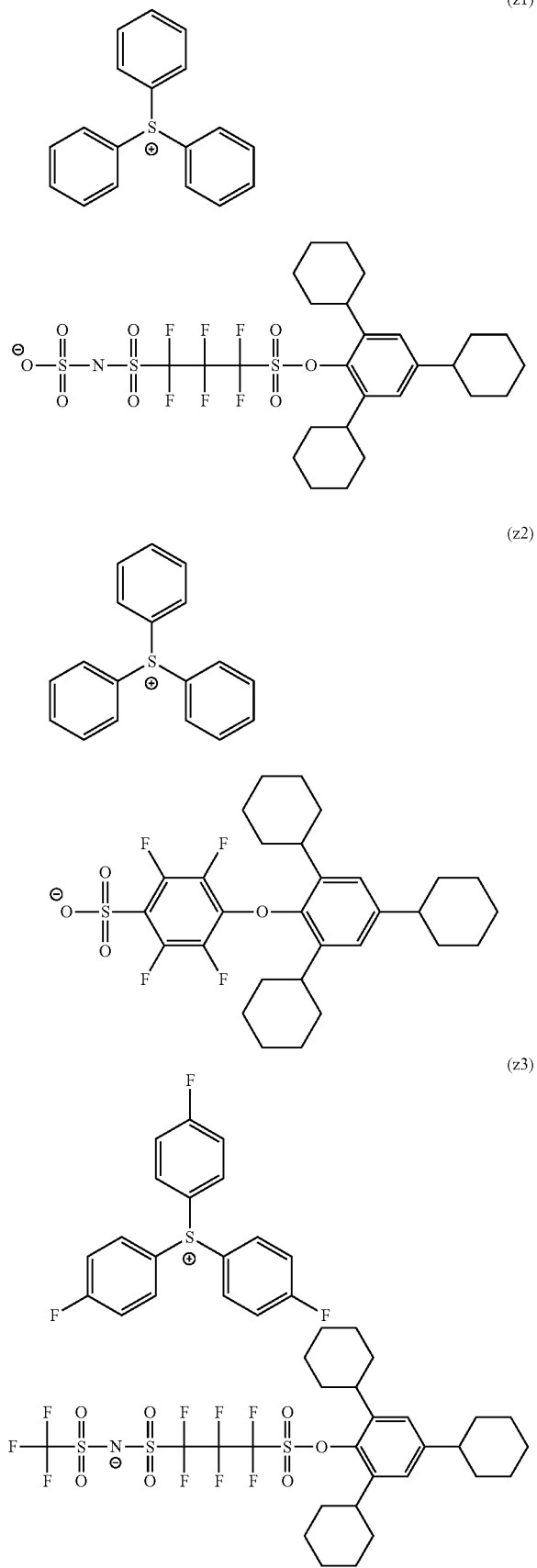
(z1)
(z2)
(z3)
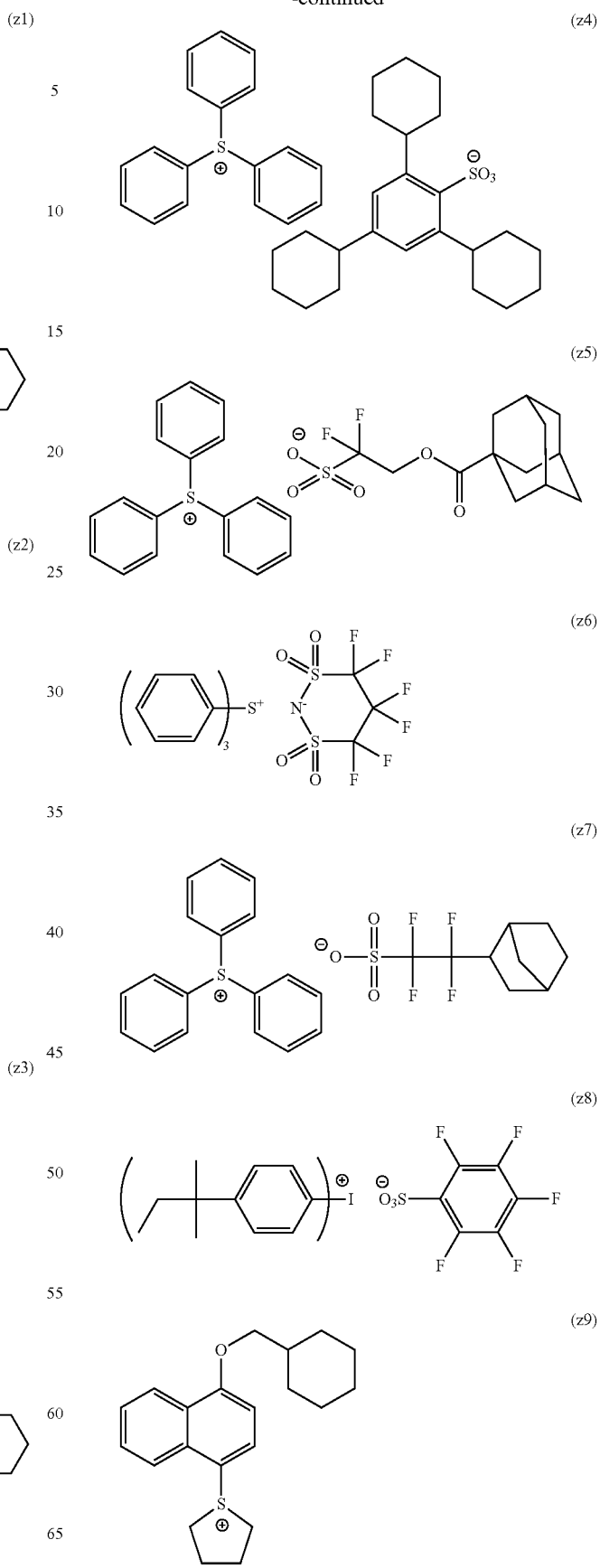
(z4)
(z5)
(z6)
(z7)
(z8)
(z9)

-continued
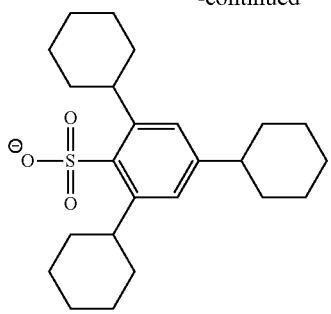
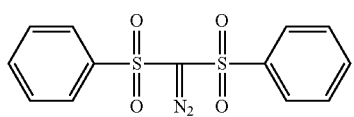
(z10)
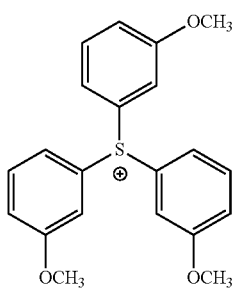
(z11)
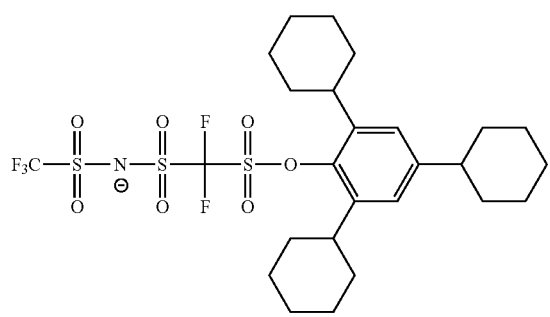
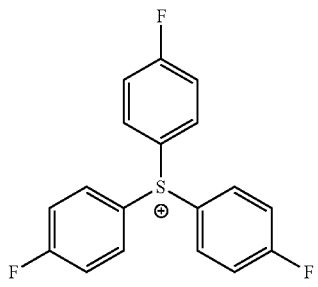
(z12)
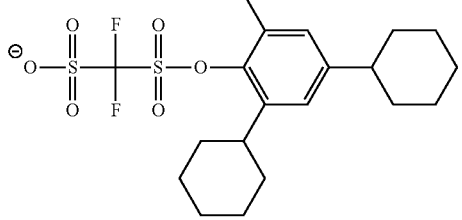
-continued
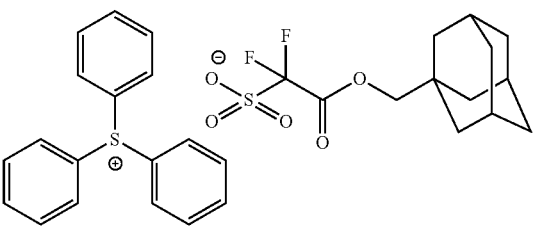
(z13)
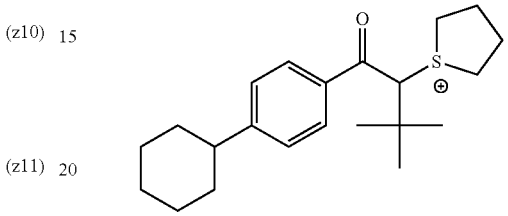
(z14)
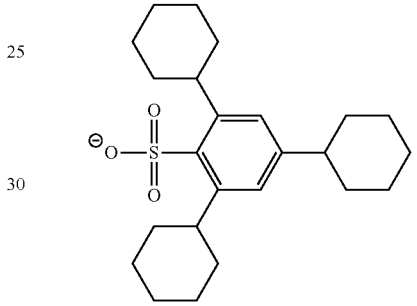
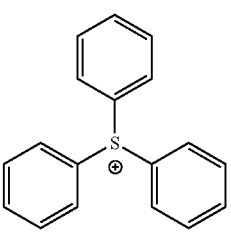
(z15)
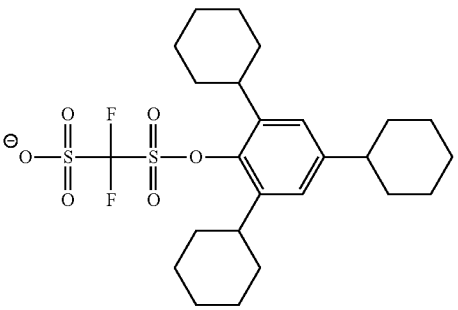
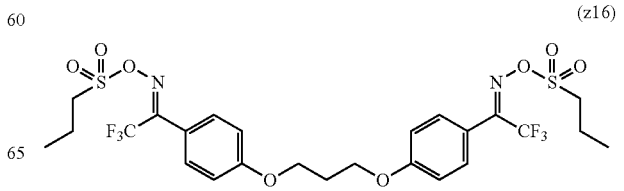
(z16)

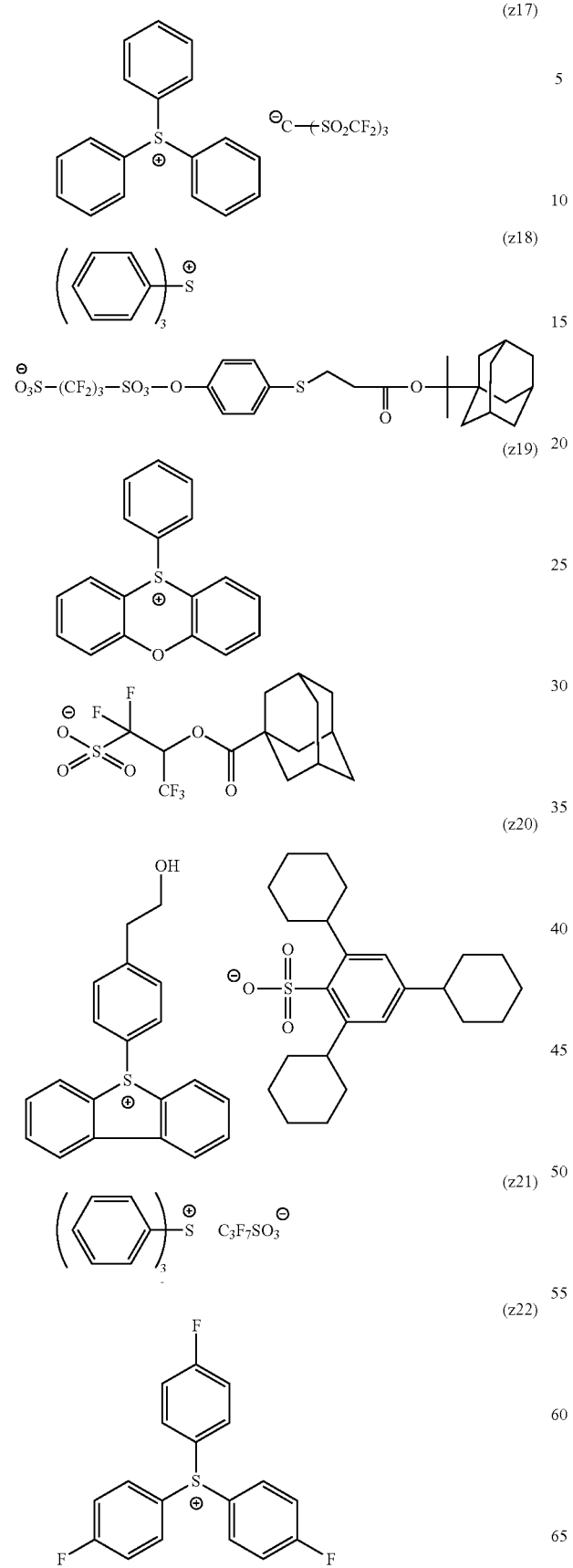
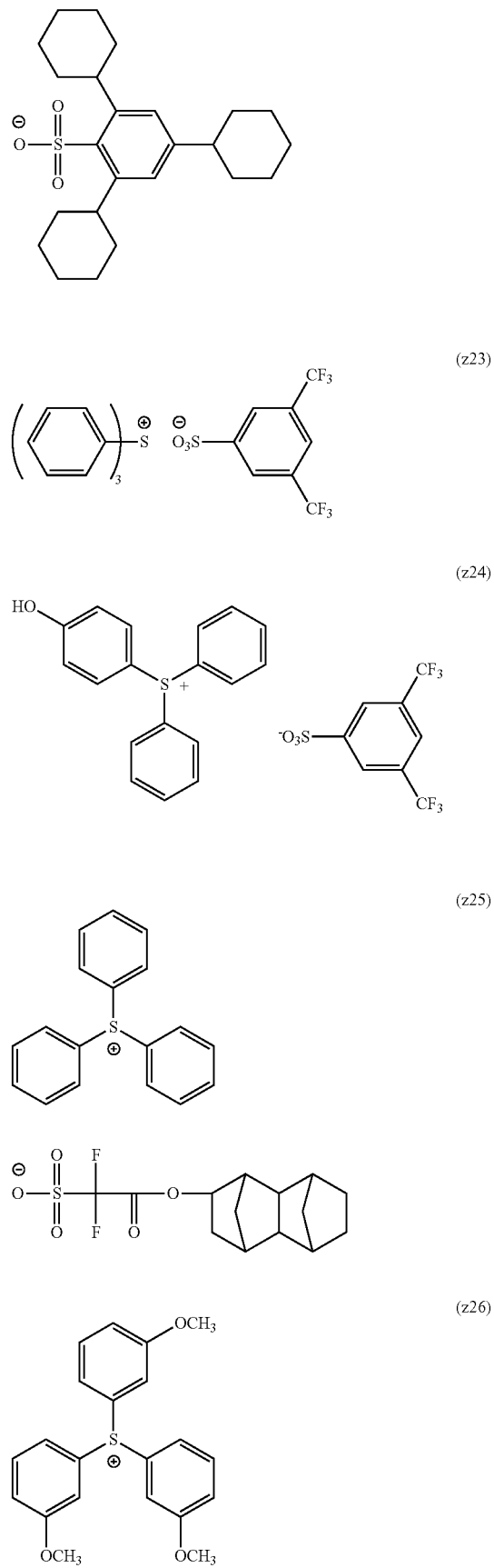

-continued
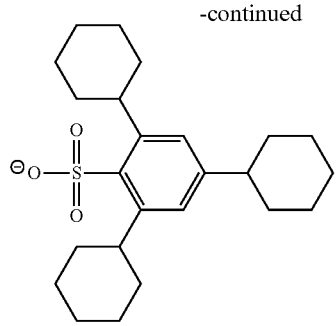
(z27)
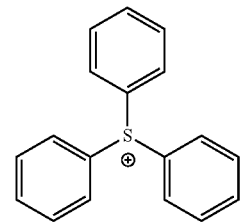
(z28)
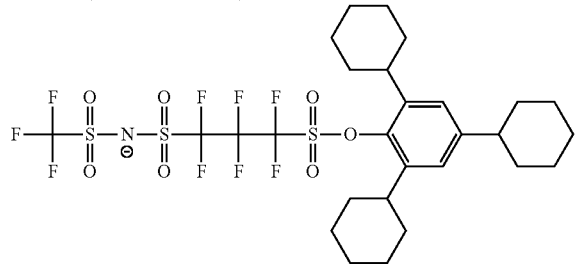
(z29)
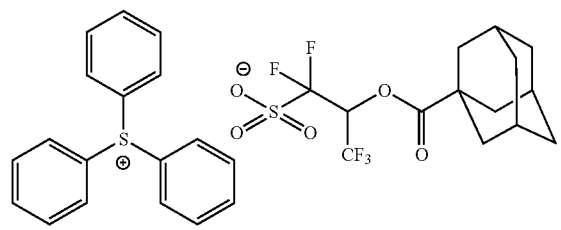
(z30)
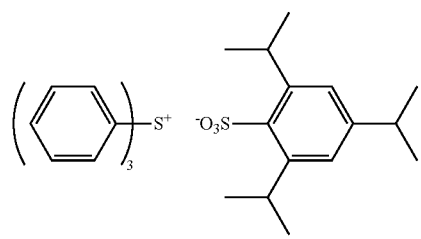
(z31)
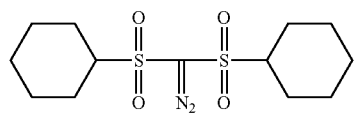
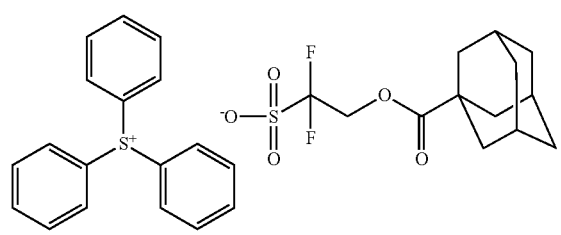
-continued
(z32)
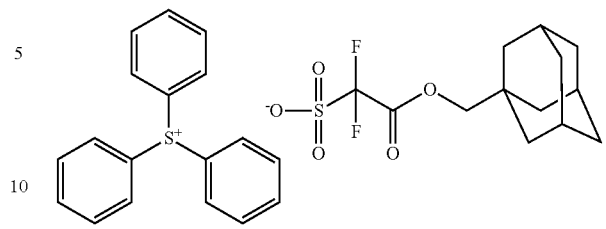
(z37)
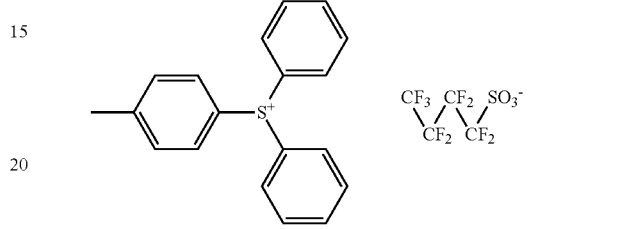
(z38)
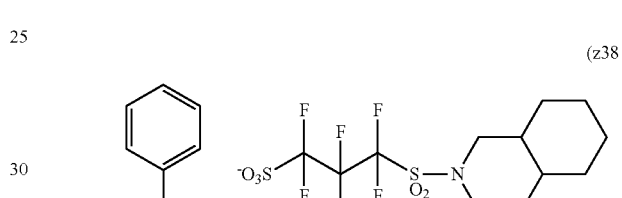
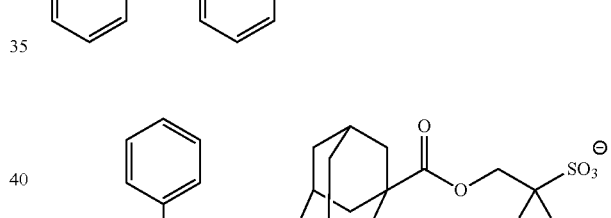
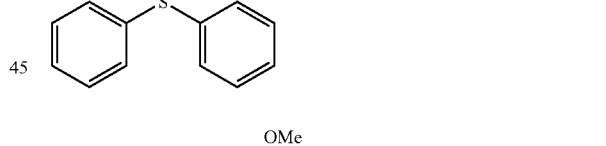
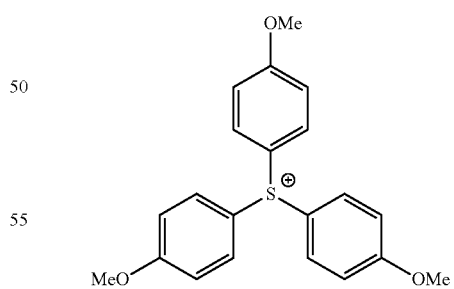
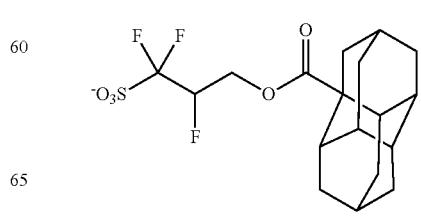

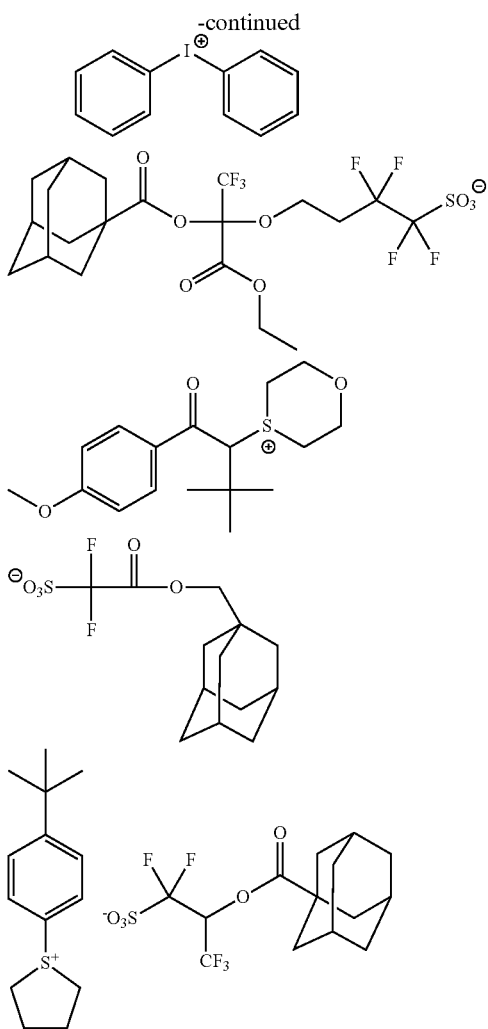

Moreover, as the acid generator (preferably an onium compound) used in the present invention, a high molecular acid generator in which a group (photoacid generating group) that generates an acid upon irradiation with actinic ray or radiation is introduced in the main chain or the side chain of the high molecular compound.

The content of the acid generator in the composition is preferably 0.1% to 25% by mass, more preferably 0.5% to 20% by mass, and still more preferably 1% to 18% by mass, with respect to the total solid content of the composition.

The acid generator can be used singly or in combination of two or more kinds thereof.

<Basic Compound (E)>

It is preferable that the composition of the present invention further includes a basic compound (hereinafter also referred to as a "compound (E)") as an acid trapping agent. By using the basic compound, a change in the performance over time from exposure to post-heating can be reduced. As the basic compound, an organic basic compound is preferable. More specific examples thereof include aliphatic amines, aromatic amines, heterocyclic amines, a nitrogen-containing compound having a carboxyl group, a nitrogen-containing compound having a sulfonyl group, a nitrogen-containing compound having a hydroxyl group, a nitrogen-containing compound having a hydroxyphenyl group, an alcoholic nitrogen-containing compound, amide derivatives, and imide derivatives. Further, an amine oxide compound (described in JP2008-102383A) and an ammonium salt (preferably a hydroxide or a carboxylate; more specifically, tetraalkylammonium hydroxide, typically tetrabutylammonium hydroxide, is preferable from the viewpoint of LER) is also appropriately used.

Moreover, a compound whose basicity increases by the action of an acid can be used as one kind of basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline, triethanolamine, N,N-dihydroxyethylaniline, tris(methoxyethoxyethyl)amine, the compounds exemplified in column 3, line 60 et seq. of U.S. Pat. No. 6,040,112A, 2-[2-{2-(2,2-dimethoxy-phenoxy-ethoxy)ethyl}-bis-(2-methoxyethyl)]amine, and the compounds (C1-1) to (C3-3) exemplified in paragraph [0066] of US2007/0224539A1. Examples of the compounds having a nitrogen-containing heterocyclic structure include 2-phenyl-benzimidazole, 2,4,5-triphenylimidazole, N-hydroxyethyl-piperidine, bis(1,2,2,6,6-pentamethyl-4-piperidyl) sebacate, 4-dimethylaminopyridine, antipyrine, hydroxyantipyrine, 1,5-diazabicyclo[4.3.0]non-5-ene, 1,8-diazabicyclo[5.4.0]undec-7-ene, and tetrabutylammonium hydroxide.

Furthermore, a basic compound or a photolytic basic compound (compound that initially exhibits basicity since a basic nitrogen atom acts as a base but upon irradiation with actinic ray or radiation, is decomposed to generate an amphoteric ion compound containing a basic nitrogen atom and an organic acid moiety, these inducing an intramolecular neutralization to result in a decrease in or a loss of the basicity, for example, the onium salts described in JP3577743B, JP2001-215689A, JP2001-166476A, and JP2008-102383A), and a photobasicity generator (for example, the compound described in JP2010-243773A) is also appropriately used.

Among these basic compounds, an ammonium salt is preferable from the viewpoint of improvement of resolution.

The content of the basic compound in the present invention is preferably 0.01% to 10% by mass, more preferably 0.03% to 5% by mass, and particularly preferably 0.05% to 3% by mass, with respect to the total solid content of the composition.

In one aspect of the present invention, it is more preferable that the basic compound is an onium salt compound containing a nitrogen atom in a cationic moiety which will be described later.

Examples of the onium salt compound include a diazonium salt compound, a phosphonium salt compound, a sulfonium salt compound, and an iodonium salt compound. Among these, a sulfonium salt compound or an iodonium salt compound is preferable, and a sulfonium salt compound is more preferable.

This onium salt compound typically includes a basic moiety containing a nitrogen atom in a cationic moiety thereof. Here, the "basic moiety" refers to a site of the cationic moiety of the compound (E) whose conjugate acid exhibits a pKa value of −3 or more. This pKa value is preferably in the range of −3 to 15, and more preferably in the range of 0 to 15. Further, the pKa value refers to a value calculated by ACD/ChemSketch (ACD/Labs 8.00 Release Product Version: 8.08).

This basic moiety includes, for example, a structure selected from the group consisting of amino groups (each a group resulting from the removal of one hydrogen atom from ammonia, a primary amine, or a secondary amine; same hereinafter) and nitrogen-containing heterocyclic groups. The amino group is preferably an aliphatic amino group. The aliphatic amino group means a group resulting from the removal of one hydrogen atom from an aliphatic amine.

In these structures, it is preferable that all the atoms adjacent to a nitrogen atom contained in the structure are carbon atoms or hydrogen atoms from the viewpoint of basicity enhancement. Also, from the viewpoint of basicity enhancement, it is preferable that no electron-withdrawing functional group (a carbonyl group, a sulfonyl group, a cyano group, a halogen atom, or the like) is directly bonded to the nitrogen atom.

The onium salt compound may include two or more of the basic moieties.

In a case where the cationic moiety of the compound (E) contains an amino group, it is preferable that the cationic moiety includes a partial structure represented by General Formula (N-I).

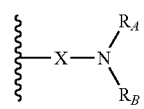

(N-I)

In the formula, $R_A$ and $R_B$ each independently represent a hydrogen atom or an organic group.

X represents a single bond or a linking group.

At least two members of $R_A$, $R_B$, and X may be bonded to each other to form a ring.

Examples of the organic group represented by $R_A$ or $R_B$ include an alkyl group, a cycloalkyl group, an alkenyl group, an aryl group, a heterocyclic hydrocarbon group, an alkoxycarbonyl group, a lactone group, and a sultone group.

These groups may have a substituent. Examples of the substituent include an alkyl group, a cycloalkyl group, an alkoxy group, an alkoxycarbonyl group, a carboxyl group, a halogen atom, a hydroxyl group, and a cyano group.

The alkyl group represented by $R_A$ or $R_B$ may be linear or branched. This alkyl group preferably has 1 to 50 carbon atoms, more preferably 1 to 30 carbon atoms, and still more preferably 1 to 20 carbon atoms. Examples of such an alkyl group include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, and a 2-ethylhexyl group.

The cycloalkyl group represented $R_A$ or $R_B$ may be monocyclic or polycyclic. Preferred examples of this cycloalkyl group include a monocycloalkyl group having 3 to 8 carbon atoms, such as a cyclopropyl group, a cyclopentyl group, and a cyclohexyl group.

The alkenyl group represented by $R_A$ or $R_B$ may be linear or branched. This alkenyl group preferably has 2 to 50 carbon atoms, more preferably 2 to 30 carbon atoms, and still more preferably 3 to 20 carbon atoms. Examples of such an alkenyl group include a vinyl group, an allyl group, and a styryl group.

The aryl group represented by $R_A$ or $R_B$ preferably has 6 to 14 carbon atoms. Examples of such a group include a phenyl group and a naphthyl group.

The heterocyclic hydrocarbon group represented $R_A$ or $R_B$ preferably has 5 to 20 carbon atoms, and more preferably 6 to 15 carbon atoms. The heterocyclic hydrocarbon group may be aromatic or non-aromatic, but the heterocyclic hydrocarbon group is preferably aromatic.

The heterocycle contained in the above group may be monocyclic or polycyclic. Examples of such a heterocycle include an imidazole ring, a pyridine ring, a pyrazine ring, a pyrimidine ring, a pyridazine ring, a 2H-pyrrole ring, a 3H-indole ring, a 1H-indazole, a purine ring, an isoquinoline ring, and a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isoxazole ring, and a benzothiazole ring.

The lactone group represented by $R_A$ or $R_B$ is, for example, a lactone group with a 5- to 7-membered ring, and may be a group resulting from fusion of a lactone group with a 5- to 7-membered ring with another ring structure such that a bicyclo structure or a spiro structure is formed.

The sultone group represented by $R_A$ or $R_B$ is, for example, a sultone group with a 5- to 7-membered ring, and may be a group resulting from fusion of a sultone group with a 5- to 7-membered ring with another ring structure such that a bicyclo structure or a spiro structure is formed.

Specifically, the groups having the structures shown below are preferable.

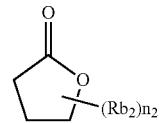

LC1-1

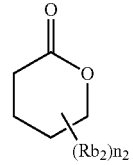

LC1-2

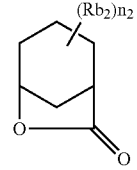

LC1-3

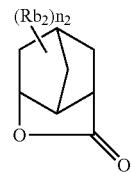

LC1-4

LC1-5 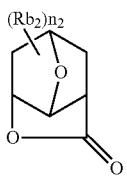

LC1-6 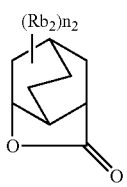

LC1-7 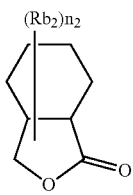

LC1-8 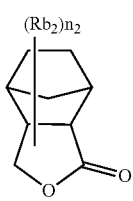

LC1-9 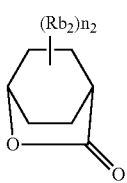

LC1-10 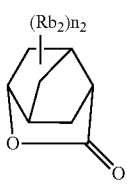

LC1-11 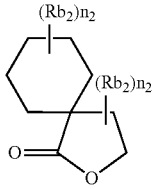

LC1-12 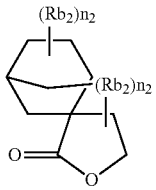

LC1-13 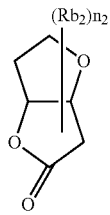

LC1-14 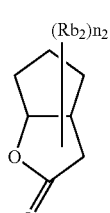

LC1-15 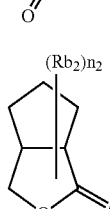

LC1-16 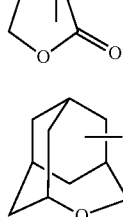

LC1-17 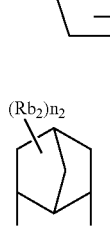

SL1-1 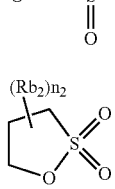

SL1-2 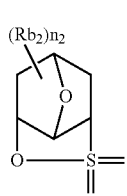

SL1-3

The lactone group and the sultone group may or may not each have a substituent ($Rb_2$). Preferred examples of the substituent ($Rb_2$) include the same substituents as those described above as the substituent of $R_A$ and $R_B$. $n_2$ represents an integer of 0 to 4. When $n_2$ is 2 or more, the substituents ($Rb_2$) that are present in plural may be the same as or different from each other. Further, the substituents ($Rb_2$) that are present in plural may be bonded to each other to form a ring.

Examples of the linking group represented by X include a linear or branched alkylene group, a cycloalkylene group, an ether bond, an ester bond, an amide bond, a urethane bond, a urea bond, and a group formed by combining two or more of these. X is preferably a single bond, an alkylene group, a group formed by combining an alkylene group and an ether bond, or a group formed by combining an alkylene group and an ester bond. The number of atoms constituting the linking group represented by X is preferably 20 or less, and more preferably 15 or less. Each of the linear or branched alkylene group and cycloalkylene group preferably has 8 or less carbon atoms, and may have a substituent. The substituent preferably has 8 or less carbon atoms. Examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms).

At least two members of $R_A$, $R_B$, and X may be bonded to each other to form a ring. The number of carbon atoms constituting the ring is preferably 4 to 20, and the ring may be monocyclic or polycyclic. An oxygen atom, a sulfur atom, a nitrogen atom, an ester bond, an amide bond, or a carbonyl group may be contained in the ring.

In a case where the cationic moiety of the compound (E) contains a nitrogen-containing heterocyclic group, the nitrogen-containing heterocyclic group may or may not have aromaticity. The nitrogen-containing heterocyclic group may be monocyclic or polycyclic. The nitrogen-containing heterocyclic group is preferably a group containing a piperidine ring, a morpholine ring, a pyridine ring, an imidazole ring, a pyrazine ring, a pyrrole ring, or a pyrimidine ring.

The onium salt compound (E) is preferably a compound represented by General Formula (N-II).

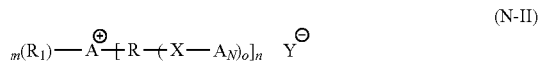

(N-II)

In the formula,

A represents a sulfur atom or an iodine atom.

$R_1$ represents a hydrogen atom or an organic group. In a case where a plurality of $R_1$'s are present, they may be the same as or different from each other.

R represents a (o+1)-valent organic group. In a case where a plurality of R's are present, they may be the same as or different from each other.

X represents a single bond or a linking group. In a case where a plurality of X's are present, they may be the same as or different from each other.

$A_N$ represents a basic moiety containing a nitrogen atom. In a case where a plurality of $A_N$'s are present, they may be the same as or different from each other.

In a case where A is a sulfur atom, n is an integer of 1 to 3 and m is an integer satisfying the relationship of m+n=3.

In a case where A is an iodine atom, n is 1 or 2, and m is an integer satisfying the relationship of m+n=2.

o is an integer of 1 to 10.

$Y^-$ represents an anion (details thereof are which will be described later as the anionic moiety of the compound (E)).

At least two members of $R_1$, X, R, and $A_N$ may be bonded to each other to form a ring.

Examples of the (o+1)-valent organic group represented by R include a (linear or branched) chained or cyclic aliphatic hydrocarbon group, a heterocyclic hydrocarbon group or an aromatic hydrocarbon group. An aromatic hydrocarbon group is preferable. In a case where R is an aromatic hydrocarbon group, it preferably bonded at the p-position (1,4-position) of the aromatic hydrocarbon group.

The linking group represented by X has the same definition as that represented by X of General Formula (N-I), and specific examples thereof are also the same.

The basic moiety represented by $A_N$ has the same definition as the "basic moiety" contained in the cationic moiety of the compound (E) described above. For example, the basic moiety may include an amino group or a nitrogen-containing heterocyclic group. In a case where the basic moiety contains an amino group, examples of the amino group include an —N($R_A$)($R_B$) group in General Formula (N-I) described above.

Examples of the organic group represented by $R_1$ include an alkyl group, an alkenyl group, an alicyclic group, an aromatic hydrocarbon group, and a heterocyclic hydrocarbon group. In a case of m=2, two $R_1$'s may be bonded to each other to form a ring. These groups or rings may further include a substituent.

The alkyl group represented by $R_1$ may be linear or branched. This alkyl group preferably has 1 to 50 carbon atoms, more preferably 1 to 30 carbon atoms, and still more preferably 1 to 20 carbon atoms. Examples of such an alkyl group include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, and a 2-ethylhexyl group.

The alkenyl group represented by $R_1$ may be linear or branched. This alkenyl group preferably has 2 to 50 carbon atoms, more preferably 2 to 30 carbon atoms, and still more preferably 3 to 20 carbon atoms. Examples of such an alkenyl group include a vinyl group, an allyl group, and a styryl group.

The alicyclic group represented by $R_1$ is, for example, a cycloalkyl group. The cycloalkyl group may be monocyclic or polycyclic. Preferred examples of this alicyclic group include a monocycloalkyl group having 3 to 8 carbon atoms, such as a cyclopropyl group, a cyclopentyl group, and a cyclohexyl group.

The aromatic hydrocarbon group represented by $R_1$ preferably has 6 to 14 carbon atoms. Examples of such a group include an aryl group, such as a phenyl group and a naphthyl group. The aromatic hydrocarbon group represented by $R_1$ is preferably a phenyl group.

The heterocyclic hydrocarbon group represented by $R_1$ may have or may not have aromaticity. This heterocyclic hydrocarbon group preferably has aromaticity.

The heterocycle contained in this group may be monocyclic or polycyclic. Examples of the heterocycle include an imidazole ring, a pyridine ring, a pyrazine ring, a pyrimidine ring, a pyridazine ring, a 2H-pyrrole ring, a 3H-indole ring, a 1H-indazole, a purine ring, an isoquinoline ring, a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isoxazole ring, and a benzothiazole ring.

It is preferable that $R_1$ is an aromatic hydrocarbon group or two $R_1$'s are bonded to each other to form a ring.

The ring that may be formed by the mutual bonding of at least two members of $R_1$, X, R, and $A_N$ is preferably a 4- to 7-membered ring, more preferably a 5- or 6-membered ring, and particularly preferably a 5-membered ring. Further, a heteroatom such as an oxygen atom, a sulfur atom, and a nitrogen atom may be contained in the skeleton of the ring.

In a case where the group represented by $R_1$ or the ring formed by the mutual bonding of two $R_1$'s further includes a substituent, examples of the substituent are as follows. That is, examples of the substituent include a halogen atom (—F, —Br, —Cl, or —I), a hydroxyl group, an alkoxy group, an aryloxy group, a mercapto group, an alkylthio group, an arylthio group, an amino group, an acyloxy group, a carbamoyloxy group, an alkylsulfoxy group, an arylsulfoxy group, an acylthio group, an acylamino group, a ureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, a carbamoyl group, an alkylsulfinyl group, an arylsulfinyl group, an alkylsulfonyl group, an arylsulfonyl group, a sulfo group (—$SO_3H$) or its conjugated base group (referred to as a sulfonato group), an alkoxysulfonyl group, an aryloxysulfonyl group, a sulfinamoyl group, a phosphono group (—$PO_3H_2$) or its conjugated base group (referred to as a phosphonato group), a phosphonooxy group (—$OPO_3H_2$), or its conjugated base group (referred to as a phosphonatooxy group), a cyano group, a nitro group, an aryl group, an alkenyl group, an alkynyl group, a heterocyclic group, a silyl group, and an alkyl group.

Among these substituents, a hydroxyl group, an alkoxy group, a cyano group, an aryl group, an alkenyl group, an alkynyl group, an alkyl group, and the like are preferable.

In General Formula (N-II), o is preferably an integer of 1 to 4, more preferably 1 or 2, and still more preferably 1.

With regard to the compound (E) represented by General Formula (N-II), in one aspect, it is preferable that at least one of n R's in the formula is an aromatic hydrocarbon group. Further, it is preferable that X in at least one of o —(X-$A_N$) groups bonded to at least one of the aromatic hydrocarbon groups is a linking group whose portion of bonding to the aromatic hydrocarbon group is a carbon atom.

That is, in compound (E) in this aspect, the basic moiety represented by $A_N$ is bonded via the carbon atom directly bonded to the aromatic hydrocarbon group represented by R to the aromatic hydrocarbon group.

The aromatic hydrocarbon group represented by R may contain a heterocycle as the aromatic ring in the aromatic hydrocarbon group. Further, the aromatic ring may be monocyclic or polycyclic.

The aromatic ring group preferably has 6 to 14 carbon atoms. Examples of the group include aryl groups such as a phenyl group, a naphthyl group, and an anthryl group. In a case where the aromatic ring group contains a heterocycle, examples of the heterocycle include a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

The aromatic hydrocarbon group represented by R is preferably a phenyl group or a naphthyl group, and particularly preferably a phenyl group.

The aromatic hydrocarbon group represented by R may further include a substituent other than a group represented by —(X-$A_N$) described later. As the substituent, for example, those enumerated above as a substituent in $R_1$ can be used.

Moreover, in this aspect, the linking group as X in at least one —(X-$A_N$) group to be used as a substituent in the aromatic ring R is not particularly limited as long as the binding position to the aromatic hydrocarbon group represented by R is a carbon atom. This linking group includes, for example, an alkylene group, a cycloalkylene group, an arylene group, —COO—, —CO—, or a combination of these. The linking group may contain a combination of each of these groups with at least one selected from the group consisting of —O—, —S—, —OCO—, —S(=O)—, —S(=O))$_2$—, —OS(=O))$_2$—, and —NR'—. Here, R' represents, for example, a hydrogen atom, an alkyl group, a cycloalkyl group, or an aryl group.

The alkylene group that can be included in the linking group represented by X may be linear or branched. The alkylene group preferably has 1 to 20 carbon atoms, and more preferably 1 to 10 carbon atoms. Examples of such an alkylene group include a methylene group, an ethylene group, a propylene group, and a butylene group.

The cycloalkylene group that can be contained in the linking group represented by X may be monocyclic or polycyclic. The cycloalkylene group preferably has 3 to 20 carbon atoms, and more preferably 3 to 10 carbon atoms. Examples of such a cycloalkylene group include a 1,4-cyclohexylene group.

The arylene group that can be contained in the linking group represented by X preferably has 6 to 20 carbon atoms, and more preferably 6 to 10 carbon atoms. Examples of such an arylene group include a phenylene group and a naphthylene group.

It is preferable that at least one of X's is represented by General Formula (N-III) or (N-IV).

(N-III)

In the formula, $R_2$ and $R_3$ each represent a hydrogen atom, an alkyl group, an alkenyl group, an alicyclic group, an aromatic hydrocarbon group, or a heterocyclic hydrocarbon group. $R_2$ and $R_3$ may be bonded to each other to form a ring. At least one of $R_2$ and $R_3$ may be bonded to E to form a ring.

E represents a linking group or a single bond.

(N-IV)

In the formula,

J represents an oxygen atom or a sulfur atom.

E represents a linking group or a single bond.

Examples of each of the groups represented by $R_2$ and $R_3$, and the substituent which these groups may further include are the same as mentioned above, respectively, with regard to $R_1$. Each of the ring formed by the bonding of $R_2$ and $R_3$ and the ring formed by the bonding of at least one of $R_2$ or $R_3$ to E is preferably a 4- to 7-membered ring, and more preferably a 5- or 6-membered ring. It is preferable that $R_2$ and $R_3$ are each independently a hydrogen atom or an alkyl group.

The linking group represented by E includes, for example, an alkylene group, a cycloalkylene group, an arylene group, —COO—, —CO—, —O—, —S—, —OCO—, —S(=O)—, —S(=O)$_2$—, —OS(=O)$_2$—, —NR—, or a combination of these. Here, R represents, for example, a hydrogen atom, an alkyl group, a cycloalkyl group, or an aryl group.

It is preferable that the linking group represented by E is at least one selected from the group consisting of an alkylene bond, an ester bond, an ether bond, a thioether bond, a urethane bond, (a group represented by

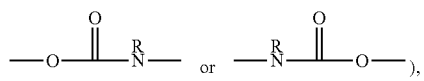), a urea bond (a group represented by

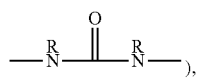), an amide bond, and a sulfonamide bond. The linking group represented by E is more preferably an alkylene bond, an ester bond, or an ether bond.

Furthermore, the compound (E) may be a compound comprising a plurality of moieties each containing a nitrogen atom. For example, the compound (E) may be a compound having the structure represented by General Formula (N-II) in which at least one of $R_1$'s is represented by General Formula (N-I).

In one aspect, the compound (E) represented by General Formula (N-II) is represented by General Formula (N-V).

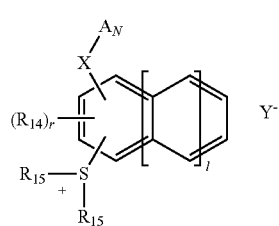 (N-V)

In the formula, X, $A_N$, and Y$^-$ have the same definitions as the respective groups in General Formula (N-II), and specific examples and preferred examples thereof are also the same.

$R_{14}$, $R_{15}$, r, and I have the same definitions as the respective groups and indexes in General Formula (ZI-4), which show one aspect of a photoacid generator, and specific examples and preferred examples thereof are also the same.

Furthermore, in one aspect, the compound (E) represented by General Formula (N-II) is represented by General Formula (N-VI).

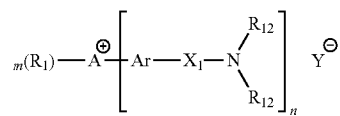 (N-VI)

In General Formula (N-VI),

A represents a sulfur atom or an iodine atom.

$R_{11}$'s each independently represent an alkyl group, an alkenyl group, an alicyclic group, an aromatic hydrocarbon group, or a heterocyclic hydrocarbon group. In a case of m=2, two $R_{11}$'s may be bonded to each other to form a ring.

Ar's each independently represent an aromatic hydrocarbon group.

$X_1$'s each independently represent a divalent linking group.

$R_{12}$'s each independently represent a hydrogen atom or an organic group.

In a case where A is a sulfur atom, m is an integer of 1 to 3 and n is an integer satisfying the relationship of m+n=3.

In a case where A is an iodine atom, m is an integer of 1 or 2 and n is an integer satisfying the relationship of m+n=2.

Y$^-$ represents an anion (details thereof are which will be described later as the anionic moiety of the compound (E)).

Specific examples and preferred examples of the alkyl group, the alkenyl group, the alicyclic group, the aromatic hydrocarbon group, and the heterocyclic hydrocarbon group as $R_{11}$ are the same as the specific examples and the preferred examples as the alkyl group, the alkenyl group, the alicyclic group, the aromatic hydrocarbon group, and the heterocyclic hydrocarbon group as $R_1$ in General Formula (N-II), respectively.

Specific examples and preferred examples of the aromatic hydrocarbon group as Ar are the same as the specific examples and the preferred examples of the aromatic hydrocarbon group as R in General Formula (N-II).

Specific examples and preferred examples of the divalent linking group as $X_1$ are the same as the specific examples and the preferred examples of the linking group as X in General Formula (N-II).

Specific examples and preferred examples of the organic group as $R_{12}$ are the same as the specific examples and the preferred examples of the organic group as $R_A$ and $R_B$ in General Formula (N-I), respectively.

An aspect in which X is an alkylene group (for example, a methylene group) and in which two $R_{12}$'s are bonded to each other to form a ring is particularly preferable from the viewpoint of dependence on post-exposure heating (PEB) temperature and post-exposure line width (PED) stability.

The anionic moiety of the compound (E) is not particularly limited. It is preferable that the anion contained in the compound (E) is a non-nucleophilic anion. Here, the non-nucleophilic anion refers to an anion whose capability of inducing a nucleophilic reaction is markedly low, which anion is capable of suppressing any decomposition over time by an intramolecular nucleophilic reaction. Thus, the temporal stability of the composition according to the present invention is improved.

Examples of the non-nucleophilic anion include a sulfonate anion, a carboxylate anion, a sulfonylimide anion, a bis(alkylsulfonyl)imide anion, and a tris(alkylsulfonyl)methyl anion.

Examples of the sulfonate anion include an aliphatic sulfonate anion, an aromatic sulfonate anion, and a camphor sulfonate anion.

Examples of the carboxylate anion include an aliphatic carboxylate anion, an aromatic carboxylate anion, and an aralkyl carboxylate anion.

The aliphatic moiety in the aliphatic sulfonate anion may be an alkyl group or a cycloalkyl group, and is preferably an alkyl group having 1 to 30 carbon atoms or a cycloalkyl group having 3 to 30 carbon atoms. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

Preferred examples of the aromatic group in the aromatic sulfonate anion include an aryl group having 6 to 14 carbon atoms, such as a phenyl group, a tolyl group, and a naphthyl group.

The alkyl group, the cycloalkyl group, and the aryl group in the aliphatic sulfonate anion and the aromatic sulfonate anion may each have a substituent. Examples of the substituent that can be contained in the alkyl group, the cycloalkyl group, and the aryl group in the aliphatic sulfonate anion and the aromatic sulfonate anion include a nitro group, a halogen atom (a fluorine atom, a chlorine atom, bromine atom, or an iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). With regard to the aryl group or the ring structure of each of these groups, examples of the substituent include an alkyl group (preferably having 1 to 15 carbon atoms).

Examples of the aliphatic moiety in the aliphatic carboxylate anion include the same alkyl groups and cycloalkyl groups with regard to the aliphatic sulfonate anion.

Examples of the aromatic group in the aromatic carboxylate anion include the same aryl groups with regard to the aromatic sulfonate anion.

Preferred examples of the aralkyl group in the aralkyl carboxylate anion include an aralkyl group having 6 to 12 carbon atoms, for example, a benzyl group, a phenethyl group, a naphthylmethyl group, a naphthylethyl group, and a naphthylbutyl group.

The alkyl group, the cycloalkyl group, the aryl group, and the aralkyl group in the aliphatic carboxylate anion, the aromatic carboxylate anion, and the aralkyl carboxylate anion may each have a substituent. Examples of the substituent which can be included in the alkyl group, the cycloalkyl group, the aryl group, and the aralkyl group in the aliphatic carboxylate anion, the aromatic carboxylate anion, and the aralkyl carboxylate anion include the same halogen atoms, alkyl groups, cycloalkyl groups, alkoxy groups, alkylthio groups, and the like with regard to the aromatic sulfonate anion.

Examples of the sulfonylimide anion include a saccharin anion.

The alkyl group in the bis(alkylsulfonyl)imide anion and the tris(alkylsulfonyl)methyl anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group, and a neopentyl group. Examples of the substituent of these alkyl groups include a halogen atom, an alkyl group substituted with a halogen atom, an alkoxy group, an alkylthio group, an alkyloxysulfonyl group, an aryloxysulfonyl group, and a cycloalkylaryloxysulfonyl group. An alkyl group substituted with a fluorine atom is preferable. In a preferred aspect, two alkyl groups in the bis(alkylsulfonyl)imide anion are bonded to each other to form a ring structure. In this case, the formed ring structure is preferably a 5- to 7-membered ring.

Examples of other non-nucleophilic anions include phosphorus fluoride, boron fluoride, and antimony fluoride.

The non-nucleophilic anion is preferably an aliphatic sulfonate anion substituted at its α-position of sulfonic acid with a fluorine atom, an aromatic sulfonate anion substituted with a fluorine atom or a group containing a fluorine atom, a bis(alkylsulfonyl)imide anion whose alkyl group is substituted with a fluorine atom or a tris(alkylsulfonyl)methide anion whose alkyl group is substituted with a fluorine atom. More preferably, the non-nucleophilic anion is a perfluorinated aliphatic sulfonate anion having 4 to 8 carbon atoms or a benzenesulfonate anion containing a fluorine atom. Still more preferably, the non-nucleophilic anion is a nonafluorobutanesulfonate anion, a perfluorooctanesulfonate anion, a pentafluorobenzenesulfonate anion, or a 3,5-bis(trifluoromethyl)benzenesulfonate anion.

In addition, the non-nucleophilic anion is preferably represented by, for example, General Formula (LD1).

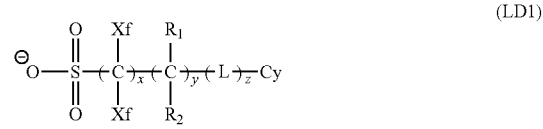

(LD1)

In the formula,

Xf's each independently represent a fluorine atom or an alkyl group substituted with at least one fluorine atom.

$R_1$ and $R_2$ each independently represent a hydrogen atom, a fluorine atom or an alkyl group.

L's each independently represent a divalent linking group.

Cy represents a cyclic organic group.

x is an integer of 1 to 20.

y is an integer of 0 to 10.

z is an integer of 0 to 10.

Xf represents a fluorine atom or an alkyl group substituted with at least one fluorine atom. This alkyl group preferably has 1 to 10 carbon atoms, and more preferably 1 to 4 carbon atoms. The alkyl group substituted with at least one fluorine atom is preferably a perfluoroalkyl group.

Xf is preferably a fluorine atom or a perfluoroalkyl group having 1 to 4 carbon atoms. More specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$.

$R_1$ and $R_2$ each independently represent a hydrogen atom, a fluorine atom or an alkyl group. A substituent (preferably a fluorine atom) may be introduced in this alkyl group. The alkyl group preferably has 1 to 4 carbon atoms. More preferably, the alkyl group is a perfluoroalkyl group having 1 to 4 carbon atoms. Specific examples of the alkyl groups with a substituent, represented by $R_1$ and $R_2$, include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

L represents a divalent linking group. Examples of the divalent linking group include —COO—, —OCO—, —CONH—, —CO—, —O—, —S—, —SO—, —SO$_2$—, an alkylene group, a cycloalkylene group, and an alkenylene group. Among these, —CONH—, —CO—, or —SO$_2$— is preferable, and —CONH— or —SO$_2$— is more preferable.

Cy represents a cyclic organic group. Examples of the cyclic organic group include an alicyclic group, an aryl group, and a heterocyclic group.

The alicyclic group may be monocyclic or polycyclic, and examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure having 7 or more carbon atoms, such as a norbornyl group, a tricyclodecanyl group, a tetracyclodecanyl group, a tetracyclododecanyl group, and an adamantyl group is preferable from the viewpoints of inhibiting diffusivity into the film during post-exposure heating (PEB) process and improving Mask Error Enhancement Factor (MEEF).

The aryl group may be monocyclic or polycyclic. Examples of the aryl group include a phenyl group, a naphthyl group, a phenanthryl group, and an anthryl group. Among these, a naphthyl group having a relatively low light absorbance at 193 nm is preferable.

The heterocyclic group may be monocyclic or polycyclic, but the heterocyclic group which is polycyclic can further suppress acid diffusion. Further, the heterocyclic group may or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle having no aromaticity include a tetrahydropyran ring, a lactone ring, and a decahydroisoquinoline ring. As a heterocycle in the heterocyclic group, a furan ring, a thiophene ring, a pyridine ring, or a decahydroisoquinoline ring is particularly preferable. In addition, examples of the lactone ring include the lactone rings exemplified with regard to $R_A$ and $R_B$ in General Formula (N-1).

The cyclic organic group may have a substituent. Examples of the substituent include an alkyl group, a cycloalkyl group, an aryl group, a hydroxyl group, an alkoxy group, an ester group, an amido group, a urethane group, a ureido group, a thioether group, a sulfonamido group, and a sulfonic acid ester group. The alkyl group may be linear or branched. Further, the alkyl group preferably has 1 to 12 carbon atoms. The cycloalkyl group may be monocyclic or polycyclic. Further, the cycloalkyl group preferably has 3 to 12 carbon atoms. The aryl group preferably has 6 to 14 carbon atoms.

x is preferably 1 to 8, and among these, it is more preferably 1 to 4, and particularly preferably 1. y is preferably 0 to 4, and more preferably 0. z is preferably 0 to 8, and particularly preferably 0 to 4.

Moreover, the non-nucleophilic anion is preferably represented by, for example, General Formula (LD2).

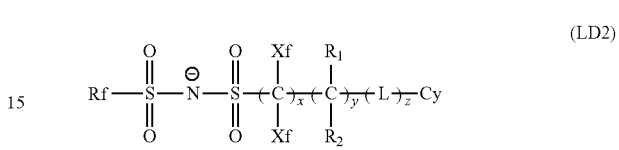

In General Formula (LD2), Xf, $R_1$, $R_2$, L, Cy, x, y, and z have the same definitions as the respective groups in General Formula (LD1). Rf is a group containing a fluorine atom.

Examples of the group containing a fluorine atom represented by Rf include an alkyl group containing at least one fluorine atom, a cycloalkyl group containing at least one fluorine atom, and an aryl group containing at least one fluorine atom.

These alkyl group, cycloalkyl group, and aryl group may be substituted with a fluorine atom, or may be substituted with another substituent containing a fluorine atom. In a case where Rf is a cycloalkyl group containing at least one fluorine atom or an aryl group containing at least one fluorine atom, examples of such other substituents containing a fluorine atom include an alkyl group substituted with at least one fluorine atom.

Furthermore, these alkyl group, cycloalkyl group, and aryl group may further be substituted with a substituent containing no fluorine atom. Examples of this substituent include any of those mentioned above with respect to Cy in which no fluorine atom is contained.

Examples of the alkyl group containing at least one fluorine atom represented by Rf include the same groups as those described above as the alkyl group substituted with at least one fluorine atom, represented by Xf. Examples of the cycloalkyl group containing at least one fluorine atom represented by Rf include a perfluorocyclopentyl group and a perfluorocyclohexyl group. Examples of the aryl group containing at least one fluorine atom represented by Rf include a perfluorophenyl group.

Examples of a preferred aspect of the anionic moiety of the compound (E) include the structures exemplified as the preferred anion structure of a photoacid generator, other than the structures represented by General Formulae (LD1) and (LD2).

Furthermore, in the compound (E), the fluorine content represented by (sum of the masses of all fluorine atoms contained in the compound)/(sum of the masses of all atoms contained in the compound) is preferably 0.30 or less, more preferably 0.25 or less, still more preferably 0.20 or less, particularly preferably 0.15 or less, and most preferably 0.10 or less.

With regard to specific examples of the compound (E), paragraphs [0108] to [0116] of JP2014-134686A can be incorporated herein by reference, the contents of which are incorporated herein by reference.

As the basic compound (E), an onium salt compound containing a nitrogen atom in the anionic moiety is also preferable.

As the onium salt compound containing a nitrogen atom in the anionic moiety, a basic compound or ammonium salt compound whose basicity decreases upon irradiation with actinic ray or radiation is preferable.

The onium salt compound containing a nitrogen atom in the anionic moiety is preferably a compound (E-1) having a basic functional group or an ammonium group, and a group that generates an acidic functional group upon irradiation with actinic ray or radiation. That is, the onium salt compound containing a nitrogen atom in the anionic moiety is preferably a basic compound having a basic functional group and a group that generates an acidic functional group upon irradiation with actinic ray or radiation, or an ammonium salt compound having an ammonium group and a group that generates an acidic functional group upon irradiation with actinic ray or radiation.

Examples of the compound whose basicity decreases, generated by the decomposition of the onium salt compound containing a nitrogen atom in the anionic moiety upon irradiation with actinic ray or radiation include a compound represented by General Formula (PA-I), (PA-II) or (PA-III), and from the viewpoint of attaining excellent effects to a high degree in all of LWR, uniformity in local pattern dimension, and DOF, the compound represented by General Formula (PA-II) or (PA-III) is particularly preferable.

First, the compound represented by General Formula (PA-I) will be described.

Q-A1-(X)$n$-B—R    (PA-I)

In General Formula (PA-I),

A1 represents a single bond or a divalent linking group.

Q represents —SO$_3$H or —CO$_2$H. Q corresponds to an acidic functional group which is generated upon irradiation with actinic ray or radiation.

X represents —SO$_2$— or —CO—. n represents 0 or 1.

B represents a single bond, an oxygen atom, or —N(Rx)-.

Rx represents a hydrogen atom or a monovalent organic group.

R represents a monovalent organic group having a basic functional group or a monovalent organic group having an ammonium group.

Subsequently, the compound represented by General Formula (PA-II) will be described.

Q1-X1-NH—X2-Q2    (PA-II)

In General Formula (PA-II),

Q1 and Q2 each independently represent a monovalent organic group, provided that any one of Q1 and Q2 has a basic functional group. Q1 and Q2 may be bonded to each other to form a ring and the ring formed may have a basic functional group.

X1 and X2 each independently represent —CO— or —SO$_2$—.

In addition, —NH— corresponds to an acidic functional group which is generated upon irradiation with actinic ray or radiation.

Next, the compound represented by General Formula (PA-III) will be described.

Q1-X1-NH—X2-A2-(X3)$m$-B-Q3    (PA-III)

In General Formula (PA-III),

Q1 and Q3 each independently represent a monovalent organic group, provided that any one of Q1 and Q3 contains a basic functional group. Q and Q3 may be bonded to each other to form a ring and the ring formed may contain a basic functional group.

X1, X2, and X3 each independently represent —CO— or —SO$_2$—.

A2 represents a divalent linking group.

B represents a single bond, an oxygen atom, or —N(Qx)-.

Qx represents a hydrogen atom or a monovalent organic group.

When B is —N(Qx)-, Q3 and Qx may be bonded to each other to form a ring.

m represents 0 or 1.

In addition, —NH— corresponds to an acidic functional group which is generated upon irradiation with actinic ray or radiation.

With regard to the onium salt compound containing a nitrogen atom in the anionic moiety, paragraphs [0421] to [0428] of JP2014-41328A can be incorporated herein by reference, the contents of which are incorporated herein by reference.

Specific examples of the onium salt compound containing a nitrogen atom in the cationic moiety or the onium salt compound containing a nitrogen atom in the anionic moiety include the following compounds, but are not limited thereto.

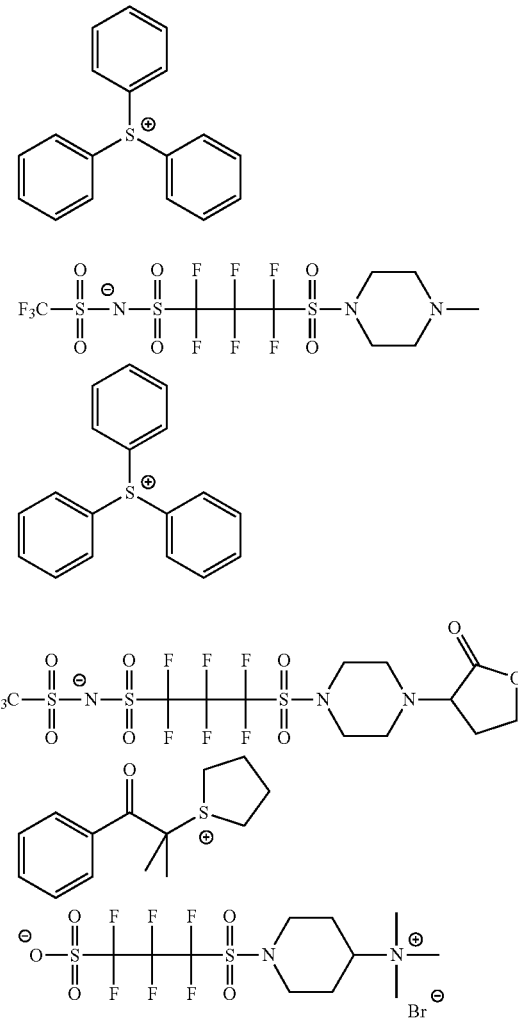

147
-continued
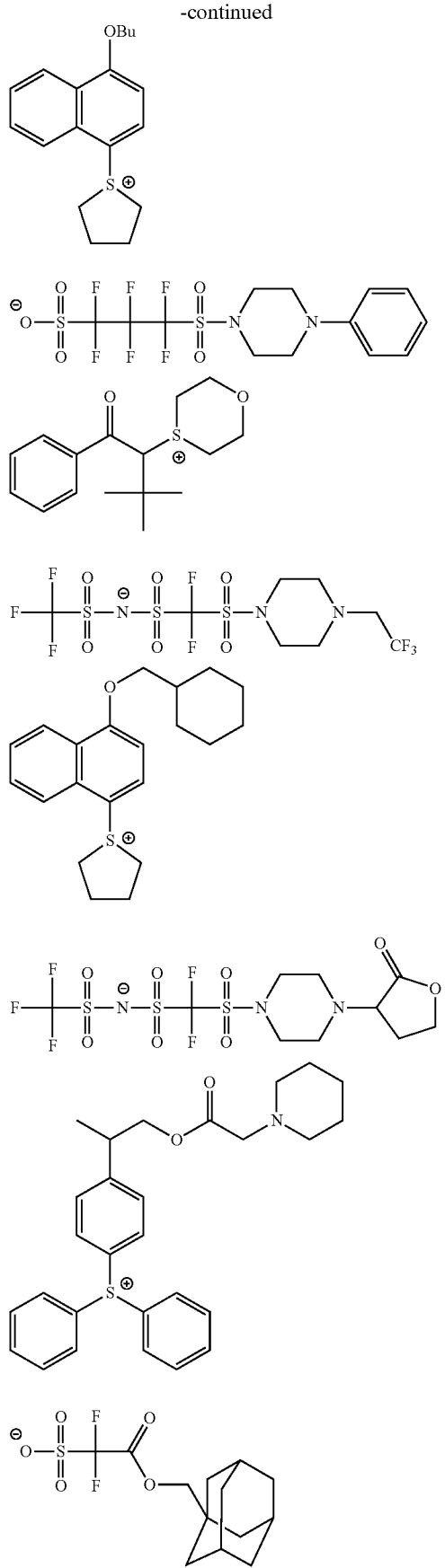
148
-continued
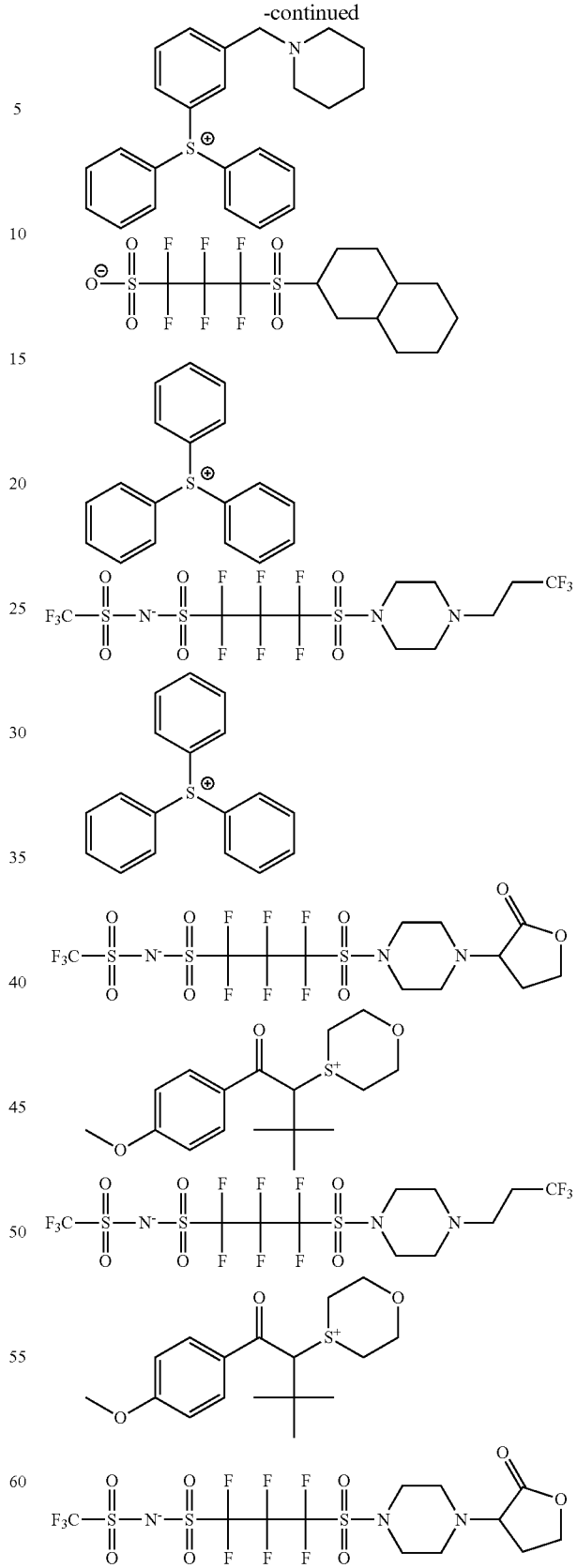
The compound (E) may be used singly or in combination of two or more kinds thereof.

The content of the compound (E) is usually in the range of 0.001% to 10% by mass, preferably 0.1% to 10% by mass, and more preferably 1% to 10% by mass, with respect to the total solid content of the composition.

In addition, from the viewpoint of improvement of resolution, it is preferable that the volume of an acid produced from the compound (E) is large.

<Onium Carboxylate Salt>

The composition of the present invention may include an onium carboxylate salt. Examples of the onium carboxylate salt include a carboxylic acid sulfonium salt, a carboxylic acid iodonium salt, and a carboxylic acid ammonium salt. In particular, as the onium carboxylate salt, a carboxylic acid sulfonium salt, or a carboxylic acid iodonium salt is preferable. Further, in the present invention, it is preferable that the carboxylate residue in the onium carboxylate salt contains neither an aromatic group nor a carbon-carbon double bond. A particularly preferred anionic moiety thereof is a linear, branched, monocyclic, or polycyclic alkyl carboxylate anion having 1 to 30 carbon atoms. A more preferred anionic moiety is a carboxylate anion in which the alkyl group is partially or fully fluorinated. The alkyl in its chain may contain an oxygen atom. Accordingly, the transparency to light of wavelength of 220 nm or less can be ensured, the sensitivity and the resolving power can be enhanced, and the iso/dense bias and the exposure margin can be improved.

The blend ratio of the onium carboxylate salt is preferably 1% to 15% by mass, and more preferably 2% to 10% by mass, with respect to the total solid content of the composition.

<Acid Proliferation Agent>

The actinic ray-sensitive or radiation-sensitive composition of the present invention may further include one kind or two or more kinds of the compounds (hereinafter also referred to as acid proliferation Agents) that decompose by the action of an acid to generate an acid. The acid generated by each acid proliferation Agent is preferably a sulfonic acid, a methide acid, or an imidic acid. The content of the acid proliferation Agent is preferably 0.1% to 50% by mass, more preferably 0.5% to 30% by mass, and still more preferably 1.0% to 20% by mass, with respect to the total solid content of the composition.

The blend ratio of the acid proliferation Agent to the acid generator (the solid content of the acid proliferation Agent with respect to the total solid content of the composition/the solid content of the acid generator with respect to the total solid content of the composition) is not particularly limited, but is preferably 0.01 to 50, more preferably 0.1 to 20, and particularly preferably 0.2 to 1.0.

With regard to the acid proliferation Agent, the description in [0381] of JP2014-41328A can be incorporated herein by reference, the contents of which are incorporated herein by reference.

<Solvent>

The composition of the present invention may include a solvent. As the solvent, ethylene glycol monoethyl ether acetate, cyclohexanone, 2-heptanone, propylene glycol monomethyl ether (PGME, also known as I-methoxy-2-propanol), propylene glycol monomethyl ether acetate (PGMEA, also known as 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, ethylene carbonate, and the like are preferable. These solvents may be used singly or in combination.

The solvent may include isomers (compounds having the same number of atoms and different structures). Incidentally, one kind or a plurality of kinds of the isomers may be included.

The composition of the present invention is preferably dissolved in the solvent such that the concentration of the solid content is 1% to 40% by mass. The concentration of the solid content of the composition of the present invention is more preferably 1% to 30% by mass, and still more preferably 1% to 20% by mass.

The concentration of the solid content of the composition of the present invention can be appropriately adjusted for the purpose of adjusting the thickness of a resist film to be prepared.

<Organic Acid>

The composition of the present invention may contain an organic acid. The organic acid neutralizes the basic compound in the composition and prevents the temporal alkali decomposition of the resin (C), and thus, the temporal stability is improved.

Whether the composition of the present invention is either a negative tone resist composition including a crosslinking agent or a positive tone resist composition, an effect derived from the incorporation of an organic acid is expressed.

In one aspect of the present invention, the content of the organic acid in the composition of the present invention is more preferably more than 5% by mass and less than 15% by mass, and still more preferably more than 5% by mass and less than 10% by mass, with respect to the total solid content of the composition.

From the viewpoint of temporal stability, the pKa of the organic acid is preferably in the range of 0 to 10, more preferably in the range of 2 to 8, and still more preferably in the range of 3 to 7. Here, the pKa represents the pKa in an aqueous solution, and for example, it is described in Chemical Handbook (11) (revised 4th edition, 1993, edited by The Chemical Society of Japan, published by Maruzen Co., Ltd.), and a smaller value means higher acidity. Specifically, the pKa in aqueous solution can be obtained by measuring the acid dissociation constant at 25° C. using an infinite dilution aqueous solution, and a value based on the database of Hammett substituent constants and known literature values can also be determined by calculation using the following software package 1. All of the pKa values in the present specification are values determined by calculation using this software package. Software package 1: Advanced Chemistry Development (ACD/Labs) Software V 8.14 for Solaris (1994-2007 ACD/Labs).

The pKa of the organic acid is preferably lower than the pKa of the resin (C), and is preferably higher than the pKa of an acid generated from the acid generator. In one aspect of the present invention, the pKa of the organic acid is preferably 3 lower than the pKa of the resin (C), and more preferably 5 lower than the pKa of the resin (C). Further, in another aspect, the pKa of the organic acid is preferably higher by 2 or more, and more preferably 3 or more than the pKa of an acid generated from the acid generator.

Examples of the organic acid which can be used in the present invention include an organic carboxylic acid and an organic sulfonic acid, and among these, the organic carboxylic acid is preferable. Examples of the organic carboxylic acid include an aromatic organic carboxylic acid, an aliphatic carboxylic acid, an alicyclic carboxylic acid, an unsaturated aliphatic carboxylic acid, an oxycarboxylic acid, and an alkoxycarboxylic acid. Specific examples of the organic acid are not particularly limited, but include those represented by the Structural Formulae below. In one aspect of the present invention, the aromatic organic carboxylic acid is preferable, and benzoic acid, 2-hydroxy-3-naphthoic acid, 2-naphthoic acid, or the like is particularly preferable.

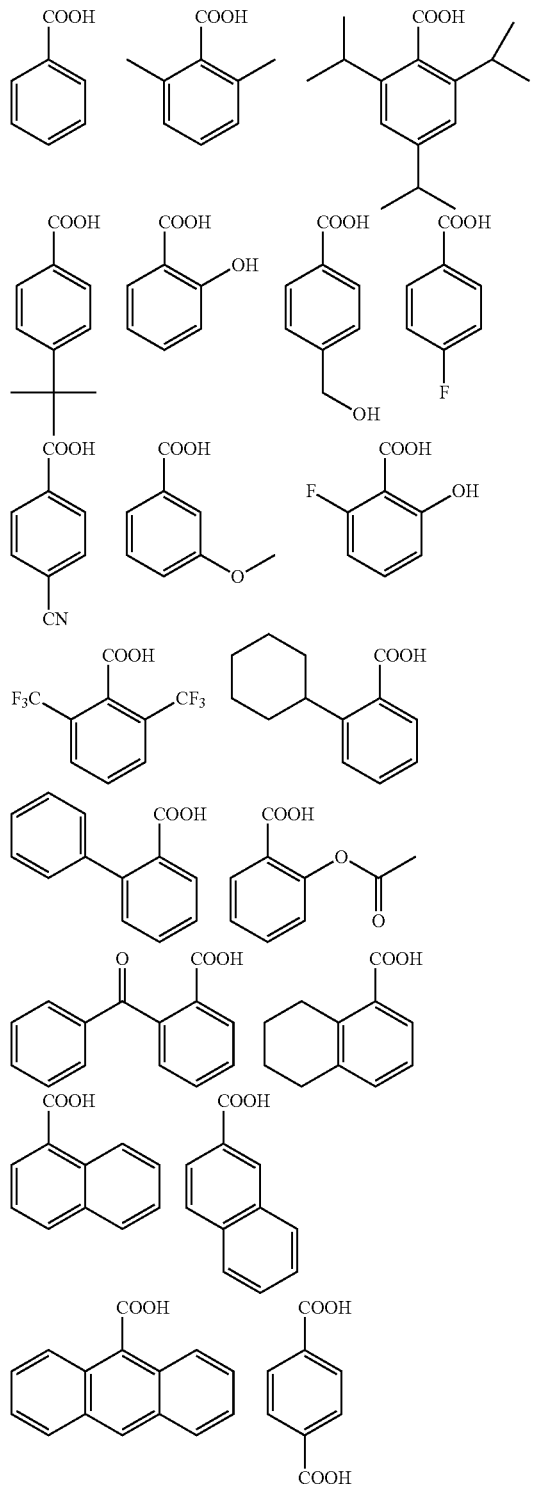

<Actinic Ray-Sensitive or Radiation-Sensitive Film, and Mask Blank>

The present invention also relates to an actinic ray-sensitive or radiation-sensitive film including the composition of the present invention. Such a film is formed by, for example, applying the composition of the present invention onto a support such as a substrate. The thickness of this film is preferably 0.02 to 0.5 µm, more preferably 0.02 to 0.3 µm, and most preferably 0.02 to 0.2 µm. The thickness of the resist film can be appropriately adjusted for the purpose of adjusting all the performances of the resist, such as dry etching resistance. For the purpose of enhancing the dry etching resistance, the film thickness is preferably high, and is also preferably set to 0.05 to 0.3 µm. As a coating method onto a substrate, an appropriate coating method such as spin coating, roll coating, flow coating, dip coating, spray coating, and doctor coating is used for coating onto a substrate, but the spin coating is preferable. The rotation speed is preferably 1,000 to 3,000 rpm. The coating film is prebaked at 60° C. to 150° C. for 1 to 20 minutes, and preferably at 80° C. to 120° C. for 1 to 15 minutes, thereby forming a thin film.

As the material constituting a substrate to be processed or a topmost surface layer thereof, for example, in a case of a semiconductor wafer, a silicon wafer can be used, and examples of the materials constituting the topmost surface layer include Si, $SiO_2$, SiN, SiON, TiN, WSi, BPSG, SOG, and an organic antireflection film.

Moreover, the present invention also relates to a mask blank including the actinic ray-sensitive or radiation-sensitive film obtained in the above manner. In a case where a pattern is formed on a photomask blank for photo mask fabrication in order to obtain the mask blank provided with such a resist film, examples of the usable transparent substrate include a transparent substrate of quartz, calcium fluoride, or the like. Generally, the substrate is laminated with necessary films selected from functional films, such as a light-shielding film, an antireflection film, and a phase shift film, and additionally, an etching stopper film and an etching mask film. As for the material of each of the functional films, a film containing silicon or a transition metal such as chromium, molybdenum, zirconium, tantalum, tungsten, titanium, and niobium is laminated. Examples of the material for use in the topmost surface layer include one whose main constituent material is silicon or a material including silicon and, contained therein, oxygen and/or nitrogen, a silicon compound material whose main constituent material is a material including the same and, contained therein, a transition metal, or a transition metal compound material whose main constituent material is a transition metal, particularly at least one selected from chromium, molybdenum, zirconium, tantalum, tungsten, titanium, niobium, and the like, or a material including the same and, contained therein, at least one element selected from oxygen, nitrogen, and carbon.

The light-shielding film may be a monolayer, but is more preferably in a multilayer structure including a plurality of materials superimposed one upon another by coating. In a case of the multilayer structure, the film thickness of each layer is not particularly limited, but is preferably 5 to 100 nm, and more preferably 10 to 80 nm. The thickness of the whole light-shielding film is not particularly limited, but is preferably 5 to 200 nm, and more preferably 10 to 150 nm.

In a case where pattern formation is performed using a composition on a photomask blank whose topmost surface layer generally contains a material containing chromium, and contained therein, oxygen or nitrogen among the above-mentioned materials, it is likely to experience the occurrence of a constricted shape near the substrate, known as an undercut shape. This undercut problem can be alleviated by the use of the present invention, as compared with the related art.

The actinic ray-sensitive or radiation-sensitive film after irradiation with actinic ray or radiation (electron beams or the like) (hereinafter also referred to as "exposure") and preferably bake (usually 80° C. to 150° C., and more preferably 90° C. to 130° C.) is developed with water. Thus, a good pattern can be obtained. Further, using this pattern as a mask, an etching treatment, ion injection, or the like is appropriately carried out, thereby manufacturing a semiconductor nanocircuit, an imprint mold structure, or the like.

In addition, a process for manufacturing a mold for imprints, using the composition of the present invention is described in, for example, JP4109085B, JP2008-162101A, and "Fundamentals of Nanoimprint and Its Technology Development/Application Deployment—Technology of Nanoimprint Substrate and Its Latest Technology Deployment" edited by Yoshihiko Hirai, published by Frontier Publishing.

<Pattern Forming Method>

The composition of the present invention can be suitably used in the process for forming a negative tone pattern shown below. That is, the composition of the present invention can be preferably used in the process including applying the composition onto a substrate to form a resist film, irradiating the resist film with actinic ray or radiation (that is, exposure), and developing the exposed film using a developer to obtain a negative tone pattern. For this process, use can be made of any of processes described in, for example, JP2008-292975A and JP2010-217884A.

The present invention further relates to a pattern forming method including exposing the resist film or a mask blank including the film, and developing the exposed resist film or the mask blank laminated with the exposed film. In the present invention, the exposure is preferably carried out using electron beams or extreme ultraviolet rays.

In the exposure to light (pattern forming process) of the resist film in, for example, the manufacturing of a precision integrated circuit element, first, it is preferable to subject the resist film of the present invention to patternwise irradiation with electron beams or extreme ultraviolet rays (EUV). The exposure is carried out at an exposure dose of, in a use of electron beams, approximately 0.1 to 20 $\mu C/cm^2$, and preferably approximately 3 to 10 $\mu C/cm^2$, and in a case of extreme ultraviolet rays, approximately 0.1 to 20 $mJ/cm^2$, and preferably approximately 3 to 15 $mJ/cm^2$. Subsequently, post-exposure heating (post-exposure bake) is carried out on a hot plate at 60° C. to 150° C. for 1 to 20 minutes, and preferably 80° C. to 120° C. for 1 to 10 minutes. Thereafter, development, rinsing, and drying are carried out to obtain a pattern. The development is carried out with a developer for 0.1 to 3 minutes, preferably 0.5 to 2 minutes by an ordinary method such as a dip method, a puddle method, and a spray method.

An alkali developer can be used as the developer.

Not only a quaternary ammonium salt whose representative is tetramethylammonium hydroxide is usually used as the alkali developer, but also an alkaline aqueous solution of, for example, an inorganic alkali, a primary amine, a secondary amine, a tertiary amine, an alcoholamine, a cycloamine, or the like can be used. Further, an appropriate amount of an alcohol and a surfactant can be added to the alkali developer before use. The alkali concentration of the alkali developer is usually 0.1% to 20% by mass. The pH of the alkali developer is usually 10.0 to 15.0.

Moreover, an appropriate amount of an alcohol and a surfactant can be added to the alkaline aqueous solution before use.

Since the composition of the present invention is a negative tone resist composition for use in the formation of a negative tone pattern, a film in unexposed areas is dissolved while the film in exposed areas is less likely to be dissolved in the developer due to the crosslinking of the compounds. Utilizing this, a desired pattern can be formed on substrates.

The pattern forming method of the present invention can be used in formation of a guide pattern (see, for example, ACS Nano Vol. 4 No. 8 Pages 4815-4823) in Directed Self-Assembly (DSA).

In addition, the resist pattern formed by the method can be used as a core material (core) in the spacer process disclosed in, for example, JP1991-270227A (JP-H03-270227A) and JP2013-164509A.

Moreover, in the pattern forming method of the present invention, a topcoat may be formed on the upper layer of the resist film. It is preferable that topcoat is not mixed with a resist film and can be uniformly coated on the upper layer of the resist film.

The topcoat is not particularly limited, and a topcoat known in the related art can be formed according to a method known in the related art, and can also be formed, with respect to the description of paragraphs [0072] to [0082] of JP2014-059543A, for example.

It is preferable that various materials (for example, a resist solvent, a resist composition, a composition for forming an antireflection film, and a composition for forming a topcoat) used in the actinic ray-sensitive or radiation-sensitive resin composition of the present invention, and the pattern forming method of the present invention do not include impurities such as metals. The content of the impurities included in these materials is preferably 1 ppm or less, more preferably 10 ppb or less, still more preferably 100 ppt or less, and particularly preferably 10 ppt or less, but it is the most preferable that the material substantially does not have impurities (at a detection limit of a measurement device or less).

Examples of a method for removing impurities such as metals from the various materials include filtration using a filter and a purification process by distillation (in particular, thin-film distillation, molecular distillation, and the like). As for the purification process by distillation, purification process by distillation, for example, "<Factory Operation Series> Augmentation/Distillation, issued on Jul. 31, 1992, Chemical Industry Co., Ltd.", "Chemical Engineering Handbook, published on Sep. 30, 2004", Asakura Shoten, pages 95 to 102", and the like may be mentioned. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. As the filter, a filter which has been washed with an organic solvent in advance may also be used. In the step of filtration using a filter, a plurality of kinds of filters may be connected in series or in parallel, and used. In a case of using a plurality of kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method of selecting raw materials having a small content of metals as raw materials constituting various materials, a method of subjecting raw materials constituting various materials to filtration using a filter, and a method of performing distillation under the condition for suppressing the contamination as much as possible by, for example, lining the inside of a device with Teflon (registered trademark). The preferred conditions for filtration using a filter, which is carried out for raw materials constituting various materials, are the same as described above.

In addition to filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon may be used.

Furthermore, the present invention relates to a method for manufacturing an electronic device, including the above-mentioned the pattern forming method of the present invention, and an electronic device manufactured by the manufacturing method.

The electronic device of the present invention is suitably mounted in electrical or electronic equipment (household electronic appliance, OA/media-related equipment, optical equipment, telecommunication equipment, and the like).

EXAMPLES

Hereinafter, the present invention will be described in detail with reference to Examples, but the contents of the present invention are not limited thereto.

The compounds used in Examples and Comparative Examples are shown below.

<Compound (A) Whose Dissolution Rate in Alkali Developer Decreases by Action of Acid>

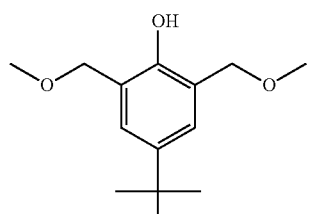

(A-1)

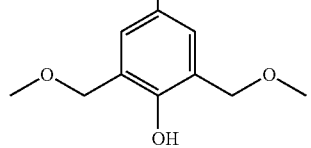

(A-2)

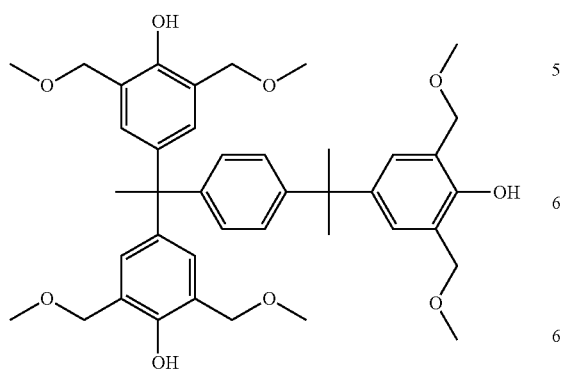

(A-9)
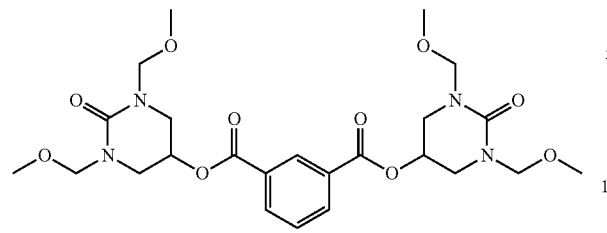
(A-10)
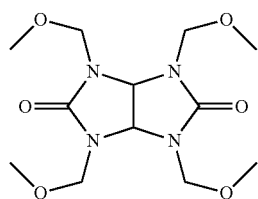
<Resin (B)>
The molar ratio, the weight-average molecular weight, and the dispersity of the repeating unit of each resin are as shown in Tables 1 to 3.
(B-9)
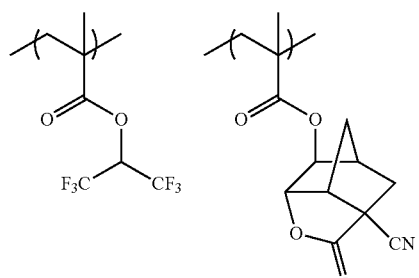
(B-26)
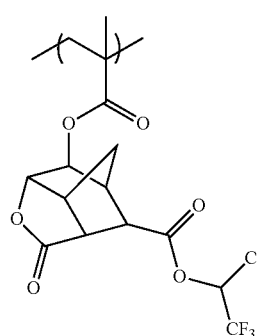
(B-29)
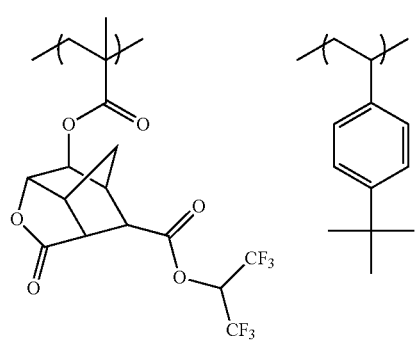
(B-39)
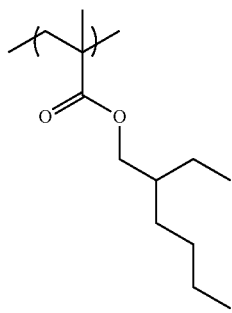
(B-40)
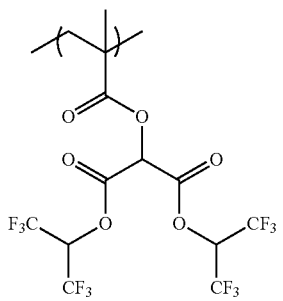
(B-44)
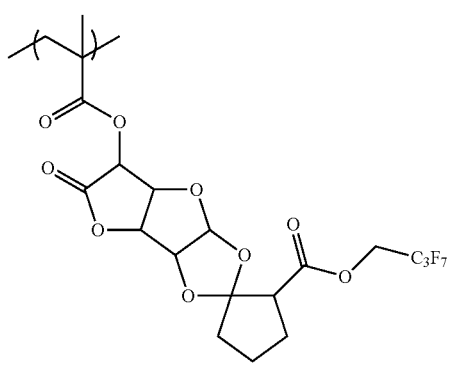
(B-51)
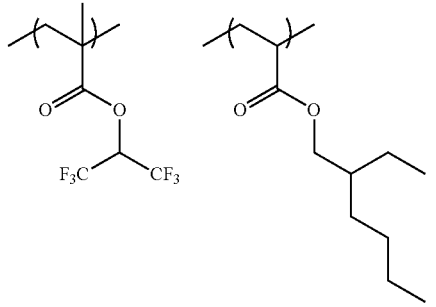
(B-56)
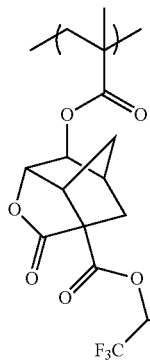

(B-57)

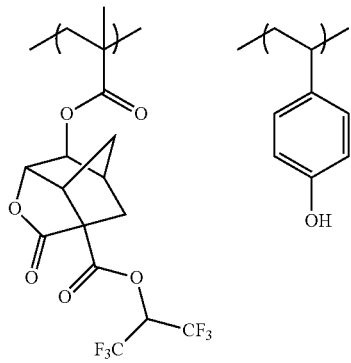

(B-56)

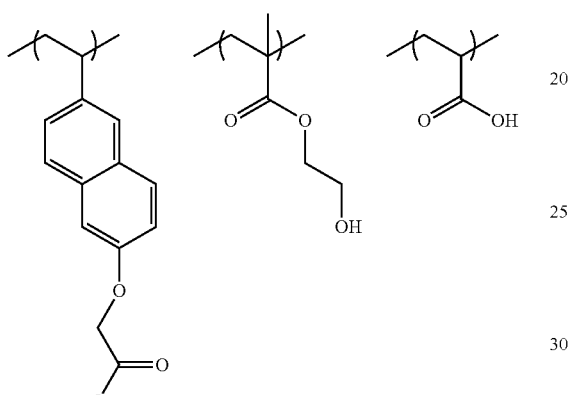

(BX-1)

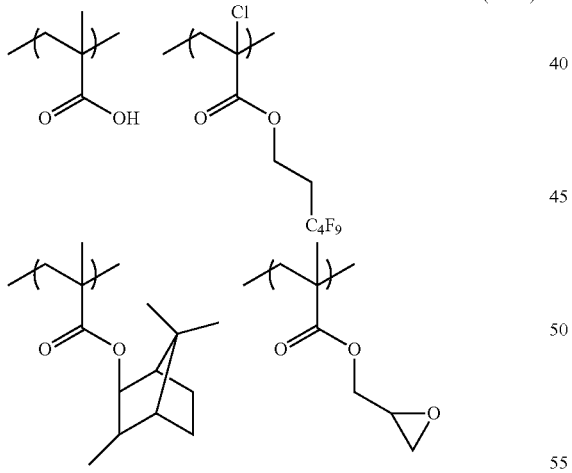

| Polymer | Compositional ratio (% by mole) | Mw | Mw/Mn |
|---|---|---|---|
| BX-1 | 36/35/14/15 | 13000 | 1.6 |

<Resin (C) Having Phenolic Hydroxyl Group>

As the alkali-soluble resin, the resins (P-1) to (P-11) shown below were used. The composition ratio (molar ratio), the weight-average molecular weight Mw, and the dispersity Mw/Mn are shown together. Here, the weight-average molecular weight Mw (in terms of polystyrene), the number-average molecular weight Mn (in terms of polystyrene), and the dispersity Mw/Mn were measured by the above-mentioned methods.

(P-1)

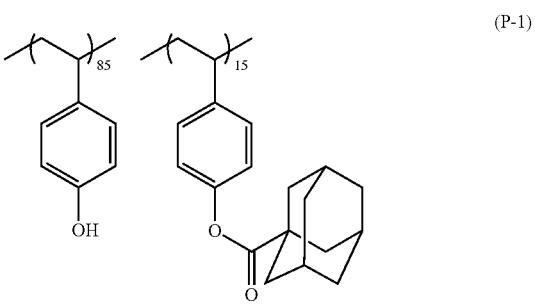

Mw = 4600
Mw/Mn = 1.2

(P-2)

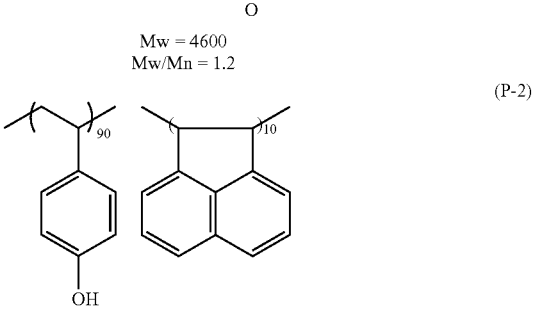

Mw = 8800
Mw/Mn = 1.6

(P-3)

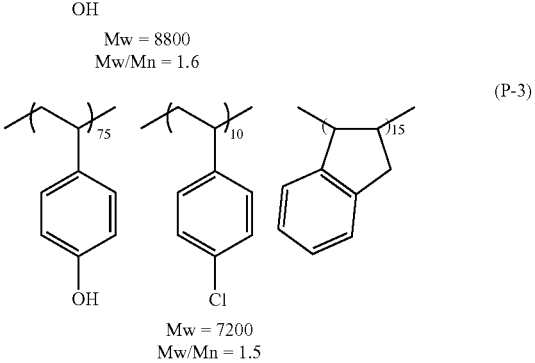

Mw = 7200
Mw/Mn = 1.5

(P-4)

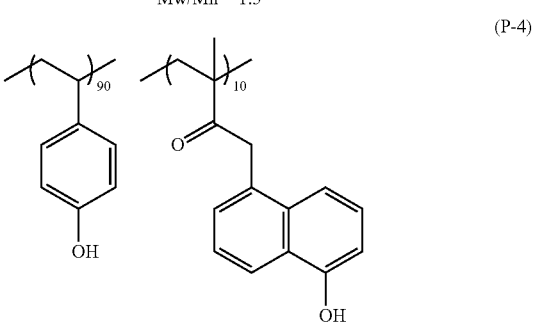

Mw = 12000
Mw/Mn = 1.2

(P-5)

Mw = 9200
Mw/Mn = 1.1

(P-6)
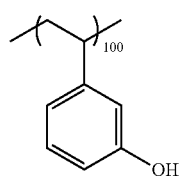
Mw = 4500
Mw/Mn = 1.1
(P-7)
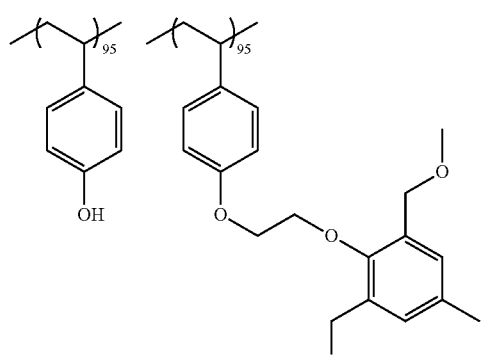
Mw = 4000
Mw/Mn = 1.1
(P-8)
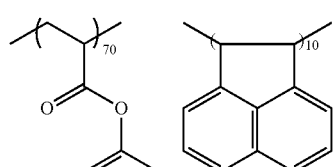
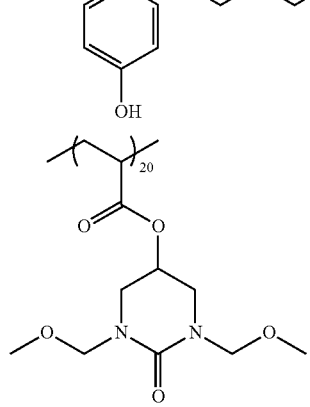
Mw = 10300
Mw/Mn = 1.5
(P-9)
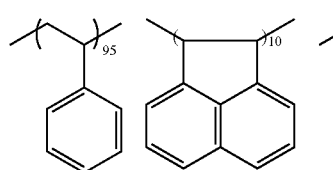
Mw = 3300
Mw/Mn = 1.5
(P-10)
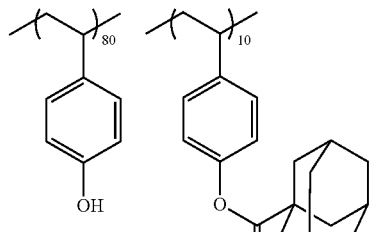
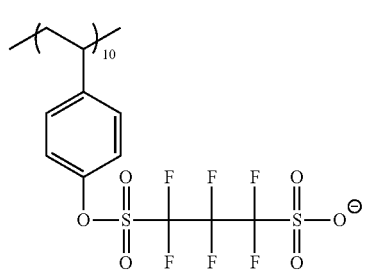
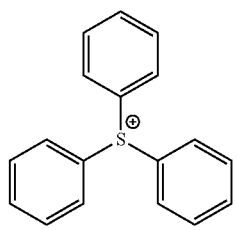
Mw = 4600
Mw/Mn = 1.2
(P-11)
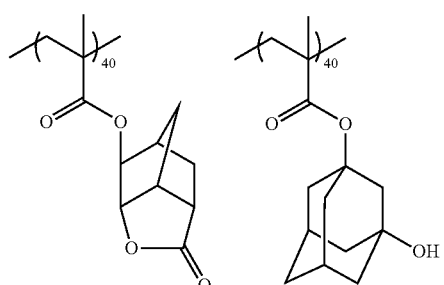
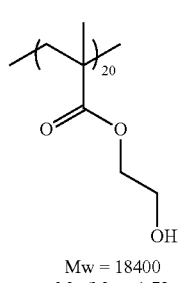
Mw = 18400
Mw/Mn = 1.72
<Acid Generator>
As the acid generator, the compounds PAG-1 to PAG-7 shown below were used.

(PAG-1)
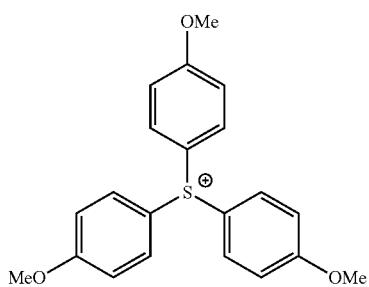
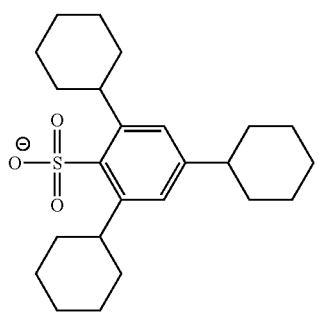
(PAG-2)
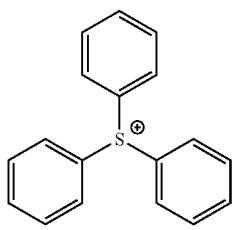
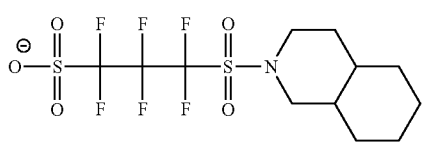
(PAG-3)
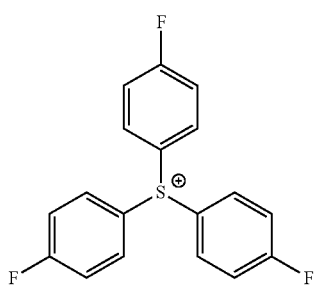
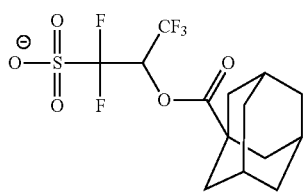
(PAG-4)
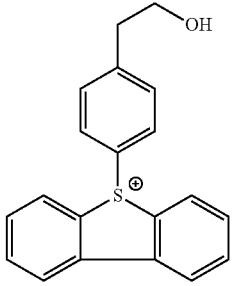
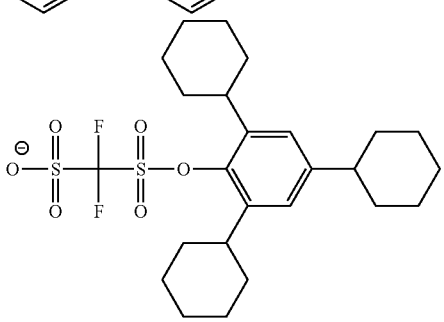
(PAG-5)
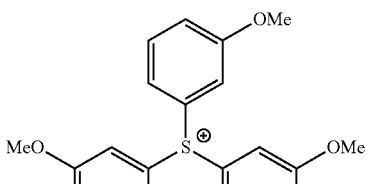
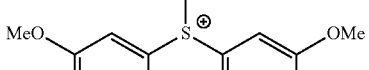
(PAG-6)
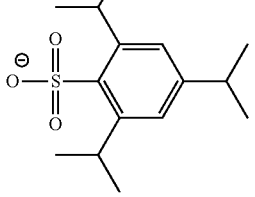
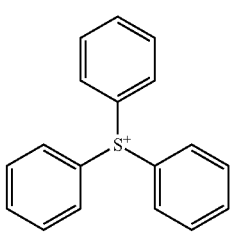
(PAG-7)
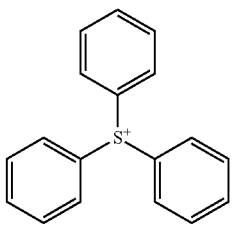

-continued

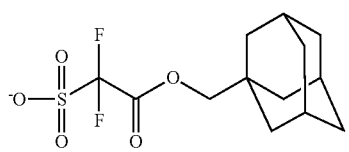

<Basic Compound>

As the basic compound, the compounds D-1 to D-7 shown below were used.

(D-1)

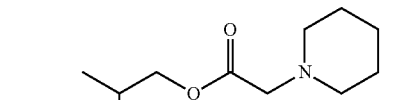

(D-2)

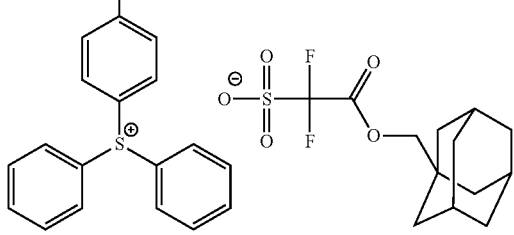

(D-3)

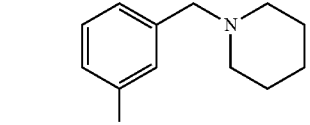

(D-4)

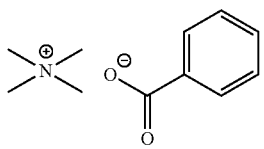

-continued (D-5)

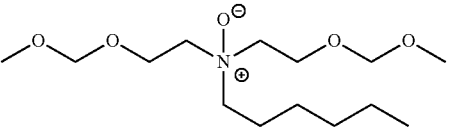

(D-6)

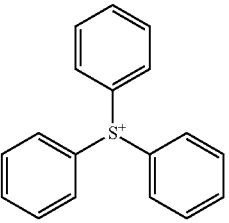

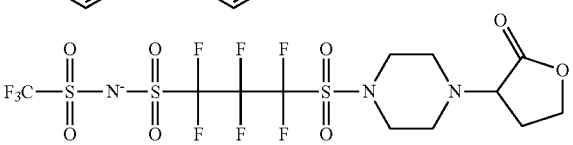

(D-7)

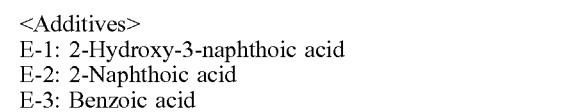

<Additives>
E-1: 2-Hydroxy-3-naphthoic acid
E-2: 2-Naphthoic acid
E-3: Benzoic acid
E-4: Salicylic acid
<Surfactant>
W-1: PF6320 (manufactured by OMNOVA Solutions Inc.)
W-2: MEGAFACE F176 (manufactured by DIC, Inc.; fluorine-based)
W-3: Polysiloxane polymer KP-341 (manufactured by Kyoeisha Chemical Co., Ltd.; silicon-based)
<Solvent>
SL-1: Propylene glycol monomethyl ether (1-methoxy-2-propanol)
SL-2: Propylene glycol monomethyl ether acetate (1-methoxy-2-acetoxypropane)
SL-3: 2-Heptanone
SL-4: Ethyl lactate
SL-5: Cyclohexanone
SL-6: γ-Butyrolactone
SL-7: Propylene carbonate

TABLE 4

| Resist composition | Resin (C) | (g) | Resin (B) | (g) | Acid generator | (g) | Basic compound | (g) | Compound (A) | (g) |
|---|---|---|---|---|---|---|---|---|---|---|
| R-1 | P-1 | 10 | B-29 | 0.10 | PAG-1 | 1.8 | D-5 | 0.5 | A-1 | 2.0 |
| R-2 | P-2 | 10 | B-9 | 0.20 | PAG-2 | 2.4 | D-3 | 0.5 | A-2 | 1.8 |
| R-3 | P-3 | 10 | B-40 | 0.22 | PAG-4 | 2.7 | D-5 | 0.2 | A-3 | 2.3 |
| R-4 | P-4 | 10 | B-26 | 0.31 | PAG-5 | 3.1 | D-5 | 0.5 | A-4 | 3.1 |
| R-5 | P-5 | 10 | B-44 | 1.00 | PAG-4 | 2.3 | D-3 | 0.5 | A-5 | 2.5 |
| R-6 | P-6 | 10 | B-57 | 0.40 | PAG-4 | 2.5 | D-3 | 0.4 | A-6 | 2.4 |

TABLE 4-continued

| | | | | | | | | | |
|---|---|---|---|---|---|---|---|---|---|
| R-7 | P-7 | 10 | B-56 | 0.22 | PAG-3 | 2.3 | D-4 | 0.2 | |
| R-8 | P-8 | 10 | B-57 | 0.14 | PAG-2 | 2.6 | D-4 | 0.4 | |
| R-9 | P-9 | 10 | B-56 | 0.51 | PAG-5 | 1.9 | D-5 | 0.2 | |
| R-10 | P-10 | 10 | B-29 | 0.23 | | | D-4 | 0.4 | A-7 1.7 |
| R-11 | P-2/P-8 | 8/2 | B-9 | 0.10 | PAG-1 | 2.9 | D-5 | 0.4 | A-2 2.0 |
| R-12 | P-4 | 10 | B-58 | 0.34 | PAG-3 | 2.4 | D-1 | 0.5 | A-1 3.4 |
| R-13 | P-1/P-5 | 5/5 | B-29 | 0.30 | PAG-3 | 2.6 | D-3 | 0.5 | A-10 2.6 |
| R-14 | P-1 | 10 | B-40 | 0.25 | PAG-3 | 2.3 | D-4 | 0.3 | A-2/A-3 2.5 |
| R-15 | P-7 | 10 | B-44 | 0.10 | PAG-3 | 2.6 | D-3 | 0.4 | A-6 2.7 |
| R-16 | P-8 | 10 | B-56 | 0.05 | PAG-4 | 2.7 | D-2 | 0.4 | A-4 3.0 |
| R-17 | P-9 | 10 | B-57 | 0.08 | PAG-4 | 2.5 | D-1 | 0.4 | A-8 1.8 |
| R-18 | P-10 | 10 | B-29 | 0.15 | PAG-3 | 2.7 | D-4 | 0.5 | A-9 1.9 |
| R-19 | P-3 | 10 | B-26/B-40 | 0.12 | PAG-5 | 3.1 | D-2 | 0.5 | A-5 2.4 |
| R-20 | P-1 | 10 | B-29 | 0.09 | PAG-3 | 2.7 | D-5 | 0.5 | A-7 2.5 |
| R-21 | P-11 | 10 | B-29 | 0.10 | PAG-1 | 1.8 | D-5 | 0.5 | A-1 2.0 |
| R-22 | P-11 | 10 | B-58 | 0.34 | PAG-3 | 2.4 | D-1 | 0.5 | A-1 3.4 |
| R-23 | P-1 | 10 | BX-1 | 4.3 | PAG-1 | 1.8 | D-5 | 0.5 | A-1 2.0 |

| Resist composition | Additive | (g) | Surfactant | (g) | Solvent | (mass ratio) | Concentration (% by weight) of solid contents |
|---|---|---|---|---|---|---|---|
| R-1 | | | W-3 | 0.05 | SL-1/SL-5 | 70/30 | 4.0 |
| R-2 | | | | | SL-3/SL-6 | 60/40 | 4.0 |
| R-3 | | | W-1 | 0.05 | SL-2/SL-7 | 90/10 | 4.0 |
| R-4 | | | W-3 | 0.05 | SL-1/SL-5 | 60/40 | 4.0 |
| R-5 | | | W-3 | 0.05 | SL-1/SL-5 | 70/30 | 4.0 |
| R-6 | | | W-2 | 0.05 | SL-1/SL-5 | 90/10 | 4.0 |
| R-7 | | | W-3 | 0.05 | SL-1/SL-5 | 90/10 | 4.0 |
| R-8 | | | W-1 | 0.05 | SL-1/SL-5 | 90/10 | 4.0 |
| R-9 | | | W-1 | 0.05 | SL-3/SL-6 | 70/30 | 4.0 |
| R-10 | E-2 | 0.2 | W-2 | 0.05 | SL-2/SL-7 | 90/10 | 4.0 |
| R-11 | E-1 | 0.3 | W-3 | 0.05 | SL-1/SL-5 | 60/40 | 4.0 |
| R-12 | | | | | SL-1/SL-6 | 60/40 | 4.0 |
| R-13 | | | W-3 | 0.05 | SL-3/SL-6 | 80/20 | 4.0 |
| R-14 | | | W-1 | 0.05 | SL-1/SL-5 | 80/20 | 4.0 |
| R-15 | E-2 | 0.3 | W-1 | 0.05 | SL-1/SL-5/SL-7 | 70/20/10 | 4.0 |
| R-16 | | | W-1 | 0.05 | SL-1/SL-7 | 80/20 | 4.0 |
| R-17 | | | W-1 | 0.05 | SL-3/SL-6 | 80/20 | 4.0 |
| R-18 | | | W-1 | 0.05 | SL-3/SL-4 | 70/30 | 4.0 |
| R-19 | | | W-3 | 0.05 | SL-1/SL-5 | 80/20 | 4.0 |
| R-20 | E-3 | 0.3 | W-1 | 0.05 | SL-2/SL-7 | 90/10 | 4.0 |
| R-21 | | | W-3 | 0.05 | SL-1/SL-5 | 70/30 | 4.0 |
| R-22 | | | W-2 | 0.05 | SL-1/SL-6 | 60/40 | 4.0 |
| R-23 | | | W-3 | 0.05 | SL-1/SL-5 | 70/30 | 4.0 |

In the resist composition R-14, the mass ratio of A-2/A-3 is 2/1.

In the resist composition R-19, the mass ratio of B-26/B-40 is 1/1.

TABLE 5

| Resist composition | Resin (C) | (g) | Resin (B) | (g) | Acid generator | (g) | Basic compound | (g) | Compound (A) | (g) | Solvent | (mass ratio) | Concentration (% by weight) of solid contents |
|---|---|---|---|---|---|---|---|---|---|---|---|---|---|
| R-24 | P-1 | 10 | B-29 | 0.54 | PAG-2 | 2.0 | D-6 | 1.1 | A-6 | 4.9 | SL-1/SL-2 | 20/80 | 2.7 |
| R-25 | P-1 | 10 | B-29 | 0.36 | PAG-2 | 2.0 | D-6 | 1.0 | A-6 | 4.9 | SL-1/SL-2 | 20/80 | 2.7 |
| R-26 | P-1 | 10 | B-29 | 0.90 | PAG-2 | 2.0 | D-6 | 1.0 | A-6 | 4.9 | SL-1/SL-2 | 20/80 | 2.7 |
| R-27 | P-1 | 10 | B-29 | 0.36 | PAG-2 | 2.0 | D-7 | 1.0 | A-6 | 4.9 | SL-1/SL-2 | 20/80 | 2.7 |
| R-28 | P-1 | 10 | B-29 | 0.36 | PAG-2 | 2.0 | D-6 | 1.0 | A-6 | 4.9 | SL-1/SL-2 | 20/80 | 3.8 |
| R-29 | P-1 | 10 | B-29 | 0.36 | PAG-2 | 2.0 | D-6 | 1.0 | A-2 | 2.4 | SL-1/SL-2 | 20/80 | 2.7 |

TABLE 6

| Resist composition | Resin (C) | (g) | Resin (B) | (g) | Acid generator | (g) | Basic compound | (g) | Compound (A) | (g) | Additive | (g) | Solvent | (mass ratio) | Concentration (% by weight) of solid contents |
|---|---|---|---|---|---|---|---|---|---|---|---|---|---|---|---|
| R-30 | P-1 | 10 | B-29 | 0.53 | PAG-2 | 2.0 | D-7 | 0.8 | A-6 | 4.9 | | | SL-1/SL-2 | 20/80 | 3.9 |
| R-31 | P-1 | 10 | B-29 | 0.53 | PAG-2 | 1.3 | D-6 | 1.9 | A-6 | 4.9 | | | SL-1/SL-2 | 20/80 | 2.7 |
| R-37 | P-1 | 10 | B-29 | 0.54 | PAG-6 | 2.0 | D-6 | 1.1 | A-6 | 4.9 | | | SL-1/SL-2 | 20/80 | 2.7 |
| R-33 | P-1 | 10 | B-29 | 0.54 | PAG-7 | 2.0 | D-6 | 1.1 | A-6 | 4.9 | | | SL-1/SL-2 | 20/80 | 2.7 |

TABLE 6-continued

| Resist composition | Resin (C) | (g) | Resin (B) | (g) | Acid generator | (g) | Basic compound | (g) | Compound (A) | (g) | Additive | (g) | Solvent | (mass ratio) | Concentration (% by weight) of solid contents |
|---|---|---|---|---|---|---|---|---|---|---|---|---|---|---|---|
| R-34 | P-1 | 10 | B-29 | 0.54 | PAG-2 | 2.0 | D-6 | 1.1 | A-6 | 4.9 | | | SL-1/SL-2/SL-4 | 20/20/60 | 2.7 |
| R-35 | P-1 | 10 | B-29 | 0.56 | PAG-2 | 2.1 | D-6 | 1.1 | A-6 | 5.1 | E-4 | 0.3 | SL-1/SL-2 | 20/80 | 9.7 |
| R-36 | P-1 | 10 | B-29 | 0.57 | PAG-2 | 2.1 | D-6 | 1.2 | A-6 | 5.2 | E-4 | 0.6 | SL-1/SL-2 | 20/80 | 2.7 |

<EB Exposure; Negative Tone; Alkali Development>

[Preparation of Support]

As a support, a 6-inch silicon wafer having Cr oxide deposited therein (silicon wafer which had been subjected to a shielding film treatment used in an ordinary photomask blank) was prepared.

[Preparation of Resist Coating Liquid]

The components shown in Tables 4 to 6 were dissolved in a solvent to prepare a solution having a total concentration of the solid contents shown in Tables 4 to 6, respectively, and these solutions were filtered through a polytetrafluoroethylene filter having a pore diameter of 0.04 μm to prepare resist solutions.

[Manufacture of Resist Film]

The resist coating liquid was coated onto the 6-inch wafer having Cr oxide deposited therein using a spin coater Mark 8 manufactured by Tokyo Electron Limited, and dried on a hot plate at 110° C. for 90 seconds to obtain a resist film having a film thickness of 50 nm. That is, a resist-coated mask blank was obtained.

One inch is equal to 25.4 mm.

[Manufacture of Negative Tone Resist Pattern]

This resist film was patternwise irradiated with electron beams using an electron beam lithography device (manufactured by Elionix Inc.; ELS-7500, acceleration voltage 50 KeV). After the irradiation, the resultant was heated on a hot plate at 110° C. for 90 seconds, dipped in a 2.38% by mass aqueous tetramethylammonium hydroxide (TMAH) solution for 60 seconds, rinsed with water for 30 seconds, and dried.

[Evaluation of Resist Pattern]

The obtained patterns were evaluated by the following methods with respect to the sensitivity, the resolving power, the scum, the collapse margin, and the line-edge-roughness (LER).

[Sensitivity]

The cross-sectional shape of the obtained pattern was observed using a scanning electron microscope (S-4300, manufactured by Hitachi, Ltd.). The exposure dose at which a 1:1 line-and-space resist pattern having a line width of 50 nm was resolved was defined as the sensitivity. The smaller the value thereof, the higher the sensitivity.

[LUS Resolving Power]

The critical resolving power (a minimum line width providing the separation and the resolution of a line and a space (line:space=1:1)) at an exposure dose exhibiting the sensitivity was defined as an L/S resolving power (nm).

[Isolated Space Pattern Resolving Power]

The critical resolving power (a minimum space width providing the separation and the resolution of a line and a space of the isolated space (line:space=100:1)) in the sensitivity was determined. Further, this value was defined as an "isolated space pattern resolving power (nm)". The smaller the value thereof, the better the performance.

[Evaluation of Scum]

With regard to the isolated space pattern resolving power evaluation, scum was evaluated as follows.

A: Scum was not observed at all.

B: Scum was observed in the line width around the critical resolving power.

C: Scum was observed in the line width wider than the critical resolving power.

[Collapse Margin]

When the irradiation dose was reduced from the optimal irradiation doses at a time of exposing a line pattern with a line width of 0.1 μm, a space width in a case where the line pattern starts to collapse was defined as an index of a "collapse margin". The larger the value thereof, the better the performance.

[Line Edge Roughness (LER)]

A 1:1 line-and-space pattern with a line width of 50 nm was formed at an exposure dose exhibiting the above sensitivity. At arbitrary 30 points included within 50 μm in the longitudinal direction of the pattern, the distance between an actual edge and a reference line on which an edge was supposed to be present was measured by means of a scanning electron microscope (S-9220, manufactured by Hitachi, Ltd.). Further, the standard deviation of the measured distances was determined to calculate 3σ. The smaller the value thereof, the better the performance.

TABLE 7

| Example | Resist composition | Sensitivity ($\mu C/cm^2$) | L/S resolving power [nm] | Isolated space pattern resolving power [nm] | Scum evaluation | Collapse margin [nm] | LER [nm] |
|---|---|---|---|---|---|---|---|
| Example 1 | R-1 | 20.3 | 20 | 25 | A | 137.5 | 4.9 |
| Example 2 | R-2 | 20.1 | 22.5 | 27.5 | B | 125.0 | 4.9 |
| Example 3 | R-3 | 20.4 | 20 | 25 | A | 137.5 | 4.0 |
| Example 4 | R-4 | 20.5 | 20 | 25 | A | 137.5 | 4.2 |
| Example 5 | R-5 | 20.2 | 20 | 25 | A | 137.5 | 4.3 |
| Example 6 | R-6 | 20.4 | 20 | 25 | A | 137.5 | 4.4 |
| Example 7 | R-7 | 20.6 | 20 | 25 | A | 137.5 | 4.1 |
| Example 8 | R-8 | 21.0 | 20 | 25 | A | 137.5 | 4.5 |
| Example 9 | R-9 | 20.5 | 20 | 25 | A | 137.5 | 4.6 |
| Example 10 | R-10 | 20.9 | 20 | 25 | A | 137.5 | 4.3 |

TABLE 7-continued

| Example | Resist composition | Sensitivity ($\mu C/cm^2$) | L/S resolving power [nm] | Isolated space pattern resolving power [nm] | Scum evaluation | Collapse margin [nm] | LER [nm] |
|---|---|---|---|---|---|---|---|
| Example 11 | R-11 | 20.6 | 22.5 | 27.5 | B | 125.0 | 5.1 |
| Example 12 | R-12 | 24.4 | 25 | 30 | B | 125.0 | 5.0 |
| Example 13 | R-13 | 22.1 | 20 | 25 | A | 137.5 | 4.6 |
| Example 14 | R-14 | 20.5 | 20 | 25 | A | 137.5 | 4.3 |
| Example 15 | R-15 | 20.7 | 20 | 25 | A | 137.5 | 4.0 |
| Example 16 | R-16 | 20.7 | 20 | 25 | A | 137.5 | 4.1 |
| Example 17 | R-17 | 20.3 | 20 | 25 | A | 137.5 | 4.7 |
| Example 18 | R-18 | 21.1 | 20 | 25 | A | 137.5 | 4.6 |
| Example 19 | R-19 | 20.2 | 20 | 25 | A | 137.5 | 4.2 |
| Example 20 | R-20 | 20.4 | 20 | 25 | A | 137.5 | 4.4 |
| Comparative Example 1 | R-21 | 38.7 | 35 | 35 | B | 100 | 5.9 |
| Comparative Example 2 | R-22 | 35.9 | 35 | 40 | C | 100 | 6.3 |
| Comparative Example 3 | R-23 | 24.4 | 30 | 40 | C | 85 | 6.5 |

TABLE 8

| Example | Resist composition | Sensitivity ($\mu C/cm^2$) | L/S resolving power [nm] | Isolated space pattern resolving power [nm] | Scum evaluation | Collapse margin [nm] | LER [nm] |
|---|---|---|---|---|---|---|---|
| Example 21 | R-24 | 20.4 | 20 | 25 | A | 137.5 | 4.2 |
| Example 22 | R-25 | 20.6 | 20 | 25 | A | 137.5 | 4.2 |
| Example 23 | R-26 | 20.1 | 20 | 25 | A | 137.5 | 4.1 |
| Example 24 | R-27 | 20.5 | 20 | 25 | A | 137.5 | 4.2 |
| Example 25 | R-28 | 20.6 | 20 | 25 | A | 137.5 | 4.2 |
| Example 26 | R-29 | 20.7 | 20 | 25 | A | 137.5 | 4.4 |

TABLE 9

| Example | Resist composition | Sensitivity ($\mu C/cm^2$) | L/S resolving power [nm] | Isolated space pattern resolving power [nm] | Scum evaluation | Collapse margin [nm] | LER [nm] |
|---|---|---|---|---|---|---|---|
| Example 27 | R-30 | 20.3 | 20 | 25 | A | 137.5 | 4.1 |
| Example 28 | R-31 | 24.2 | 20 | 25 | A | 137.5 | 4.0 |
| Example 29 | R-32 | 20.6 | 20 | 25 | A | 137.5 | 4.3 |
| Example 30 | R-33 | 20.4 | 20 | 25 | A | 137.5 | 4.5 |
| Example 31 | R-34 | 20.1 | 20 | 25 | A | 137.5 | 4.4 |
| Example 32 | R-35 | 20.5 | 20 | 25 | A | 137.5 | 4.6 |
| Example 33 | R-36 | 20.2 | 20 | 25 | A | 137.5 | 4.1 |

Furthermore, in Examples above, even when the resin (C), the resin (B), the acid generator, the basic compound, the compound (A), the additive, and the surfactant were changed within the above-mentioned preferred ranges, the same performance was exhibited.

INDUSTRIAL APPLICABILITY

According to the present invention, it is possible to provide an actinic ray-sensitive or radiation-sensitive resin composition capable of forming a pattern which has excellent sensitivity, resolution, and collapse performance, suppressed generation of scum, and excellent line-edge-roughness performance in the formation of an ultrafine pattern (for example, a pattern having a line width of 50 nm or less), as well as an actinic ray-sensitive or radiation-sensitive film, a mask blank having the actinic ray-sensitive or radiation-sensitive film, a pattern forming method, and a method for manufacturing an electronic device, including the pattern forming method, each using the actinic ray-sensitive or radiation-sensitive resin composition.

Although the present invention has been described in detail and with reference to specific embodiments, it is apparent to those skilled in the art that it is possible to add various alterations and modifications while the alterations and modifications do not deviate from the spirit and the scope of the present invention.

This application is based on a Japanese patent application filed on Feb. 27, 2015 (JP2015-38744), Japanese patent application filed on Jun. 18, 2015 (JP2015-123245), and Japanese patent application filed on Dec. 18, 2015 (JP2015-247932), the contents which are incorporated herein by reference.

What is claimed is:

1. An actinic ray-sensitive or radiation-sensitive resin composition comprising:
   a resin [N-A] whose dissolution rate in an alkali developer decreases by the action of an acid;

a resin (B) having a group that decomposes by the action of an alkali developer to increase the solubility in the alkali developer and having at least one of a fluorine atom or a silicon atom;

a resin (C) having a phenolic hydroxyl group, different from the resin (B), wherein the resin [N-A] has at least one of a repeating unit represented by General Formula (L-1) or a repeating unit represented by General Formula (L-2):

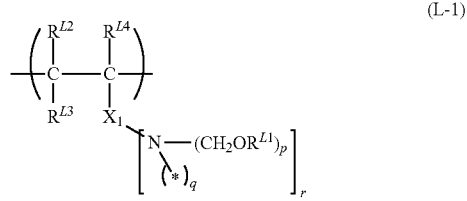
(L-1)

wherein, $R^{L1}$ represents a hydrogen atom, an alkyl group, or a cycloalkyl group;

p represents 1 or 2;

q represents an integer represented by (2-p);

* represents a bonding arm to another atom constituting the repeating unit (L-1);

in a case where p is 2, or r is 2 or more, a plurality of $R^{L1}$'s may be the same as or different from each other;

$R^{L2}$, $R^{L3}$, and $R^{L4}$ each independently represent a hydrogen atom, an alkyl group, a cycloalkyl group, a halogen atom, a cyano group, or an alkoxycarbonyl group;

$X_1$ represents a single bond, or a r+1-valent group selected from the group consisting of:

a linear or branched hydrocarbon group, a cyclic hydrocarbon group which may contain a heteroatom as a ring member, —O—, —S—, —CO—, —SO$_2$—, —NR—, and a group formed by combining these members;

R represents a hydrogen atom, an alkyl group, or a group represented by —CH$_2$OR$^{L1}$ wherein $R^{L1}$ has the same definition as $R^{L1}$;

r represents an integer of 1 to 5, provided that in a case where $X_1$ is a single bond, r is 1;

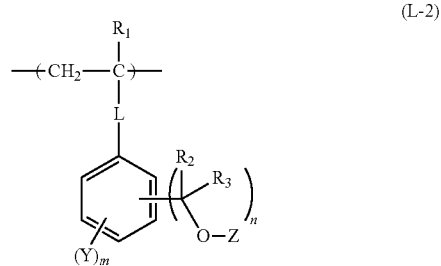
(L-2)

wherein, $R_1$ represents a hydrogen atom, a methyl group, or a halogen atom;

$R_2$ and $R_3$ each independently represent a hydrogen atom, an alkyl group, or a cycloalkyl group;

L represents a divalent linking group or a single bond;

Y represents a monovalent substituent excluding a methylol group;

Z represents a hydrogen atom or a monovalent substituent;

m represents an integer of 0 to 4;

n represents an integer of 1 to 5;

m+n is 5 or less;

in a case where m is 2 or more, a plurality of Y's may be the same as or different from each other, and a plurality of Y's may be bonded to each other to form a ring structure; and in a case where n is 2 or more, a plurality of $R_2$'s, $R_3$'s, and Z's, may be the same as or different from each other;

and a compound that generates an acid upon irradiation with actinic ray or radiation.

2. The actinic ray-sensitive or radiation-sensitive resin composition according to claim 1, wherein the resin (C) having a phenolic hydroxyl group has a repeating unit represented by General Formula (30),

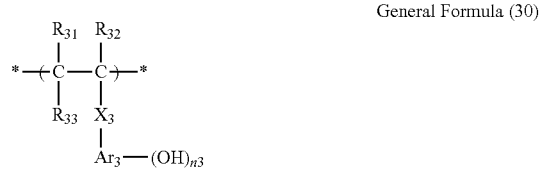
General Formula (30)

in General Formula (30), $R_{31}$, $R_{32}$, and $R_{33}$ each independently represent a hydrogen atom, an alkyl group, a cycloalkyl group, a halogen atom, a cyano group, or an alkoxycarbonyl group, $R_{33}$ may be bonded to $Ar_3$ to form a ring, and $R_{33}$ in this case represents an alkylene group, $X_3$ represents a single bond or a divalent linking group, $Ar_3$ represents an (n3+1)-valent aromatic ring group, and in a case of being bonded to $R_{33}$ to form a ring, $Ar_3$ represents an (n3+2)-valent aromatic ring group, and n3 represents an integer of 1 to 4.

3. The actinic ray-sensitive or radiation-sensitive resin composition according to claim 1, wherein the group that decomposes by the action of an alkali developer in the resin (B) to increase the solubility in the alkali developer is a group represented by X in a partial structure represented by General Formula (KA-1) or (KB-1),

(KA-1)

(KB-1)

in General Formula (KA-1) or (KB-1), X represents —COO—, —C(O)OC(O)—, —NHCONH—, —COS—, —OC(O)O—, —OSO$_2$O—, or —SO$_2$O—, and $Y^1$ and $Y^2$ may be the same as or different from each other, and represent an electron-withdrawing group.

4. The actinic ray-sensitive or radiation-sensitive resin composition according to claim 1, wherein the compound that generates an acid upon irradiation with actinic ray or radiation is a sulfonium salt.

5. The actinic ray-sensitive or radiation-sensitive resin composition according to claim 1, further comprising a basic compound or ammonium salt compound whose basicity decreases upon irradiation with actinic ray or radiation.

6. An actinic ray-sensitive or radiation-sensitive film formed using the actinic ray-sensitive or radiation-sensitive resin composition according to claim 1.

7. A mask blank comprising the actinic ray-sensitive or radiation-sensitive film according to claim 6.

8. A pattern forming method comprising:
a step of applying the actinic ray-sensitive or radiation-sensitive resin composition according to claim 1 onto a substrate to form a film;
a step of exposing the film; and
a step of developing the exposed film to form a negative tone pattern.

9. The pattern forming method according to claim 8, wherein
the step of exposing the film is performed with electron beams or extreme ultraviolet rays.

10. A method for manufacturing an electronic device, comprising the pattern forming method according to claim 8.

11. The actinic ray-sensitive or radiation-sensitive resin composition according to claim 1,
wherein $R^{L1}$ in the General Formula (L-1) represents a hydrogen atom or an alkyl group having 1 to 8 carbon atoms.

12. The actinic ray-sensitive or radiation-sensitive resin composition according to claim 1,
wherein $R^{L1}$ in the General Formula (L-1) represents a cycloalkyl group having 3 to 17 carbon atoms which may be either monocyclic or polycyclic.

13. The actinic ray-sensitive or radiation-sensitive resin composition according to claim 1,
wherein the repeating unit represented by General Formula (L-1) is any one of the following:

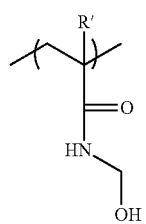
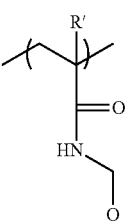
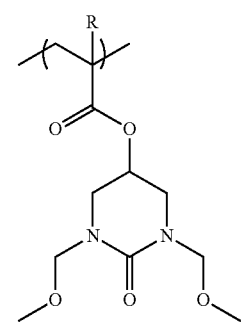
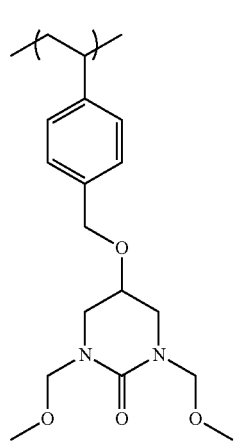
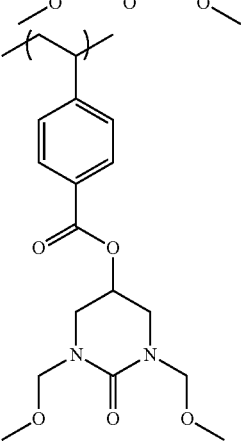

wherein R and R' each represent a hydrogen atom or a methyl group.

14. The actinic ray-sensitive or radiation-sensitive resin composition according to claim 1,
wherein L in the General Formula (L-2) is a divalent aromatic ring group or a linking group represented by —COO—.

15. The actinic ray-sensitive or radiation-sensitive resin composition according to claim 1,
wherein the repeating unit represented by General Formula (L-2) is any one of the following:

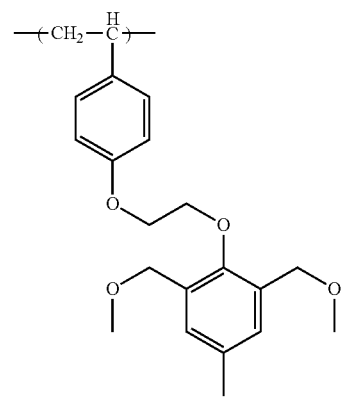
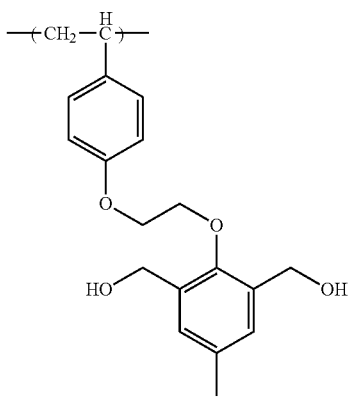
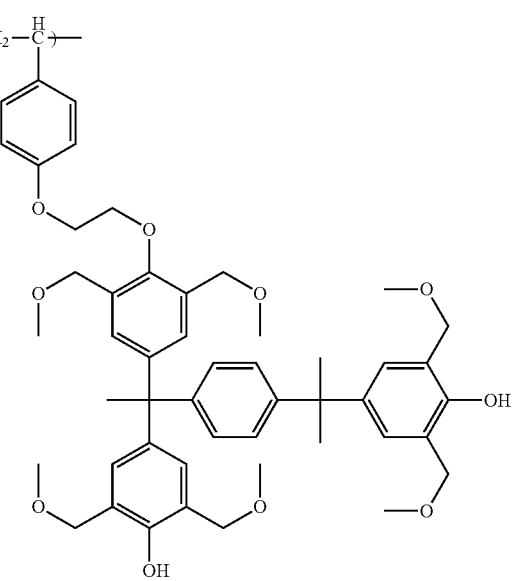

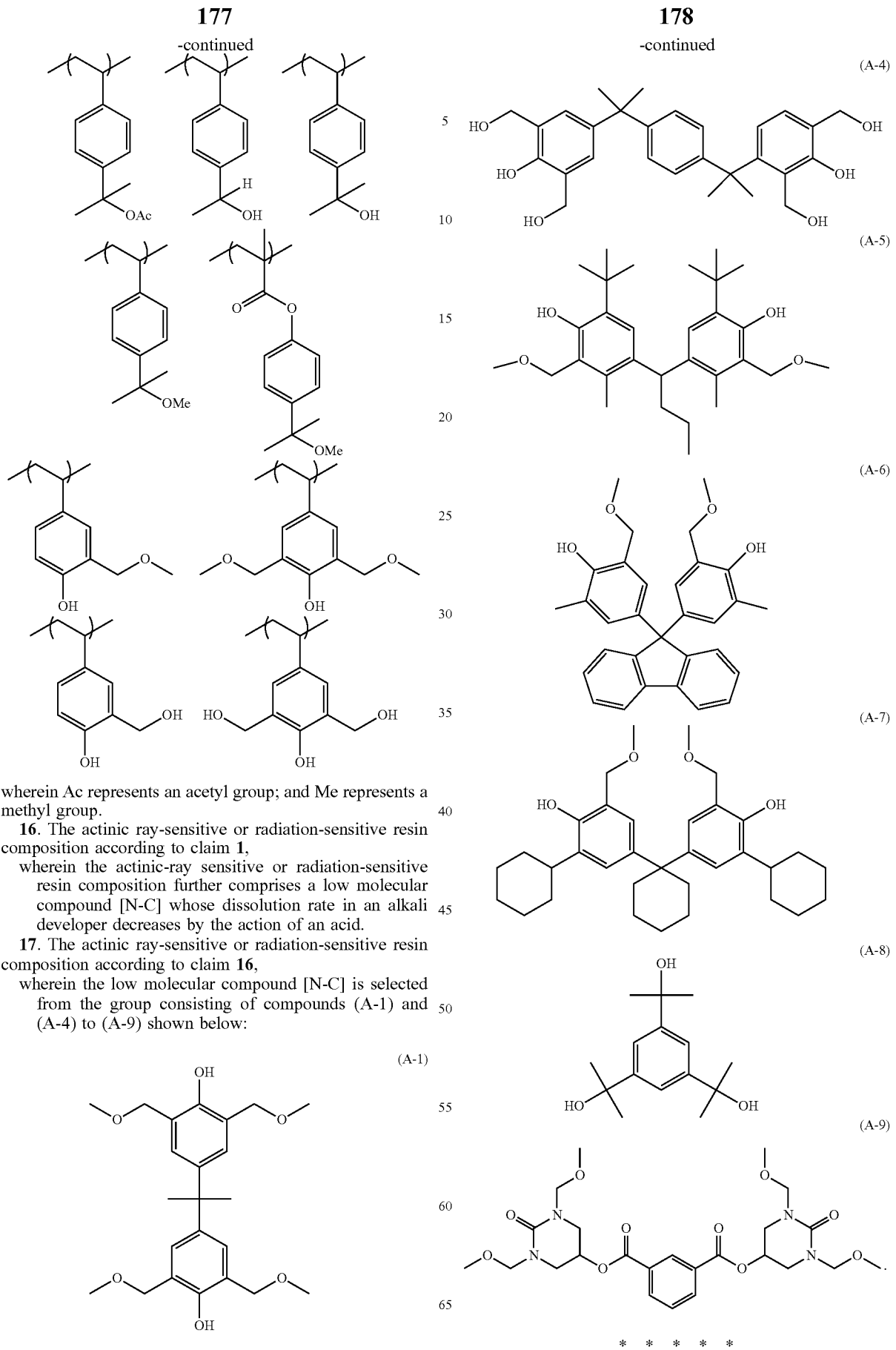

wherein Ac represents an acetyl group; and Me represents a methyl group.

16. The actinic ray-sensitive or radiation-sensitive resin composition according to claim 1,
wherein the actinic-ray sensitive or radiation-sensitive resin composition further comprises a low molecular compound [N-C] whose dissolution rate in an alkali developer decreases by the action of an acid.

17. The actinic ray-sensitive or radiation-sensitive resin composition according to claim 16,
wherein the low molecular compound [N-C] is selected from the group consisting of compounds (A-1) and (A-4) to (A-9) shown below:

* * * * *